US012745404B2

(12) United States Patent
Okada et al.

(10) Patent No.: US 12,745,404 B2

(45) Date of Patent: Sep. 22, 2026

(54) SEMICONDUCTOR MEMORY DEVICE

(71) Applicant: KIOXIA CORPORATION, Tokyo (JP)

(72) Inventors: Nobuaki Okada, Kawasaki (JP); Akihiko Chiba, Yokohama (JP); Kenichi Matoba, Yokohama (JP); Haruna Sugiura, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 275 days.

(21) Appl. No.: 18/455,937

(22) Filed: Aug. 25, 2023

(65) Prior Publication Data

US 2024/0074214 A1 Feb. 29, 2024

(30) Foreign Application Priority Data

Aug. 25, 2022 (JP) ................................ 2022-134523
Mar. 23, 2023 (JP) ................................ 2023-047179

(51) Int. Cl.

*H10B 80/00* (2026.01)
*H01L 25/065* (2023.01)
*H10W 90/00* (2026.01)

(52) U.S. Cl.

CPC ............ *H10B 80/00* (2023.02); *H10W 90/00* (2026.01); *H10W 90/792* (2026.01)

(58) Field of Classification Search

CPC ..... H01L 24/08; H01L 25/0657; H01L 25/18; H10B 80/00

See application file for complete search history.

(56) References Cited

U.S. PATENT DOCUMENTS 10,090,315 B2 10/2018 Fukuzumi et al.
11,121,147 B2 9/2021 Nakatsuka et al.
(Continued)

FOREIGN PATENT DOCUMENTS

JP 2020155714 A 9/2020
JP 2020178010 A 10/2020
(Continued)

OTHER PUBLICATIONS

Office Action issued on Jul. 30, 2026, in corresponding Japanese Application No. 2023-047179, 11 pages.

*Primary Examiner* — Dale E Page
*Assistant Examiner* — Wilner Jean Baptiste
(74) *Attorney, Agent, or Firm* — Maier & Maier, PLLC

(57) ABSTRACT

A semiconductor memory device includes a plurality of transistors arranged in a first direction, and arranged in a second direction and a first wiring layer disposed between a semiconductor substrate and a plurality of voltage supply wirings. Each of the plurality of transistors includes a source region and a drain region. The first wiring layer includes a plurality of first connecting portions disposed at positions overlapping with the plurality of source regions when viewed in a third direction and electrically connected to the plurality of source regions and the plurality of voltage supply wirings, a plurality of second connecting portions disposed at positions overlapping with the plurality of source regions when viewed in the third direction and electrically connected to a plurality of the drain regions and a plurality of conductive layers, and a passing wiring region disposed between a pair of the second connecting portions.

20 Claims, 64 Drawing Sheets

(56) References Cited

U.S. PATENT DOCUMENTS

| | | | | |
|---|---|---|---|---|
| 11,488,675 | B2 * | 11/2022 | Utsumi .................. | H10B 43/40 |
| 11,594,546 | B2 | 2/2023 | Morozumi et al. | |
| 11,705,443 | B2 * | 7/2023 | Maejima ................ | G11C 16/08 257/777 |
| 11,710,727 | B2 * | 7/2023 | Okada ..................... | H01L 24/03 257/299 |
| 11,810,624 | B2 | 11/2023 | Kato | |
| 2021/0082877 | A1 * | 3/2021 | Uchiyama ............... | H01L 25/18 |
| 2021/0082896 | A1 | 3/2021 | Harashima et al. | |
| 2021/0320094 | A1 | 10/2021 | Zhang et al. | |
| 2021/0375790 | A1 * | 12/2021 | Oda ........................ | H01L 25/50 |
| 2022/0085003 | A1 | 3/2022 | Iwashita et al. | |
| 2022/0344361 | A1 * | 10/2022 | Jeon ....................... | H10B 41/27 |
| 2023/0061301 | A1 * | 3/2023 | Kim ....................... | H10B 43/27 |
| 2023/0083442 | A1 * | 3/2023 | Murakami .............. | H01L 24/08 257/777 |
| 2023/0117267 | A1 * | 4/2023 | Choi ................... | H01L 25/0657 257/777 |

FOREIGN PATENT DOCUMENTS

| | | | |
|---|---|---|---|
| JP | 2021048220 | A | 3/2021 |
| JP | 2022113999 | A | 8/2022 |
| TW | 202203423 | A | 1/2022 |
| TW | 202219964 | A | 5/2022 |

* cited by examiner

VG
vg1
$V_{PGM}$
$L_{VG1}$
vg2
$V_{USEL}$
$L_{VG2}$
vg3
$V_{CGR}$
$L_{VG3}$
P
$L_P$
DRV
VSEL1
$T_{DRV1}$
VSEL2
$T_{DRV2}$
VSEL3
$T_{DRV3}$
VSEL4
$T_{DRV4}$
VSEL5
$T_{DRV5}$
VSEL6
$T_{DRV6}$
$CGI_S$
$CGI_U$
CGI
WLD
wld
RD
$T_{WLS}$
$T_{WLU}$
$WLSEL_S$
$WLSEL_U$
RowC
BLKSEL
blkd
WLSW
SGSW
SGSW
SGD
WL
SGS VZ
ma
120
Z
Y
X
102
MA
101
100
110(SGS)
110(WL)
110(SGD)
CH
Vy
M0
M1
MB
DB
D4
D3
D2
D1
D0
GC
200S
200
$C_M$
$C_P$
$L_{SB}$
$L_{MCA}$
CC
m0
m1
BL
m1(m1a)
V1
$P_{I1}$
$P_{I2}$
$p_{I1B}$
$p_{I1M}$
$p_{I2M}$
$p_{I2B}$
d4
d3
d2
d1
d0
Tr
gc
STI
200G
WLSW
$R_{HU}$
$R_{MH}$ MP
X
Y
Z
CC
ST
BLK(1)
BLK(2)
BLK(3)
BLK(4)
BLK(5)
BLK(6)
BLK(7)
BLK(8)
$R_{HU}$(P1)
$R_{HU}$(P2)
$R_{HU}$(P3)
$R_{HU}$(P4)
$R_{HU}$(P5)
$R_{HU}$(P6)
$R_{HU}$(P7)
$R_{HU}$(P8)
$R_{HU}$(N1)
$R_{HU}$(N2)
$R_{HU}$(N3)
$R_{HU}$(N4)
$R_{HU}$(N5)
$R_{HU}$(N6)
$R_{HU}$(N7)
$R_{HU}$(N8)
$R_{HU}$
$R_{MH}$ b1
b2
b3
b4
MP0´
MP1´
MP2´
MP3´
$G_P$
$R_{RC}$
$R_{BD}$
$R_{PC}$
$R_{CC}$
$R_C$
$R_{HU}$
$R_{MH}$
$R_{MHU}$
m1a
A
X
Y
Z b1
b2
b3
b4
MP0´
MP1´
MP2´
MP3´
$C_P$
$R_{RC}$
$R_{BD}$
$R_{PC}$
$R_{CC}$
SYN
TW
B
$R_{HU}$
$R_{MH}$
$R_C$
Y
X
Z ST
BLK(1)
BLK(2)
BLK(3)
BLK(4)
BLK(5)
BLK(6)
BLK(7)
BLK(8)
TG3
WLSW
D
STI
CS1
CS2
203
206
C
C'
Ypitch
X
Y
Z Z
X
Y
M100
$L_{MCA}$
D103
D102
D101
D100
$L_{TR}$
500
BL
m100
CC
C400
$520_U$
$520_L$
520
d103
d102
d101
d100
CS
STI
Tr
gc
510A
510
511
512
Vy
Ch
GC
$R_{MH2}$
$R_{HU22}$ W0
W0
d02b
d02b
PD
Border
d02
d02
A=5,B=0
A−B=5
A=9,B=0
A−B=9
A=10,B=3
A−B=7
A=13,B=10
A−B=3
$R_{MH}$
$R_{RC}$
$R_{HU}$
Ypitch
X
Y
Z CS1
d01
d02
CS2
d02b
W0(1)
W0(2)
W0(3)
203
R(+X)
R(−X)
$R_{W0}$
$R_{CGI}$
$R_{WLHU1}$
Ypitch
$R_{WLHU2}$
X
Y
Z W0
W0
d02b
d02b
PD
PD
Border
d02
d02
d02
A=5,B=0
A−B=5
A=9,B=0
A−B=9
A=10,B=1
A−B=9
A=11,B=2
A−B=9
A=13,B=6
A−B=7
$R_{RC}$
$R_{MH}$
$R_{HU}$
Ypitch
X
Y
Z d02
d01
CS1
CS2
d02b
W0(1)
W0(2)
W0(3)
203
$R_{W0}$
R(+X)
R(-X)
$R_{CGI}$
$R_{WLHU1}$
$R_{WLHU2}$
Ypitch
X
Y
Z

SEMICONDUCTOR MEMORY DEVICE

CROSS-REFERENCE TO RELATED APPLICATIONS

This application is based upon and claims the benefit of Japanese Patent Application No. 2022-134523, filed on Aug. 25, 2022, and Japanese Patent Application No. 2023-047179, filed on Mar. 23, 2023, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers stacked in a direction intersecting with a surface of this substrate, a semiconductor layer opposed to these plurality of conductive layers, and a gate insulating layer disposed between the conductive layers and the semiconductor layer. The gate insulating layer includes a memory portion that can store data, and the memory portion is, for example, an insulating electric charge accumulating layer of silicon nitride (SiN) or the like and a conductive electric charge accumulating layer, such as a floating gate.

DETAILED DESCRIPTION

Figure 1:
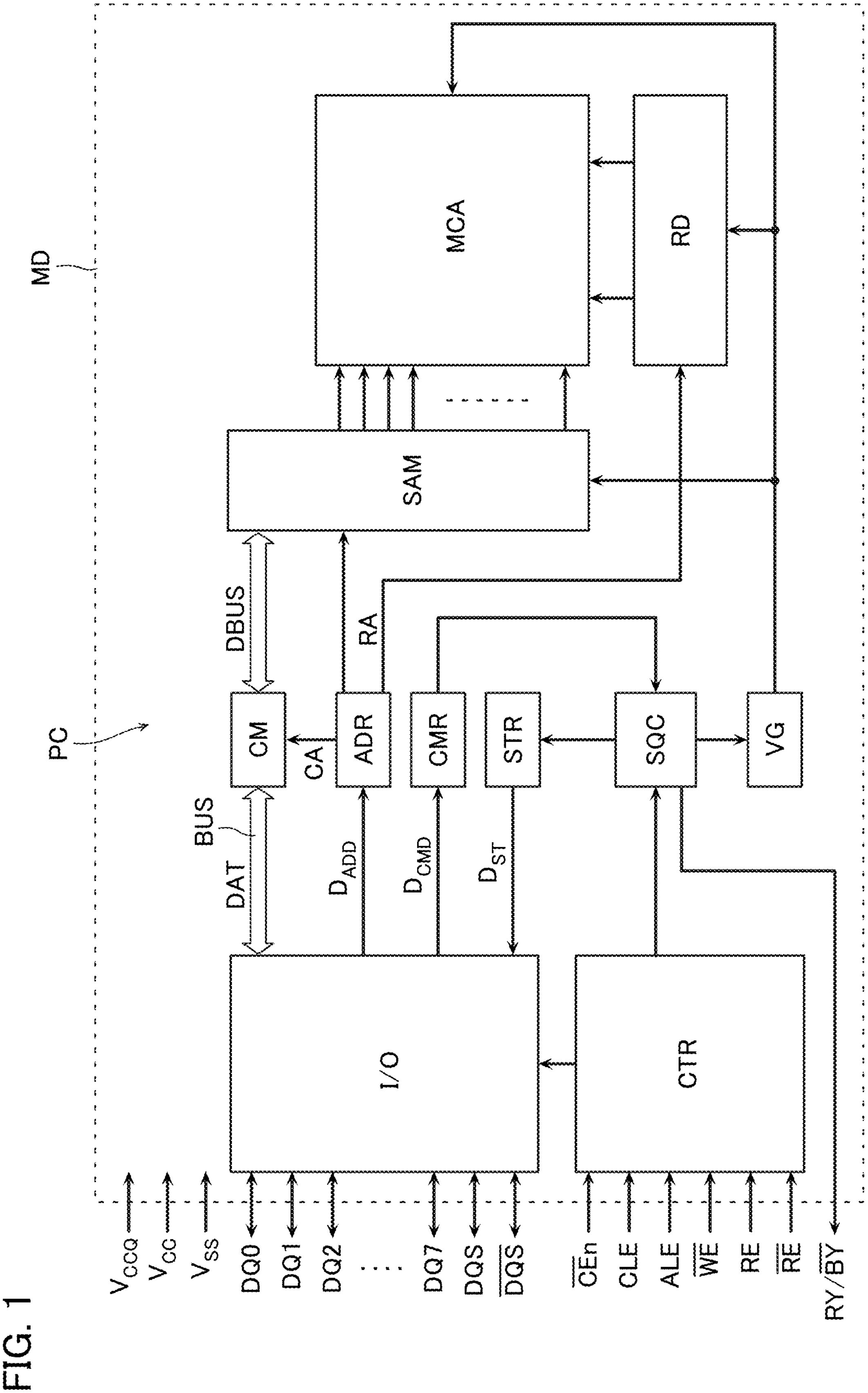
FIG. 1 is a schematic block diagram illustrating a configuration of a memory die MD.

A semiconductor memory device according to one embodiment comprises: a semiconductor substrate; a plurality of voltage supply wirings; a plurality of transistors disposed on the semiconductor substrate, arranged in a first direction, and arranged in a second direction intersecting with the first direction; and a first wiring layer disposed between the semiconductor substrate and the plurality of voltage supply wirings. Each of the plurality of transistors includes a source region and a drain region arranged with the source region in the second direction. The first wiring layer includes: a plurality of first connecting portions disposed at positions overlapping with the plurality of source regions when viewed in a third direction intersecting with the first direction and the second direction and electrically connected to the plurality of source regions and the plurality of voltage supply wirings; a plurality of second connecting portions disposed at positions overlapping with the plurality of source regions when viewed in the third direction and electrically connected to the plurality of drain regions and a plurality of conductive layers; and a passing wiring region disposed between a pair of the second connecting portions arranged in the second direction. The passing wiring region includes one or a plurality of passing wirings extending in the first direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by the same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

In this specification, when referring to a "wiring", it includes a wiring, a connecting portion for connecting a via-contact electrode a wiring and a via-contact electrode, a bonding electrode, and the like in some cases.

First Embodiment

[Circuit Configuration of Memory Die MD]

Figure 2:
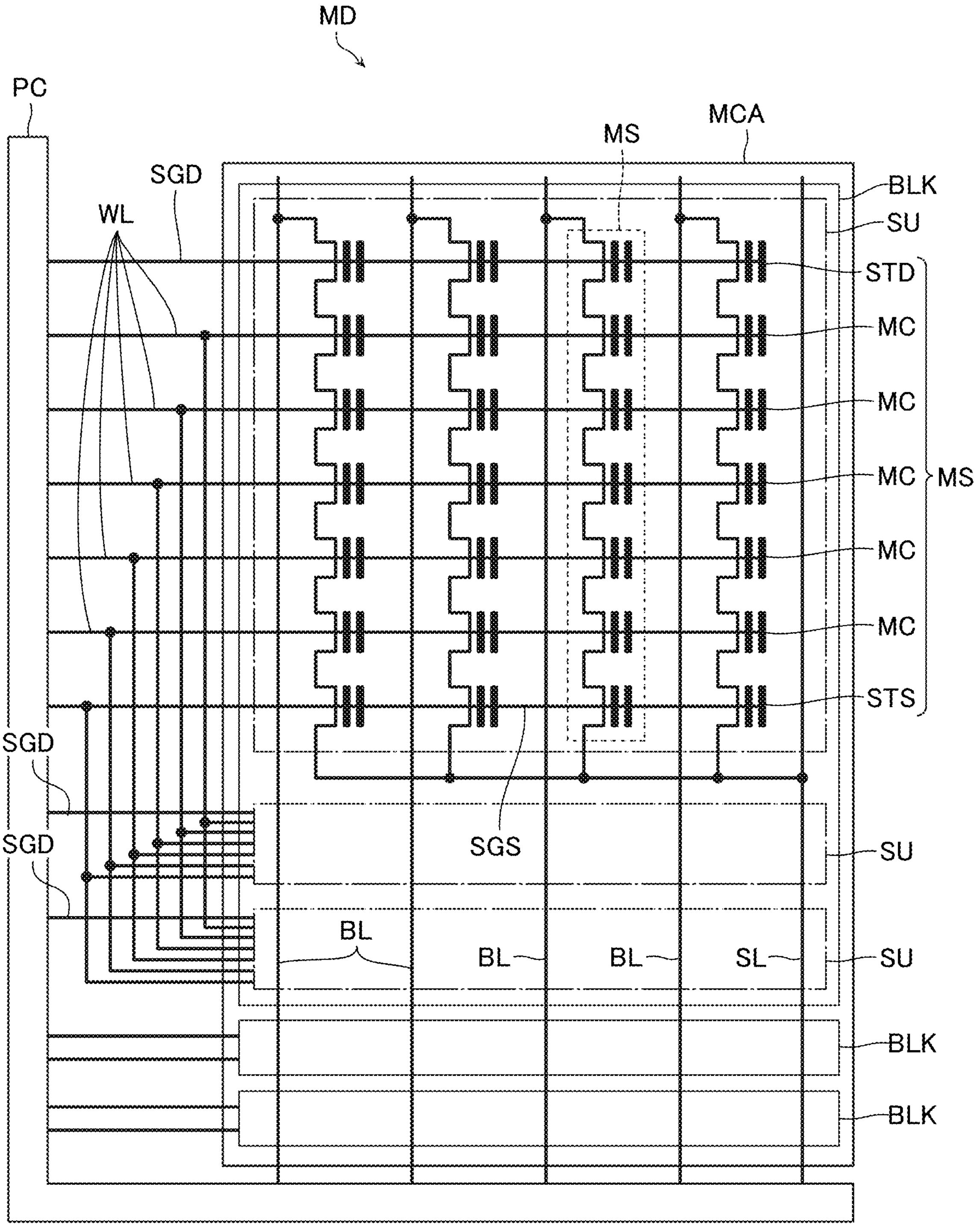
FIG. 2 is a schematic circuit diagram illustrating a configuration of a part of the memory die MD.
Figure 3:
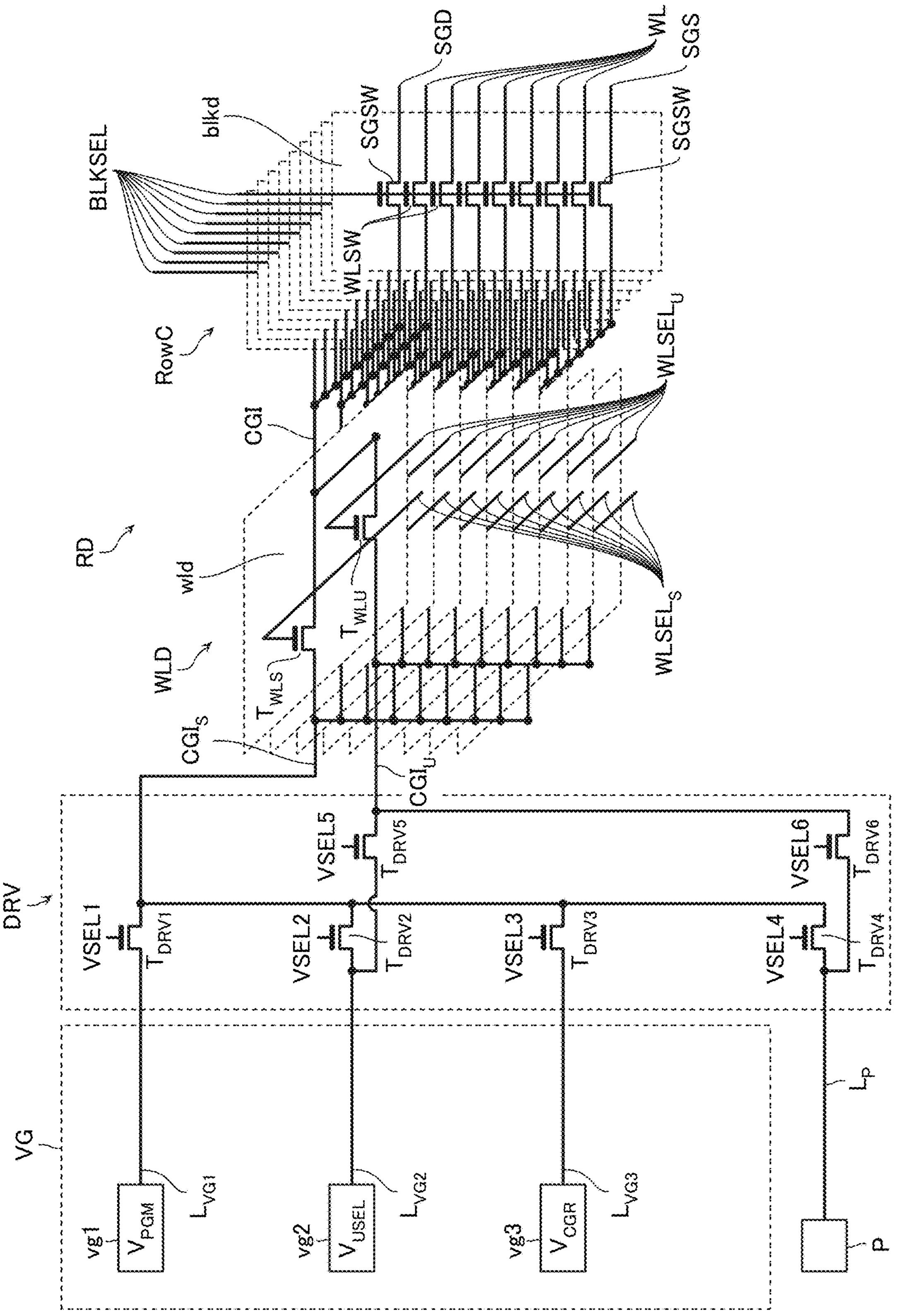
FIG. 3 is a schematic circuit diagram illustrating configurations of a voltage generation circuit VG, a driver circuit DRV, and a row decoder RD.
Figure 4:
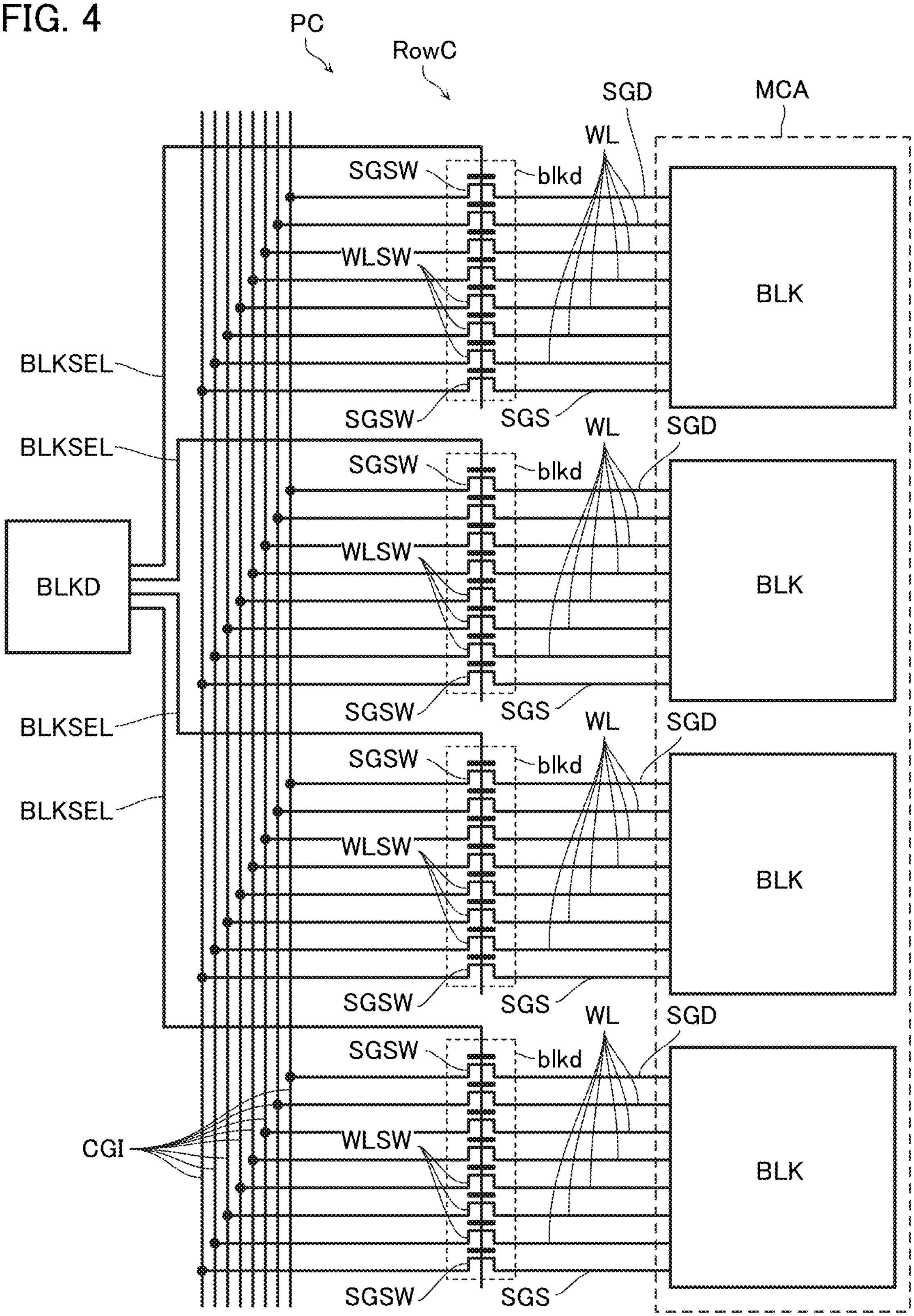
FIG. 4 is a schematic circuit diagram illustrating a configuration of a part of a peripheral circuit PC.

FIG. 1 is a schematic block diagram illustrating a configuration of the memory die MD according to the first embodiment. FIG. 2 is a schematic circuit diagram illustrating a configuration of a part of the memory die MD. FIG. 3 is a schematic circuit diagram illustrating configurations of a voltage generation circuit VG, a driver circuit DRV, and a row decoder RD. FIG. 4 is a schematic block diagram illustrating configurations of a row control circuit RowC and a block decoder BLKD.

Note that FIG. 1 illustrates, for example, a plurality of control terminals. These plurality of control terminals are expressed as control terminals corresponding to high active signals (positive logic signals) in some cases. The plurality of control terminals are expressed as control terminals corresponding to low active signals (negative logic signals) in some cases. The plurality of control terminals are expressed as control terminals corresponding to both of the high active signals and the low active signals in some cases. In FIG. 1, reference numerals of the control terminals corresponding to the low active signals include overlines (overbars). In this specification, a reference numeral of the control terminal corresponding to the low active signal includes a slash ("/"). Note that the description in FIG. 1 is an example, and the specific aspect is appropriately adjustable. For example, a part of or all of the high active signals can be changed to the low active signals, or a part of or all of the low active signals can be changed to the high active signals.

As illustrated in FIG. 1, the memory die MD includes a memory cell array MCA and a peripheral circuit PC. The peripheral circuit PC includes the voltage generation circuit VG, the row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

As illustrated in FIG. 2, the memory cell array MCA includes the plurality of memory blocks BLK described above. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory transistors), and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS may be simply referred to as select transistors (STD, STS).

The memory cell MC is a field-effect type transistor. The memory cell MC includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC stores the data of one bit or a plurality of bits. Respective word lines WL are connected to the gate electrodes of the plurality of memory cells MC corresponding to one memory string MS. Each of these word lines WL is connected to all of the memory strings MS in one memory block BLK in common.

The select transistors (STD, STS) are field-effect type transistors. The select transistors (STD, STS) each include a semiconductor layer, a gate insulating film, and a gate electrode. The semiconductor layer functions as a channel region. The gate insulating film may include an electric charge accumulating layer. The select gate lines (SGD, SGS) are connected to the respective gate electrodes of the select transistors (STD, STS). One drain-side select gate line SGD is connected to all of the memory strings MS in one string unit SU in common. One source-side select gate line SGS is connected to all of the memory strings MS in one memory block BLK in common. The respective drain-side select gate line SGD and source-side select gate line SGS may be referred to as select gate lines SG.

[Circuit Configuration of Voltage Generation Circuit VG]

For example, as illustrated in FIG. 3, the voltage generation circuit VG (FIG. 1) includes a plurality of voltage generation units vg1 to vg3. The voltage generation units vg1 to vg3 generate voltages of predetermined magnitudes and output them via voltage supply lines $L_{VG}$ in a read operation, a write operation, and an erase operation. For example, the voltage generation unit vg1 outputs a program voltage in the write operation. The voltage generation unit vg2 outputs a read pass voltage in the read operation. The voltage generation unit vg2 outputs a write pass voltage in the write operation. The voltage generation unit vg3 outputs a read voltage in the read operation. The voltage generation unit vg3 outputs a verify voltage in the write operation. For example, the voltage generation units vg1 to vg3 may be a step-up circuit, such as a charge pump circuit, or may be a step-down circuit, such as a regulator. These step-down circuit and step-up circuit are each connected to a voltage supply line $L_P$. The voltage supply line $L_P$ is applied with a power supply voltage $V_{CC}$ or a ground voltage $V_{SS}$ (FIG. 1). These voltage supply lines $L_P$ are, for example, connected to pad electrodes P. The operating voltage output from the voltage generation circuit VG is appropriately adjusted in accordance with a control signal from the sequencer SQC.

The voltage generation circuit VG (FIG. 1) described with reference to FIG. 3 has a configuration that generates the program voltage, the read pass voltage, the write pass voltage, the read voltage, and the verify voltage applied to the word lines WL via a wiring CGI. However, not only the operating voltages applied to the word lines WL, the voltage generation circuit VG can generate a plurality of patterns of operating voltages applied to the bit line BL, the source line SL, and the select gate lines (SGD, SGS) at the read operation, the write operation, and the erase operation on the memory cell array MCA and output them to a plurality of voltage supply lines. These operating voltages are appropriately adjusted in accordance with the control signal from the sequencer SQC.

[Circuit Configuration of Row Decoder RD]

For example, as illustrated in FIG. 3, the row decoder RD includes a row control circuit RowC, a word line decoder WLD, the driver circuit DRV, and an address decoder (not illustrated). For example, as illustrated in FIG. 4, the row control circuit RowC includes a plurality of block decoder units blkd and the block decoder BLKD.

The plurality of block decoder units blkd correspond to the plurality of memory blocks BLK in the memory cell array MCA. The block decoder unit blkd includes the plurality of word line switches WLSW and a plurality of select gate line switches SGSW. The plurality of word line switches WLSW correspond to the plurality of word lines WL in the memory block BLK. The plurality of select gate line switches SGSW correspond to the drain-side select gate line SGD and the source-side select gate line SGS in the memory block BLK.

The word line switch WLSW and the select gate line switch SGSW are, for example, field-effect type NMOS transistors. The word line switch WLSW has a drain electrode connected to the word line WL. The select gate line switches SGSW have drain electrodes connected to the drain-side select gate line SGD and the source-side select gate line SGS. The word line switch WLSW and the select gate line switch SGSW have source electrodes connected to the wirings CGI. The wiring CGI is connected to all of the block decoder units blkd in the row control circuit RowC. The word line switches WLSW and the select gate line switches SGSW have gate electrodes connected to a signal supply line BLKSEL. A plurality of the signal supply lines BLKSEL are disposed corresponding to all of the block decoder units blkd. Additionally, the signal supply line BLKSEL is connected to all of the word line switches WLSW and the select gate line switches SGSW in the block decoder unit blkd.

The block decoder BLKD decodes the block address at, for example, the read operation and the write operation. In the read operation, the write operation, or the like, for example, one signal line BLKSEL corresponding to the block address in the address register ADR (FIG. 1) enters an "H" state and the other signal lines BLKSEL enter an "L" state. For example, a predetermined driving voltage having a positive magnitude is applied to one signal line BLKSEL and ground voltages $V_{SS}$ and the like are applied to the other signal lines BLKSEL. Accordingly, all of the word lines WL and the select gate line SG in one memory block BLK corresponding to this block address are electrically conductive to all of the wirings CGI. Additionally, all of the word lines WL and the select gate lines SG in the other memory blocks BLK enter a floating state.

The word line decoder WLD includes a plurality of word line decode units wld. The plurality of word line decode units wld correspond to the plurality of memory cells MC in the memory string MS. In the example of FIG. 3, the word line decode unit wld includes two transistors $T_{WLS}$, $T_{WLU}$. The transistors $T_{WLS}$, $T_{WL}$u are, for example, field-effect type NMOS transistors. The transistors $T_{WLS}$, $T_{WL}$u have drain electrodes connected to the wiring CGI. The transistor $T_{WL}$s has a source electrode connected to a wiring CGIs. The transistor $T_{WL}$u has a source electrode connected to a wiring $CGI_U$. The transistor $T_{WL}$s has a gate electrode connected to a signal line $WLSEL_S$. The transistor $T_{WLU}$ has a gate electrode connected to a signal line $WLSEL_U$. The plurality of signal lines $WLSEL_S$ are disposed corresponding to one transistors $T_{WLS}$ included in all of the word line decode units wld. The plurality of signal lines $WLSEL_U$ are disposed corresponding to the other transistors $T_{WLU}$ included in all of the word line decode units wld.

In the read operation, the write operation, and the like, for example, the signal line $WLSEL_S$ corresponding to one word line decode unit wld corresponding to a page address in the address register ADR (FIG. 1) enters the "H" state and the signal line $WLSEL_U$ corresponding to the one word line decode unit wld enters the "L" state. Further, the signal lines $WLSEL_S$ corresponding to the other word line decode units wld enter the "L" state and the signal lines $WLSEL_U$ corresponding to the other word line decode units wld enter the "H" state. A voltage corresponding to the selected word line WL is applied to the wiring CGIs. Voltages corresponding to the unselected word lines WL are applied to the wirings $CGI_U$. Thus, the voltage corresponding to the selected word line WL is applied to the one word line WL corresponding to the page address. Additionally, the voltages corresponding to the unselected word lines WL are applied to the other word lines WL.

The driver circuit DRV, for example, includes six transistors $T_{DRV1}$ to $T_{DRV6}$. The transistors $T_{DRV1}$ to $T_{DRV6}$ are, for example, field-effect type NMOS transistors. The transistor $T_{DRV1}$ to $T_{DRV4}$ have drain electrodes connected to the wiring CGIs. The transistors $T_{DRV5}$, $T_{DRV6}$ have drain electrodes connected to the wiring $CGI_U$. The transistor $T_{DRV1}$ has a source electrode connected to an output terminal of the voltage generation unit vg1 via a voltage supply line $L_{VG1}$. The transistors $T_{DRV2}$, $T_{DRV5}$ have source electrodes connected to an output terminal of the voltage generation unit vg2 via the voltage supply line $L_{VG2}$. The transistor $T_{DRV3}$ has a source electrode connected to an output terminal of the voltage generation unit vg3 via the voltage supply line $L_{VG3}$. The transistors $T_{DRV4}$, $T_{DRV6}$ have source electrodes connected to the pad electrode P via the voltage supply line $L_P$. The transistors $T_{DRV1}$ to $T_{DRV}$ have gate electrodes to which signal lines VSEL1 to VSEL6 are connected, respectively.

In the read operation, the write operation, and the like, for example, one of the plurality of signal lines VSEL1 to VSEL4 corresponding to the wiring CGIs enters the "H" state and the others enter the "L" state. Additionally, one of the two signal lines VSEL5, VSEL6 corresponding to the wiring $CGI_U$ enters the "H" state and the other enters the "L" state.

The address decoder (not illustrated), for example, sequentially refers to a row address RA of the address register ADR (FIG. 1) in accordance with the control signal from the sequencer SQC (FIG. 1). The row address RA includes the above-described block address and page address. The address decoder controls the voltages of the signal lines BLKSEL, $WLSEL_S$, $WLSEL_U$ to the "H" state or the "L" state.

In the example of FIG. 3, in the row decoder RD, one block decoder unit blkd is disposed for one memory block BLK. However, this configuration is appropriately changeable. For example, one block decoder unit blkd may be disposed for two or more of the memory blocks BLK.

[Circuit Configuration of Sense Amplifier Module SAM]

The sense amplifier module SAM (FIG. 1) detects the ON state/OFF state of the memory cell MC and acquires data indicative of the state of this memory cell MC. This operation is referred to as a sense operation in some cases. The sense amplifier module SAM includes a plurality of sense amplifier units. The plurality of sense amplifier units correspond to the plurality of bit lines BL. Each of the plurality of sense amplifier units includes a sense amplifier circuit and a latch circuit.

[Circuit Configuration of Cache Memory CM]

The cache memory CM (FIG. 1) includes a plurality of latch circuits. The plurality of latch circuits are connected to the latch circuits in the sense amplifier modules SAM via a wiring DBUS. Data DAT included in these plurality of latch circuits are sequentially transferred to the sense amplifier module SAM or the input/output control circuit I/O.

A decode circuit and a switch circuit (not illustrated) are connected to the cache memory CM. The decode circuit decodes a column address CA latched in the address register ADR. The switch circuit causes the latch circuit corresponding to the column address CA to electrically conduct with a bus (FIG. 1) according to an output signal from a decode circuit.

[Circuit Configuration of Sequencer SQC]

The sequencer SQC (FIG. 1) outputs an internal control signal to the row decoder RD, the sense amplifier module SAM, and the voltage generation circuit VG in accordance with command data $D_{CMD}$ latched in the command register CMR. The sequencer SQC outputs status data $D_{ST}$ indicating its own state to the status register STR as necessary.

The sequencer SQC generates a ready/busy signal and outputs it to a terminal RY//BY. In a period while the terminal RY//BY is in an "L" state (busy period), access to the memory die MD is basically inhibited. In a period while the terminal RY//BY is in an "H" state (ready period), access to the memory die MD is permitted.

[Circuit Configuration of Input/Output Control Circuit I/O]

The input/output control circuit I/O includes data signal input/output terminals DQ0 to DQ7, toggle signal input/output terminals DQS, /DQS, a plurality of input circuits, a plurality of output circuits, a shift register, and a buffer circuit. The plurality of input circuits, the plurality of output circuits, the shift register, and the buffer circuit are each connected to a terminal to which a power supply voltage $V_{CCQ}$ or the ground voltage $V_{SS}$ is applied.

The data input via the data signal input/output terminals DQ0 to DQ7 are output from the buffer circuit to the cache memory CM, the address register ADR, or the command register CMR according to the internal control signal from the logic circuit CTR. The data output via the data signal input/output terminals DQ0 to DQ7 are input to the buffer circuit from the cache memory CM or the status register STR according to the internal control signal from the logic circuit CTR.

The plurality of input circuits include, for example, comparators connected to any of the data signal input/output terminals DQ0 to DQ7 or both of the toggle signal input/output terminals DQS, /DQS. The plurality of output circuits include, for example, Off Chip Driver (OCD) circuits connected to any of the data signal input/output terminals DQ0 to DQ7 or any of the toggle signal input/output terminals DQS, /DQS.

[Circuit Configuration of Logic Circuit CTR]

The logic circuit CTR (FIG. 1) receives an external control signal from the controller die CD via external control terminals/CEn, CLE, ALE, /WE, RE, or/RE and outputs the internal control signal to the input/output control circuit I/O according to the external control signal.

[Structure of Memory Die MD]

Figure 5:
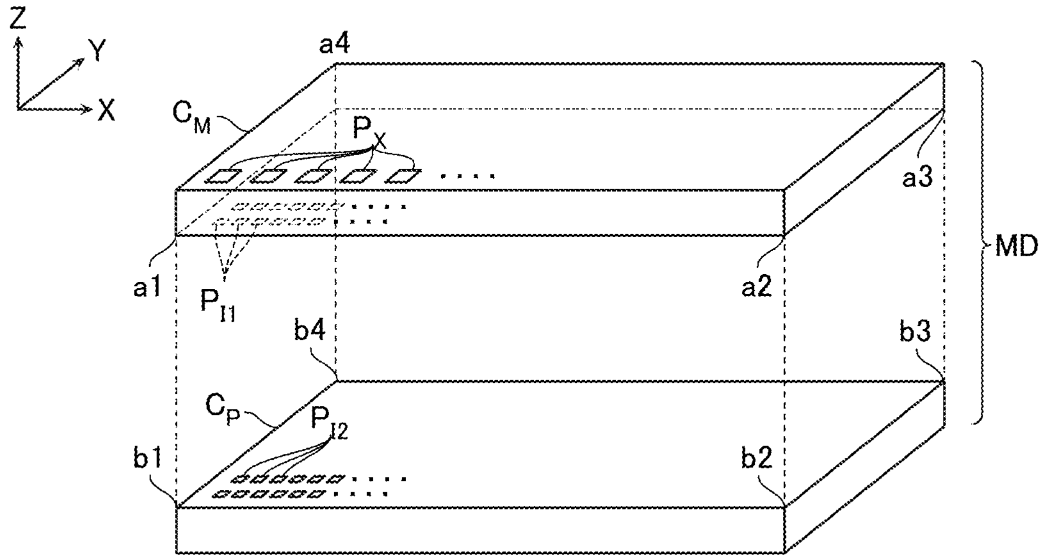
FIG. 5 is a schematic exploded perspective view illustrating an exemplary configuration of a semiconductor memory device according to a first embodiment.

FIG. 5 is a schematic exploded perspective view illustrating an exemplary configuration of the semiconductor memory device according to the first embodiment. As illustrated in FIG. 5, the memory die MD includes a chip $C_M$ on the memory cell array MCA side and a chip $C_P$ on the peripheral circuit PC side.

On the upper surface of the chip $C_M$, a plurality of external pad electrodes $P_X$ connectable to bonding wires (not illustrated) are disposed. Additionally, a plurality of bonding electrodes $P_{I1}$ are disposed on the lower surface of the chip $C_M$. A plurality of bonding electrodes $P_{I2}$ are disposed on the upper surface of the chip $C_P$. Hereinafter, regarding the chip $C_M$, a surface on which the plurality of bonding electrodes $P_{I1}$ are disposed is referred to as a front surface and a surface on which the plurality of external pad electrodes $P_X$ are disposed is referred to as a back surface. Additionally, regarding the chip $C_P$, a surface on which the plurality of bonding electrodes $P_{I2}$ are disposed is referred to as a front surface and a surface on the side opposite to the front surface is referred to as a back surface. In the example illustrated in the drawing, the surface of the chip $C_P$ is disposed above the back surface of the chip $C_P$ and the back surface of the chip $C_M$ is disposed above the front surface of the chip $C_M$.

In the chip $C_M$ and the chip $C_P$, the front surface of the chip $C_M$ is disposed to be opposed to the front surface of the chip $C_P$. The respective plurality of bonding electrodes $P_{I1}$ are disposed corresponding to the plurality of bonding electrodes $P_{I2}$ and are disposed at positions where the plurality of bonding electrodes $P_{I1}$ can be bonded to the plurality of bonding electrodes $P_{I2}$. The bonding electrode $P_{I1}$ and the bonding electrode $P_{I2}$ function as bonding electrodes to bond the chip $C_M$ and the chip $C_P$ together to electrically conduct the chip $C_M$ and the chip $C_P$.

In the example of FIG. 5, corner portions a1, a2, a3, a4 of the chip $C_M$ correspond to corner portions b1, b2, b3, b4 of the chip $C_P$, respectively.

Figure 6:
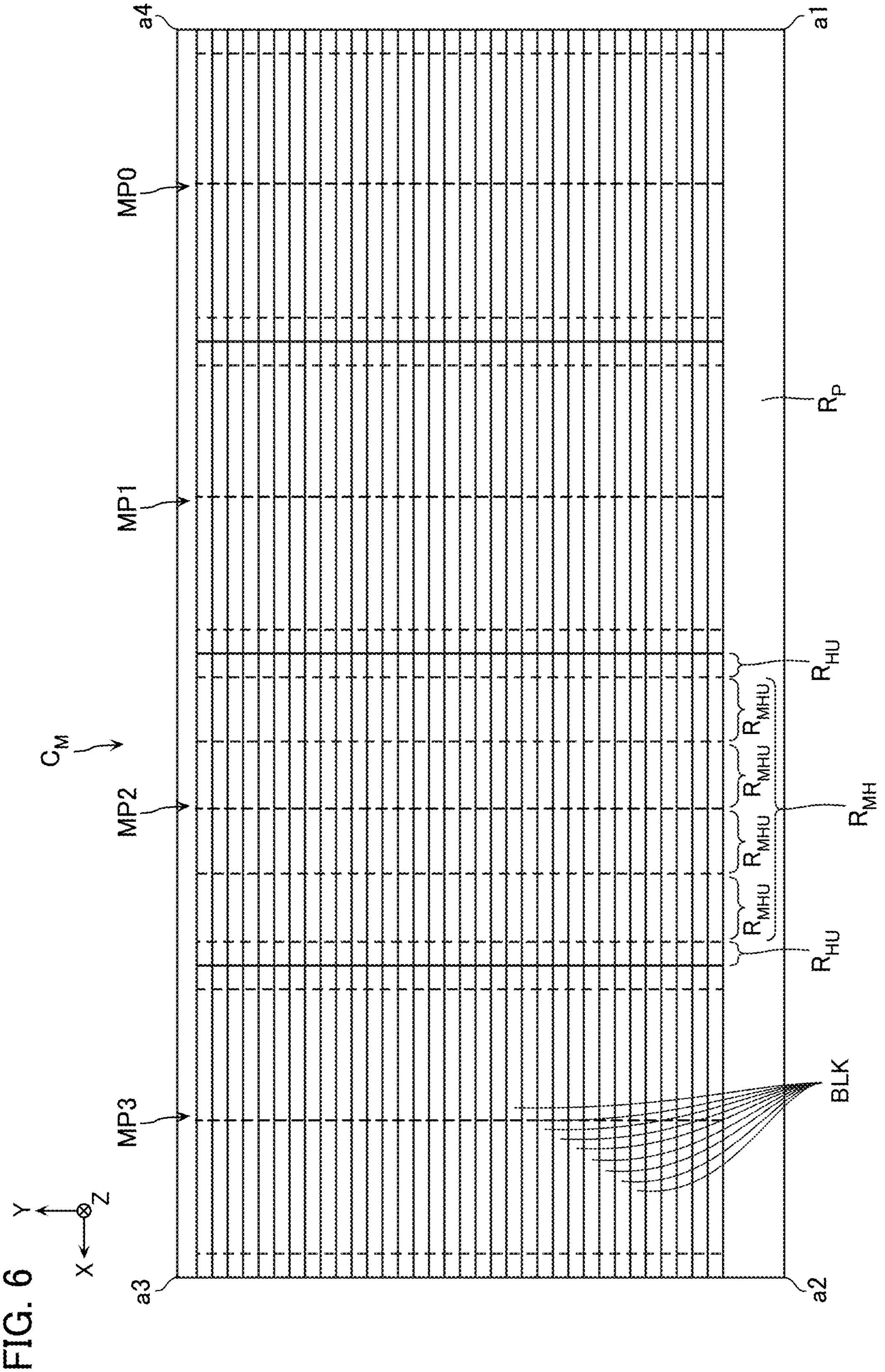
FIG. 6 is a schematic bottom view illustrating an exemplary configuration of a chip $C_M$.
Figure 7:
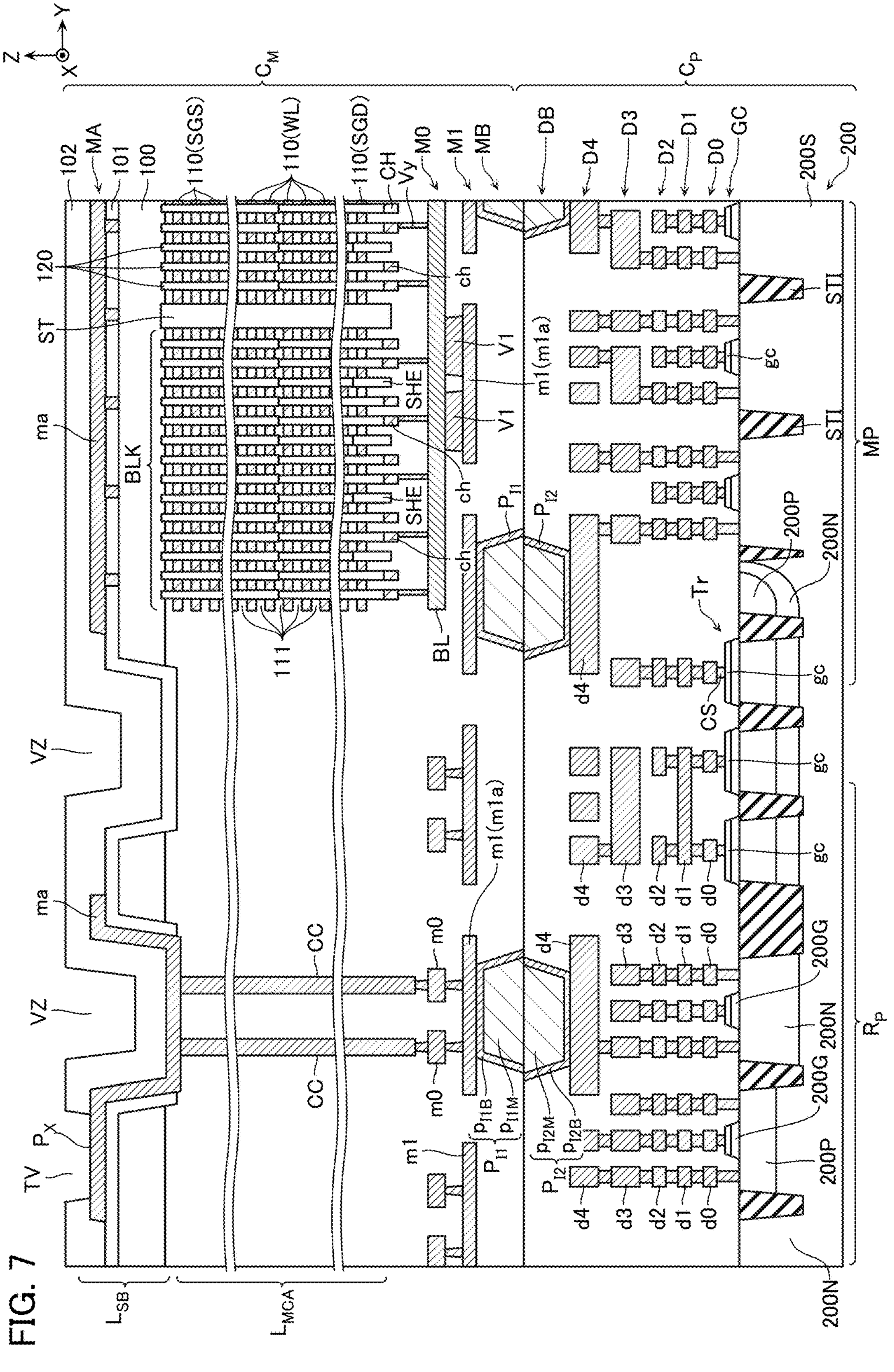
FIG. 7 is a schematic cross-sectional view illustrating a configuration of a part of the memory die MD.
Figure 8:
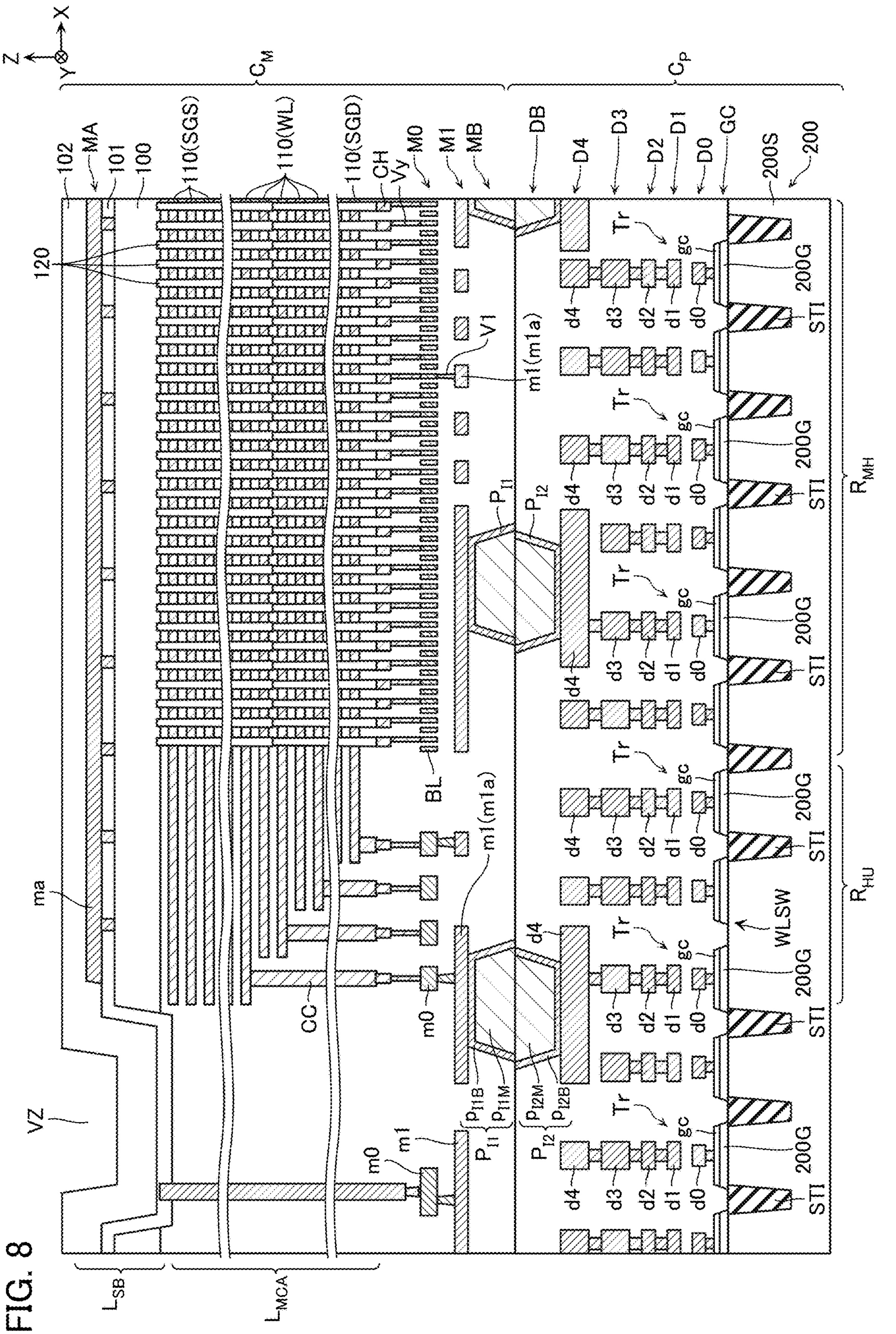
FIG. 8 is a schematic cross-sectional view illustrating a configuration of a part of the memory die MD.
Figure 9:
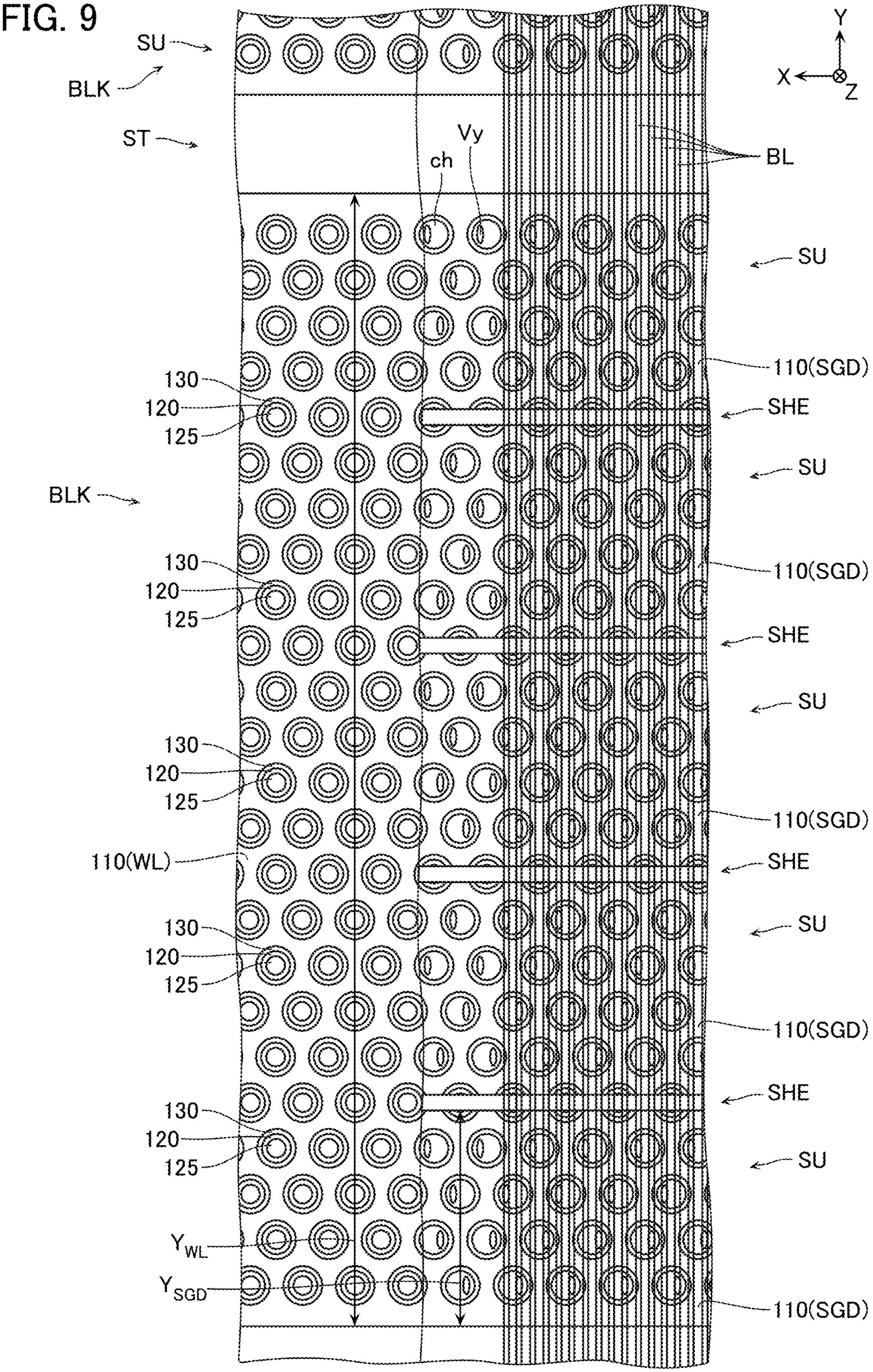
FIG. 9 is a schematic bottom view illustrating a configuration of a part of the chip $C_M$.
Figure 10:
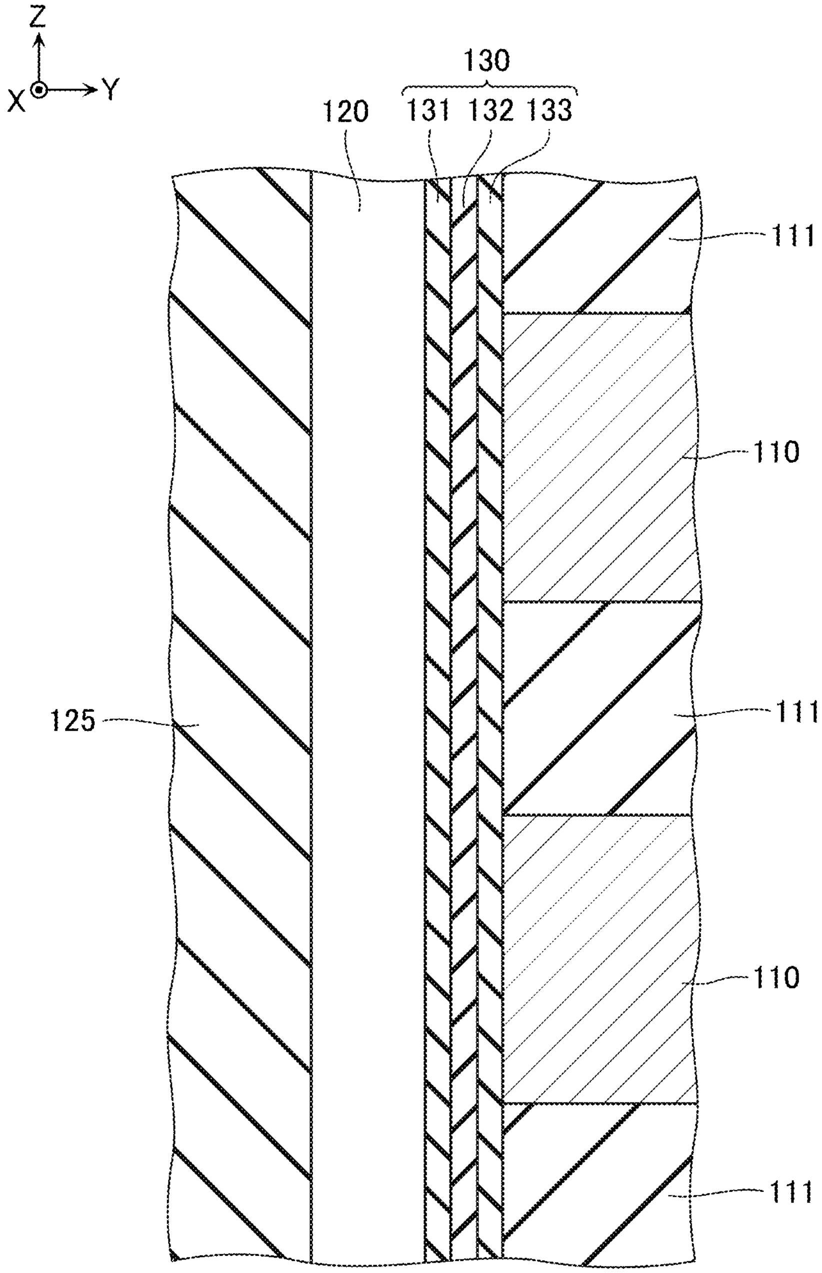
FIG. 10 is a schematic cross-sectional view illustrating a configuration of a part of the chip $C_M$.
Figure 11:
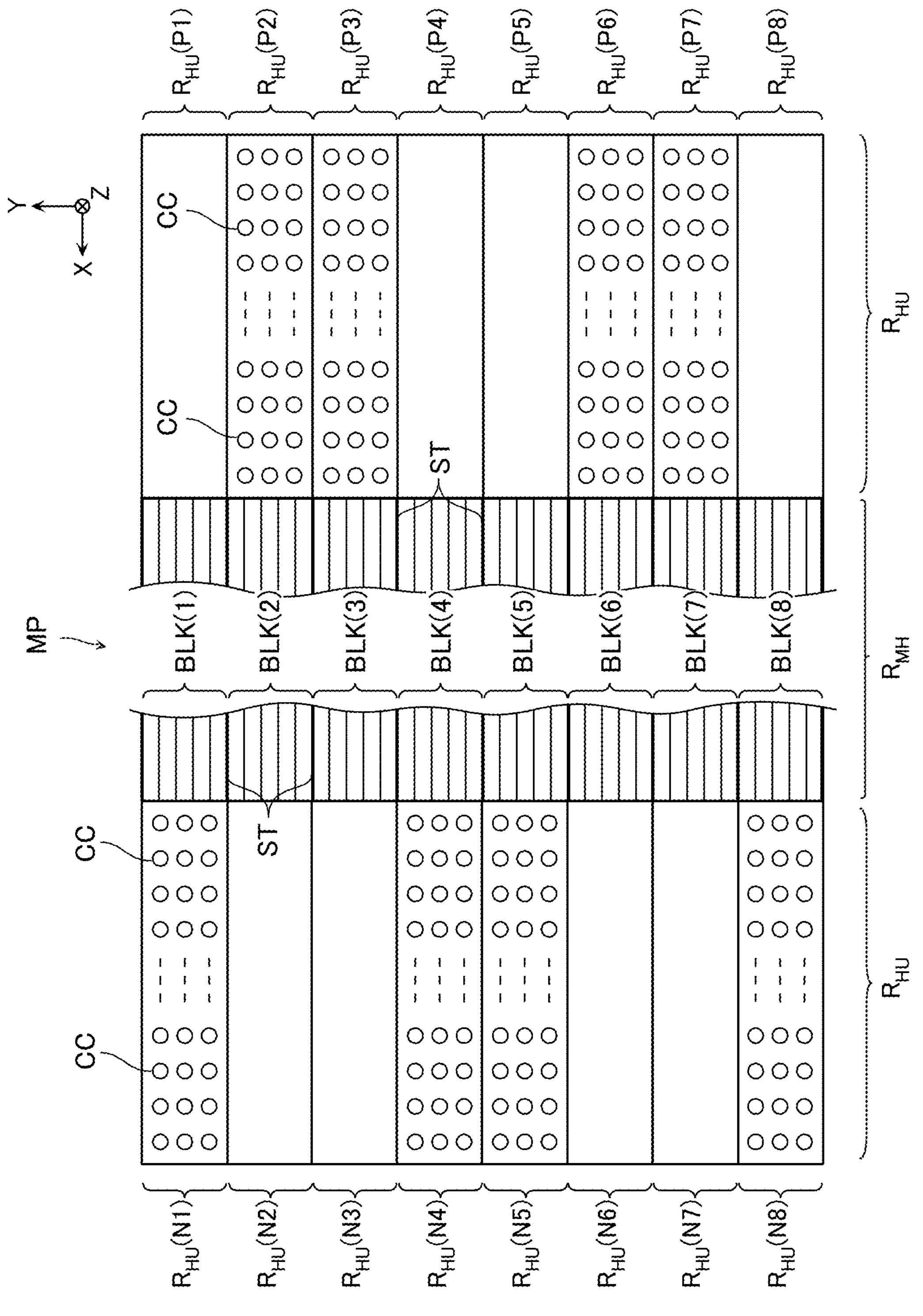
FIG. 11 is a schematic plan view illustrating an exemplary configuration of hook-up regions $R_{HU}$.
Figure 12:
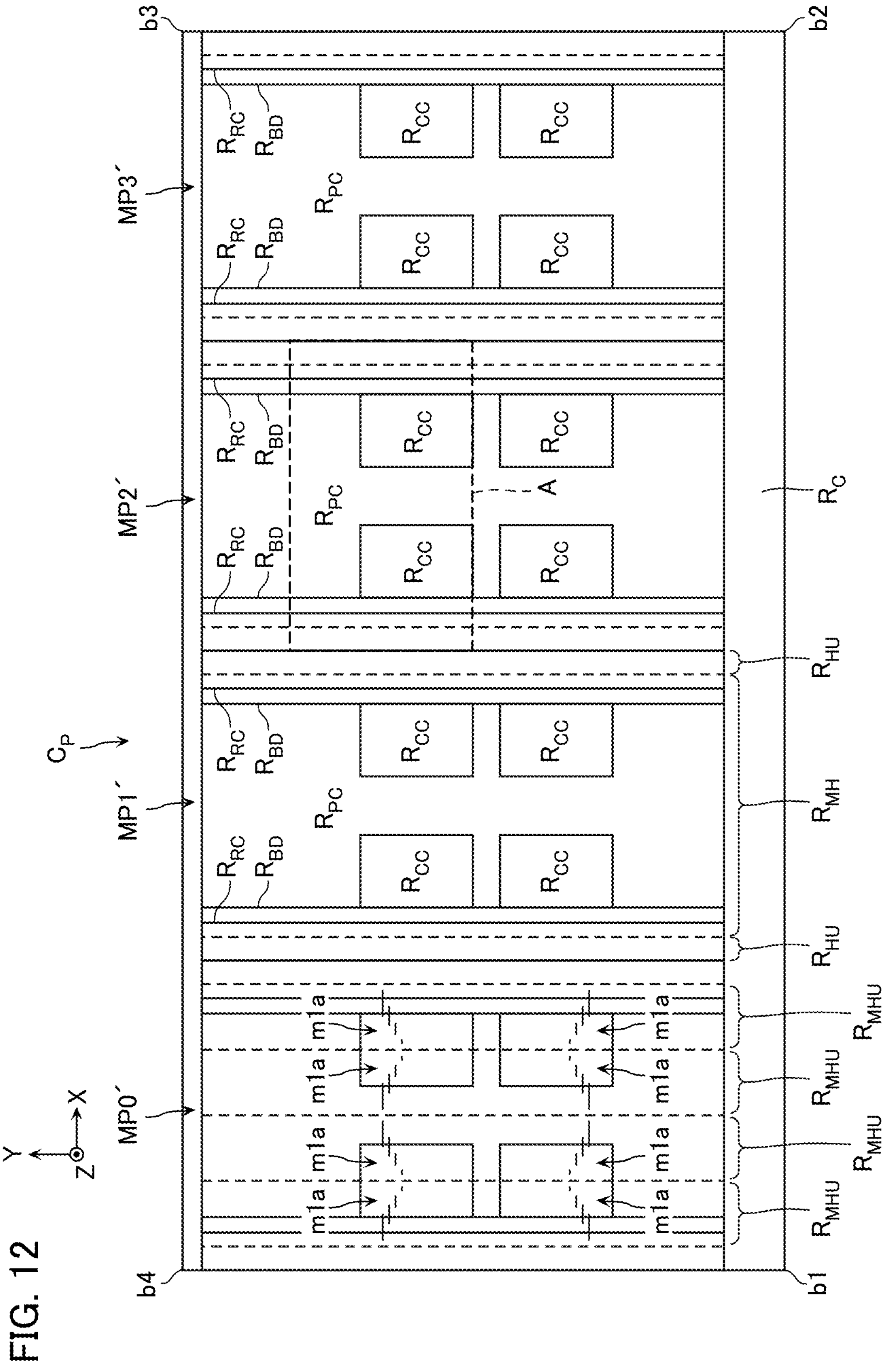
FIG. 12 is a schematic plan view illustrating an exemplary configuration of a chip $C_P$.
Figure 13:
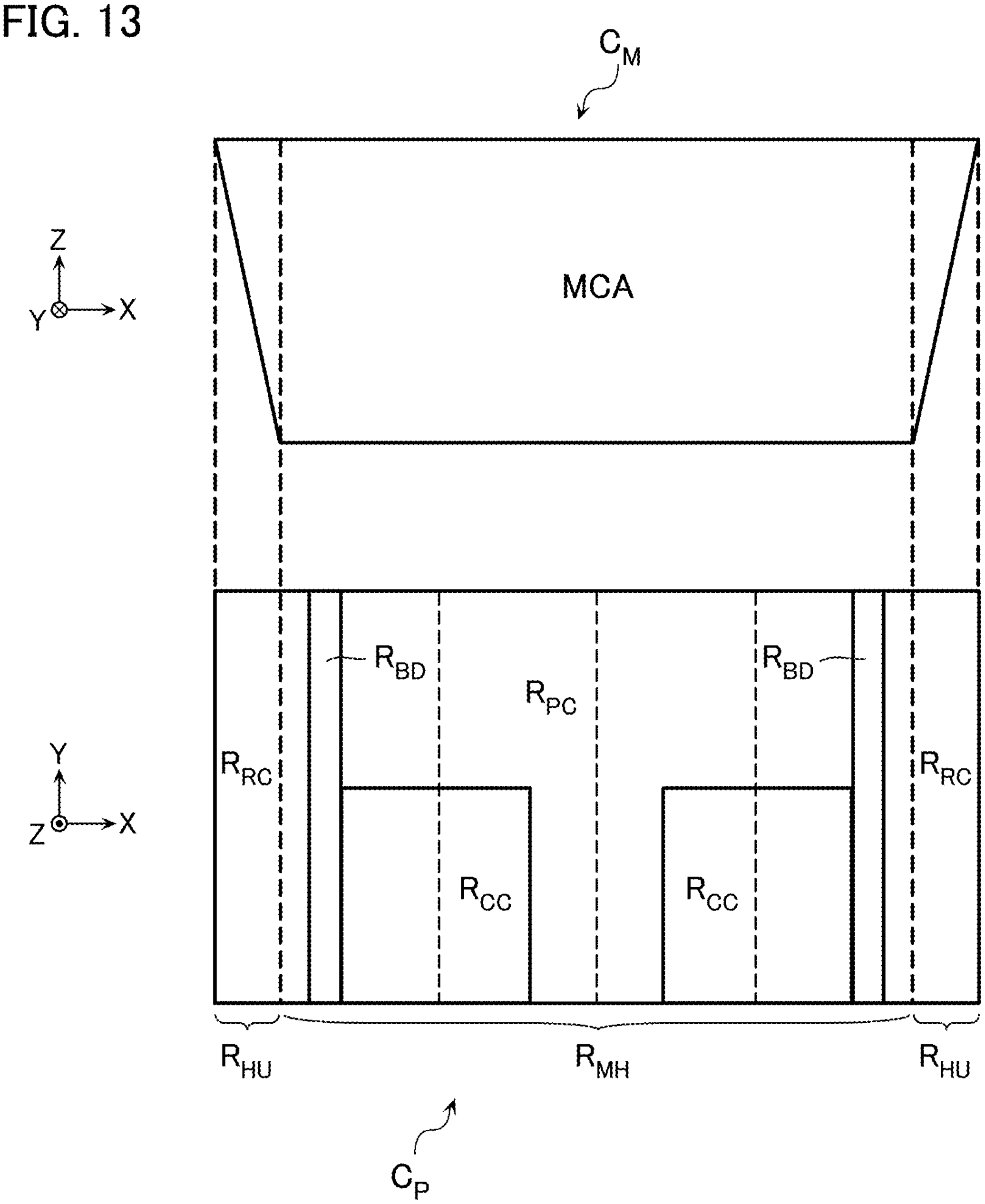
FIG. 13 is a schematic enlarged view of a part indicated by A in FIG. 12.

FIG. 6 is a schematic bottom view illustrating an exemplary configuration of the chip $C_M$. FIG. 6 omits a part of a configuration, such as the bonding electrodes $P_{I1}$. FIG. 7 and FIG. 8 are schematic cross-sectional views illustrating a configuration of a part of the memory die MD. FIG. 9 is a schematic bottom view illustrating a configuration of a part of the chip $C_M$. FIG. 9 illustrates the X-Y cross-sectional surface of the position of the word line WL in the left side region and illustrates the X-Y cross-sectional surface of the position of the drain-side select gate line SGD in the right side region. In the right side region of FIG. 9, to represent connection parts of semiconductor layers 120 and the bit lines BL, via-contact electrodes ch, Vy and the bit lines BL are also illustrated. In the left side region of FIG. 9 as well, the via-contact electrodes ch, Vy and the bit lines BL are disposed. FIG. 10 is a schematic cross-sectional view illustrating a configuration of a part of the chip $C_M$. While FIG. 10 illustrates the Y—Z cross-sectional surface, the structure similar to FIG. 10 is observed when a cross-sectional surface other than the Y—Z cross-sectional surface (for example, the X—Z cross-sectional surface) along the central axis of the semiconductor layer 120 is observed. FIG. 11 is a schematic plan view illustrating an exemplary configuration of hook-up regions $R_{HU}$. FIG. 12 is a schematic plan view illustrating an exemplary configuration of the chip $C_P$. FIG. 12 omits a part of a configuration, such as the bonding electrodes $P_{I2}$. FIG. 13 is a schematic enlarged view of a part indicated by A in FIG. 12. FIG. 13 also illustrates the configuration of the chip $C_M$ (the part of the X—Z cross-sectional surface) corresponding to the configuration of the chip $C_P$ (a part of the X-Y plane indicated by A in FIG. 12).

[Structure of Chip $C_M$]

In the example of FIG. 6, the chip $C_M$ includes four memory planes MP0 to MP3 arranged in the X-direction. Note that each of the four memory planes MP0 to MP3 is simply referred to as a memory plane MP in some cases. Each of these four memory planes MP0 to MP3 includes the plurality of memory blocks BLK arranged in the Y-direction. In the example of FIG. 6, each of these four memory planes MP0 to MP3 includes the hook-up regions $R_{HU}$ disposed at both end portions in the X-direction and a memory hole region $R_{MH}$ (memory region) disposed between the hook-up regions $R_{HU}$. Further, in the example of FIG. 6, the memory hole region $R_{MH}$ is divided into four regions $R_{MHU}$ in the X-direction. All of the widths in the X-direction of these four regions $R_{MHU}$ may be the same or need not be the same. The chip $C_M$ includes a peripheral region $R_P$ disposed on one end side in the Y-direction with respect to the four memory planes MP0 to MP3.

Note that in the example illustrated in the drawing, the hook-up regions $R_{HU}$ are disposed at both end portions in the X-direction of the memory plane MP. However, the configuration is merely an example, and a specific configuration is appropriately adjustable. For example, the hook-up region $R_{HU}$ may be disposed at one end portion in the X-direction, not both end portions in the X-direction of the memory plane MP. Alternatively, the hook-up region $R_{HU}$ may be disposed at the center position or a position near the center in the X-direction of the memory plane MP.

For example, as illustrated in FIG. 7, the chip $C_M$ includes a substrate layer $L_{SB}$, a memory cell array layer $L_{MCA}$ disposed below the substrate layer $L_{SB}$, a via-contact electrode layer CH disposed below the memory cell array layer $L_{MCA}$, a plurality of wiring layers M0, M1 disposed below the via-contact electrode layer CH, and a chip bonding electrode layer MB disposed below the wiring layers M0, M1.

[Structure of Substrate Layer $L_{SB}$ in Chip $C_M$]

For example, as illustrated in FIG. 7, the substrate layer $L_{SB}$ includes a conductive layer 100 disposed on the upper surface of the memory cell array layer $L_{MCA}$, an insulating layer 101 disposed on the upper surface of the conductive layer 100, a back side wiring layer MA disposed on the upper surface of the insulating layer 101, and an insulating layer 102 disposed on the upper surface of the back side wiring layer MA.

The conductive layer 100, for example, may contain a semiconductor layer, such as silicon (Si), into which N-type impurities, such as phosphorus (P), or P-type impurities, such as boron (B), are implanted, may contain a metal, such as tungsten (W), or may contain silicide, such as tungsten silicide (WSi).

The conductive layer 100 functions as a part of the source line SL (FIG. 1). The four conductive layers 100 are disposed corresponding to the four memory plane regions MP0 to MP3 (FIG. 6). The memory plane MP have end portions in the X-direction and Y-direction where regions VZ that do not include the conductive layer 100 are disposed.

The insulating layer 101 contains, for example, silicon oxide ($SiO_2$).

The back side wiring layer MA includes a plurality of wirings ma. These plurality of wirings ma may contain, for example, aluminum (Al).

A part of the plurality of wirings ma functions as a part of the source line SL (FIG. 2). The four wirings ma are disposed corresponding to the four memory planes MP0 to MP3 (FIG. 6). Each of these wirings ma is electrically connected to the conductive layer 100.

Parts of the plurality of wirings ma function as the external pad electrodes $P_X$. These wirings ma are disposed in the peripheral region $R_P$. These wirings ma are connected to via-contact electrodes CC in the memory cell array layer $L_{MCA}$ in the regions VZ not including the conductive layer 100. A part of the wirings ma is exposed to the outside of the memory die MD via an opening TV provided in the insulating layer 102.

The insulating layer 102 is, for example, a passivation layer made of an insulating material, such as polyimide.

[Structure of Chip $C_M$ in Memory Hole Region $R_{MH}$ of Memory Cell Array Layer $L_{MCA}$]

As described with reference to FIG. 6, in the memory cell array layer $L_{MCA}$, the plurality of memory blocks BLK arranged in the Y-direction are disposed. As illustrated in FIG. 7, between the two memory blocks BLK adjacent in the Y-direction, an inter-block insulating layer ST, such as silicon oxide ($SiO_2$), is disposed. A plurality of stacked structures including the plurality of conductive layers 110 arranged in the Z-direction and arranged in the Y-direction correspond to the plurality of memory blocks BLK.

For example, as illustrated in FIG. 7, the memory block BLK includes a plurality of conductive layers 110 arranged in the Z-direction and the plurality of semiconductor layers 120 extending in the Z-direction. Additionally, as illustrated in FIG. 10, respective gate insulating films 130 are disposed between the plurality of conductive layers 110 and the plurality of semiconductor layers 120.

The conductive layer 110 has an approximately plate shape extending in the X-direction. The conductive layer 110 may include, for example, a stacked film of a barrier conductive film, such as titanium nitride (TiN), and a metal film, such as tungsten (W) and molybdenum (Mo). The conductive layer 110 may contain, for example, polycrystalline silicon containing impurities, such as phosphorus (P) or boron (B). Between the plurality of conductive layers 110 arranged in the Z-direction, an interlayer insulating layer 111 of silicon oxide ($SiO_2$) or the like is disposed.

Among the plurality of conductive layers 110, one or a plurality of conductive layers 110 positioned on the uppermost layer function as a gate electrode of the source-side select transistor STS (FIG. 2) and the source-side select gate line SGS (see FIG. 7). These plurality of conductive layers 110 are electrically independent in every memory block BLK.

Additionally, the plurality of conductive layers 110 positioned below this conductive layer 110 function as a gate electrode of the memory cell MC (FIG. 2) and the word line WL. Each of these plurality of conductive layers 110 is electrically independent in every memory block BLK.

One or a plurality of conductive layers 110 positioned below the conductive layers 110 function as a gate electrode of the drain-side select transistor STD and the drain-side select gate line SGD. For example, as illustrated in FIG. 9, a width $Y_{SGD}$ in the Y-direction of these plurality of conductive layers 110 is smaller than a width $Y_{WL}$ in the Y-direction of the conductive layers 110 that function as the word lines WL. Between two conductive layers 110 adjacent in the Y-direction, an inter-string unit insulating layer SHE, such as silicon oxide ($SiO_2$), is disposed.

For example, as illustrated in FIG. 9, the semiconductor layers 120 are arranged in a predetermined pattern in the X-direction and the Y-direction. The respective semiconductor layers 120 function as the channel regions of the plurality of memory cells MC and the select transistors (STD, STS) included in one memory string MS (FIG. 2). The semiconductor layer 120 contains, for example, polycrystalline silicon (Si). The semiconductor layer 120 has a substantially cylindrical shape and includes an insulating layer 125, such as silicon oxide, in the center portion. The outer peripheral surfaces of the semiconductor layers 120 are each surrounded by the plurality of conductive layers 110 and opposed to these plurality of conductive layers 110.

Additionally, on the upper end of the semiconductor layer 120, an impurity region (not illustrated) is disposed. This impurity region is connected to the conductive layer 100 (see FIG. 7). This impurity region, for example, contains N-type impurities, such as phosphorus (P), and P-type impurities, such as boron (B).

On the lower end of the semiconductor layer 120, an impurity region (not illustrated) is disposed. This impurity region is connected to the bit line BL via a via-contact electrode ch and a via-contact electrode Vy. The impurity region contains N-type impurities, such as phosphorus (P).

For example, as illustrated in FIG. 9, the gate insulating film 130 has an approximately cylindrical shape covering the outer peripheral surface of the semiconductor layer 120. For example, as illustrated in FIG. 10, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 contain, for example, silicon oxide ($SiO_2$) and silicon oxynitride (SiON). The electric charge accumulating film 132 includes, for example, a film of silicon nitride (SiN) or the like that can accumulate an electric charge. The tunnel insulating film 131, the electric charge accumulating film 132, and the block insulating film 133 have an approximately cylindrical shape, and extend in the Z-direction along the outer peripheral surface of the semiconductor layer 120 excluding a contact portion of the semiconductor layer 120 with the conductive layer 100.

Note that FIG. 10 illustrates an example of the gate insulating film 130 including the electric charge accumulating film 132, such as silicon nitride. However, the gate insulating film 130, for example, may include a floating gate, such as polycrystalline silicon, containing N-type or P-type impurities.

[Structure of Chip $C_M$ in Hook-Up Region $R_{HU}$ of Memory Cell Array Layer $L_{MCA}$]

As illustrated in FIG. 8, the hook-up region $R_{HU}$ includes the plurality of via-contact electrodes CC. Each of these plurality of via-contact electrodes CC extends in the Z-direction and has an upper end connected to the conductive layer 110 (WL, SGD, SGS).

As illustrated in FIG. 11, the hook-up regions $R_{HU}$ are disposed on the X-direction negative side and the X-direction positive side of the memory plane MP, and the memory hole region $R_{MH}$ is disposed between the two hook-up regions $R_{HU}$. In the memory hole region $R_{MH}$, the first to eighth memory blocks counted from the Y-direction positive side are assumed to be memory blocks BLK(1) to BLK(8). The hook-up region $R_{HU}$ on the X-direction negative side is divided into hook-up regions $R_{HU}$(N1) to $R_{HU}$(N8) corresponding to the memory blocks BLK(1) to BLK(8) The hook-up region $R_{HU}$ on the X-direction positive side is divided into hook-up regions $R_{HU}$(P1) to $R_{HU}$(P8) corresponding to the memory blocks BLK(1) to BLK(8).

In the hook-up regions $R_{HU}$(N1), $R_{HU}$(N4), $R_{HU}$(N5), $R_{HU}$(N8), $R_{HU}$(P2), $R_{HU}$(P3), $R_{HU}$(P6), $R_{HU}$(P7), a plurality of rows of the three via-contact electrodes CC arranged in the Y-direction are arranged in the X-direction.

The plurality of via-contact electrodes CC in the hook-up region $R_{HU}$(N1) are connected to the conductive layers 110 of the respective layers in the memory block BLK(1) The plurality of via-contact electrodes CC in the hook-up region $R_{HU}$(P2) are connected to the conductive layers 110 of the respective layers in the memory block BLK(2) The plurality of via-contact electrodes CC in the hook-up region $R_{HU}$(P3) are connected to the conductive layers 110 of the respective layers in the memory block BLK(3) The plurality of via-contact electrodes CC in the hook-up region $R_{HU}$(N4) are connected to the conductive layers 110 of the respective layers in the memory block BLK(4) The plurality of via-contact electrodes CC in the hook-up region $R_{HU}$(N5) are connected to the conductive layers 110 of the respective layers in the memory block BLK(5). The plurality of via-contact electrodes CC in the hook-up region $R_{HU}$(P6) are connected to the conductive layers 110 of the respective layers in the memory block BLK(6). The plurality of via-contact electrodes CC in the hook-up region $R_{HU}$(P7) are connected to the conductive layers 110 of the respective layers in the memory block BLK(7). The plurality of via-contact electrodes CC in the hook-up region $R_{HU}$(N8) are connected to the conductive layers 110 of the respective layers in the memory block BLK(8).

[Structure of Memory Cell Array Layer $L_{MCA}$ of Chip $C_M$ in Peripheral Region $R_P$]

For example, as illustrated in FIG. 7, the peripheral region $R_P$ includes the plurality of via-contact electrodes CC corresponding to the external pad electrode $P_X$. These plurality of via-contact electrodes CC have upper ends connected to the external pad electrode $P_X$.

[Structure of Via-Contact Electrode Layer CH]

The plurality of via-contact electrodes ch included in the via-contact electrode layer CH are, for example, electrically connected to at least one of the configuration in the memory cell array layer $L_{MCA}$ and the configuration in the chip $C_P$.

The via-contact electrode layer CH includes the plurality of via-contact electrodes ch as the plurality of wirings. These plurality of via-contact electrodes ch may include, for example, a stacked film of a barrier conductive film, such as titanium nitride (TiN), and a metal film, such as tungsten (W). The via-contact electrodes ch are disposed corresponding to the plurality of semiconductor layers 120 and connected to lower ends of the plurality of semiconductor layers 120.

[Structure of Wiring Layers M0, M1 in Chip $C_M$]

A plurality of wirings included in the wiring layers M0, M1 are, for example, electrically connected to at least one of the configuration in the memory cell array layer $L_{MCA}$ and the configuration in the chip $C_P$.

The wiring layer M0 includes a plurality of wirings m0. These plurality of wirings m0 may include, for example, a stacked film of a barrier conductive film, such as titanium nitride (TiN), tantalum nitride (TaN), and a stacked film of tantalum nitride (TaN) and tantalum (Ta); and a metal film, such as copper (Cu). Note that a part of the plurality of wirings m0 function as the bit lines BL. As illustrated in FIG. 9, the bit lines BL, for example, are arranged in the X-direction and extends in the Y-direction.

For example, as illustrated in FIG. 7, the wiring layer M1 includes the plurality of wirings m1. These plurality of wirings m1 may include, for example, a stacked film of a barrier conductive film, such as titanium nitride (TiN), and a metal film, such as tungsten (W). A wiring pattern in the wiring layer M1 will be described later.

[Structure of Chip Bonding Electrode Layer MB]

The plurality of wirings included in the chip bonding electrode layer MB are, for example, electrically connected to at least one of the configuration in the memory cell array layer $L_{MCA}$ and the configuration in the chip $C_P$.

The chip bonding electrode layer MB includes the plurality of bonding electrodes $P_{I1}$ (bonding pads). These plurality of bonding electrodes $P_{I1}$ may include, for example, a stacked film of a barrier conductive film $p_{I1B}$, such as titanium nitride (TiN), tantalum nitride (TaN), and a stacked film of tantalum nitride (TaN) and tantalum (Ta); and a metal film $p_{I1M}$, such as copper (Cu).

[Structure of Chip $C_P$]

For example, as illustrated in FIG. 12, the chip $C_P$ includes regions MP0' to MP3' arranged in the X-direction and overlapping with the four memory planes MP0 to MP3. Row control circuit regions $R_{RC}$ are disposed at both end portions in the X-direction of each of these four regions MP0' to MP3'. Additionally, two block decoder regions $R_{BD}$ arranged in the X-direction are disposed between these two row control circuits regions $R_{RC}$. Additionally, a peripheral circuit region $R_{PC}$ is disposed between these two block decoder regions $R_{BD}$. The peripheral circuit region $R_{PC}$ includes four column control circuit regions $R_{CC}$ arranged in the X-direction and the Y-direction. Although the illustration is omitted, a circuit is also disposed in another region of the peripheral circuit region $R_{PC}$. A circuit region $R_C$ is disposed in a region of the chip $C_P$ opposed to the peripheral region $R_P$ (FIG. 6) of the chip $C_M$.

The row control circuit region $R_{RC}$ includes the plurality of block decoder units blkd described with reference to FIG. 3 and FIG. 4. That is, the row control circuit region $R_{RC}$ includes the plurality of word line switches WLSW and the plurality of select gate line switches SGSW constituting the plurality of block decoder units blkd. The block decoder region $R_{BD}$ includes the block decoder BLKD described with reference to FIG. 4. The column control circuit region $R_{CC}$ includes the sense amplifier module SAM described with reference to FIG. 1. The circuit region $R_C$ includes an input/output circuit (not illustrated). This input/output circuit is connected to the external pad electrodes $P_X$ via the via-contact electrodes CC described with reference to FIG. 7 and the like.

FIG. 12 and FIG. 13 illustrate the regions overlapping with the hook-up regions $R_{HU}$ (FIG. 6) when viewed in the Z-direction by the dotted lines. In the examples of FIG. 12 and FIG. 13, parts of the row control circuit regions $R_{RC}$ are disposed in the regions overlapping with the hook-up regions $R_{HU}$ (FIG. 6) when viewed in the Z-direction. Parts of the row control circuit regions $R_{RC}$ are disposed in the regions overlapping with the memory hole regions $R_{HU}$ (FIG. 6) when viewed in the Z-direction. In the examples of FIG. 12 and FIG. 13, the width in the X-direction of the row control circuit region $R_{RC}$ is larger than the width in the X-direction of the hook-up region $R_{HU}$ (FIG. 6). Thus, the plurality of word line switches WLSW and the select gate line switches of the row control circuit region $R_{RC}$ are disposed at the positions overlapping with the parts of the hook-up regions $R_{HU}$ and memory hole regions $R_{MH}$ when viewed in the Z-direction.

In the example of FIG. 12, the center positions in the X-direction of the column control circuit regions $R_{CC}$ match the boundary between the first and second regions $R_{MHU}$ counted from the X-direction negative side or the boundary between the third and fourth regions $R_{MHU}$ counted from the X-direction negative side. Note that the center positions in the X-direction of the column control circuit regions $R_{CC}$ need not match the boundary between the first and second regions $R_{MHU}$ counted from the X-direction negative side and the boundary between the third and fourth regions $R_{MHU}$ counted from the X-direction negative side.

For example, as illustrated in FIG. 7, the chip $C_P$ includes a semiconductor substrate 200, an electrode layer GC disposed above the semiconductor substrate 200, wiring layers D0, D1, D2, D3, D4 disposed above the electrode layer GC, and a chip bonding electrode layer DB disposed above the wiring layers D0, D1, D2, D3, D4.

[Structure of Semiconductor Substrate 200 in Chip $C_P$]

The semiconductor substrate 200, for example, contains P-type silicon (Si) containing P-type impurities, such as boron (B). On the surface of the semiconductor substrate 200, for example, N-type well regions 200N containing N-type impurities, such as phosphorus (P), P-type well regions 200P containing P-type impurities, such as boron (B), a semiconductor substrate region 200S in which the N-type well region 200N or the P-type well region 200P is not disposed, and insulating regions STI are disposed. A part of the P-type well region 200P is disposed in the semiconductor substrate region 200S, and a part of the P-type well region 200P is disposed in the N-type well region 200N. The respective N-type well regions 200N, P-type well regions 200P disposed in the N-type well region 200N and the semiconductor substrate region 200S, and semiconductor substrate region 200S function as parts of a plurality of transistors Tr, a plurality of capacitors, and the like constituting the peripheral circuit PC. Note that a part of the plurality of transistors Tr function as the word line switches WLSW and the select gate line switches SGSW.

[Structure of Electrode Layer GC in Chip $C_P$]

The electrode layer GC is disposed on the upper surface of the semiconductor substrate 200 via an insulating layer 200G. The electrode layer GC includes a plurality of electrodes gc opposed to the surface of the semiconductor substrate 200. Each region of the semiconductor substrate 200 and each of the plurality of electrodes gc included in the electrode layer GC are connected to the via-contact electrode CS.

The respective N-type well regions 200N, P-type well regions 200P disposed in the N-type well region 200N and the semiconductor substrate region 200S, and semiconductor substrate region 200S of the semiconductor substrate 200 function as channel regions of the plurality of transistors Tr, one electrodes of the plurality of capacitors, and the like constituting the peripheral circuit PC.

The respective plurality of electrodes gc included in the electrode layer GC function as gate electrodes of the plurality of transistors Tr, the other electrodes of the plurality of capacitors, and the like constituting the peripheral circuit PC.

The via-contact electrode CS extends in the Z-direction and has a lower end connected to the semiconductor substrate 200 or the upper surface of the electrode gc. An impurity region containing N-type impurities or P-type impurities is disposed in a connection part of the via-contact electrode CS and the semiconductor substrate 200. The via-contact electrode CS may include, for example, a stacked film of a barrier conductive film, such as titanium nitride (TiN), and a metal film, such as tungsten (W).

[Structure of Wiring Layers D0, D1, D2, D3, D4 of Chip $C_P$]

For example, as illustrated in FIG. 7, the plurality of connecting portions and the plurality of wirings included in the wiring layers D0, D1, D2, D3, D4 are, for example, electrically connected to at least one of the configuration in the memory cell array layer $L_{MCA}$ and the configuration in the chip $C_P$.

The wiring layers D0, D1, D2 includes a plurality of connecting portions d0, d1, d2, respectively, and a plurality of wirings (for example, hook-up wirings W0 in FIG. 27, hook-up wirings W1 in FIG. 26, and hook-up wirings W2, passing wirings TW2, and shield wirings s2 in FIG. 25 described later). These plurality of connecting portion d0, d1, d2 and the plurality of wirings may include, for example, a stacked film of a barrier conductive film, such as titanium nitride (TiN), and a metal film, such as tungsten (W).

The wiring layers D3, D4 include a plurality of connecting portions d3, d4, respectively and a plurality of wirings (for example, hook-up wirings W3, passing wirings TW3, and shield wirings s3 in FIG. 23 and the wirings CGI in FIG. 20 described later). These plurality of connecting portion d3, d4 and plurality of wirings may include, for example, a stacked film of a barrier conductive film, such as titanium nitride (TiN), tantalum nitride (TaN), and a stacked film of tantalum nitride (TaN) and tantalum (Ta); and a metal film, such as copper (Cu).

The configurations of the connecting portions d0, d1, d2, d3, d4 and the plurality of wirings in the wiring layers D0, D1, D2, D3, D4 will be described later (see FIG. 17 to FIG. 27).

[Structure of Chip Bonding Electrode Layer DB]

The plurality of wirings included in the chip bonding electrode layer DB are, for example, electrically connected to at least one of the configuration in the memory cell array layer $L_{MCA}$ and the configuration in the chip $C_P$.

The chip bonding electrode layer DB includes the plurality of bonding electrodes $P_{I2}$. These plurality of bonding electrodes $P_{I2}$ may include, for example, a stacked film of a barrier conductive film $p_{I2B}$, such as titanium nitride (TiN), tantalum nitride (TaN), and a stacked film of tantalum nitride (TaN) and tantalum (Ta); and a metal film $p_{I2M}$, such as copper (Cu).

When the metal films $p_{I1M}$, $p_{I2M}$, such as copper (Cu), are used for the bonding electrode $P_{I1}$ and the bonding electrode $P_{I2}$, the metal film $p_{I1M}$ and the metal film $P_{I2M}$ are integrated, and confirmation of the mutual boundary is difficult. However, the bonding structure can be confirmed by distortion of the shape of bonding the bonding electrode $P_{I1}$ and the bonding electrode $P_{I2}$ due to the positional displacement of the bonding and the positional displacement (generation of discontinuous portions in side surfaces) of the barrier conductive films $p_{I1B}$, $p_{I2B}$. Additionally, when the bonding electrode $P_{I1}$ and the bonding electrode $P_{I2}$ are formed by damascene method, the respective side surfaces have a tapered shape. In view of this, in the shape of the cross-sectional surface along the Z-direction in the part where the bonding electrode $P_{I1}$ and the bonding electrode $P_{I2}$ are bonded, the sidewall does not have a linear shape, but a non-rectangular shape. Additionally, when the bonding electrode $P_{I1}$ and the bonding electrode $P_{I2}$ are bonded, a structure of covering the bottom surface, the side surface, and the upper surface of each Cu forming them by a barrier metal is formed. In contrast to this, in a wiring layer using general Cu, an insulating layer (for example, SiN or SiCN) having an oxidation reduction function of Cu is disposed on the upper surface of Cu, and a barrier metal is not disposed. In view of this, even when the positional displacement of the bonding does not occur, distinction with a general wiring layer is possible.

[Wiring Pattern in Wiring Layer M1]

As described with reference to FIG. 4 and the like, the word line switch WLSW is connected to each of the word lines WL. The select gate line switch SGSW is connected to each of the select gate lines SG. Here, since a comparatively large voltage is applied to the word line WL and the select gate line SG in some cases, high breakdown voltage transistors are used for the word line switch WLSW and the select gate line switch SGSW. Here, the high breakdown voltage transistor becomes comparatively large in some cases. In terms of this, the area of the row control circuit region $R_{RC}$ described with reference to FIG. 12 becomes comparatively large in some cases.

Here, when the area of the row control circuit region $R_{RC}$ is larger than the area of the hook-up region $R_{HU}$, it is considered that a part of the row control circuit regions $R_{RC}$ are disposed in the regions overlapping with the hook-up regions $R_{HU}$ when viewed in the Z-direction and the remaining parts are disposed in the regions not overlapping with the regions MP' when viewed in the Z-direction. However, in this case, the area of the entire regions MP' increases, and the circuit area of the memory die MD increases in some cases.

Therefore, in this embodiment, as described with reference to FIG. 12, a part of the row control circuit regions $R_{RC}$ are disposed in the regions overlapping with the hook-up regions $R_{HU}$ when viewed in the Z-direction and the remaining parts are disposed in the regions overlapping with the memory hole regions $R_{MH}$ when viewed in the Z-direction.

When such a structure is employed, when viewed in the Z-direction, a part of the bit lines BL are disposed at the positions overlapping with the row control circuit regions $R_{RC}$ and the block decoder regions $R_{BD}$, not the column control circuit regions $R_{CC}$.

Therefore, in this embodiment, wirings m1*a* extending in the X-direction are disposed in the wiring layer M1, and a part of the bit lines BL and the configurations in the column control circuit regions $R_{CC}$ are electrically connected via these wirings m1*a*. With this configuration, the increase in the circuit area of the memory die MD in association with the increase in the area of the row control circuit region $R_{RC}$ is reduced, and the semiconductor memory device that allows high integration can be provided.

Note that the area of the row control circuit region $R_{RC}$ may be the same as the area of the hook-up region $R_{HU}$ and may be smaller than the area of the hook-up region $R_{HU}$. In this case, the wiring layer M1 do not necessarily include the wiring m1*a* for electrically connecting a part of the bit lines BL and the configurations in the column control circuit regions $R_{CC}$.

[Control Circuit SYN and Passing Wiring TW]

Figure 14:
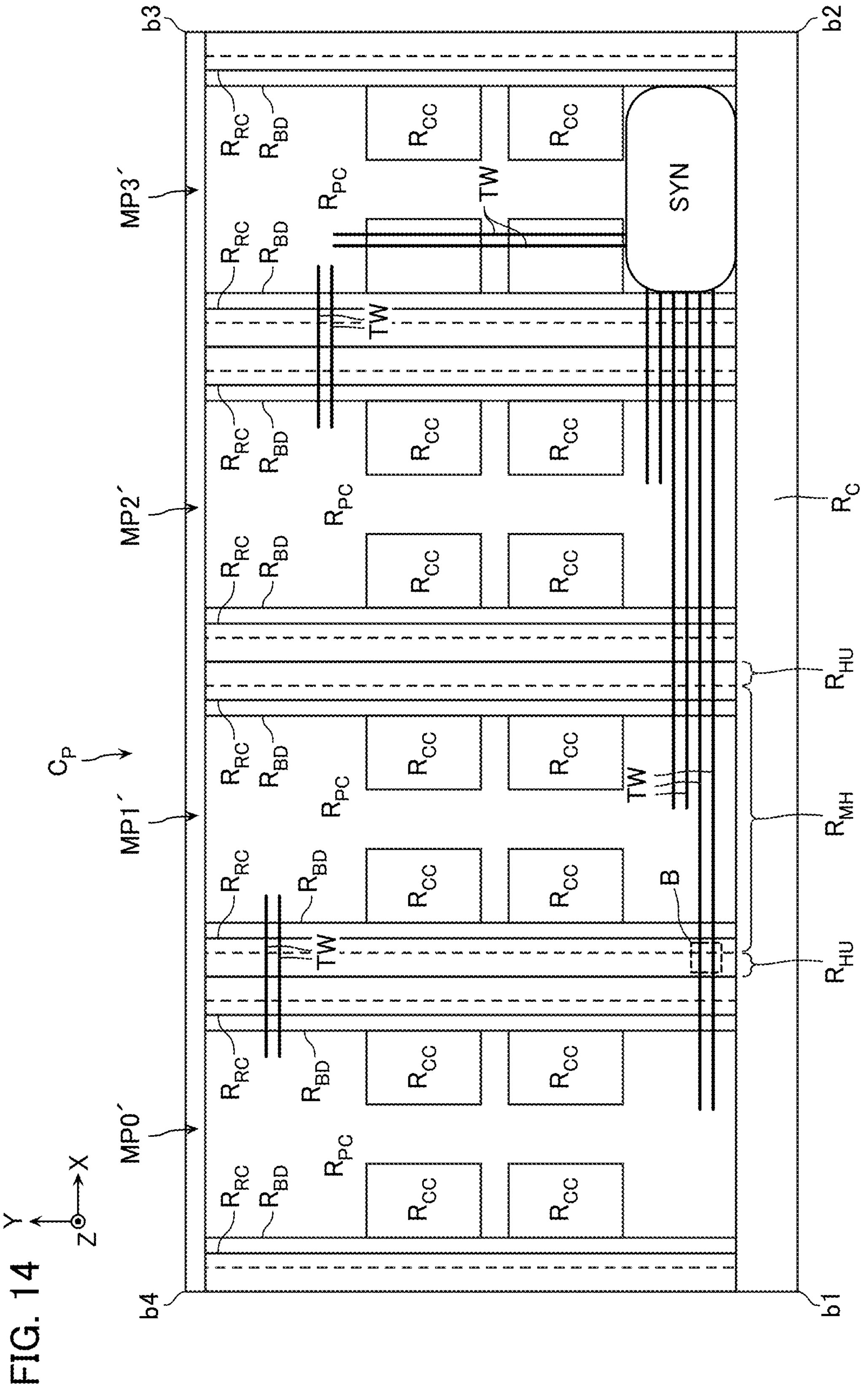
FIG. 14 is a schematic plan view illustrating a control circuit SYN and passing wirings TW.

FIG. 14 is a schematic plan view illustrating the control circuit SYN and the passing wirings TW. In FIG. 14, the same reference numerals are given to the configurations same as the configurations of FIG. 12, and the overlapping explanation will be omitted.

The control circuit SYN is a module that outputs the control signals of various kinds of the peripheral circuits PC in the chip $C_P$ based on input signals. The control circuit SYN includes the sequencer SQC or the like described with reference to FIG. 1 in some cases. Additionally, the control signal output from the control circuit SYN includes a voltage control signal (input to a charge pump circuit, a regulator, and the like), an address signal, and the like in some cases. In the example of FIG. 14, the control circuit SYN is disposed in a region on the Y-direction negative side in the peripheral circuit region $R_{PC}$ in the region MP3'. Note that the control circuit SYN may be disposed at a position different from the position illustrated in FIG. 14.

The plurality of passing wirings TW connect between the peripheral circuits PC in the plurality of regions MP'. As illustrated in FIG. 14, the plurality of passing wirings TW extending in the X-direction and the Y-direction are disposed across the plurality of regions MP'. The plurality of passing wirings TW transmit various kinds of signals including the control signal. A part of the plurality of passing wirings TW are connected to the control circuit SYN and transmit the control signals from the control circuit SYN. These plurality of passing wirings TW are, for example, formed in the wiring layers D2, D3, D4 in the chip $C_P$.

As illustrated in FIG. 14, the plurality of passing wirings TW disposed across the plurality of regions MP' pass through above the row control circuit regions $R_{RC}$ and the block decoder regions $R_{BD}$ in the semiconductor substrate 200.

[Structures of Word Line Switch WLSW and Select Gate Line Switch SGSW]

Figure 15:
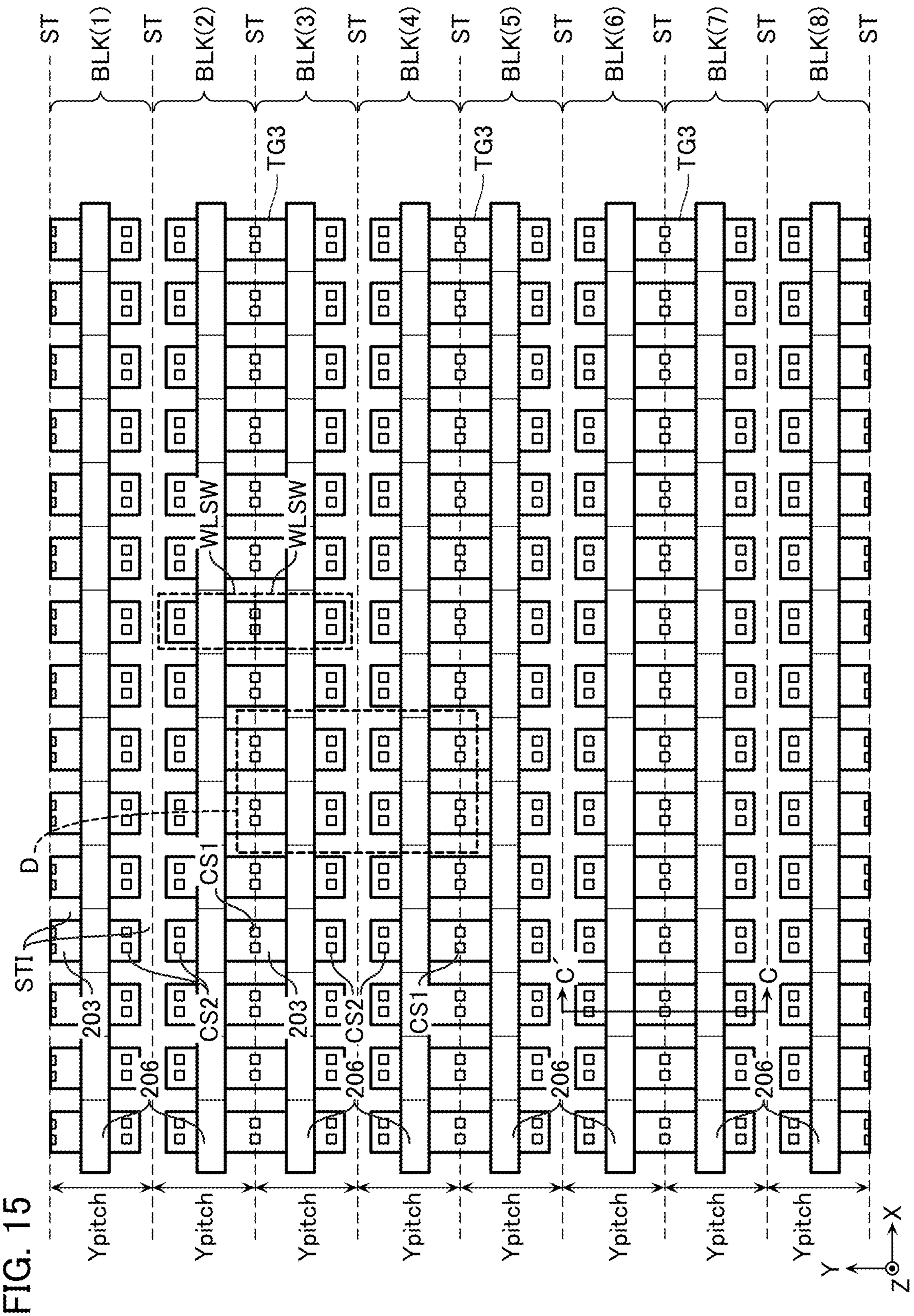
FIG. 15 is a schematic plan view illustrating an exemplary configuration of word line switches WLSW.
Figure 16:
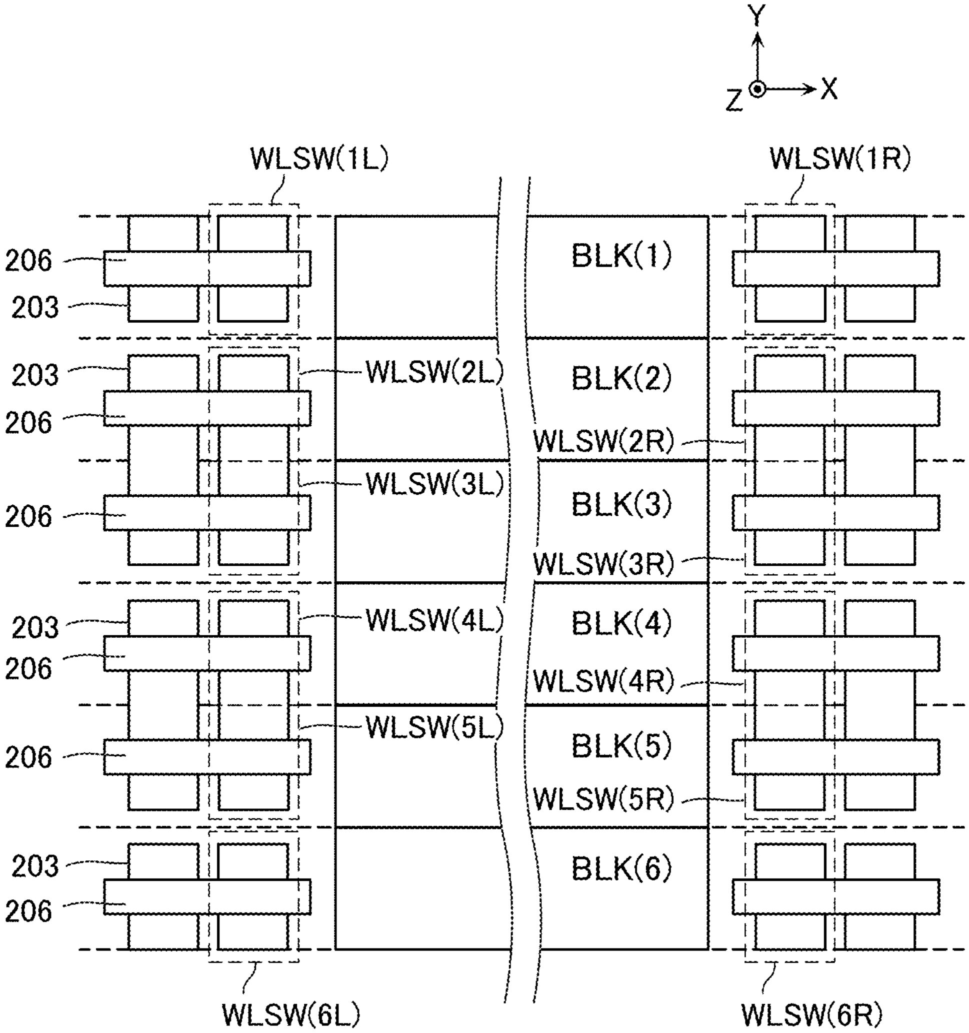
FIG. 16 is a schematic diagram illustrating a positional relationship between the word line switches WLSW and memory blocks BLK.

FIG. 15 is a schematic plan view illustrating an exemplary configuration of the word line switches WLSW. Note that FIG. 15, for example, corresponds to the part indicated by B in FIG. 14. FIG. 16 is a schematic diagram illustrating a positional relationship between the word line switches WLSW and the memory blocks BLK. Note that FIG. 15 and FIG. 16 illustrate the dotted lines indicative of the boundaries of the memory blocks BLK for describing the correspondence relationship between the word line switches WLSW and the memory blocks BLK.

FIG. 15 illustrates the two word line switches WLSW (transistors) having a common source region. Hereinafter, the two word line switches WLSW (transistors) are referred to as a "transistor group TG3".

As illustrated in FIG. 15, the transistor group TG3 includes a semiconductor region (diffusion region) 203 extending in the Y-direction. The semiconductor regions 203 are arranged in the Y-direction and arranged in the X-direction. The insulating region STI is formed around the semiconductor region 203. Additionally, at both end portions in the Y-direction of the semiconductor region 203, respective via-contact electrodes CS2 functioning as drain terminals of the word line switches WLSW are disposed. Additionally, via-contact electrodes CS1 functioning as common source terminals of the two word line switches WLSW are disposed between these via-contact electrodes CS2. Additionally, each of a gate insulating film 205 (see FIG. 17) and a gate electrode 206 are disposed between the via-contact electrodes CS2 functioning as the drain terminals and the via-contact electrodes CS1 functioning as the source terminals.

As illustrated in FIG. 15, among a pair of the semiconductor regions 203 arranged in the Y-direction, a position of an intermediate line where distances from the end portion on the Y-direction negative side of one semiconductor region 203 and the end portion on the Y-direction positive side of the other semiconductor region 203 are equal matches a position of an inter-block insulating layer ST (FIG. 7, FIG. 9) when viewed in the Z-direction. Further, the position of the center line in the Y-direction of the semiconductor region 203 matches the position of the inter-block insulating layer ST (FIG. 7, FIG. 9) when viewed in the Z-direction. The interval between the inter-block insulating layers ST arranged in the Y-direction is a pitch (Ypitch in FIG. 15) in the Y-direction of the word line switches WLSW. That is, in this embodiment, the pitch in the Y-direction of the word line switches WLSW is the same as the pitch in the Y-direction of the memory blocks BLK. The pitches of the word line switch WLSW and the memory block BLK in the Y-direction being the same is denoted as 1 Tr/1 BLK in some cases.

Note that while FIG. 15 illustrates the structure of the word line switches WLSW, the structure of the select gate line switches SGSW may be similar to the structure of the word line switches WLSW.

The conductive layers 110 in the respective layers in the memory block BLK(1) in FIG. 16 are electrically connected to the via-contact electrodes CS2 of the word line switches WLSW(1L), WLSW(2L) in the row control circuit region $R_{RC}$ on the X-direction negative side via the plurality of via-contact electrodes CC (FIG. 11), the bonding electrode $P_{I1}$, $P_{I2}$, and the wiring layers DO to D4 in the hook-up region $R_{HU}$(N1).

The conductive layers 110 in the respective layers in the memory block BLK(2) are electrically connected to the via-contact electrodes CS2 of the word line switches WLSW (1R), WLSW(2R) in the row control circuit region $R_{RC}$ on the X-direction positive side via the plurality of via-contact electrodes CC (FIG. 11), the bonding electrode $P_{I1}$, $P_{I2}$, and the wiring layers DO to D4 in the hook-up region $R_{HU}$(P2).

The conductive layers 110 in the respective layers in the memory block BLK(3) are electrically connected to the via-contact electrodes CS2 of the word line switches WLSW (3R), WLSW(4R) in the row control circuit region $R_{RC}$ on the X-direction positive side via the plurality of via-contact electrodes CC (FIG. 11), the bonding electrode $P_{I1}$, $P_{I2}$, and the wiring layers DO to D4 in the hook-up region $R_{HU}$(P3).

The conductive layers 110 in the respective layers of the memory block BLK(4) are electrically connected to the via-contact electrodes CS2 of the word line switches WLSW (3L), WLSW(4L) in the row control circuit region $R_{RC}$ on the X-direction negative side via the plurality of via-contact electrodes CC (FIG. 11), the bonding electrode $P_{I1}$, $P_{I2}$, and the wiring layers DO to D4 in the hook-up region $R_{HU}$(N4).

The connection between the conductive layers 110 of the respective layers and the plurality of word line switches WLSW in the memory blocks BLK(5) to BLK(6) are similar to the connection between the conductive layers 110 of the respective layers and the plurality of word line switches WLSW in the memory blocks BLK(1) to BLK(4). Thus, a pair of the word line switches WLSW disposed by the width of the pair of memory blocks BLK are connected to the conductive layers 110 (word lines WL) in the same memory block BLK. Note that the same applies to the connection between the select gate line SG and the select gate line switch SGSW. [Path between Conductive Layer 110, Word Line Switch WLSW, and Select Gate Line Switch SGSW]

Figure 17:
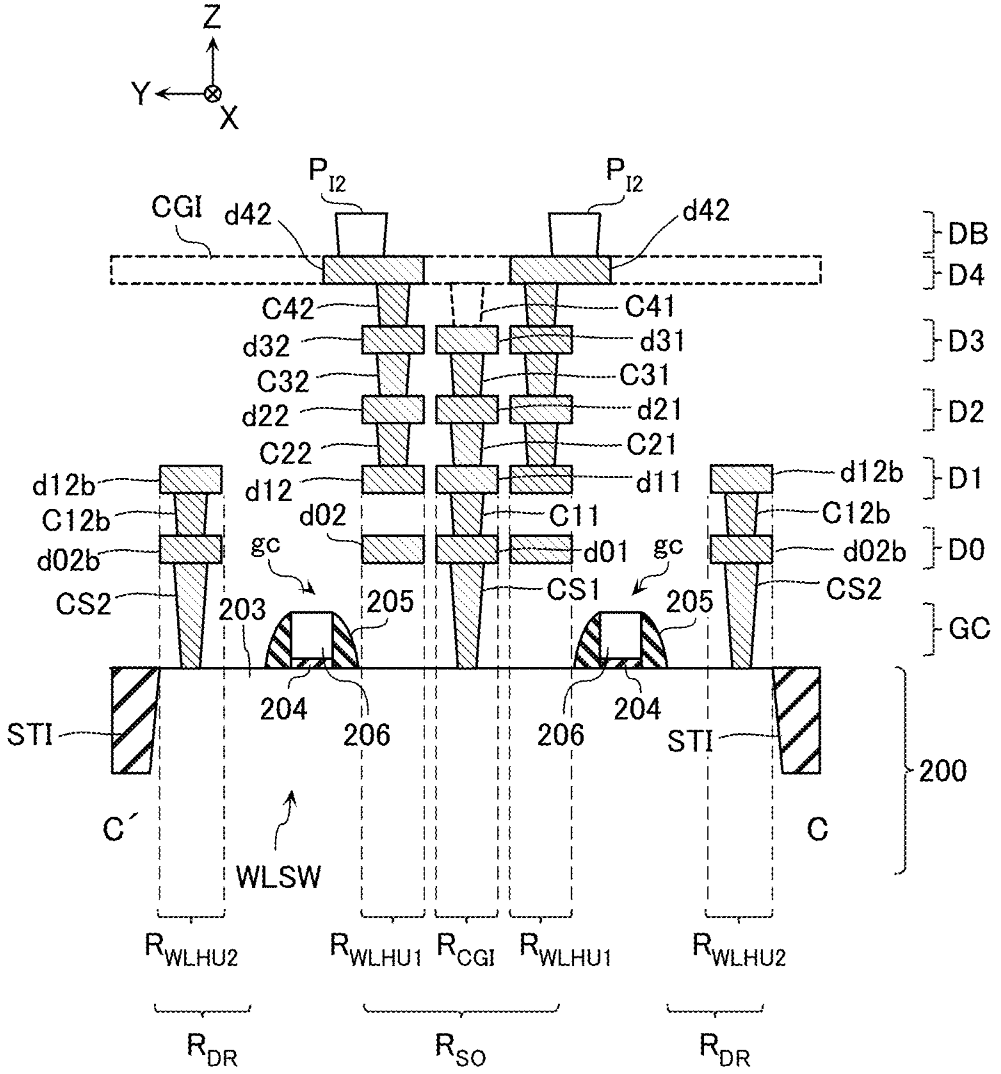
FIG. 17 is a schematic cross-sectional view illustrating structures of the word line switches WLSW, connecting portions, and via-contact electrodes.
Figure 18:
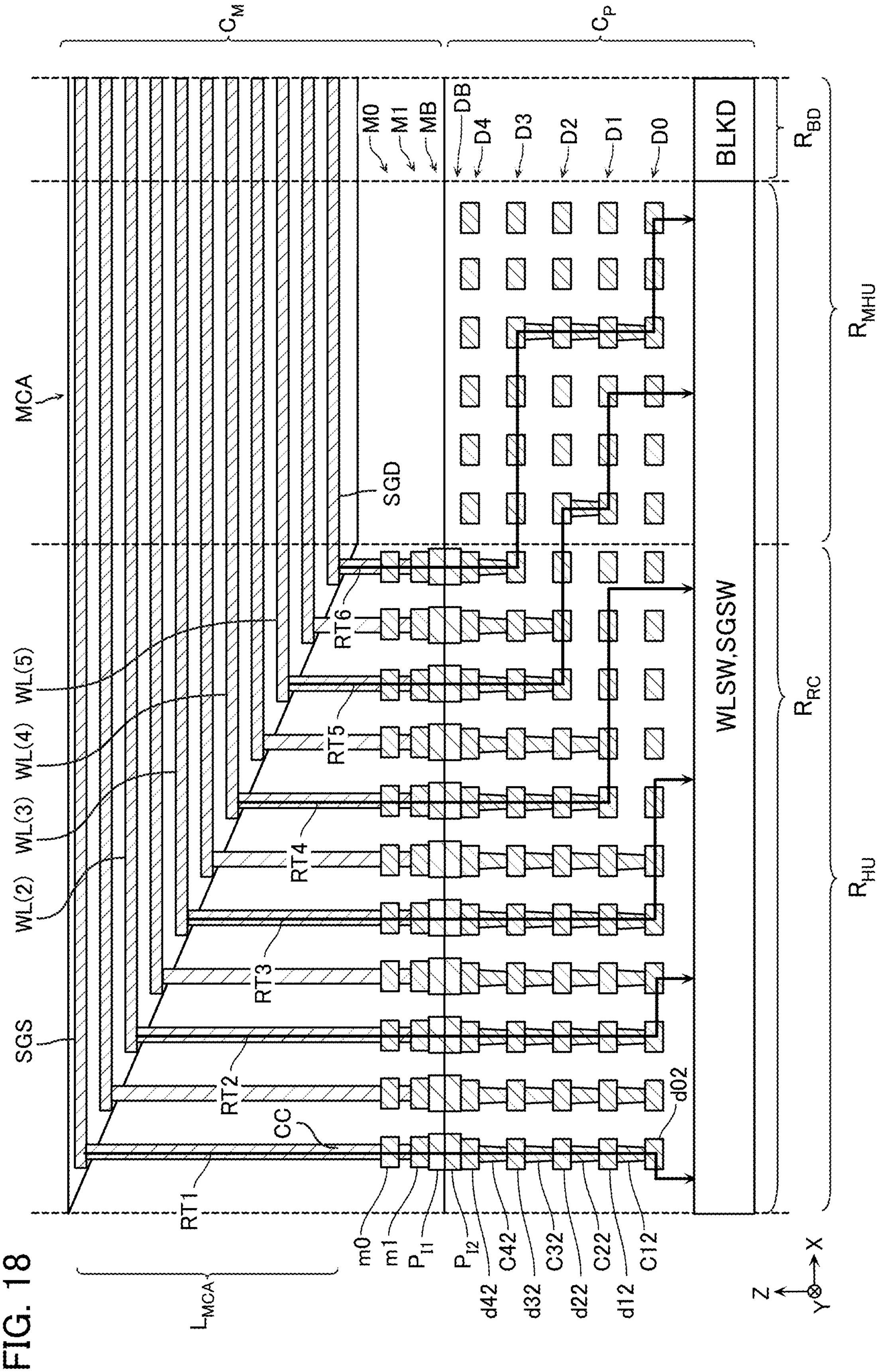
FIG. 18 is a schematic cross-sectional view illustrating paths between conductive layers 110 and the word line switch WLSW and between the conductive layers 110 and a select gate line switch SGSW.

FIG. 17 is a schematic cross-sectional view illustrating structures of the word line switches WLSW, the connecting portions, and the via-contact electrodes. Note that FIG. 17 is a diagram taken along the line C-C' illustrated in FIG. 15 and viewed along the direction of the arrows. FIG. 18 is a schematic cross-sectional view illustrating paths between the conductive layers 110 and the word line switch WLSW and the select gate line switch SGSW.

As illustrated in FIG. 17, in the semiconductor substrate 200, the semiconductor region 203 constituting the two word line switches WLSW is formed. The two electrodes gc extending in the X-direction are disposed on the upper surface of the semiconductor region 203. The electrode gc includes a gate insulating layer 204 disposed on the upper surface of the semiconductor region 203, the gate electrode 206 disposed on the upper surface of the gate insulating layer 204, and gate insulating films 205 disposed on both side surfaces in the Y-direction of the gate insulating layer 204 and the gate electrode 206.

The gate insulating layer 204, for example, may contain at least one of silicon oxide ($SiO_2$) and silicon nitride (SiN) or may contain any insulating metal oxide film including aluminum oxide (AlO) and hafnium oxide (HfO). The gate electrode 206, for example, may contain a metal, such as polycrystalline silicon (Si) containing N-type or P-type impurities and tungsten (W), silicide, such as nickel silicide (NiSi), nickel platinum silicide (NiPtSi), cobalt silicide (CoSi), and tungsten silicide (WSi), a stacked film combining two or more among these, and the like. The gate insulating film 205, for example, may contain at least one of silicon oxide ($SiO_2$) and silicon nitride (SiN).

A source region $R_{SO}$ of the semiconductor region 203 is a region between the two electrodes gc. Drain regions $R_{DR}$ of the semiconductor region 203 are a region between the electrode gc on the Y-direction positive side and the insulating region STI on the Y-direction positive side and a region between the electrode gc on the Y-direction negative side and the insulating region STI on the Y-direction negative side.

Via-contact electrodes C41, C31, C21, C11, CS1 and the connecting portions d31, d21, d11, d01 are via-contact electrodes and connecting portions for connecting the wiring CGI and the source region $R_{SO}$ of the semiconductor region 203. The via-contact electrodes C41, C31, C21, C11, CS1 and the connecting portions d31, d21, d11, d01 for connecting the wiring CGI are disposed in a first region $R_{CGI}$ overlapping with the region that goes across the plurality of source regions $R_{SO}$ arranged in the X-direction when viewed in the Z-direction.

As illustrated in FIG. 17, the wiring CGI extends in the Y-direction in the wiring layer D4. The via-contact electrode C41 has an upper end connected to the wiring CGI and a lower end connected to the connecting portion d31 of the wiring layer D3. In FIG. 17, since the positions in the X-direction of the wiring CGI and the via-contact electrode C41 are displaced from the connecting portion d31, the via-contact electrode C31, and the like, the wiring CGI and the via-contact electrode C41 are indicated by the dotted lines. The via-contact electrode C31 has an upper end connected to the connecting portion d31 and a lower end connected to the connecting portion d21 of the wiring layer D2. The via-contact electrode C21 has an upper end connected to the connecting portion d21 and a lower end connected to the connecting portion d11 of the wiring layer D1. The via-contact electrode C11 has an upper end connected to the connecting portion d11 and a lower end connected to the connecting portion d01 of the wiring layer DO. The via-contact electrode CS1 has an upper end connected to the connecting portion d01 and a lower end connected to the source region $R_{SO}$ of the semiconductor region 203.

Thus, the via-contact electrodes C41, C31, C21, C11, CS1 and the connecting portions d31, d21, d11, d01 are connected immediately below or approximately immediately below from the wiring CGI to the source region $R_{SO}$ of the semiconductor region 203.

Via-contact electrodes C42, C32, C22, C12 (C12*b*), CS2 and the connecting portions d42, d32, d22, d12 (d12*b*), d02 (d02*b*) are via-contact electrodes and connecting portions for connecting the bonding electrodes $P_{I2}$ and the drain regions $R_{DR}$ of the semiconductor region 203. The via-contact electrodes C42, C32, C22, C12 and the connecting portions d42, d32, d22, d12, d02 for connecting the bonding electrodes $P_{I2}$ are disposed in a pair of second regions $R_{WLHU1}$ at the proximity of the first region $R_{CGI}$ overlapping with the source region $R_{SO}$ of the semiconductor region 203 when viewed in the Z-direction. The second regions $R_{WLHU1}$ are regions close to both sides in the Y-direction of the first region $R_{CGI}$. In the example of FIG. 17, the via-contact electrode C12 is not disposed. FIG. 18 described later and the like illustrate the via-contact electrode C12. The via-contact electrodes C12*b*, CS2 and the connecting portions d12*b*, d02*b* for connecting the bonding electrodes $P_{I2}$ are disposed in a third region $R_{WLHU2}$ overlapping with the pair of drain regions $R_{DR}$ of the semiconductor region 203 when viewed in the Z-direction.

As illustrated in FIG. 17, the bonding electrode $P_{I2}$ of the chip bonding electrode layer DB is connected to the connecting portion d42 of the wiring layer D4. In FIG. 17, while the positions in the X-direction of the bonding electrode $P_{I2}$ and the connecting portion d42 and the like are matched, the positions in the X-direction may be displaced. The via-contact electrode C42 has an upper end connected to the connecting portion d42 and a lower end connected to the connecting portion d32 of the wiring layer D3. The via-contact electrode C32 has an upper end connected to the connecting portion d32 and a lower end connected to the connecting portion d22 of the wiring layer D2. The via-contact electrode C22 has an upper end connected to the connecting portion d22 and a lower end connected to the connecting portion d12 of the wiring layer D1. The connecting portion d12 and the connecting portion d12*b* of the wiring layer D1 are connected with a wiring (not illustrated in FIG. 17) (the hook-up wiring W1 in FIG. 26 described later). The via-contact electrode C12*b* has an upper end connected to the connecting portion d12*b* and a lower end connected to the connecting portion d02*b* of the wiring layer DO. The via-contact electrode CS2 has an upper end connected to the connecting portion d02*b* and a lower end connected to the drain region $R_{DR}$ of the semiconductor region 203.

In FIG. 17, the connecting portion d12 and the connecting portion d12*b* of the wiring layer D1 are connected with the hook-up wiring (the hook-up wiring W1 in FIG. 26 described later). In this case, the via-contact electrode C12 is not disposed. The connecting portion d02 of the wiring layer DO is a dummy connecting portion (wiring) not electrically connected to the connecting portion d12 of the wiring layer D1. That is, the connecting portion d02 is electrically insulated and floating. From the aspect of lithography, the dummy connecting portion d02 is formed in the wiring layer DO. Additionally, to reduce a risk of short circuit with an adjacent wiring caused by an influence from dust, the connecting portion d02 is unconnected to the connecting portion d12. However, the connecting portion d02 and the connecting portion d02*b* of the wiring layer DO are connected with the hook-up wiring (the hook-up wiring W0 in FIG. 27 described later) in some cases. In this case, the via-contact electrode C12 is disposed, but the via-contact electrode C12*b* is not disposed. In this case as well, the connecting portion d12*b* of the wiring layer D1 is a dummy connecting portion (wiring) not electrically connected to the connecting portion d02*b* of the wiring layer DO. That is, in this case, the connecting portion d12*b* is electrically insulated and floating.

Thus, using the via-contact electrodes and the connecting portions disposed in the second regions $R_{WLHU1}$ and the via-contact electrodes and the connecting portions disposed in the third regions $R_{WLHU2}$, the bonding electrodes $P_{I2}$ and the drain regions $R_{DR}$ of the semiconductor region 203 are connected. In this case, the connecting portions d12 of the second regions $R_{WLHU1}$ and the connecting portions d12*b* of the third regions $R_{WLHU2}$ are connected with the hook-up wirings (the hook-up wirings W1 in FIG. 26 described later) of the wiring layer D1 or the connecting portions d02 of the second regions $R_{WLHU1}$ and the connecting portions d02*b* of the third regions $R_{WLHU2}$ are connected with the hook-up wirings (the hook-up wirings W0 in FIG. 27 described later) of the wiring layer DO.

Note that in FIG. 17, the connecting portion d42 of the wiring layer D4 corresponds to the connecting portion d4 in FIG. 7 and FIG. 8. The connecting portions d31, d32 of the wiring layer D3 correspond to the connecting portions d3 in FIG. 7 and FIG. 8. The connecting portions d21, d22 of the wiring layer D2 correspond to the connecting portions d2 in FIG. 7 and FIG. 8. The connecting portions d11, d12 (d12*b*) of the wiring layer D1 correspond to the connecting portions d1 in FIG. 7 and FIG. 8. The connecting portions d01, d02 (d02*b*) of the wiring layer DO correspond to the connecting portions d0 in FIG. 7 and FIG. 8.

As illustrated in FIG. 18, the word lines WL and the select gate lines SG (SGD, SGS) in the memory cell array layer $L_{MCA}$ of the chip $C_M$ are electrically connected to the via-contact electrodes CS2 that function as the drain terminals of the word line switch WLSW and the select gate line switch SGSW via the via-contact electrodes CC, the bonding electrodes $P_{I1}$, $P_{I2}$, the connecting portions d42 of the wiring layer D4, the via-contact electrodes C42, the connecting portions d32 of the wiring layer D3, the via-contact electrodes C32, the connecting portions d22 of the wiring layer D2, the via-contact electrodes C22, the connecting portions d12 of the wiring layer D1, the via-contact electrodes C12, and the connecting portions d02 of the wiring layer DO. Note that FIG. 18 omits the via-contact electrode layer CH. Paths from the word lines WL and the select gate lines SG to the word line switch WLSW and the select gate line switch SGSW as described above are referred to as paths RT in FIG. 18.

As illustrated in FIG. 18, the source-side select gate line SGS as the uppermost layer in the memory cell array layer $L_{MCA}$ is connected to the select gate line switch SGSW at the end portion on the X-direction negative side (this select gate line switch SGSW is denoted as SGSW(1)) in the row control circuit region $R_{RC}$ via the path RT1. The word line WL(2) below the source-side select gate line SGS is connected to the word line switch WLSW on the X-direction positive side with respect to the select gate line switch SGSW(1) (this word line switch WLSW is denoted as WLSW(2)) via the path RT2. The word line WL(3) below the word line WL(2) is connected to the word line switch WLSW on the X-direction positive side with respect to the word line switch WLSW(2) (this word line switch WLSW is denoted as WLSW(3)) via the path RT3.

Although not illustrated in FIG. 18, in the above-described paths RT1, RT2, RT3, the connecting portions d02 and the connecting portions d02*b* of the wiring layer DO are connected with the hook-up wirings (the hook-up wirings W0 in FIG. 27 described later), and the connecting portions d02*b* are connected to the via-contact electrodes CS2.

The word line WL(4) below the word line WL(3) is connected to the word line switch WLSW on the X-direction positive side with respect to the word line switch WLSW(3) (this word line switch WLSW is denoted as WLSW(4)) via the path RT4.

Although not illustrated in FIG. 18, in the above-described path RT4, the connecting portion d12 and the connecting portion d12*b* of the wiring layer D1 are connected with the hook-up wiring (the hook-up wiring W1 in FIG. 26 described later), the connecting portion d12*b* is connected to the connecting portion d02*b* via the via-contact electrode C12*b*, and the connecting portion d02*b* is connected to the via-contact electrode CS2.

The word line WL(5) below the word line WL(4) is connected to the word line switch WLSW on the X-direction positive side with respect to the word line switch WLSW(4) (this word line switch WLSW is denoted as WLSW(5)) via the path RT5.

Although not illustrated in FIG. 18, in the above-described path RT5, the connecting portion d22 of the wiring layer D2 and the connecting portion d22 at the position on the X-direction positive side with respect to this connecting portion d22 are connected with the hook-up wiring (the hook-up wiring W2 in FIG. 25 described later). The connecting portion d22 is connected to the connecting portion d12 via the via-contact electrode C22, the connecting portion d12 and the connecting portion d12*b* are connected with the hook-up wiring (the hook-up wiring W1 in FIG. 26 described later), the connecting portion d12*b* is connected to the connecting portion d02*b* via the via-contact electrode C12*b*, and the connecting portion d02*b* is connected to the via-contact electrode CS2.

The drain-side select gate line SGD below the word line WL(5) is connected to the select gate line switch SGSW(6) on the X-direction positive side with respect to the word line switch WLSW(5) via the path RT6.

Although not illustrated in FIG. 18, in the above-described path RT6, the connecting portion d32 of the wiring layer D3 and the connecting portion d32 at the position on the X-direction positive side with respect to this connecting portion d32 are connected with the hook-up wiring (the hook-up wiring W3 in FIG. 23 described later). The connecting portion d32 is connected to the connecting portion d22 via the via-contact electrode C32, the connecting portion d22 is connected to the connecting portion d12 via the via-contact electrode C22, and the connecting portion d12 is connected to the connecting portion d02 via the via-contact electrode C12. The connecting portion d02 and the connecting portion d02*b* are connected with the hook-up wiring (the hook-up wiring W0 in FIG. 27 described later), and the connecting portion d02*b* is connected to the via-contact electrode CS2.

As illustrated in FIG. 18, the respective plurality of connecting portions d42, d32, d22, d12, d02 are formed to be spaced in the X-direction and the Y-direction regardless of whether they are connected to the via-contact electrodes and the wirings or not. The connecting portions d42, d32, d22, d12, d02 unconnected to the via-contact electrodes and the wirings are dummy connecting portions not constituting the electrical connection paths. Although not illustrated in FIG. 18, the respective plurality of connecting portions d12*b*, d02*b* are formed to be spaced in the X-direction and the Y-direction regardless of whether they are connected to the via-contact electrodes and the wirings or not. The connecting portions d12*b*, d02*b* unconnected to the via-contact electrodes and the wirings are dummy connecting portions not constituting electrical connection paths. However, the dummy connecting portion need not be formed.

Additionally, the plurality of bonding electrodes $P_{I1}$, $P_{I2}$ connected to the word lines WL and the select gate lines SG via the via-contact electrodes CC are disposed in the hook-up region $R_{HU}$. The number of these plurality of bonding electrodes $P_1$, $P_{I2}$ is determined according to the number of the word lines WL and the select gate lines SG. Among the plurality of bonding electrodes $P_{I1}$, $P_{I2}$, the dummy bonding electrodes $P_1$, $P_{I2}$ unconnected to the word lines WL and the select gate lines SG may be disposed.

Note that in FIG. 18, the select gate line switch SGSW(1), the word line switches WLSW(2), (3), (4), (5), and the select gate line switch SGSW (6) are disposed in the order on the X-direction positive side. However, the disposition of the select gate line switches SGSW(1), (6) and the word line switches WLSW(2), (3), (4), (5) are one example and is not limited to the disposition illustrated in FIG. 18.

In the paths RT1 to RT6 in FIG. 18, the paths on the X-direction positive side (such as the paths RT5, RT6) with respect to the paths on the X-direction negative side (such as the paths RT1, RT2) electrically connect the connecting portions using the hook-up wirings of the upper wiring layers. However, such paths RT1 to RT6 are one example and are not limited to the paths illustrated in FIG. 18.

For example, in the above-described path RT5, the connecting portion d22 of the wiring layer D2 and the connecting portion d22 at the position on the X-direction positive side with respect to this connecting portion d22 are connected with the hook-up wiring (the hook-up wiring W2 in FIG. 25 described later). The connecting portion d22 is connected to the connecting portion d12 of the wiring layer D1 via the via-contact electrode C22, and the connecting portion d12 is connected to the connecting portion d02 of the wiring layer DO via the via-contact electrode C12. The connecting portion d02 and the connecting portion d02*b* may be connected with the hook-up wiring (the hook-up wiring W0 in FIG. 27 described later), and the connecting portion d02*b* may be connected to the via-contact electrode CS2.

For example, in the above-described path RT6, the connecting portion d22 of the wiring layer D2 and the connecting portion d22 at the position on the X-direction positive side with respect to this connecting portion d22 are connected with the hook-up wiring (the hook-up wiring W2 in FIG. 25 described later). The connecting portion d22 is connected to the connecting portion d12 via the via-contact electrode C22 and the connecting portion d12 is connected to the connecting portion d02 via the via-contact electrode C12. The connecting portion d02 and the connecting portion d02*b* may be connected with the hook-up wiring (the hook-up wiring W0 in FIG. 27 described later), and the connecting portion d02*b* may be connected to the via-contact electrode CS2.

For example, in the above-described path RT6, the connecting portion d22 of the wiring layer D2 is connected to the connecting portion d12 via the via-contact electrode C22, the connecting portion d12 and the connecting portion d12*b* are connected with the hook-up wiring (the hook-up wiring W1 in FIG. 26 described later), and the connecting portion d12*b* is connected to the connecting portion d02*b* via the via-contact electrode C12. The connecting portion d02*b* may be connected to the via-contact electrode CS2.

[Positions of Bonding Electrodes $P_{I2}$ of Chip Bonding Electrode Layer DB]

Figure 19:
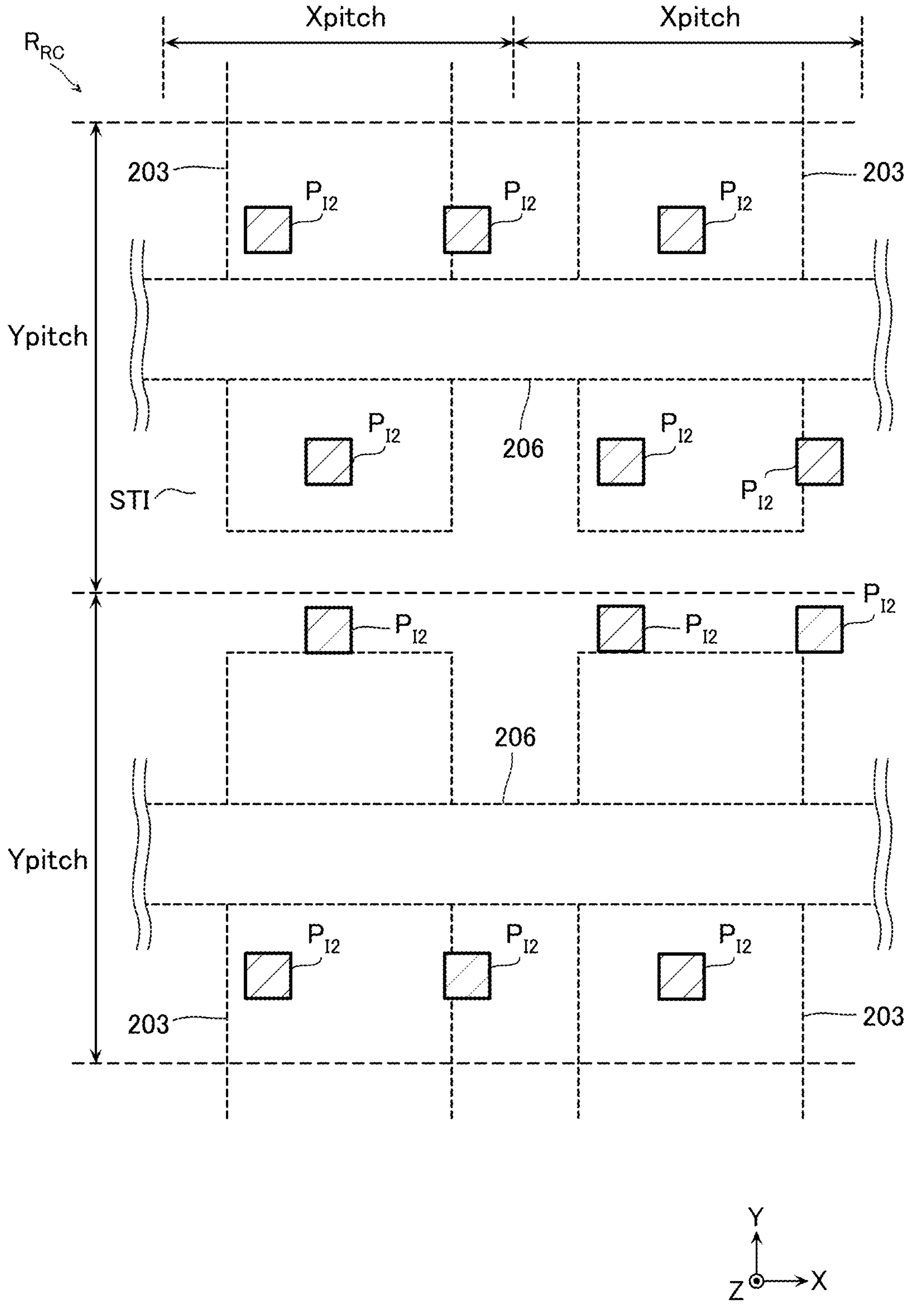
FIG. 19 is a schematic plan view illustrating positions of bonding electrodes $P_{I2}$ in the hook-up region $R_{HU}$.

FIG. 19 is a schematic plan view illustrating the positions of the bonding electrodes $P_{I2}$ in the hook-up region $R_{HU}$. FIG. 19 indicates the semiconductor regions 203 and the gate electrodes 206 by the dotted lines. In FIG. 19, a pitch in the X-direction of the word line switches WLSW is denoted as Xpitch and a pitch in the Y-direction of the word line switches WLSW is denoted as Ypitch. FIG. 19 illustrates the row control circuit region $R_{RC}$ on the X-direction negative side in the region MP' (the upper region corresponding to the region indicated by D in FIG. 15).

As illustrated in FIG. 19, the plurality of bonding electrodes $P_{I2}$ are arranged at regular intervals or predetermined intervals in the X-direction. The two rows of the plurality of bonding electrodes $P_{I2}$ arranged in the X-direction are arranged per the width in the Y-direction (Ypitch) of one word line switch WLSW. The three bonding electrodes $P_{I2}$ are disposed per the region in the X-direction and the Y-direction (Xpitch, Ypitch) of one word line switch WLSW.

[Positions of Wirings CGI and Connecting Portion d42 of Wiring Layer D4]

Figure 20:
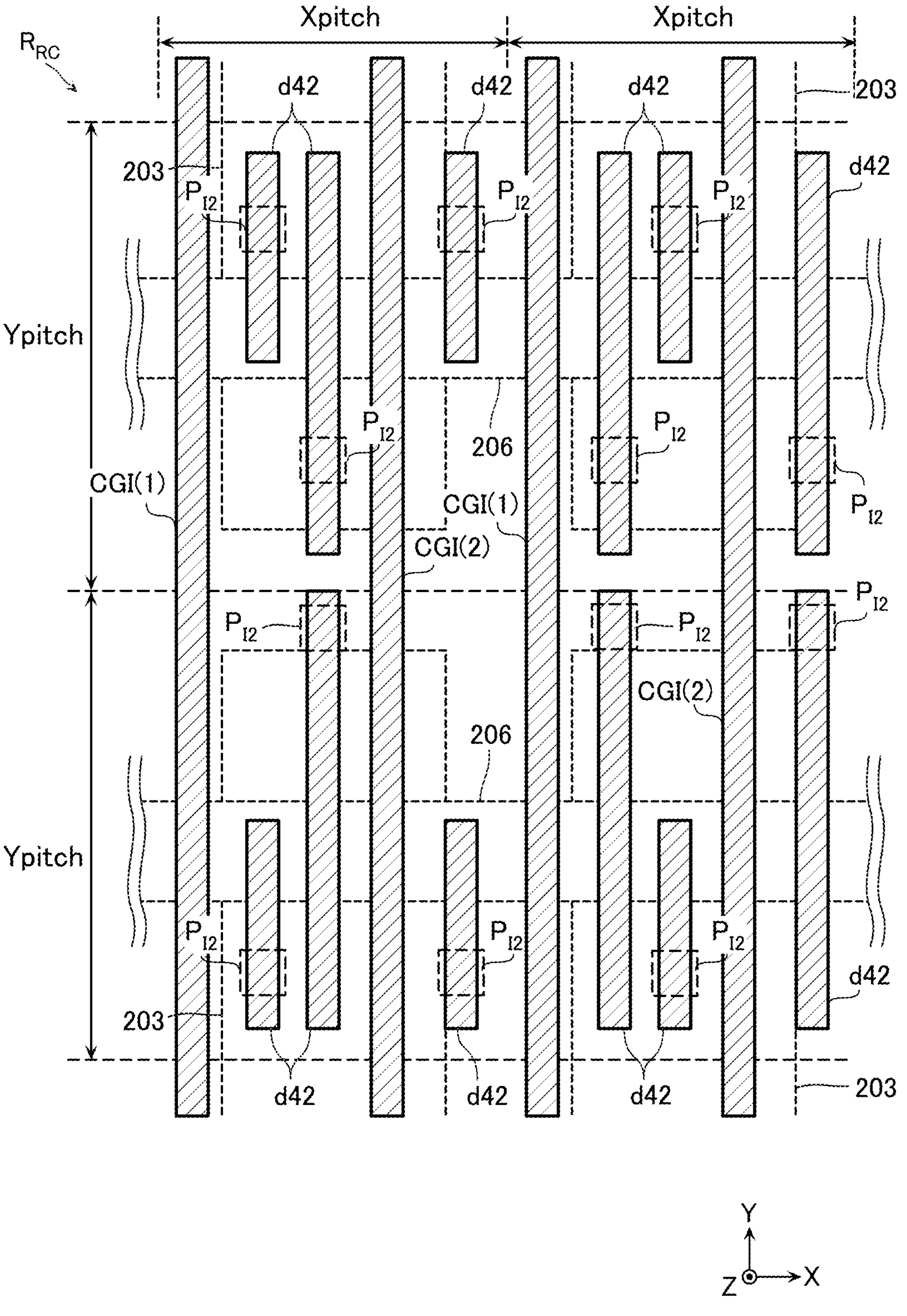
FIG. 20 is a schematic plan view illustrating positions of wirings CGI and connecting portions d42 disposed in a wiring layer D4.

FIG. 20 is a schematic plan view illustrating the positions of the wirings CGI and the connecting portions d42 disposed in the wiring layer D4. FIG. 20 illustrates the semiconductor regions 203 and the gate electrodes 206 by the dotted lines. FIG. 20 indicates the positions of the bonding electrodes $P_{I2}$ illustrated in FIG. 19 by the dotted lines. In FIG. 20, the pitch in the X-direction of the word line switches WLSW is denoted as Xpitch and the pitch in the Y-direction of the word line switches WLSW is denoted as Ypitch. FIG. 20 illustrates the row control circuit region $R_{RC}$ on the X-direction negative side in the region MP' (the upper region corresponding to the region indicated by D in FIG. 15).

As illustrated in FIG. 20, the two wirings CGI extending in the Y-direction are arranged per the width in the X-direction (Xpitch) of one word line switch WLSW. Among the two wirings CGI, the wiring on the X-direction negative side is assumed to be a wiring CGI(1) and the wiring on the X-direction positive side is assumed to be a wiring CGI(2). Between the two wirings CGI(1), CGI(2), the two connecting portions d42 extending in the Y-direction are disposed. One of the two connecting portions d42 overlaps with the bonding electrode $P_{I2}$ at the upper side (the Y-direction positive side) of the source region $R_{SO}$ when viewed in the Z-direction, and the other overlaps with the bonding electrode $P_{I2}$ at the upper side (Y-direction negative side) of the drain region $R_{DR}$ when viewed in the Z-direction. Additionally, among the regions of the two adjacent word line switches WLSW, one connecting portion d42 extending in the Y-direction is disposed between the wiring CGI(2) disposed in one region and the wiring CGI(1) disposed in the other region. This connecting portion d42 overlaps with the bonding electrode $P_{I2}$ on the Y-direction positive side of the gate electrode 206 or the Y-direction negative side of the gate electrode 206 when viewed in the Z-direction.

Thus, the three connecting portions d42 are disposed per the region of one word line switch WLSW. As described above, the three respective connecting portions d42 are connected to the three bonding electrodes $P_{I2}$.

[Positions of Connecting Portions d31, d32 of Wiring Layer D3 and Wiring Pattern in Wiring Layer D3]

Figure 21:
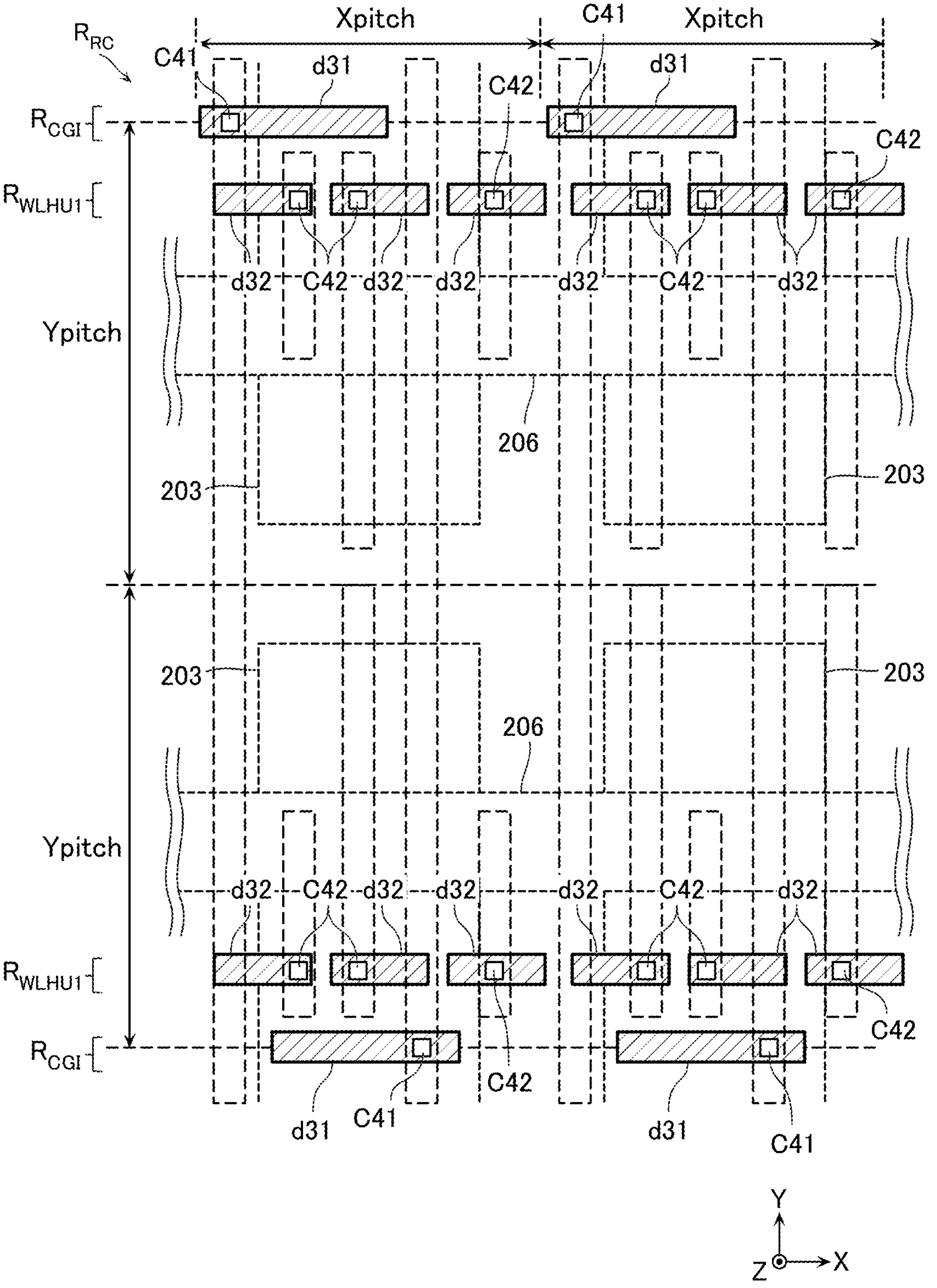
FIG. 21 is a schematic plan view illustrating positions of connecting portions d31, d32 disposed in a wiring layer D3.
Figure 22:
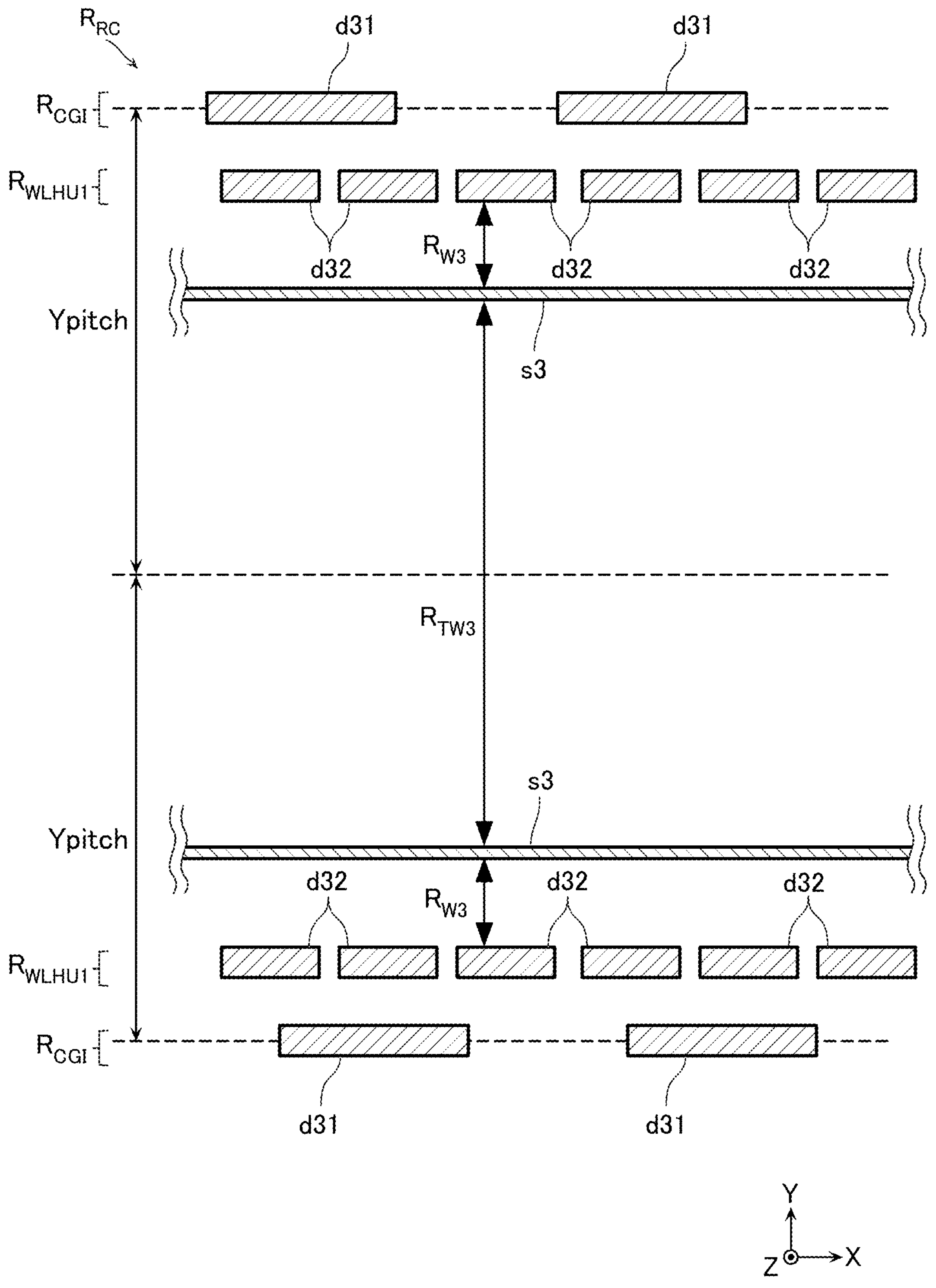
FIG. 22 is a schematic plan view illustrating positions of shield wirings s3 and a passing wiring region $R_{TW3}$ disposed in the wiring layer D3.

FIG. 21 is a schematic plan view illustrating the positions of the connecting portions d31, d32 disposed in the wiring layer D3. FIG. 22 is a schematic plan view illustrating the positions of the shield wirings s3 and a passing wiring region $R_{TW3}$ disposed in the wiring layer D3. FIG. 23 is a schematic plan view illustrating an example of the wiring pattern in the wiring layer D3. FIG. 21 indicates the semiconductor regions 203 and the gate electrodes 206 by the dotted lines. In FIG. 21, a pitch in the X-direction of the word line switches WLSW is denoted as Xpitch and a pitch in the Y-direction of the word line switches WLSW is denoted as Ypitch. FIG. 21 to FIG. 23 illustrate the row control circuit region $R_{RC}$ on the X-direction negative side in the region MP' (FIG. 21 and FIG. 22 are the upper region corresponding to the region indicated by D in FIG. 15).

As illustrated in FIG. 21, one connecting portion d31 extending in the X-direction is disposed per the pitch Xpitch in the X-direction of one word line switch WLSW.

That is, the connecting portions d31 are arranged at regular intervals or predetermined intervals at every Xpitch. The connecting portion d31 is disposed in the first region $R_{CC}$z overlapping with the source region $R_{SO}$ of the semiconductor region 203. The connecting portion d31 is connected to the wiring CGI via the via-contact electrode C41.

The three connecting portions d32 extending in the X-direction are disposed per the pitch Xpitch in the X-direction of one word line switch WLSW. That is, the three connecting portions d32 are arranged at regular intervals or predetermined intervals at every Xpitch. The connecting portions d32 are disposed in the second regions $R_{WLHU1}$ arranged at both sides in the Y-direction of the first region $R_{CC}$z. The three respective connecting portions d32 are connected to the connecting portions d42 via the via-contact electrodes C42.

As illustrated in FIG. 22, a pair of the shield wirings s3 extending in the X-direction are disposed in the wiring layer D3 between a row of the plurality of connecting portions d32 in one word line switch WLSW side and a row of the connecting portions d32 in the other word line switch WLSW side among a pair of the word line switches WLSW disposed to be spaced on the Y-direction positive side and negative side. A region between the pair of shield wirings s3 (at least a pair of the connecting portions d32) is the passing wiring region $R_{TW3}$ of the wiring layer D3. Additionally, a region between the shield wiring s3 and the row of the plurality of connecting portions d32 is a wiring region $R_{W3}$ of the wiring layer D3.

Figure 23:
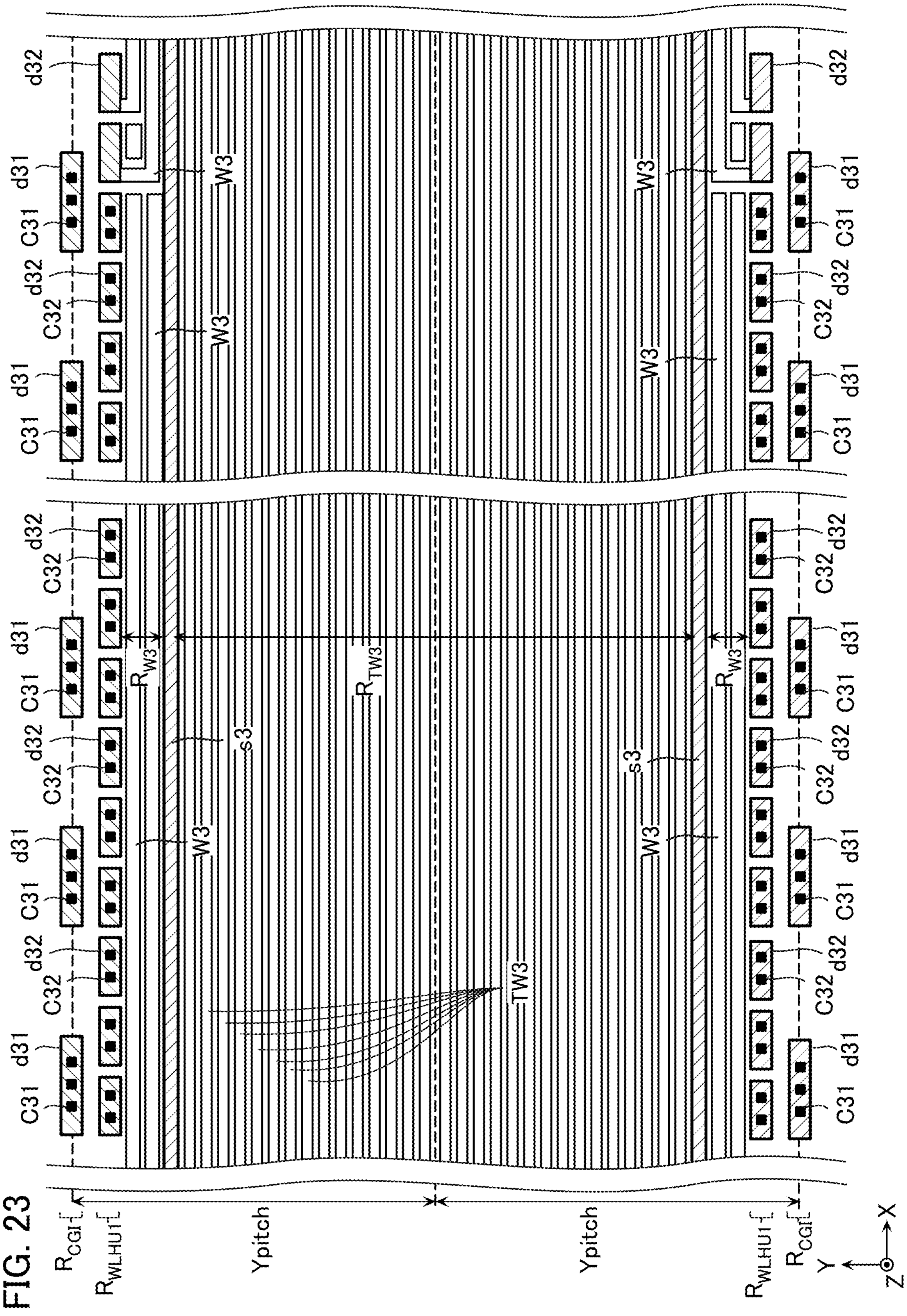
FIG. 23 is a schematic plan view illustrating an example of a wiring pattern in the wiring layer D3.

As illustrated in FIG. 23, in the passing wiring region $R_{TW3}$, the plurality of passing wirings TW3 are disposed. The passing wiring TW3 corresponds to the passing wiring TW described with reference to FIG. 14. The plurality of passing wirings TW3 extend in the X-direction and are arranged in the Y-direction. In the wiring region $R_{W3}$, the plurality of hook-up wirings W3 are disposed. The plurality of hook-up wirings W3 extend in the X-direction and are arranged in the Y-direction. The hook-up wiring W3 connects one connecting portion d32 and another connecting portion d32 at a position in the X-direction different from the one connecting portion d32. In the example of FIG. 23, the hook-up wiring W3 connects one connecting portion d32 and another connecting portion d32 at a position on the X-direction positive side with respect to the one connecting portion d32.

The one connecting portion d32 to which the hook-up wiring W3 is connected is connected to the connecting portion d42 of the wiring layer D4 via the via-contact electrode C42, but is not connected to the via-contact electrode C32. The other connecting portion d32 to which the hook-up wiring W3 is connected is connected to the connecting portion d22 of the wiring layer D2 via the via-contact electrode C32, but is not connected to the via-contact electrode C42. The connecting portions d32 unconnected to the hook-up wiring W3 are connected to the connecting portions d42, d22 of the wiring layers D4, D2 via the via-contact electrodes C42, C32. Note that the dummy connecting portions d32 unconnected to any of the hook-up wiring W3 or the via-contact electrodes C42, C32 are also disposed. The dummy connecting portion d32 is electrically insulated and floating.

In the wiring region $R_{W3}$, the hook-up wirings W3 are preferred to be formed at approximately constant pitches at the exposure in photolithography or the like. While Chemical Mechanical Polishing (CMP) is performed in forming the plurality of wiring layers, an arrangement density of the wiring layer D3 is preferred to be uniform in performing the CMP. Therefore, as illustrated in FIG. 23, for disposing the hook-up wirings W3 to be approximately constant in the wiring region $R_{W3}$, a dummy wiring unconnected to any of the connecting portions d32 is disposed as the hook-up wiring W3.

Note that the passing wirings TW3 are preferred to be formed at approximately constant pitches also in the passing wiring region $R_{TW3}$. Accordingly, the dummy passing wiring may be disposed also in the passing wiring region $R_{TW3}$.

While the wiring region $R_{W3}$ is disposed in the example of FIG. 21 to FIG. 23, the wiring region $R_{W3}$ may be not necessarily disposed. In this case, the passing wiring region $R_{TW3}$ can be enlarged by the size of the omitted wiring region $R_{W3}$.

The shield wiring s3 is a wiring for shielding the hook-up wiring W3 from the passing wiring TW3. In the read operation, the write operation, the erase operation, and the like, while a high voltage, such as a read pass voltage $V_{READ}$, a write voltage $V_{PGM}$, and an erase voltage $V_{ERA}$, is applied to the hook-up wiring W3, a comparatively low voltage at around from the ground voltage $V_{SS}$ to the power supply voltage $V_{CC}$ is applied to most of the passing wirings TW3. In the wiring adjacent to the wiring to which a high voltage has been applied, the voltage easily increases unintentionally due to a capacitive coupling. In order to reduce the voltage fluctuation of the passing wiring TW3, the shield wiring s3 is disposed between the wiring region $R_{W3}$ and the passing wiring region $R_{TW3}$, and shields the hook-up wiring W3 from the passing wiring TW3. For example, the ground voltage $V_{SS}$ is applied to the shield wiring s3. However, a voltage $V_{DD}$ generated by the voltage generation circuit VG may be applied to the shield wiring s3. In this case, the voltage $V_{DD}$ may be used as a power supply voltage of a predetermined wiring.

In the wiring layer D3, a high voltage is applied to the connecting portion d31, the connecting portion d32, and the hook-up wiring W3 in some cases. Provisionally, when the connecting portion d31, the connecting portion d32, and the hook-up wiring W3 are disposed at various positions, it is required to shield the connecting portion d31, the connecting portion d32, and the hook-up wiring W3 at each of the positions. In this embodiment, the connecting portion d31, the connecting portion d32, and the hook-up wiring W3 are disposed in the first region $R_{CGI}$, the second region $R_{WLU1}$, and the wiring region $R_{W3}$ arranged in the Y-direction, respectively, and these first region $R_{CGI}$, second region $R_{WLU1}$, and wiring region $R_{W3}$ are disposed at both end portions in the Y-direction of one word line switch WLSW. Additionally, the passing wiring region $R_{TW3}$ is disposed between the one first region $R_{CGI}$, second region $R_{WLHU1}$, and wiring region $R_{W3}$ and the other first region $R_{CGI}$, second region $R_{WLHU1}$, and wiring region $R_{W3}$, and the shield wiring s3 is disposed between the wiring region $R_{W3}$ and the passing wiring region $R_{TW3}$. With this configuration, the connecting portions d31, d32 and the hook-up wiring W3 to which the high voltage is applied can be shielded from the passing wiring TW3 to which various voltages are applied, and the increase in number of the shield wirings s3 can be reduced to allow ensuring the wide passing wiring region $R_{TW3}$.

[Positions of Connecting Portions d21, d22 of Wiring Layer D2 and Wiring Pattern in Wiring Layer D2]

Figure 24:
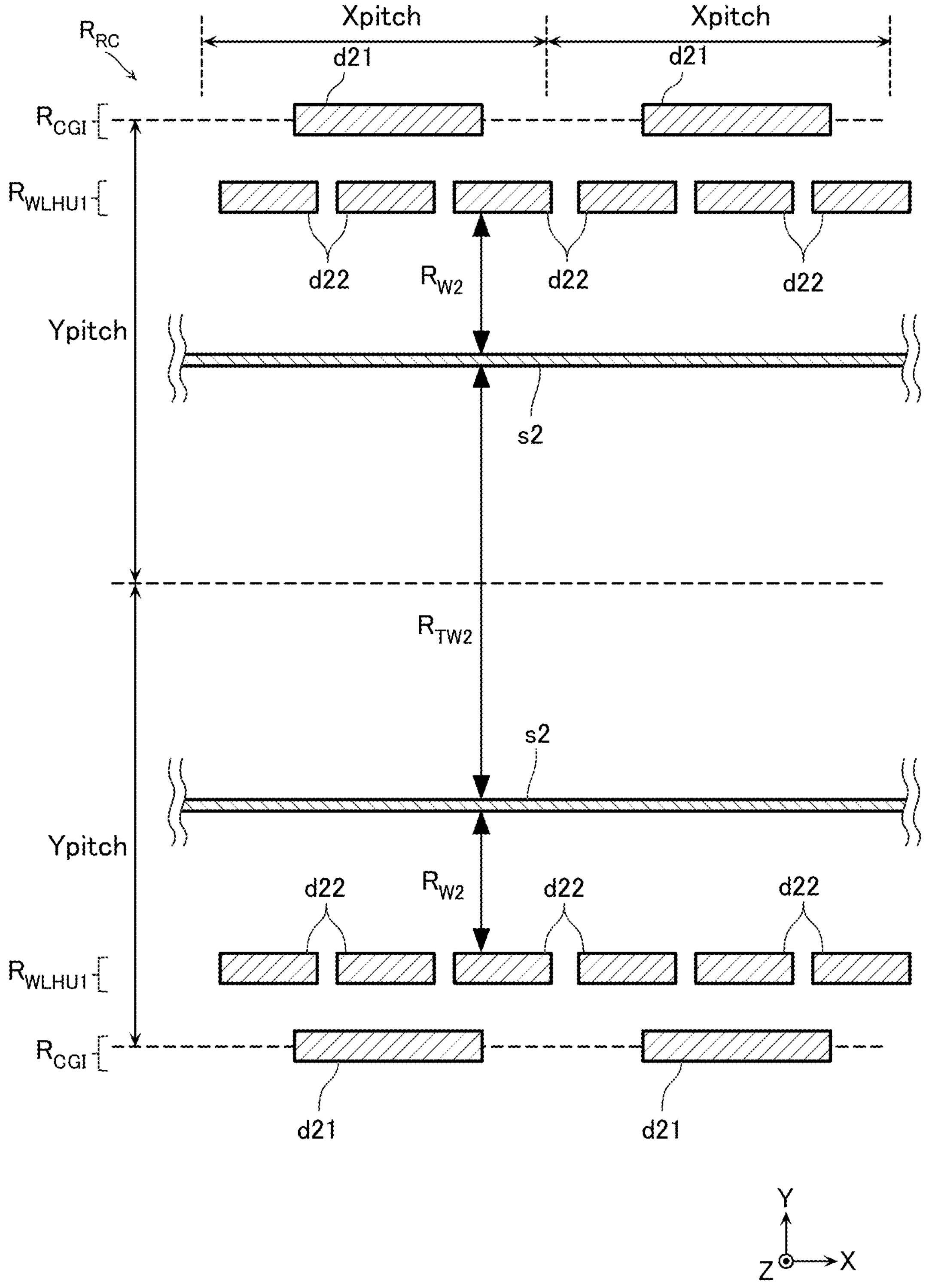
FIG. 24 is a schematic plan view illustrating positions of shield wirings s2 and a passing wiring region $R_{TW2}$ disposed in a wiring layer D2.

FIG. 24 is a schematic plan view illustrating positions of the shield wirings s2 and a passing wiring region $R_{TW2}$ disposed in the wiring layer D2. FIG. 25 is a schematic plan view illustrating an example of a wiring pattern in the wiring layer D2. In FIG. 24, a pitch in the X-direction of the word line switches WLSW is denoted as Xpitch and a pitch in the Y-direction of the word line switches WLSW is denoted as Ypitch. FIG. 24 and FIG. 25 illustrate the row control circuit region $R_{RC}$ on the X-direction negative side in the region MP' (FIG. 24 is the upper region corresponding to the region indicated by D in FIG. 15).

As illustrated in FIG. 24, one connecting portion d21 extending in the X-direction is disposed per the pitch Xpitch in the X-direction of one word line switch WLSW.

That is, the connecting portions d21 are arranged at regular intervals or predetermined intervals at every Xpitch. The connecting portion d21 is disposed at a position overlapping with the connecting portion d31 when viewed in the Z-direction in the first region $R_{CGI}$. The connecting portion d21 is connected to the connecting portion d31 via the via-contact electrode C31, and connected to the connecting portion d11 via the via-contact electrode C21.

The three connecting portions d22 extending in the X-direction are disposed per the pitch Xpitch in the X-direction of one word line switch WLSW. That is, the three connecting portions d22 are arranged at regular intervals or predetermined intervals at every Xpitch. The connecting portion d22 is disposed at a position overlapping with the connecting portion d32 when viewed in the Z-direction in the second region $R_{WLHU1}$. The three respective connecting portions d22 are connected to the connecting portions d32 via the via-contact electrodes C32, and connected to the connecting portions d12 via the via-contact electrodes C22. However, the connecting portion d22 is not connected to the connecting portion d12 via the via-contact electrode C22, but connected to another connecting portion d22 at a position in the X-direction different from the connecting portion d22 by the hook-up wiring (the hook-up wiring W2 in FIG. 25) in some cases.

As illustrated in FIG. 24, a pair of the shield wirings s2 extending in the X-direction are disposed in the wiring layer D2 between a row of the plurality of connecting portions d22 in one word line switch WLSW side and a row of the plurality of connecting portions d22 in the other word line switch WLSW side among a pair of the word line switches WLSW arranged in the Y-direction. A region between the pair of shield wirings s2 (at least the connecting portions d22) is the passing wiring region $R_{TW2}$ of the wiring layer D2. Additionally, a region between the shield wiring s2 and the row of the plurality of connecting portions d22 is the wiring region $R_{W2}$ of the wiring layer D2.

In the example of FIG. 22 and FIG. 24, the passing wiring region $R_{TW2}$ is narrower than the passing wiring region $R_{TW3}$, and the wiring region $R_{W2}$ is wider than the wiring region $R_{W3}$. However, the sizes of the passing wiring region and the wiring region are appropriately adjustable.

Figure 25:
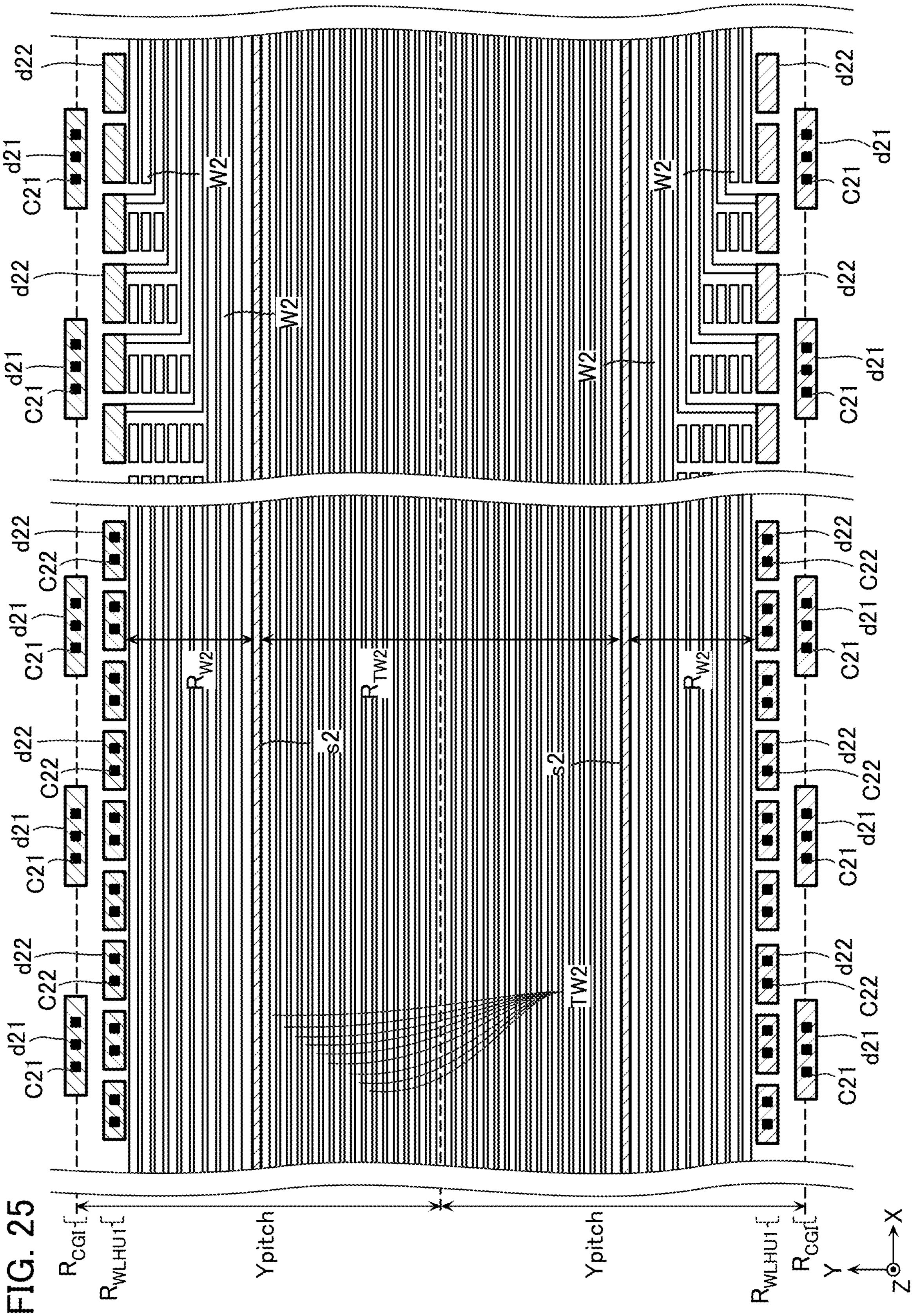
FIG. 25 is a schematic plan view illustrating an example of a wiring pattern in the wiring layer D2.

As illustrated in FIG. 25, in the passing wiring region $R_{TW2}$, a plurality of the passing wirings TW2 are disposed. The plurality of passing wirings TW2 extend in the X-direction and are arranged in the Y-direction. The passing wiring TW2 corresponds to the passing wiring TW described with reference to FIG. 14. In the wiring region $R_{W2}$, a plurality of the hook-up wirings W2 are disposed. The plurality of hook-up wirings W2 extend in the X-direction and are arranged in the Y-direction. The hook-up wiring W2 connects one connecting portion d22 and another connecting portion d22 at a position in the X-direction different from the one connecting portion d22. In the example of FIG. 25, the hook-up wiring W2 connects one connecting portion d22 and another connecting portion d22 at a position on the X-direction positive side with respect to the one connecting portion d22.

The one connecting portion d22 to which the hook-up wiring W2 is connected is connected to the connecting portion d32 of the wiring layer D3 via the via-contact electrode C32, but is not connected to the via-contact electrode C22. The other connecting portion d22 to which the hook-up wiring W2 is connected is connected to the connecting portion d12 of the wiring layer D1 via the via-contact electrode C22, but is not connected to the via-contact electrode C32. The connecting portions d22 unconnected to the hook-up wirings W2 are connected to the connecting portions d32, d12 of the wiring layers D3, D1 via the via-contact electrodes C32, C22. Note that the dummy connecting portions d22 unconnected to any of the hook-up wirings W2 or the via-contact electrodes C32, C22 are also disposed. The dummy connecting portion d22 is electrically insulated and floating.

In the wiring region $R_{W2}$, for forming the hook-up wirings W2 at approximately constant pitches similarly to the wiring region $R_{W3}$, a dummy wiring unconnected to any of the connecting portions d22 is disposed as the hook-up wiring W2.

Note that the passing wirings TW2 are preferred to be formed at approximately constant pitches also in the passing wiring region $R_{TW2}$. Accordingly, the dummy passing wiring may be disposed also in the passing wiring region $R_{TW2}$.

While the wiring region $R_{W2}$ is disposed in the example of FIG. 24 and FIG. 25, the wiring region $R_{W2}$ may be not necessarily disposed. In this case, the passing wiring region $R_{TW2}$ can be enlarged by the size of the omitted wiring region $R_{W2}$.

The shield wiring s2 is a wiring for shielding the hook-up wiring W2 from the passing wiring TW2. For example, the ground voltage $V_{SS}$ is applied to the shield wiring s2. However, the voltage $V_{DD}$ generated by the voltage generation circuit VG may be applied to the shield wiring s2. In this case, the voltage $V_{DD}$ may be used as a power supply voltage of a predetermined wiring.

In this embodiment, the connecting portion d21, the connecting portion d22, and the hook-up wiring W2 are disposed in the first region $R_{CGI}$, the second region $R_{WLHU1}$, and the wiring region $R_{W2}$ arranged in the Y-direction, respectively, and these first region $R_{CGI}$, second region $R_{WLHU1}$, and wiring region $R_{W2}$ are disposed at both end portions in the Y-direction of one word line switch WLSW. Additionally, the passing wiring region $R_{TW2}$ is disposed between the one first region $R_{CGI}$, second region $R_{WLHU1}$, and wiring region $R_{W2}$ and the other first region $R_{CGI}$, second region $R_{WLHU1}$, and wiring region $R_{W2}$, and the shield wiring s2 is disposed between the wiring region $R_{W2}$ and the passing wiring region $R_{TW2}$. With this configuration, the connecting portions d21, d22 and the hook-up wiring W2 to which the high voltage is applied can be shielded from the passing wiring TW2 to which various voltages are applied, and the increase in number of the shield wirings s2 can be reduced to allow ensuring the wide passing wiring region $R_{TW2}$.

[Positions of Connecting Portions d11, d12, d12*b* of Wiring Layer D1 and Wiring Pattern in Wiring Layer D1]

Figure 26:
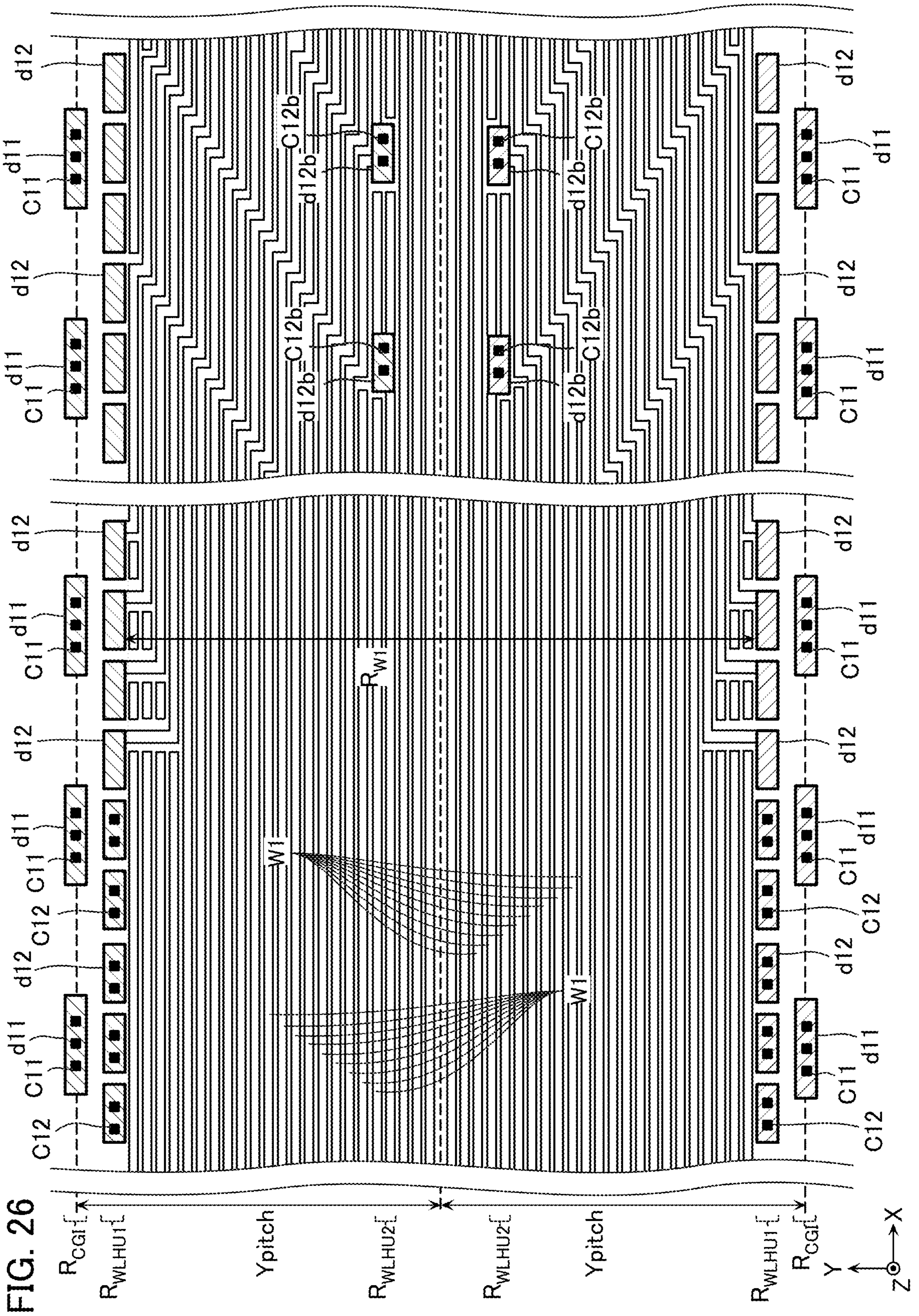
FIG. 26 is a schematic plan view illustrating an example of a wiring pattern in a wiring layer D1.

FIG. 26 is a schematic plan view illustrating an example of a wiring pattern in the wiring layer D1. FIG. 26 illustrates the row control circuit region $R_{RC}$ on the X-direction negative side in the region MP'.

One connecting portion d11 extending in the X-direction is disposed per the pitch Xpitch in the X-direction of one word line switch WLSW. That is, the connecting portions d11 are arranged at regular intervals or predetermined intervals at every Xpitch. The connecting portion d11 is disposed at a position overlapping with the connecting portion d21 when viewed in the Z-direction in the first region $R_{CGI}$ (FIG. 17). The connecting portion d11 is connected to the connecting portion d21 via the via-contact electrode C21, and connected to the connecting portion d01 via the via-contact electrode C11 (FIG. 17).

The three connecting portions d12 extending in the X-direction are disposed per the pitch Xpitch in the X-direction of one word line switch WLSW. That is, the three connecting portions d12 are arranged at regular intervals or predetermined intervals at every Xpitch. The connecting portion d12 is disposed at a position overlapping with the connecting portion d22 when viewed in the Z-direction in the second region $R_{WLHU1}$ (FIG. 17). The three respective connecting portions d12 are connected to the connecting portions d22 via the via-contact electrodes C22, and connected to the connecting portions d02 via the via-contact electrodes C12 (FIG. 17).

One connecting portion d12*b* extending in the X-direction is disposed per the pitch Xpitch in the X-direction of one word line switch WLSW. That is, the connecting portions d12*b* are arranged at regular intervals or predetermined intervals by one for every Xpitch. As illustrated in FIG. 26, the connecting portion d12*b* is disposed in the third region $R_{WLHU2}$. However, the third region $R_{WLHU2}$ includes a region without the connecting portion d12*b*. The connecting portion d12*b* is connected to the connecting portion d02*b* via the via-contact electrode C12*b* (FIG. 17).

As illustrated in FIG. 26, a wiring region $R_{W1}$ of the wiring layer D1 is disposed between a row of the plurality of connecting portions d12 in one word line switch WLSW side and a row of the plurality of connecting portions d12 in the other word line switch WLSW side among a pair of the word line switches WLSW arranged in the Y-direction. Thus, in the wiring layer D1, the shield wiring and the passing wiring region are not disposed. However, the shield wiring and the passing wiring region may be disposed in the wiring layer D1.

In the wiring region $R_{W1}$, a plurality of the hook-up wirings W1 are disposed. The plurality of hook-up wirings W1 extend in the X-direction and are arranged in the Y-direction. The hook-up wiring W1 connects the connecting portion d12 and another connecting portion d12*b* at a position in the X-direction different from the connecting portion d12. In the example of FIG. 26, the hook-up wiring W1 connects the connecting portion d12 and the connecting portion d12*b* at the position on the X-direction positive side with respect to the connecting portion d12. As illustrated in FIG. 26, in a part of the region in the wiring region $R_{W1}$, the hook-up wirings W1 are bent in a crank shape at every predetermined interval while extending in the X-direction. In the other part of the region in the wiring region $R_{W1}$, the hook-up wirings W1 linearly extend in the X-direction without being bent.

The connecting portion d12 to which the hook-up wiring W1 is connected is connected to the connecting portion d22 of the wiring layer D2 via the via-contact electrode C22, but is not connected to the via-contact electrode C12. The connecting portion d12*b* to which the hook-up wiring W1 is connected is connected to the connecting portion d02*b* of the wiring layer DO via the via-contact electrode C12*b*. The connecting portions d12 unconnected to the hook-up wirings W1 are connected to the connecting portions d22, d02 of the wiring layers D2, DO via the via-contact electrodes C22, C12. Note that the dummy connecting portions d12 unconnected to any of the hook-up wirings W1 or the via-contact electrodes C22, C12 are also disposed. The dummy connecting portion d12 is electrically insulated and floating.

In the wiring region $R_{W1}$, for forming the hook-up wirings W1 at approximately constant pitches similarly to the wiring region $R_{W3}$ and the wiring region $R_{W2}$, a dummy wiring unconnected to any of the connecting portions d12, d12*b* is disposed as the hook-up wiring W1.

[Positions of Connecting Portions d01, d02, d02*b* of Wiring Layer D0 and Wiring Pattern in Wiring Layer D0]

Figure 27:
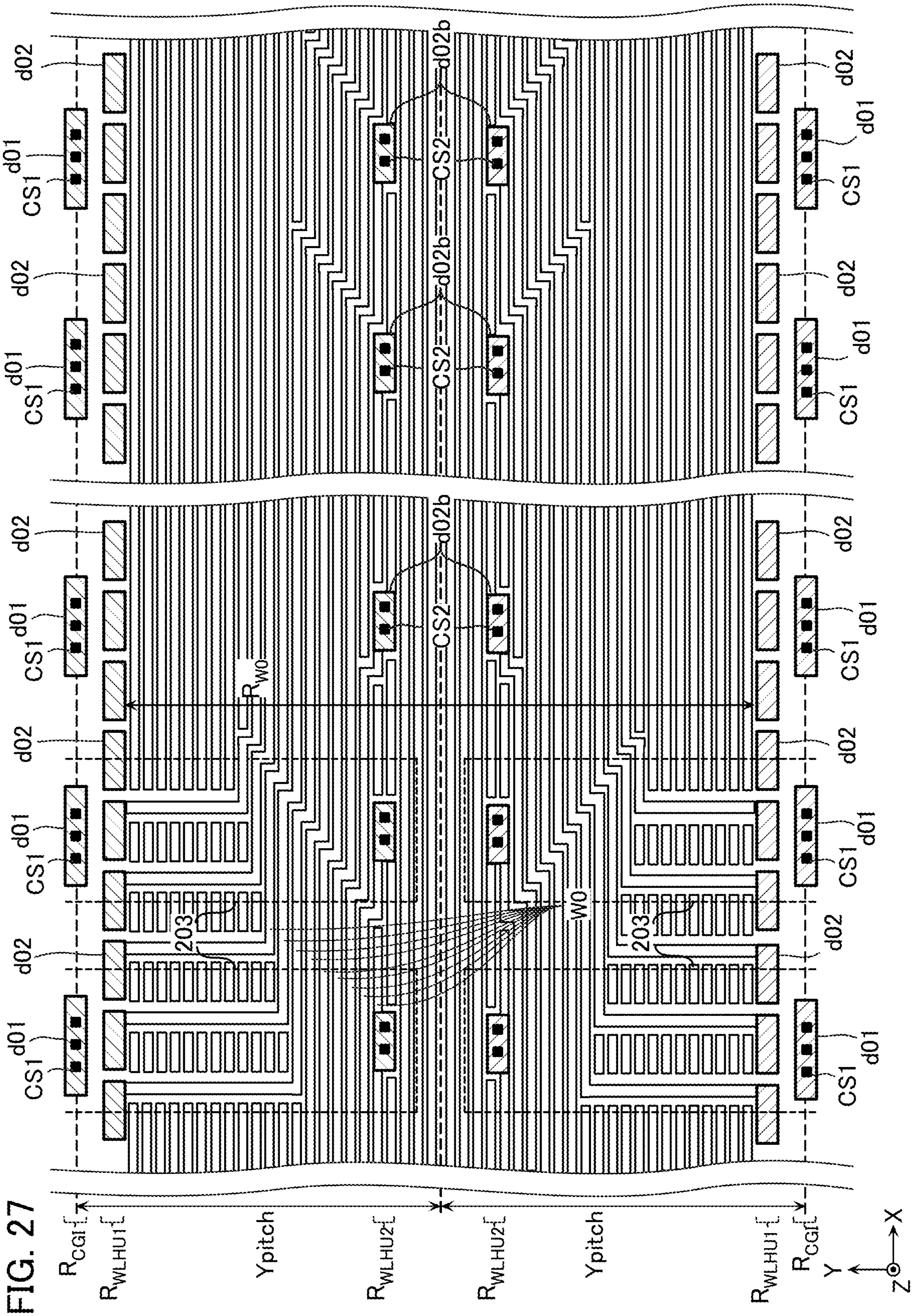
FIG. 27 is a schematic plan view illustrating an example of a wiring pattern in a wiring layer DO.

FIG. 27 is a schematic plan view illustrating an example of a wiring pattern in the wiring layer DO. FIG. 27 illustrates the row control circuit region $R_{RC}$ on the X-direction negative side in the region MP'.

One connecting portion d01 extending in the X-direction is disposed per the pitch Xpitch in the X-direction of one word line switch WLSW. That is, the connecting portions d01 are arranged at regular intervals or predetermined intervals at every Xpitch. The connecting portion d01 is disposed at a position overlapping with the connecting portion d11 when viewed in the Z-direction in the first region $R_{CGI}$ (FIG. 17). The connecting portion d01 is connected to the connecting portion d11 via the via-contact electrode C11, and connected to the source region $R_{SO}$ of the semiconductor region 203 via the via-contact electrode CS1 (FIG. 17).

The three connecting portions d02 extending in the X-direction are disposed per the pitch Xpitch in the X-direction of one word line switch WLSW. That is, the three connecting portions d02 are arranged at regular intervals or predetermined intervals at every Xpitch. The connecting portion d02 is disposed at a position overlapping with the connecting portion d12 when viewed in the Z-direction in the second region $R_{WLHU1}$ (FIG. 17). The three respective connecting portions d02 are connected to the connecting portions d12 via the via-contact electrodes C12.

One connecting portion d02*b* extending in the X-direction is disposed per the pitch Xpitch in the X-direction of one word line switch WLSW. That is, the connecting portions d02*b* are arranged at regular intervals or predetermined intervals by one for every Xpitch. The connecting portion d02*b* is connected to the drain region $R_{DR}$ of the semiconductor region 203 via the via-contact electrode CS2. As illustrated in FIG. 27, the connecting portion d02*b* is disposed in the third region $R_{WLHU2}$.

As illustrated in FIG. 27, a wiring region $R_{W0}$ of the wiring layer DO is disposed between a row of the plurality of connecting portions d02 on one word line switch WLSW side and a row of the plurality of connecting portions d02 on the other word line switch WLSW side among a pair of the word line switches WLSW arranged in the Y-direction. Thus, in the wiring layer DO, the shield wiring and the passing wiring region are not disposed.

In the wiring region $R_{W0}$, a plurality of the hook-up wirings W0 are disposed. The plurality of hook-up wirings W0 extend in the X-direction and are arranged in the Y-direction. The hook-up wiring W0 connects the connecting portion d02 and a connecting portion d02*b* at a position in the X-direction different from the connecting portion d02. In the example of FIG. 27, the hook-up wiring W0 connects the connecting portion d02 and the connecting portion d02*b* at the position on the X-direction positive side with respect to the connecting portion d02. As illustrated in FIG. 27, in a part of the region in the wiring region $R_{W0}$, the hook-up wirings W0 are bent in a crank shape at every predetermined interval while extending in the X-direction. In the other part of the region in the wiring region $R_{W0}$, the hook-up wirings W0 linearly extend in the X-direction without being bent.

The connecting portion d02 to which the hook-up wiring W0 is connected is connected to the connecting portion d12 of the wiring layer D1 via the via-contact electrode C12. The connecting portion d02*b* to which the hook-up wiring W0 is connected is connected to the drain region $R_{DR}$ via the via-contact electrode CS2. Note that the dummy connecting portions d02 unconnected to any of the hook-up wiring W0 or the via-contact electrode C12 are also disposed. The dummy connecting portion d02 is electrically insulated and floating.

In the wiring region $R_{W0}$, similarly to the wiring region $R_{W3}$ to the wiring region $R_{W1}$, for avoiding formation of a space in which the hook-up wiring W0 is not disposed, a dummy wiring unconnected to any of the connecting portions d02, d02*b* is disposed as the hook-up wiring W0.

In FIG. 19 to FIG. 27, the connection between the wiring CGI and the word line switch WLSW and the connection between the word line WL and the word line switch WLSW have been described. However, the connection between the wiring CGI and the select gate line switch SGSW and the connection between the select gate line SG and the select gate line switch SGSW are achieved with the similar configuration.

In FIG. 23, FIG. 25, FIG. 26, and FIG. 27, the hook-up wirings W3, W2, W1, W0 connect connecting portions and connecting portions positioned on the X-direction positive side with respect to the connecting portions. However, the hook-up wirings W3, W2, W1, W0 connect connecting portions and connecting portions positioned on the X-direction negative side with respect to the connecting portions in some cases.

[Wiring Width]

Figure 28:
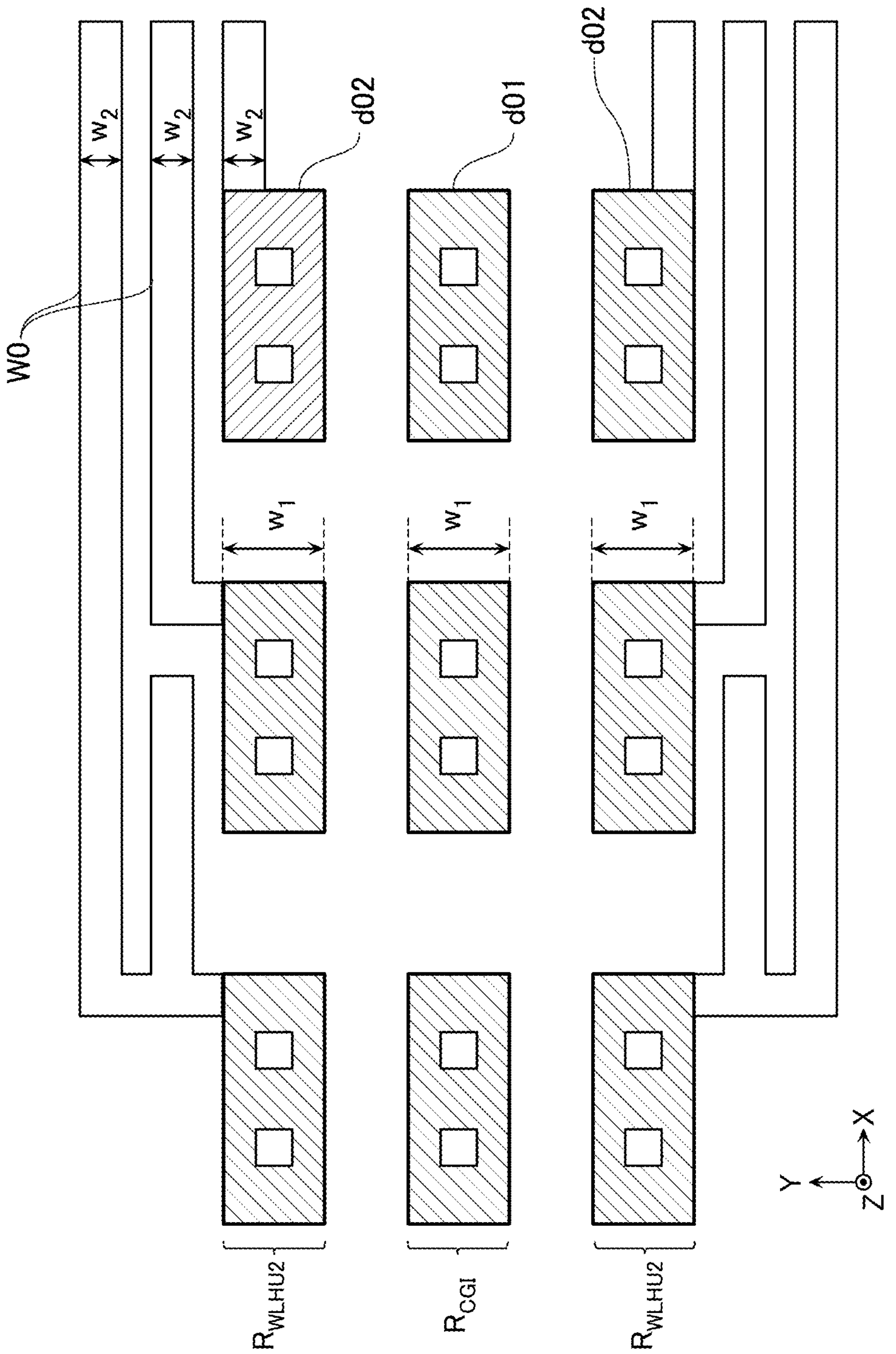
FIG. 28 is a schematic plan view illustrating widths of connecting portions d02 and hook-up wirings W0.

FIG. 28 is a schematic plan view illustrating widths of the connecting portions d02 and the hook-up wirings W0. As illustrated in FIG. 28, assume that the width in the Y-direction of the connecting portion d02 is "$w_1$," and the width of the hook-up wiring W0 is "$w_2$". The width $w_2$ is smaller than the width $w_1$. For example, the width $w_2$ is a half or less of the width $w_1$. However, the width $w_1$ and the width $w_2$ are appropriately adjustable. The relationship of the width in the Y-direction between the connecting portion d02 and the hook-up wiring W0 illustrated in FIG. 28 similarly applies to the relationship of the width in the Y-direction between the connecting portion d12 and the hook-up wiring W1 in the wiring layer D1, and the relationship of the width in the Y-direction between the connecting portion d22 and the hook-up wiring W2 in the wiring layer D2.

The width in the Y-direction of the connecting portion d01 may be same as or different from the width $w_1$ of the connecting portion d02 of FIG. 28. The widths in the Y-direction of the connecting portions d11, d12, d21, d22, d31, d32, d42 may be same as or different from the width $w_1$ of the connecting portion d02. The widths in the Y-direction of the connecting portions d11, d21, d31 may be same as or different from the widths in the Y-direction of the connecting portions d12, d22, d32, respectively. In the example of FIG. 23, while the width in the Y-direction of the hook-up wiring W3 is larger than the widths of the hook-up wirings W0, W1, W2, the widths in the Y-direction of the hook-up wirings W1, W2, W3 may be same as or different from the width $w_2$ of the hook-up wiring W0. The widths in the Y-direction of these connecting portions and wirings are appropriately adjustable. Typically, the width in the Y-direction of the wiring is smaller than the width of the connecting portion.

A ratio between the width in the Y-direction of the shield wiring s3 described with reference to FIG. 22 and FIG. 23 and the width in the Y-direction of the passing wiring TW3 may be, for example, about 1:0.6 to 1:6. That is, the width of the passing wiring TW3 may be smaller than the width of the shield wiring s3, and may be larger than the width of the shield wiring s3. A ratio between the width in the Y-direction of the shield wiring s2 described with reference to FIG. 24 and FIG. 25 and the width in the Y-direction of the passing wiring TW2 may be, for example, 1:0.8 to 1:10. That is, the width in the Y-direction of the passing wiring TW2 also may be smaller than the width in the Y-direction of the shield wiring s2, and may be larger than the width in the Y-direction of the shield wiring s2. The shield wirings s2, s3 may have the same width or different widths.

In FIG. 23, FIG. 25, FIG. 26, and FIG. 27, the widths in the Y-direction and the pitches in the Y-direction of the respective hook-up wirings W3, W2, W1, W0 in the wiring regions $R_{W3}$, $R_{W2}$, $R_{W1}$, $R_{W0}$ and the widths in the Y-direction and the pitches in the Y-direction of the respective passing wirings TW3, TW2 are illustrated to be the same or approximately same widths and pitches. However, the widths in the Y-direction of the hook-up wirings W3, W2, W1, W0 in the wiring regions $R_{W3}$, $R_{W2}$, $R_{W1}$, $R_{W0}$ may be smaller than the widths in the Y-direction of the passing wirings TW3, TW2. The pitches in the Y-direction of the hook-up wirings W3, W2, W1, W0 in the wiring regions $R_{W3}$, $R_{W2}$, $R_{W1}$, $R_{W0}$ may be smaller than the pitches of the passing wirings TW3, TW2. Note that, the above-described widths in the Y-direction of the hook-up wirings W3 to W0 and the passing wirings TW3, TW2 are examples, and are appropriately adjustable. For example, the widths or pitches in the Y-direction of the hook-up wirings W2, W1, W0 in the wiring regions $R_{W2}$, $R_{W1}$, $R_{W0}$ may be smaller than the widths or pitches in the Y-direction of the passing wirings TW3, TW2. Alternatively, the width or pitch in the Y-direction of the hook-up wirings W3 in the wiring region $R_{W3}$ may be smaller than or larger than the width or pitch of the passing wirings TW3.

Figure 29:
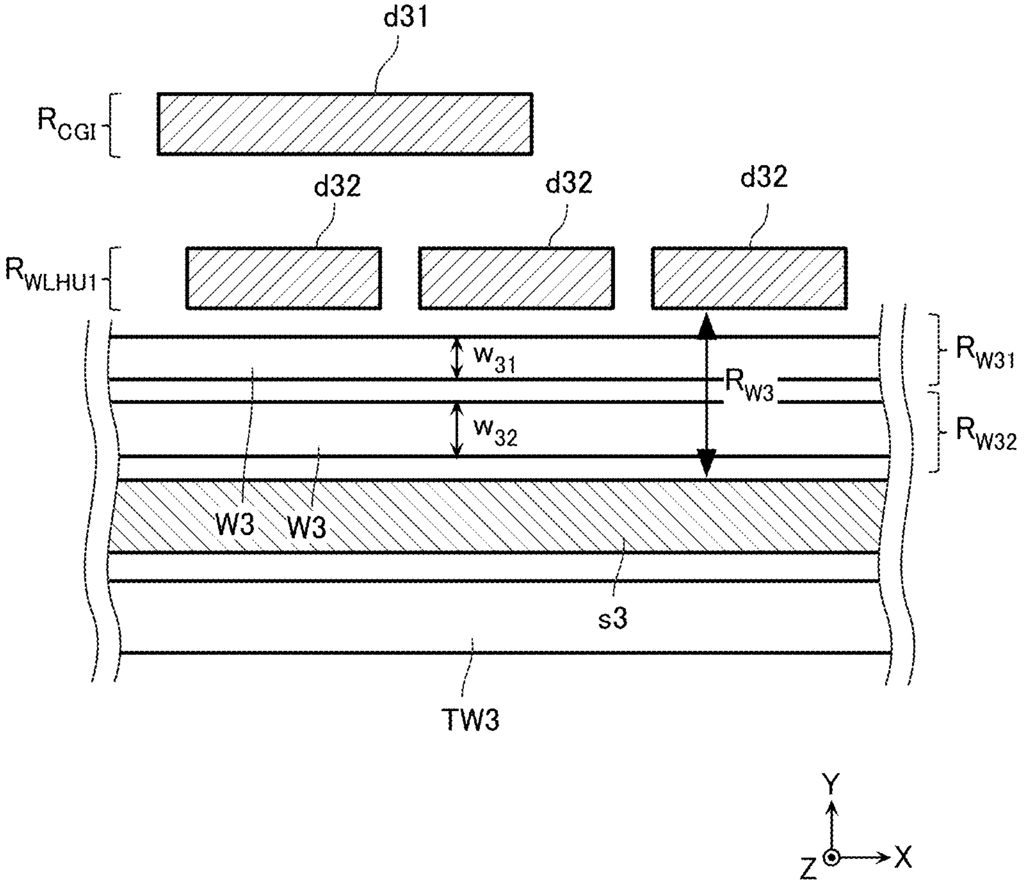
FIG. 29 is a schematic plan view illustrating widths of hook-up wirings W3.

As illustrated in FIG. 29, for example, in a region $R_{W31}$ at a predetermined distance in the Y-direction from the connecting portion d32, the width in the Y-direction of the hook-up wiring W3 is "$w_{31}$". In a region $R_{W32}$ at equal to or more than the predetermined distance in the Y-direction from the connecting portion d32, the width in the Y-direction of the hook-up wiring W3 is "$w_{32}$". The width $w_{32}$ in the Y-direction is larger than the width $w_{31}$ in the Y-direction. Accordingly, it can be avoided that the width in the Y-direction of the wiring sharply changes in a boundary portion between the hook-up wiring W3 and the passing wiring TW3.

Figure 30:
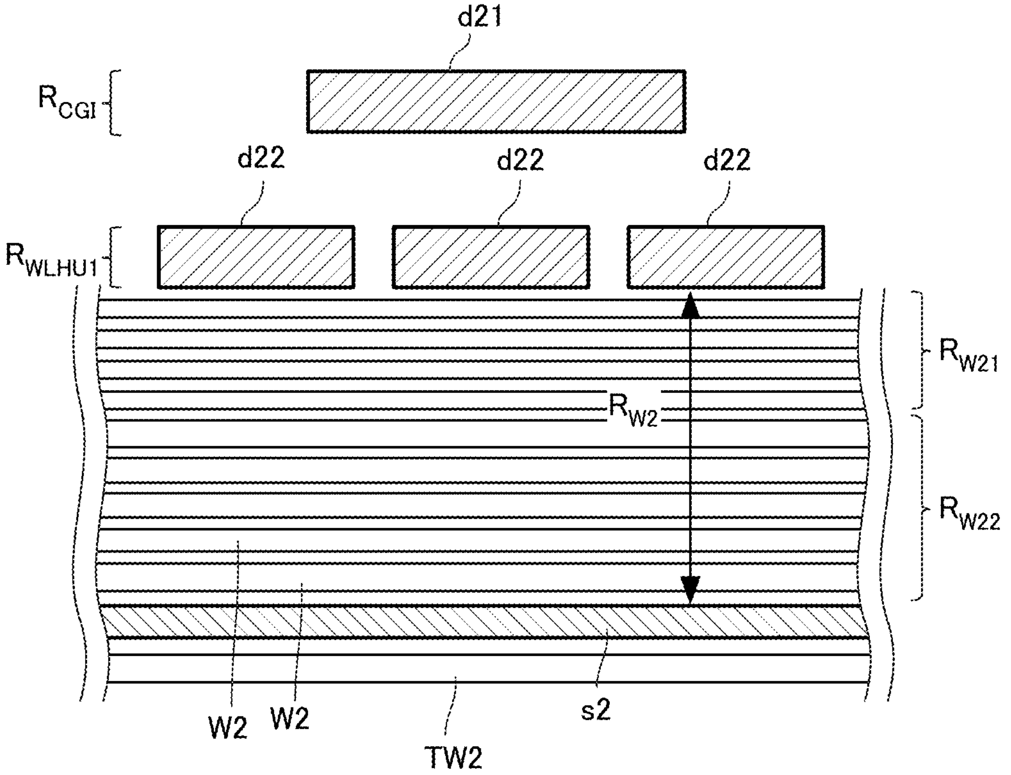
FIG. 30 is a schematic plan view illustrating widths of hook-up wirings W2.

Additionally, as illustrated in FIG. 30, for example, assume that a region at a predetermined distance in the Y-direction from the connecting portion d22 is a region $R_{W21}$, and a region at equal to or more than the predetermined distance in the Y-direction from the connecting portion d22 is a region $R_{W22}$. The width in the Y-direction of the hook-up wiring W2 in the region $R_{W22}$ is larger than the width in the Y-direction of the hook-up wiring W2 in the region $R_{W21}$. Accordingly, it can be avoided that the width in the Y-direction of the wiring sharply changes in a boundary portion between the hook-up wiring W2 and the passing wiring TW2. The width of the hook-up wiring W2 may be increased as the predetermined distance from the connecting portion d22 increases in the Y-direction (as the hook-up wiring W2 becomes close to the shield wiring s2).

Typically, the number of the passing wirings TW3, TW2 to be disposed is larger in the passing wiring regions $R_{TW3}$, $R_{TW2}$ close to the control circuit SYN than that in the passing wiring regions $R_{TW3}$, $R_{TW2}$ far from the control circuit SYN.

When the number of the passing wirings TW3, TW2 in the passing wiring regions $R_{TW3}$, $R_{TW2}$ is small, for example, the dummy passing wirings TW3, TW2 are disposed. The widths in the Y-direction of the passing wirings TW3, TW2 are increased. The same signal is transmitted by two or more passing wirings. Accordingly, it can be avoided that a space in which the passing wirings formed at approximately constant pitches are not disposed is generated.

[Effects]

As described with reference to FIG. 14, when a plurality of the passing wirings TW are disposed over a plurality of the regions MP', the plurality of passing wirings TW are disposed above the row control circuit region $R_{RC}$ in which the word line switch WLSW and the select gate line switch SGSW are disposed. In this case, it is necessary to dispose a plurality of the hook-up wirings W3 to W0, which connect a plurality of the word lines WL (and the select gate line SG) and a plurality of the word line switches WLSW (and the select gate line switch SGSW), and a plurality of the passing wirings TW above the row control circuit region $R_{RC}$.

In this embodiment, the connecting portions d31, d21, d11, d01 connecting the wiring CGI and the word line switch WLSW and the like, and the connecting portions d32, d22, d12, d02 connecting the word line WL and the like and the word line switch WLSW and the like are disposed in the first region $R_{CGI}$ and the second regions $R_{WLHU1}$ at end portions in the Y-direction of the word line switch WLSW and the like. The passing wiring region $R_{TW}$ is disposed between one first region $R_{CGI}$ and second region $R_{WLHU1}$ and the other first region $R_{CGI}$ and second region $R_{WLHU1}$ arranged in the Y-direction. Then, the shield wiring is disposed between the first region $R_{CGI}$, the second region $R_{WLHU1}$, and the passing wiring region $R_{TW}$. With this configuration, the wide wiring region and passing wiring region can be ensured.

With the configuration as described above, the connecting portion and wiring to which the high voltage is applied can be shielded from the passing wiring to which various voltages are applied with the small number of the shield wirings.

Each of the hook-up wirings W3 to W0 has the similar width in the Y-direction, and narrow pitch wiring tends to be used for the hook-up wirings W3 to W0. In this embodiment, since the hook-up wirings W3 to W0 are disposed in the wiring regions $R_{W3}$ to $R_{W0}$, and the passing wirings TW3, TW2 are disposed in the passing wiring regions $R_{TW3}$, $R_{TW2}$, the wirings having the same or similar width in the Y-direction can be collectively disposed.

Since the wide region can be ensured as the passing wiring region $R_{TW}$, the width in the Y-direction of the passing wiring can be appropriately changed according to the signal to be transmitted. For example, the width in the Y-direction of the passing wiring that transmits the voltage (what is referred to as a power line) can be configured to be large, and the width in the Y-direction of the passing wiring that transmits the control signal (what is referred to as a signal line) can be configured to be small. As a result, the signal can be surely transmitted by the passing wiring, and the stability of the operation of the peripheral circuit PC can be achieved.

When the connecting portions d0, d1, d2 and the wirings of the wiring layers DO to D2 are stacked films of a metal film, such as tungsten (W), or the like, and the connecting portions d3, d4 and the wirings of the wiring layers D3, D4 are stacked films of a metal film, such as copper (Cu), or the like, the resistance is smaller in the wiring layers D3, D4 than in the wiring layers DO to D2. In this case, the passing wiring that transmits the voltage may be disposed in the wiring layer D3 having the comparatively small resistance, and the passing wiring that transmits the control signal may be disposed in the wiring layer D2 having the comparatively large resistance.

Second Embodiment

[Structure of Memory Die MD2]

Figure 31:
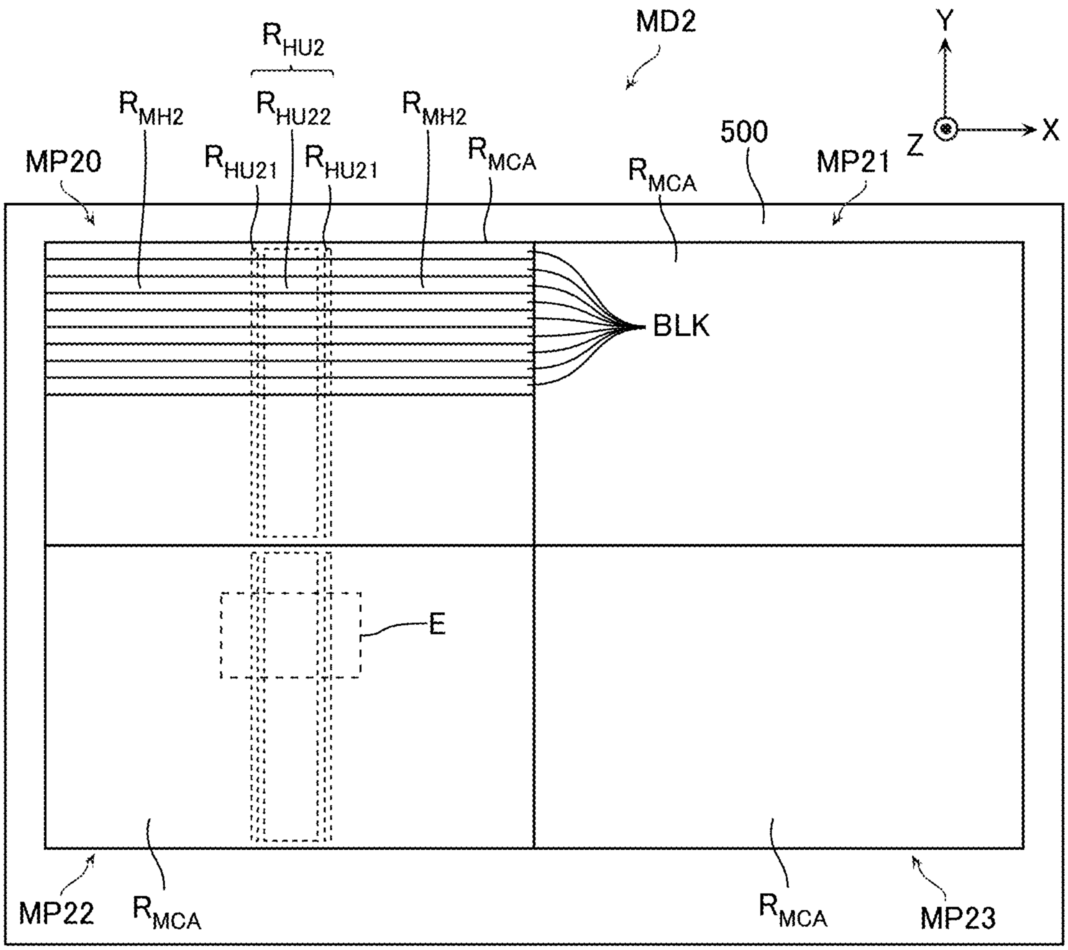
FIG. 31 is a schematic plan view illustrating an exemplary configuration of a memory die MD2 according to a second embodiment.
Figure 32:
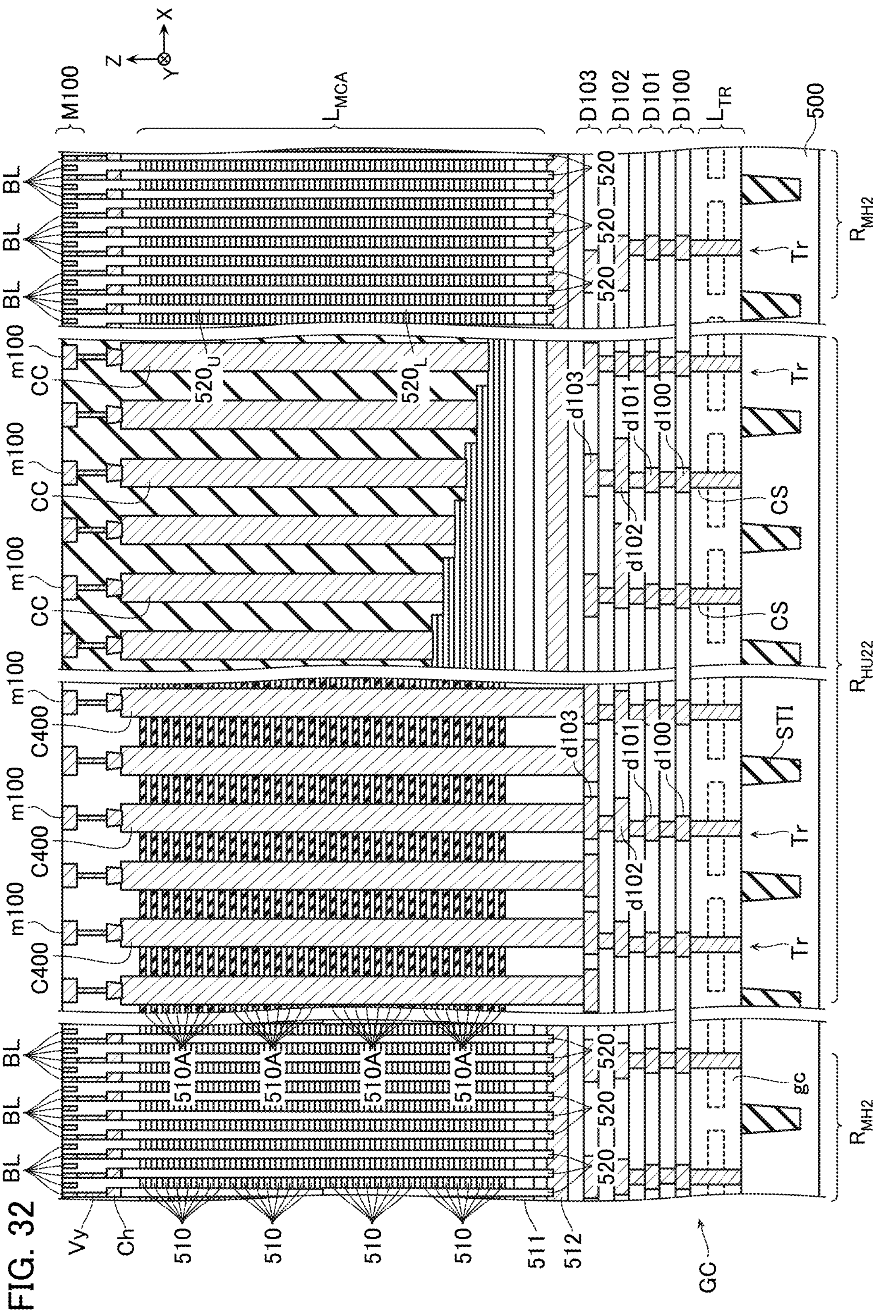
FIG. 32 is a schematic cross-sectional view illustrating an exemplary configuration of the memory die MD2.
Figure 33:
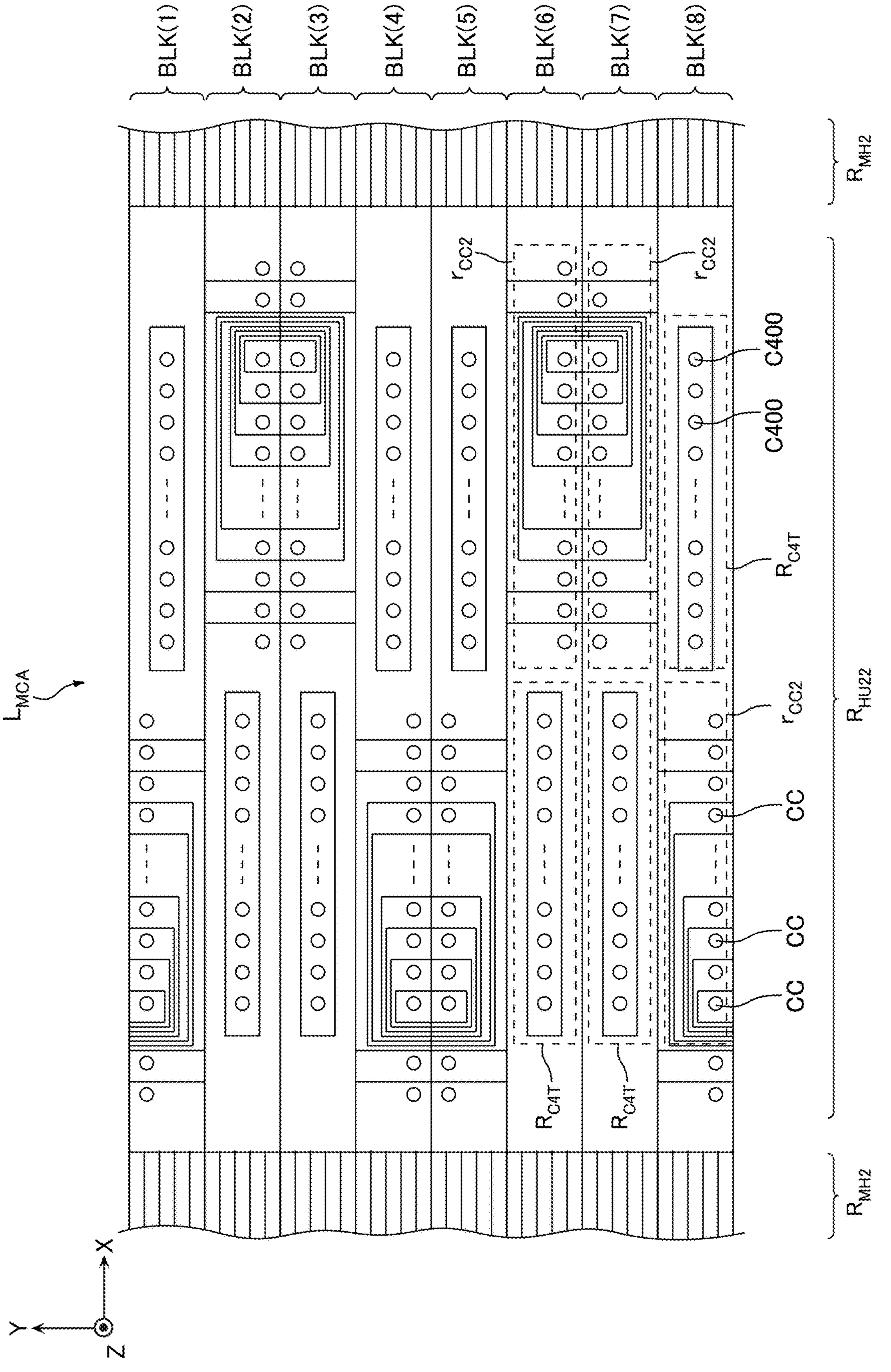
FIG. 33 is a schematic enlarged view of a part indicated by E in FIG. 31.

FIG. 31 is a schematic plan view illustrating an exemplary configuration of the memory die MD2 according to the second embodiment. FIG. 32 is a schematic cross-sectional view illustrating an exemplary configuration of the memory die MD2. FIG. 32 is a diagram for describing a schematic configuration of the memory die MD2, and does not illustrate the specific number, shape, arrangement, or the like of the configurations. FIG. 33 is a schematic enlarged view of a part indicated by E in FIG. 31. In FIG. 33, a part of the configurations of FIG. 31 (first hook-up region $R_{HU21}$ described later) is omitted.

For example, as illustrated in FIG. 31, the memory die MD2 includes a semiconductor substrate 500. In the example illustrated in the drawing, the semiconductor substrate 500 includes four memory planes MP20 to MP23 arranged in the X-direction and the Y-direction. Each of memory cell array regions $R_{MCA}$ of the memory planes MP20 to MP23 includes two memory hole regions $R_{MH2}$ (memory regions) arranged in the X-direction, two first hook-up regions $R_{HU21}$ arranged in the X-direction between these two memory hole regions $R_{MH2}$, and a second hook-up region $R_{HU22}$ disposed between these two first hook-up regions $R_{HU21}$. The first hook-up region $R_{HU21}$ and the second hook-up region $R_{HU22}$ are referred to as a hook-up region $R_{HU2}$ in some cases.

For example, as illustrated in FIG. 32, the memory die MD2 includes the semiconductor substrate 500, a transistor layer $L_{TR}$ disposed on the semiconductor substrate 500, a wiring layer D100 disposed above the transistor layer $L_{TR}$, a wiring layer D101 disposed above the wiring layer D100, a wiring layer D102 disposed above the wiring layer D101, a wiring layer D103 disposed above the wiring layer D102, a wiring layer M100 disposed above the memory cell array layer $L_{MCA}$, and a wiring layer (not illustrated) disposed above the wiring layer M100.

[Structure of Semiconductor Substrate 500]

The semiconductor substrate 500 contains, for example, P-type silicon (Si) containing P-type impurities, such as boron (B). On the surface of the semiconductor substrate 500, an N-type well region containing N-type impurities, such as phosphorus (P), a P-type well region containing P-type impurities, such as boron (B), a semiconductor substrate region in which the N-type well region or the P-type well region is not disposed, and an insulating region STI are disposed.

[Structure of Transistor Layer $L_{TR}$]

For example, as illustrated in FIG. 32, the electrode layer GC is disposed on the upper surface of the semiconductor substrate 500 via an insulating layer (not illustrated). The electrode layer GC includes the plurality of electrodes gc opposed to the surface of the semiconductor substrate 500. Each region of the semiconductor substrate 500 and each of the plurality of electrodes gc included in the electrode layer GC are connected to the via-contact electrode CS. The electrode layer GC, the electrodes gc, and the via-contact electrodes CS in FIG. 32 correspond to the electrode layer GC, the electrodes gc, and the via-contact electrodes CS illustrated in FIG. 7 and the like.

The respective N-type well region, P-type well region, and semiconductor substrate region of the semiconductor substrate 500 function as channel regions of the plurality of transistors Tr, one electrodes of the plurality of capacitors, and the like constituting the peripheral circuit PC.

The via-contact electrode CS extends in the Z-direction and has a lower end connected to the semiconductor substrate 500 or the upper surface of the electrode gc. An impurity region containing N-type impurities or P-type impurities is disposed in a connection part of the via-contact electrode CS and the semiconductor substrate 500. The via-contact electrode CS may include, for example, a stacked film of a barrier conductive film, such as titanium nitride (TiN), and a metal film, such as tungsten (W).

[Structure of Wiring Layers D100, D101, D102, D103]

For example, as illustrated in FIG. 32, the plurality of connecting portions and the plurality of wirings included in the wiring layers D100, D101, D102, D103 are electrically connected to at least one of the configuration in the memory cell array MCA and the configuration in the peripheral circuit PC.

The wiring layers D100, D101, D102, D103 include a plurality of connecting portions d100, d101, d102, d103, respectively, and a plurality of wirings. These plurality of connecting portions d100, d101, d102, d103 and the plurality of wirings may include, for example, a stacked film of a barrier conductive film, such as titanium nitride (TiN), and a metal film, such as tungsten (W).

The configurations of the connecting portions d100, d101, d102, d103 and the plurality of wirings in the wiring layers D100, D101, D102, D103, D104 will be described later (see FIG. 36).

[Structure of Memory Cell Array Layer $L_{MCA}$ in Memory Hole Region $R_{MH2}$]

For example, as illustrated in FIG. 32, in the memory cell array layer $L_{MCA}$, the plurality of memory blocks BLK arranged in the Y-direction are disposed. The memory block BLK basically has a configuration similar to the configuration of the above-described first embodiment.

Here, the plurality of conductive layers 110 and the plurality of insulating layers 111 in the first embodiment correspond to a plurality of conductive layers 510 and a plurality of insulating layers 510A in the second embodiment. The plurality of semiconductor layers 120 in the first embodiment correspond to a plurality of semiconductor layers 520 in the second embodiment. While the conductive layer 100 functions as the source line SL in the first embodiment, a conductive layer 512 functions as the source line SL in the second embodiment. While the plurality of bit lines BL are connected to the lower ends of the plurality of semiconductor layers 120 in the first embodiment, the plurality of bit lines BL are connected to upper ends of the plurality of semiconductor layers 520 in the second embodiment.

For example, as illustrated in FIG. 32, the memory block BLK includes the plurality of conductive layers 510 arranged in the Z-direction and the plurality of semiconductor layers 520 extending in the Z-direction. The plurality of memory blocks BLK correspond to a plurality of stacked structures.

For example, as illustrated in FIG. 32, a conductive layer 511 is disposed below the conductive layers 510. The conductive layer 511 may contain, for example, polycrystalline silicon containing impurities, such as phosphorus (P) or boron (B). Between the conductive layer 511 and the conductive layers 510, an insulating layer, such as silicon oxide ($SiO_2$), is disposed.

The conductive layer 511 functions as the source-side select gate line SGS and gate electrodes of the plurality of source-side select transistors STS connected to the source-side select gate line SGS. Among the plurality of conductive layers 510, one or a plurality of conductive layers 510 positioned at the lowermost layer function as the source-side select gate line SGS and the gate electrodes of the plurality of source-side select transistors STS connected to the source-side select gate line SGS.

A plurality of conductive layers 510 positioned above the one or plurality of conductive layers 510 positioned at the lowermost layer function as a part of the word lines WL and gate electrodes of the plurality of memory cells MC connected to the word lines WL.

One or a plurality of conductive layers 510 positioned above the plurality of conductive layers 510 functioning as the part of the word lines WL function as the drain-side select gate line SGD and gate electrodes of a plurality of the drain-side select transistors STD connected to the drain-side select gate line SGD.

The semiconductor layer 520 has an upper end connected to the bit line BL via the via-contact electrodes ch, Vy.

[Structure of Memory Cell Array Layer $L_{MCA}$ in Second Hook-Up Region $R_{HU22}$]

As illustrated in FIG. 33, in the second hook-up region $R_{HU22}$, a plurality of contact connection sub-regions $r_{CC2}$ and a plurality of contact connection regions $R_{C4T}$ are disposed corresponding to the plurality of memory blocks BLK.

The contact connection sub-region $r_{CC2}$ includes a part of the plurality of conductive layers 510 functioning as the word lines WL or the source-side select gate lines SGS. The contact connection sub-region $r_{CC2}$ includes the plurality of via-contact electrodes CC arranged in the X-direction when viewed in the Z-direction. These plurality of via-contact electrodes CC are connected to the respective conductive layers 510.

A plurality of via-contact electrodes C400 are arranged in the X-direction. For example, as illustrated in FIG. 32, the via-contact electrode C400 extends in the Z-direction, has an upper end connected to a wiring m100 in the wiring layer M100, and has a lower end connected to the connecting portion d103 in the wiring layer D103.

These plurality of via-contact electrodes CC are connected to the drain electrodes of the transistors Tr via the wiring m100 and the like in the wiring layer M100 and the like, the via-contact electrodes C400, the connecting portions d100 (d1002), d101 (d1012), d102 (d1022), d103 (d1032) in the wiring layers D100, D101, D102, D103, and the via-contact electrodes CS (CS2).

Although not illustrated, in the first hook-up region $R_{HU21}$ of the memory cell array layer $L_{MCA}$, end portions in the X-direction of the plurality of conductive layers 510 functioning as the drain-side select gate lines SGD are disposed. In the first hook-up region $R_{HU21}$, the plurality of via-contact electrodes CC arranged in a matrix when viewed in the Z-direction are disposed. These plurality of via-contact electrodes CC extend in Z-direction, and have lower ends connected to the conductive layers 510.

These plurality of via-contact electrodes CC are connected to the drain region $R_{DR}$ of the word line switch WLSW or the select gate line switch SGSW (transistor Tr) via the wiring m100 and the like in the wiring layer M100 and the like, the via-contact electrodes C400, the connecting portions d100 (d1002), d101 (d1012), d102 (d1022), d103 (d1032) in the wiring layers D100, D101, D102, D103, and the via-contact electrodes CS (CS2).

[Structure of Wiring Layer M100 and the Like]

As illustrated in FIG. 32, the plurality of wirings included in the wiring layer M100 are electrically connected to, for example, at least one of the configuration in the memory cell array layer $L_{MCA}$ and the configuration in the transistor layer $L_{TR}$.

The wiring layer M100 includes the plurality of wirings m100. These plurality of wirings m100 may include, for example, a stacked film of a barrier conductive film, such as titanium nitride (TiN) and tantalum nitride (TaN), and a metal film, such as copper (Cu).

A part of the plurality of wirings m100 function as the bit lines BL. The bit lines BL are arranged in the X-direction and extend in the Y-direction. Each of these plurality of bit lines BL is connected to one semiconductor layer 520 included in each of the string units SU.

As described above, wiring layers are further disposed above the wiring layer M100. Each of these wiring layers includes a plurality of wirings. These plurality of wirings may include, for example, a stacked film of a barrier conductive film, such as titanium nitride (TiN) and tantalum nitride (TaN), and a metal film, such as copper (Cu).

[Control Circuit SYN and Passing Wiring TW]

Figure 34:
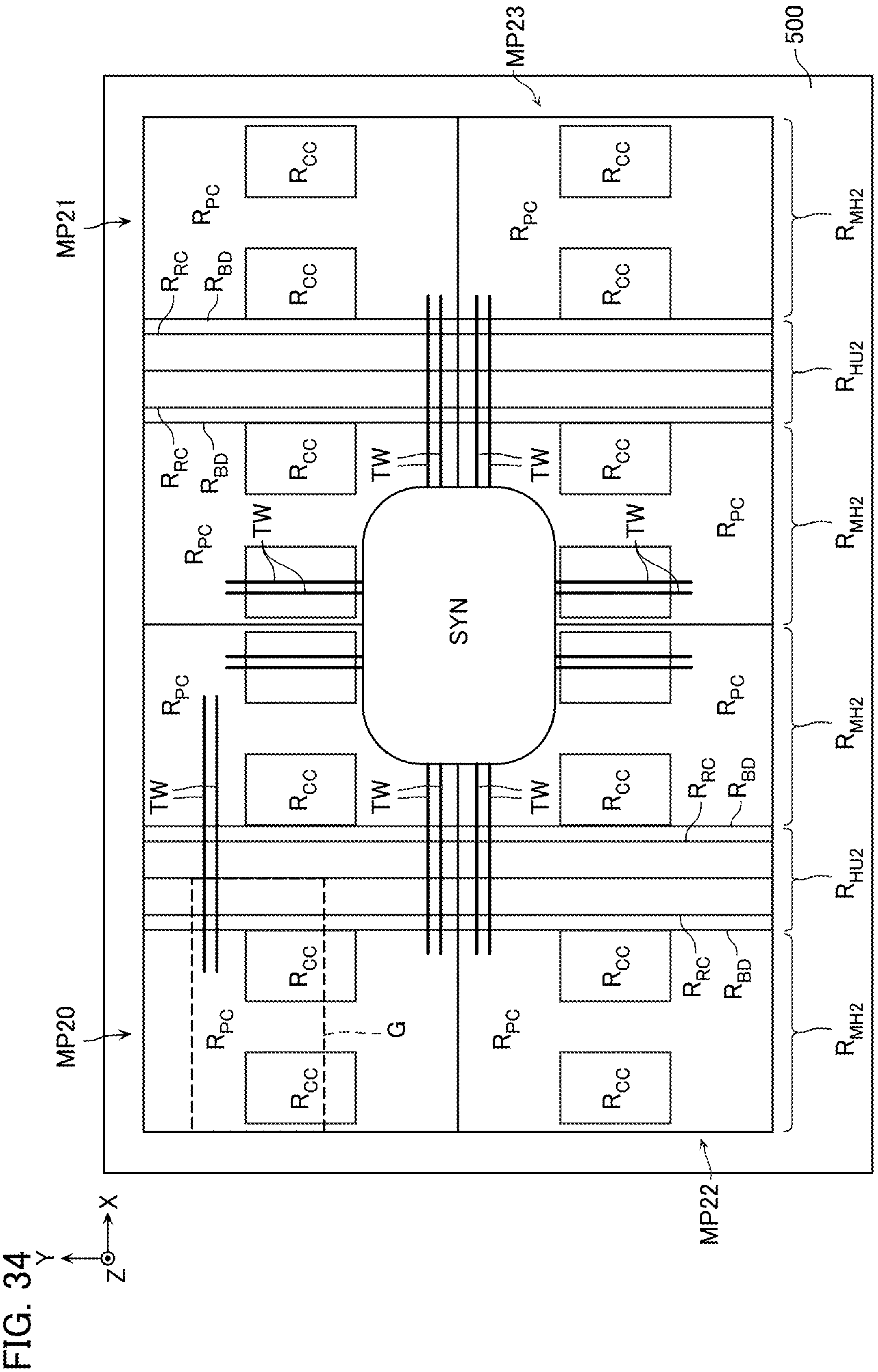
FIG. 34 is a schematic plan view illustrating an exemplary configuration of a semiconductor substrate 500 according to the second embodiment.
Figure 35:
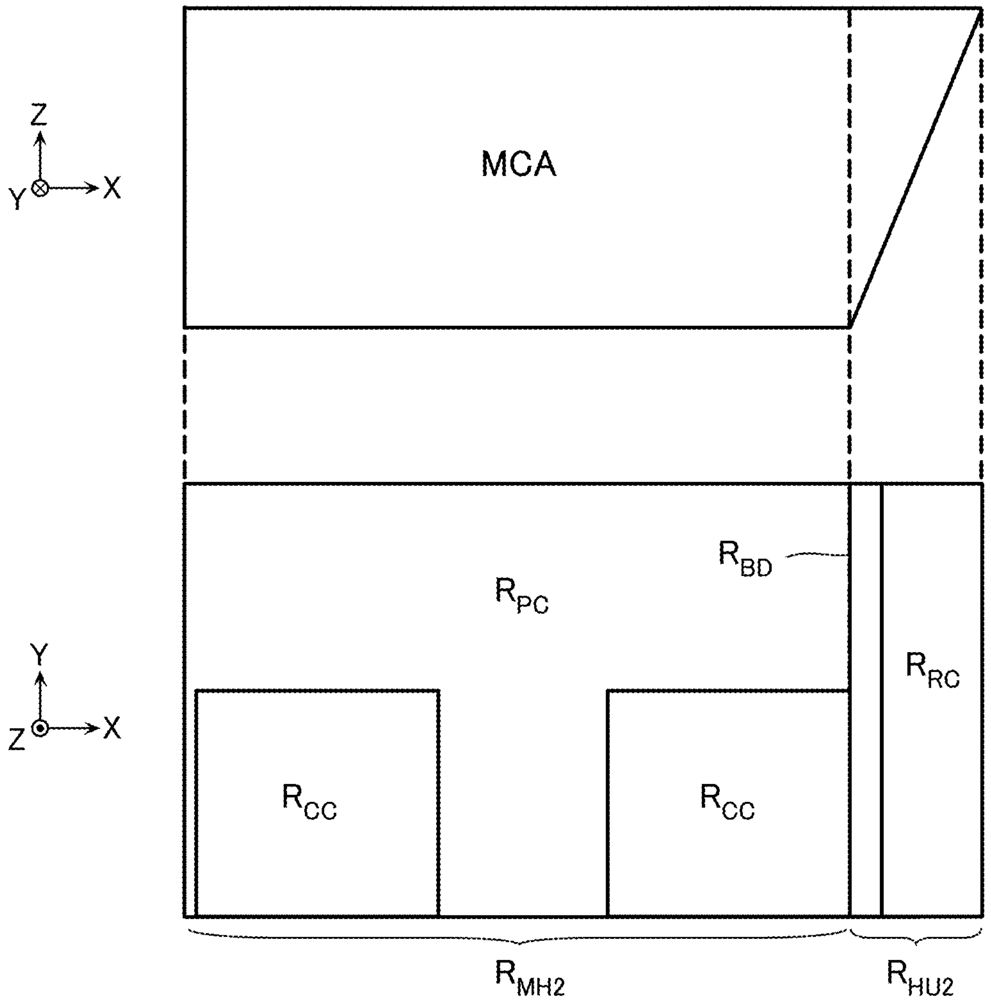
FIG. 35 is a schematic enlarged view of a part indicated by G in FIG. 34.

FIG. 34 is a schematic plan view illustrating an exemplary configuration of the semiconductor substrate 500 according to the second embodiment. FIG. 35 is a schematic enlarged view of a part indicated by G in FIG. 34. FIG. 35 also illustrates the configuration of the memory cell array MCA (a part of the X—Z cross-sectional surface) corresponding to the configuration of the semiconductor substrate 500 (a part of the X-Y plane indicated by G in FIG. 34).

As illustrated in FIG. 34, the semiconductor substrate 500 includes the four memory planes MP20 to MP23 arranged in the X-direction and the Y-direction. In each of the center portions of these four memory planes MP20 to MP23, the two row control circuit regions $R_{RC}$ arranged in the X-direction are disposed. The two block decoder regions $R_{BD}$ arranged on the X-direction negative side and positive side of these two row control circuit regions $R_{RC}$ are disposed. The two peripheral circuit regions $R_{PC}$ arranged on the X-direction negative side and positive side of these two block decoder regions $R_{BD}$ are disposed. The two column control circuit regions $R_{CC}$ arranged in the X-direction are disposed in each of the two peripheral circuit regions $R_{PC}$.

In the example of FIG. 34 and FIG. 35, the row control circuit region $R_{RC}$ is disposed in the hook-up region $R_{HU2}$. The peripheral circuit region $R_{PC}$ is disposed in the memory hole region $R_{MH2}$.

In the example of FIG. 34, the control circuit SYN is disposed in the center portion of the four memory planes MP20 to MP23. At the control circuit SYN, a plurality of the passing wirings TW connect between the peripheral circuits PC inside the memory plane MP, and connect between the peripheral circuits PC of the plurality of memory planes MP. As illustrated in FIG. 34, the plurality of passing wirings TW extending in the X-direction and the Y-direction are disposed inside the memory planes MP, and disposed over the plurality of memory planes MP. These plurality of passing wirings TW are formed in, for example, the wiring layer D102.

[Connection Between Via-Contact Electrode C400 and Word Line Switch WLSW, and Connection Between Wiring CGI and Word Line Switch WLSW]

Each layer of the conductive layers 510 in the memory block BLK(1) of FIG. 33 is connected to the via-contact electrodes CS2 of a plurality of the word line switches WLSW(1), (2) disposed at positions overlapping with the memory blocks BLK(1), (2) when viewed in the Z-direction via the plurality of via-contact electrodes CC in the contact connection sub-region $r_{CC2}$ corresponding to the memory block BLK(1), the plurality of via-contact electrodes C400 in the contact connection region $R_{C4T}$ corresponding to the memory block BLK(1), and the wiring layers D103 to D100.

Each layer of the conductive layers 510 in the memory block BLK(2) is connected to the via-contact electrodes CS2 of the plurality of word line switches WLSW(1), (2) disposed at positions overlapping with the memory blocks BLK(1), (2) when viewed in the Z-direction via the plurality of via-contact electrodes CC in the contact connection sub-region $r_{CC2}$ corresponding to the memory block BLK (2), the plurality of via-contact electrodes C400 in the contact connection region $R_{C4T}$ corresponding to the memory block BLK(2), and the wiring layers D103 to D100.

The connection between the conductive layers 510 and the word line switches WLSW in the memory blocks BLK (3) to BLK(8) is similar to the connection between the conductive layers 510 and the word line switches WLSW in the memory blocks BLK(1), BLK(2). Thus, the conductive layers 510 in the memory blocks BLK(1) to (8) are connected to the word line switches WLSW(1) to WLSW(8) disposed at the positions overlapping with the memory blocks BLK(1) to (8) when viewed in the Z-direction, respectively. Accordingly, the two word line switches WLSW adjacent in the Y-direction are connected to the conductive layers 510 in the different memory blocks BLK (the memory blocks BLK adjacent in the Y-direction). The wirings in the two wiring regions adjacent in the Y-direction are connected to the conductive layers 510 in the different memory blocks BLK. Note that the same applies to the connection between the select gate line SG and the select gate line switch SGSW.

Figure 36:
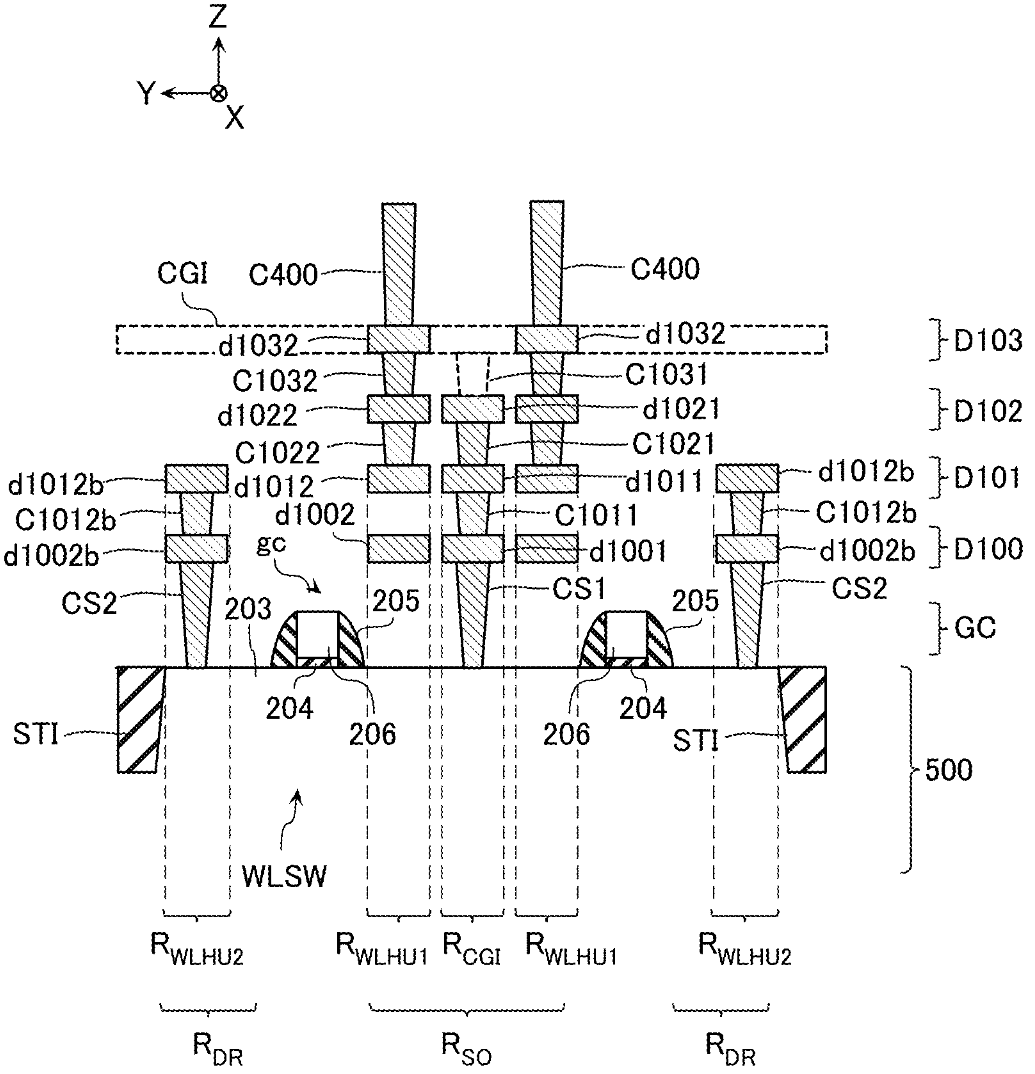
FIG. 36 is a schematic cross-sectional view illustrating structures of the word line switch WLSW, connecting portions, and via-contact electrodes according to the second embodiment.

FIG. 36 is a schematic cross-sectional view illustrating structures of the word line switch WLSW, connecting portions, and via-contact electrodes according to the second embodiment. FIG. 36 is a diagram corresponding to FIG. 17 in the first embodiment. In FIG. 36, the same reference numerals are given to the configurations same as the configurations of FIG. 17, and the overlapping explanation will be omitted.

In the first embodiment, the five wiring layers DO to D4 are disposed as the wiring layers (FIG. 17). In contrast to this, in the second embodiment, the four wiring layers D100, D101, D102, D103 are disposed as the wiring layers. In the first embodiment, the bonding electrode $P_{I2}$ is connected to the connecting portion d42 of the wiring layer D4 (FIG. 17). In contrast to this, in the second embodiment, the lower end of the via-contact electrode C400 is connected to the connecting portion d1032 of the wiring layer D103. In the first embodiment, the wiring CGI is disposed in the wiring layer D4 (FIG. 17). In contrast to this, in the second embodiment, the wiring CGI is disposed in, for example, the wiring layer D103. For the configuration excluding the above-described differences, the configuration of the first embodiment is basically same as the configuration of the second embodiment.

Via-contact electrodes C1031, C1021, C1011, CS1 and connecting portions d1021, d1011, d1001 are via-contact electrodes and connecting portions for connecting the wiring CGI and the source region $R_{SO}$ of the semiconductor region 203.

For example, assume that the via-contact electrode C1031 in FIG. 36 corresponds to the via-contact electrode C41 in FIG. 17, the connecting portion d1021 and the via-contact electrode C1021 in FIG. 36 correspond to the connecting portion d21 and the via-contact electrode C21 in FIG. 17, the connecting portion d1011 and the via-contact electrode C1011 in FIG. 36 correspond to the connecting portion d11 and the via-contact electrode C11 in FIG. 17, and the connecting portion d1001 and the via-contact electrode CS1 in FIG. 36 correspond to the connecting portion d01 and the via-contact electrode CS1 in FIG. 17. In this case, the connecting portion d31 and the via-contact electrode C31 in FIG. 17 are removed. Note that the connecting portion d21 and the via-contact electrode C21 in FIG. 17 may be removed, or the connecting portion d11 and the via-contact electrode C11 in FIG. 17 may be removed.

With this configuration, also in the configuration of the second embodiment, similarly to the configuration of the first embodiment, the wiring CGI can be electrically connected to the source region $R_{SO}$ of the word line switch WLSW. For example, the wiring layer D103 has the configuration illustrated in FIG. 20, the wiring layer D102 has the configuration illustrated in FIG. 24 and FIG. 25, the wiring layer D101 has the configuration illustrated in FIG. 26, and the wiring layer D100 has the configuration illustrated in FIG. 27.

Via-contact electrodes C1032, C1022, C1012 (C1012*b*), CS2 and the connecting portions d1032, d1022, d1012 (d1012*b*), d1002 (d1002*b*) are via-contact electrodes and connecting portions for connecting the via-contact electrode C400 and the drain region $R_{DR}$ of the semiconductor region 203.

For example, assume that the connecting portion d1032 and the via-contact electrode C1032 in FIG. 36 correspond to the connecting portion d42 and the via-contact electrode C42 in FIG. 17, the connecting portion d1022 and the via-contact electrode C1022 in FIG. 36 correspond to the connecting portion 22 and the via-contact electrode C22 in FIG. 17, the connecting portions d1012, d1012*b* and the via-contact electrode C1012*b* in FIG. 36 correspond to the connecting portions d12, d12*b* and the via-contact electrode C12*b* in FIG. 17, and the connecting portions d1002, d1002*b* and the via-contact electrode CS2 in FIG. 36 correspond to the connecting portions d02, d02*b* and the via-contact electrode CS2 in FIG. 17. In this case, the connecting portion d32 and the via-contact electrode C32 in FIG. 17 are removed.

With this configuration, also in the configuration of the second embodiment, similarly to the configuration of the first embodiment, the via-contact electrode C400 can be electrically connected to the source region $R_{SO}$ of the word line switch WLSW. For example, the wiring layer D103 has the configuration illustrated in FIG. 20, the wiring layer D102 has the configuration illustrated in FIG. 24 and FIG. 25, the wiring layer D101 has the configuration illustrated in FIG. 26, and the wiring layer D100 has the configuration illustrated in FIG. 27. Note that in the case of the above-described configuration, the passing wiring region $R_{TW}$ is disposed in the wiring layer D102.

In FIG. 36, the connecting portions d1031, d1032 of the wiring layer D103 correspond to the connecting portion d103 in FIG. 32. The connecting portions d1021, d1022 of the wiring layer D102 correspond to the connecting portion d102 in FIG. 32. The connecting portions d1011, d1012 (d1012*b*) of the wiring layer D101 correspond to the connecting portion d101 in FIG. 32. The connecting portions d1001, d1002 (d1002*b*) of the wiring layer D100 correspond to the connecting portion d100 in FIG. 32.

While FIG. 36 illustrates the configuration of the word line switch WLSW, the same applies to the configuration of the select gate line switch SGSW.

Also with the configuration as described above, the connecting portion and the wiring to which the high voltage is applied can be shielded from the passing wiring to which various voltages are applied with the small number of the shield wirings, and the wide wiring region and passing wiring region can be ensured.

Third Embodiment

Figure 37:
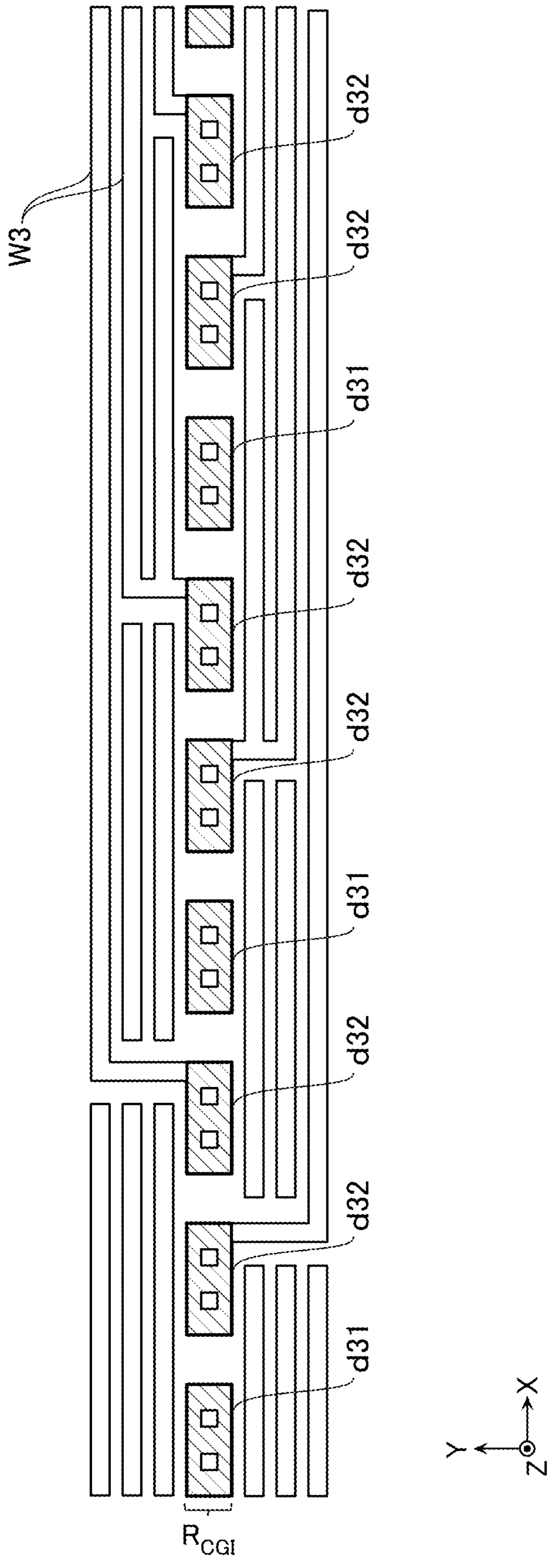
FIG. 37 is a schematic plan view illustrating positions of the connecting portions d31, d32 disposed in the wiring layer D3 according to a third embodiment.

FIG. 37 is a schematic plan view illustrating positions of the connecting portions d31, d32 disposed in the wiring layer D3 according to the third embodiment. In FIG. 37, the same reference numerals are given to the configurations same as the configurations of FIG. 21 and FIG. 22, and the overlapping explanation will be omitted.

In the configuration of the first embodiment, the connecting portion d31 is disposed in the first region $R_{CC}$z, and the connecting portion d32 is disposed in the second region $R_{WLHU1}$ (FIG. 21 and FIG. 22). In contrast to this, in the configuration of the third embodiment, both of the connecting portions d31, d32 have been disposed in the first region $R_{CGI}$ (FIG. 37). In the example of FIG. 37, the connecting portions d31, d32 are arranged in the X-direction in a row, and the connecting portion d31 is disposed between the two connecting portions d32. With this configuration, the second region $R_{WLHU1}$ can be removed, and any one or both of the wiring region $R_{W3}$ and the passing wiring region $R_{TW3}$ can be enlarged by the size of the second region $R_{WLHU1}$.

While the connecting portions d31, d32 of the wiring layer D3 are described in FIG. 37, the same pattern is applicable to the connecting portions d21, d22 of the wiring layer D2, the connecting portions d11, d12 of the wiring layer D1, and the connecting portions d01, d02 of the wiring layer DO. In this case, the connecting portions d31, d21, d11, d01 overlap when viewed in the Z-direction, and the connecting portions d32, d22, d12, d02 overlap when viewed in the Z-direction.

Fourth Embodiment

Figure 38:
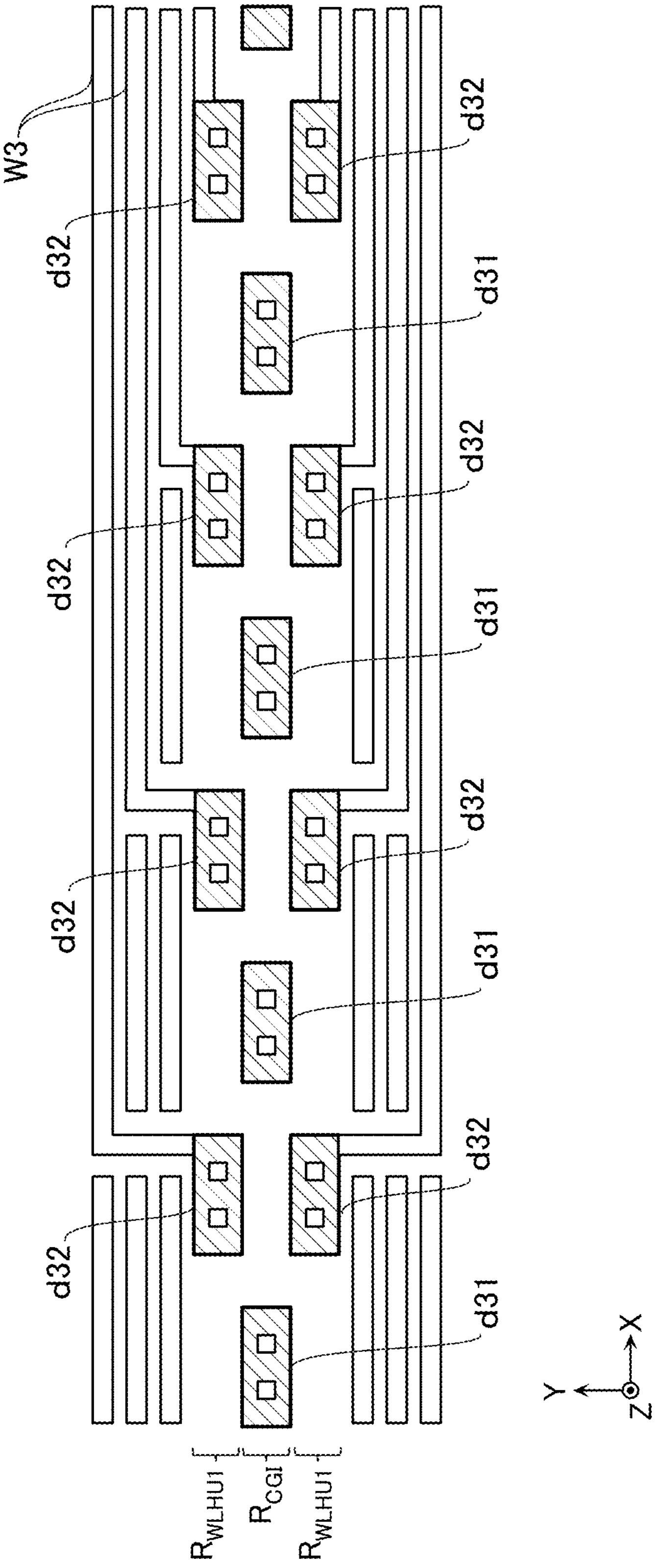
FIG. 38 is a schematic plan view illustrating positions of the connecting portions d31, d32 disposed in the wiring layer D3 according to a fourth embodiment.

FIG. 38 is a schematic plan view illustrating positions of the connecting portions d31, d32 disposed in the wiring layer D3 according to the fourth embodiment. In FIG. 38, the same reference numerals are given to the configurations same as the configurations of FIG. 21 and FIG. 22, and the overlapping explanation will be omitted.

In the configuration of the fourth embodiment, the connecting portion d31 is disposed in the first region $R_{CGI}$, and the connecting portion d32 is disposed in the second region $R_{WLHU1}$. In the configuration of the first embodiment, the first region $R_{CGI}$ and the second region $R_{WLHU1}$ are positioned to be spaced in the Y-direction by about a necessary inter-wiring distance. In contrast to this, in the configuration of the fourth embodiment, the first region $R_{CGI}$ and the second region $R_{WLHU1}$ are mutually in contact in the Y-direction, or have a distance lee than the necessary inter-wiring distance in the Y-direction. In the example of FIG. 38, the connecting portion d31 of the first region $R_{CGI}$ and the two connecting portions d32, which are arranged to be spaced in the X-direction by a predetermined distance in the second regions $R_{WLHU1}$ adjacent to the first region $R_{CGI}$, are alternately arranged in the X-direction. The connecting portion d31 does not overlap with the connecting portion d32 in the Y-direction. With this configuration, a blank region positioned between the first region $R_{CGI}$ and the second region $R_{WLHU1}$ can be reduced or eliminated, and any one or both of the wiring region $R_{W3}$ and the passing wiring region $R_{TW3}$ can be enlarged by the size of the blank region. Note that the first region $R_{CGI}$ may partially overlap with the second region $R_{WLHU1}$ in the Y-direction.

While the connecting portions d31, d32 of the wiring layer D3 have been described in FIG. 38, the same pattern is applicable to the connecting portions d21, d22 of the wiring layer D2, the connecting portions d11, d12 of the wiring layer D1, and the connecting portions d01, d02 of the wiring layer DO. In this case, the connecting portions d31, d21, d11, d01 overlap when viewed in the Z-direction, and the connecting portions d32, d22, d12, d02 overlap when viewed in the Z-direction.

Fifth Embodiment

Figure 39:
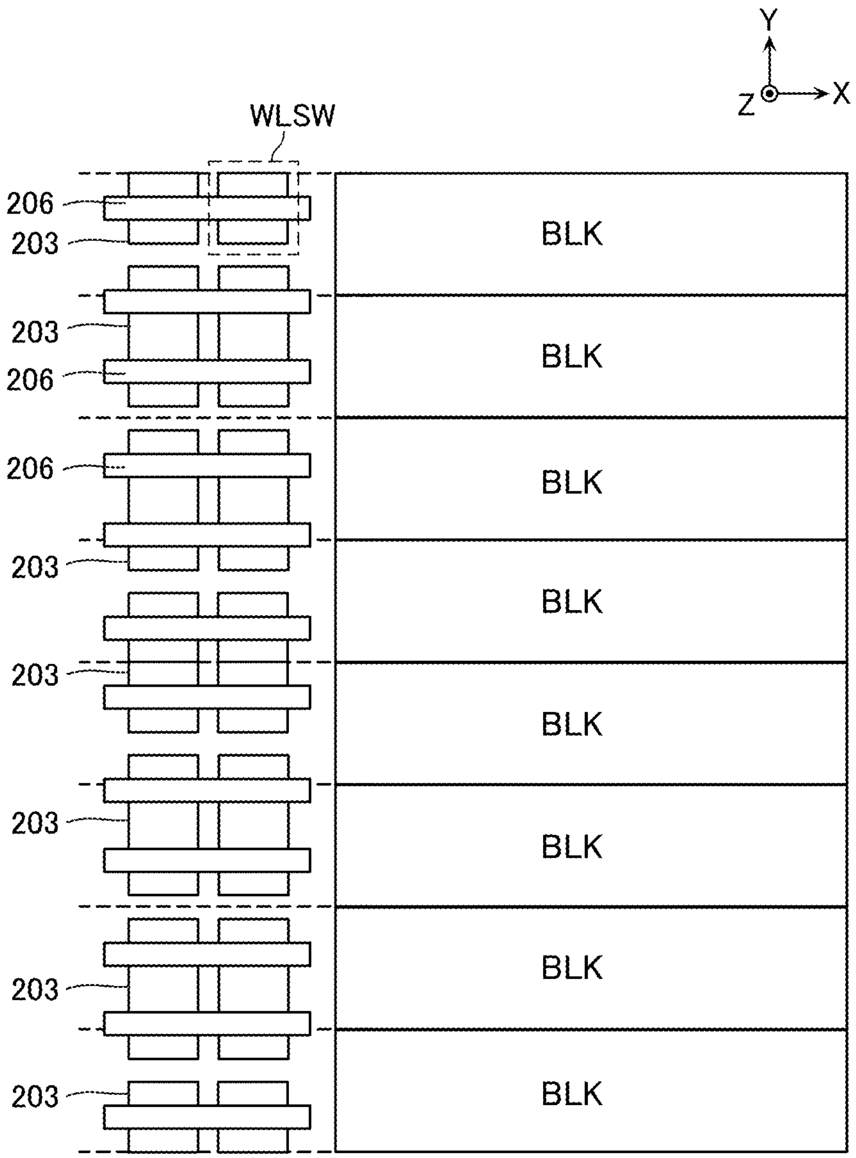
FIG. 39 is a schematic diagram illustrating a positional relationship between the word line switches WLSW and the memory blocks BLK according to a fifth embodiment.

FIG. 39 is a schematic diagram illustrating a positional relationship between the word line switches WLSW and the memory blocks BLK according to the fifth embodiment. In FIG. 39, the same reference numerals are given to the configurations same as the configurations of FIG. 16, and the overlapping explanation will be omitted.

In the first embodiment, the pitch in the Y-direction of the word line switches WLSW is the same as the pitch in the Y-direction of the memory blocks BLK (FIG. 16). That is, the first embodiment is in the state of 1 Tr/1 BLK. In contrast to this, in the fifth embodiment, as illustrated in FIG. 39, three times of the pitch in the Y-direction of the word line switches WLSW is the same as twice the pitch in the Y-direction of the memory blocks BLK. That is, the fifth embodiment is in the state of 3 Tr/2 BLK.

Figure 40:
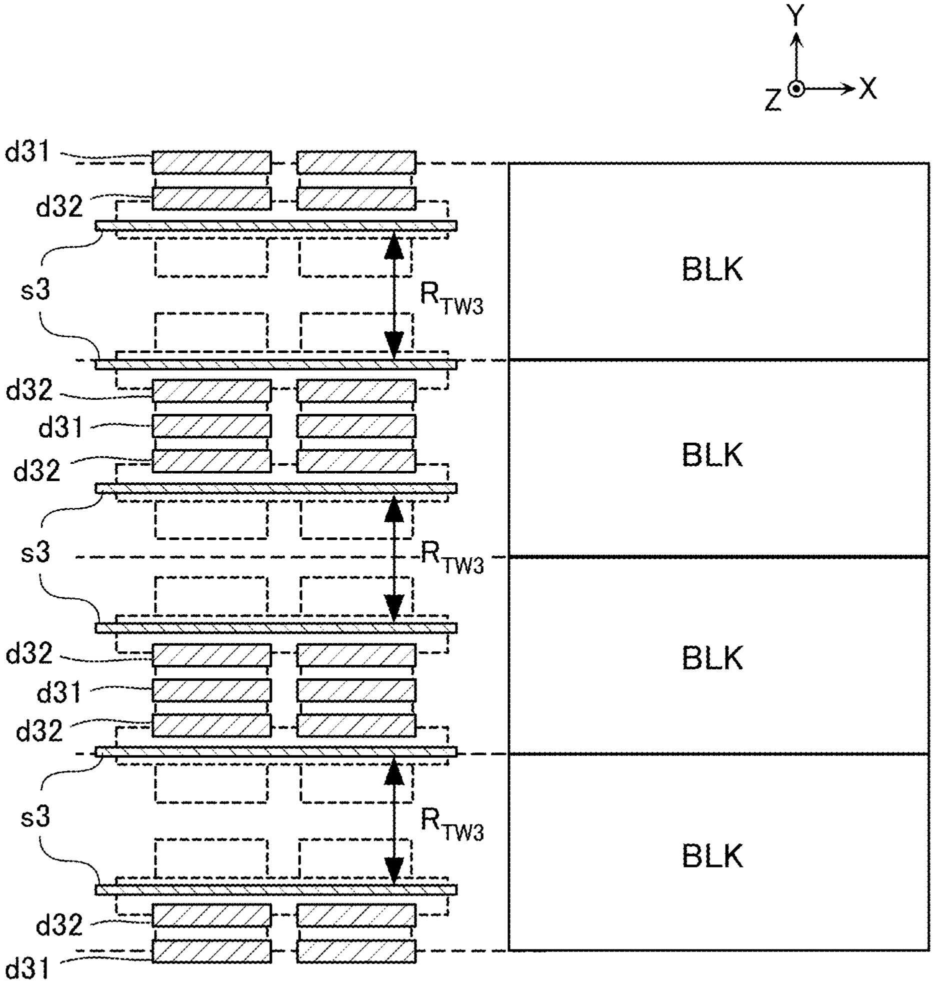
FIG. 40 is a schematic plan view illustrating positions of the connecting portions d31, d32 disposed in the wiring layer D3 according to the fifth embodiment.

FIG. 40 is a schematic plan view illustrating positions of the connecting portions d31, d32 disposed in the wiring layer D3 according to the fifth embodiment. As illustrated in FIG. 40, the connecting portion d31 is disposed above the center position in the Y-direction in the source region $R_{SO}$ of the semiconductor region 203, and the connecting portions d32 are disposed on the Y-direction negative side and positive side of the connecting portion d31. The shield wirings s3 are disposed on the Y-direction negative side and positive side of the connecting portion d32. The passing wiring region $R_{TW3}$ is disposed between the shield wirings s3. This configuration is basically similar to the configuration of the first embodiment (FIG. 21 and FIG. 22).

FIG. 40 is different from the configuration of the first embodiment in that the wiring region $R_{W3}$ is not disposed. While the three connecting portions d32 are disposed for Xpitch of the word line switches WLSW in the first embodiment (FIG. 21 and FIG. 22), one connecting portion d32 is disposed for Xpitch of the word line switch WLSW in FIG. 40. Also in FIG. 40, the wiring region $R_{W3}$ may be disposed between the connecting portion d32 and the shield wiring s3. Also in FIG. 40, the three connecting portions d32 may be disposed for Xpitch of the word line switch WLSW.

Figure 41:
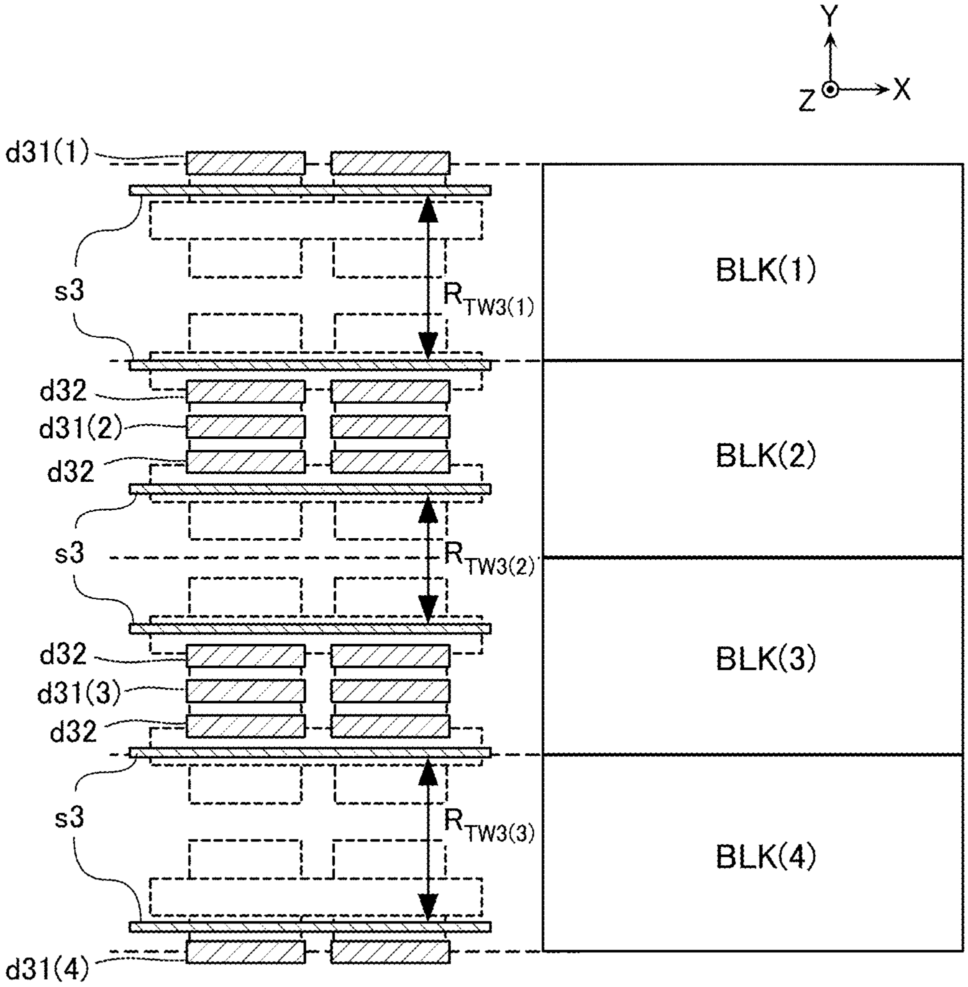
FIG. 41 is a schematic plan view illustrating other positions of the connecting portions d31, d32 disposed in the wiring layer D3 according to the fifth embodiment.

FIG. 41 is a schematic plan view illustrating other positions of the connecting portions d31, d32 disposed in the wiring layer D3 according to the fifth embodiment. In FIG. 41, while the connecting portions d32 are disposed on the Y-direction negative side and positive side of the connecting portions d31(2), d31(3), the connecting portions d32 are not disposed on the Y-direction negative side or positive side of the connecting portions d31(1), d31(4). In this case, the passing wiring regions $R_{TW3(1)}$, $R_{TW3(3)}$ can be made wider than the passing wiring region $R_{TW3(2)}$.

Figure 42:
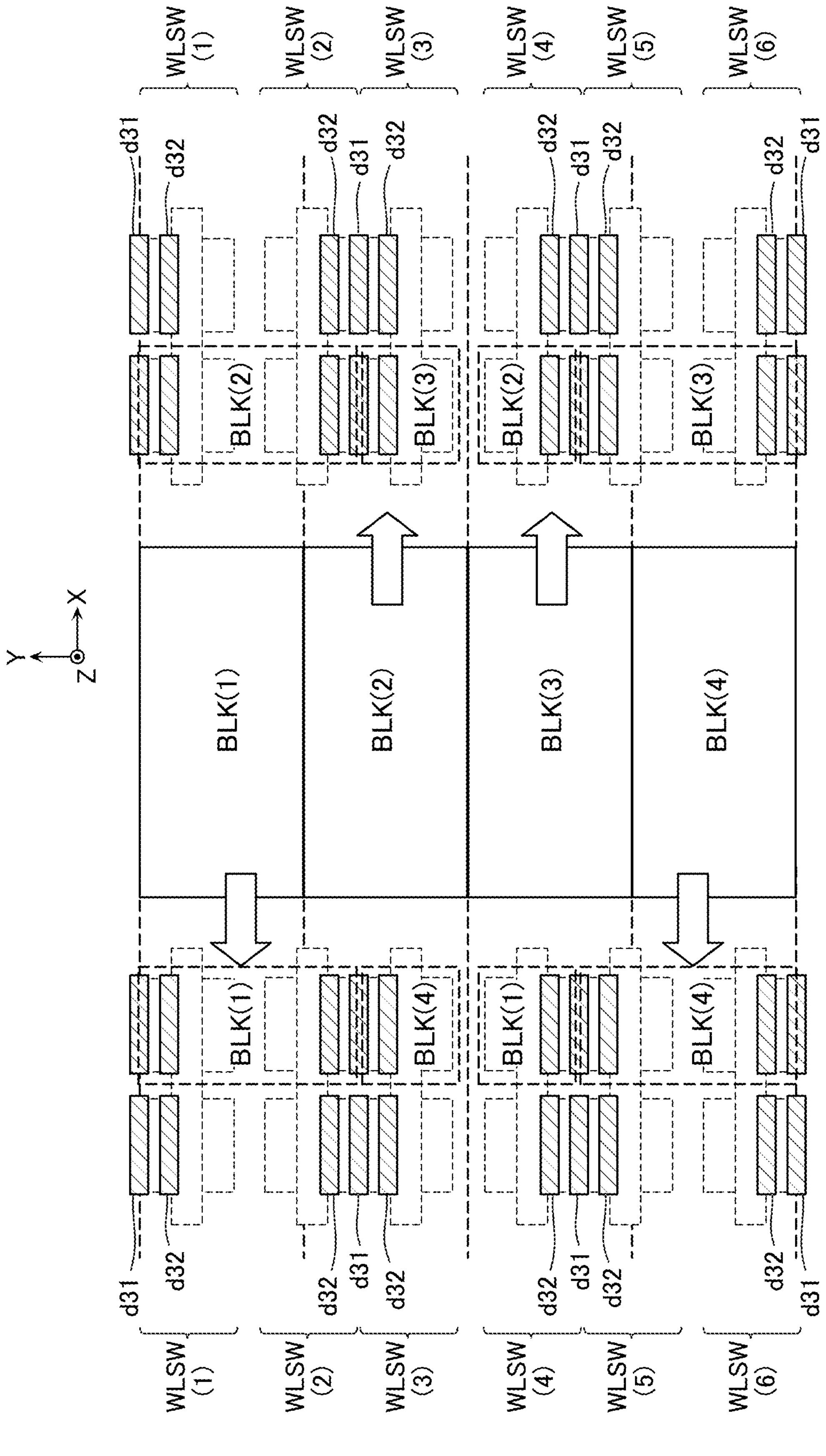
FIG. 42 is a schematic diagram illustrating a relationship of wiring connection between the word line switches WLSW and the memory blocks BLK according to the fifth embodiment.

FIG. 42 is a schematic diagram illustrating a relationship of wiring connection between the word line switches WLSW and the memory blocks BLK according to the fifth embodiment. As illustrated in FIG. 42, the word lines WL of the memory block BLK(1) are connected to the drain regions $R_{DR}$ of the word line switches WLSW(1), WLSW(2), WLSW(4) in the row control circuit region $R_{RC}$ on the X-direction negative side via the via-contact electrodes CC of the hook-up region $R_{HU}$(N1) in FIG. 11. The word lines WL of the memory block BLK(4) are connected to the drain regions $R_{DR}$ of the word line switches WLSW(3), WLSW(5), WLSW(6) in the row control circuit region $R_{RC}$ on the X-direction negative side via the via-contact electrodes CC of the hook-up region $R_{HU}$(N4) in FIG. 11.

The word lines WL of the memory block BLK(2) are connected to the drain regions $R_{DR}$ of the word line switches (for example, WLSW(1), WLSW(2), WLSW(4) of FIG. 42) in the row control circuit region $R_{RC}$ on the X-direction positive side via the via-contact electrodes CC of the hook-up region $R_{HU}$(P2) in FIG. 11. The word lines WL of the memory block BLK(3) are connected to the drain regions $R_{DR}$ of the word line switches (for example, WLSW(3), WLSW(5), WLSW(6) of FIG. 42) in the row control circuit region $R_{RC}$ on the X-direction positive side via the via-contact electrodes CC of the hook-up region $R_{HU}$(N4) in FIG. 11.

The relationship of wiring connection between the word line switches WLSW and the memory blocks BLK illustrated in FIG. 42 is applicable to the second embodiment (FIG. 31 to FIG. 36).

Also with this configuration, the connecting portion and the wiring to which the high voltage is applied can be shielded from the passing wiring to which various voltages are applied with the small number of the shield wirings, and the wide wiring region and passing wiring region can be ensured.

The relationship of the pitches in the Y-direction between the word line switches WLSW and the memory blocks BLK is not limited to 1 Tr/1 BLK or 3 Tr/2 BLK, and may be, for example, 2 Tr/1 BLK or 4 Tr/3 BLK.

Sixth Embodiment

Figure 43:
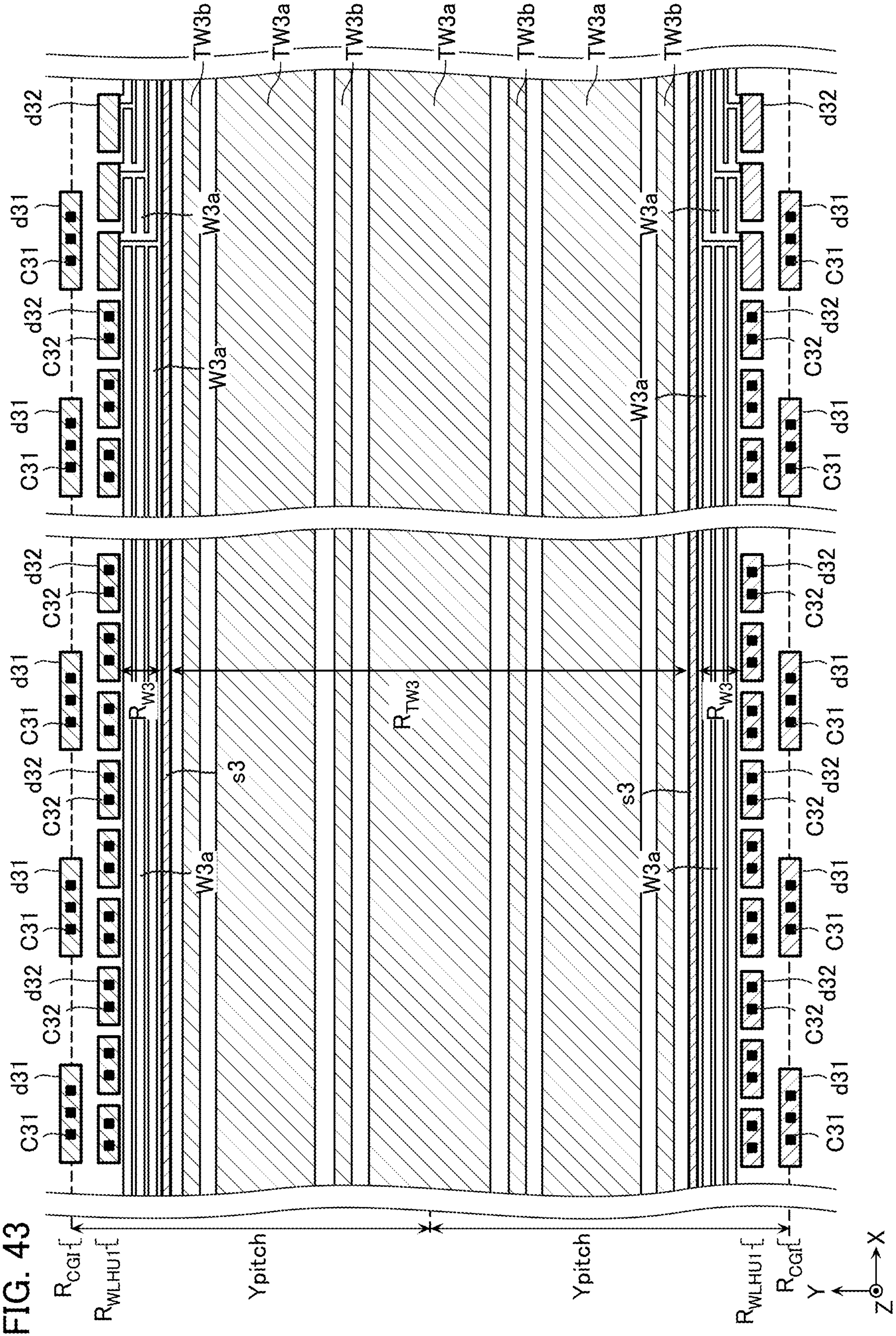
FIG. 43 is a schematic plan view illustrating an example of a wiring pattern in the wiring layer D3 of a sixth embodiment.
Figure 44:
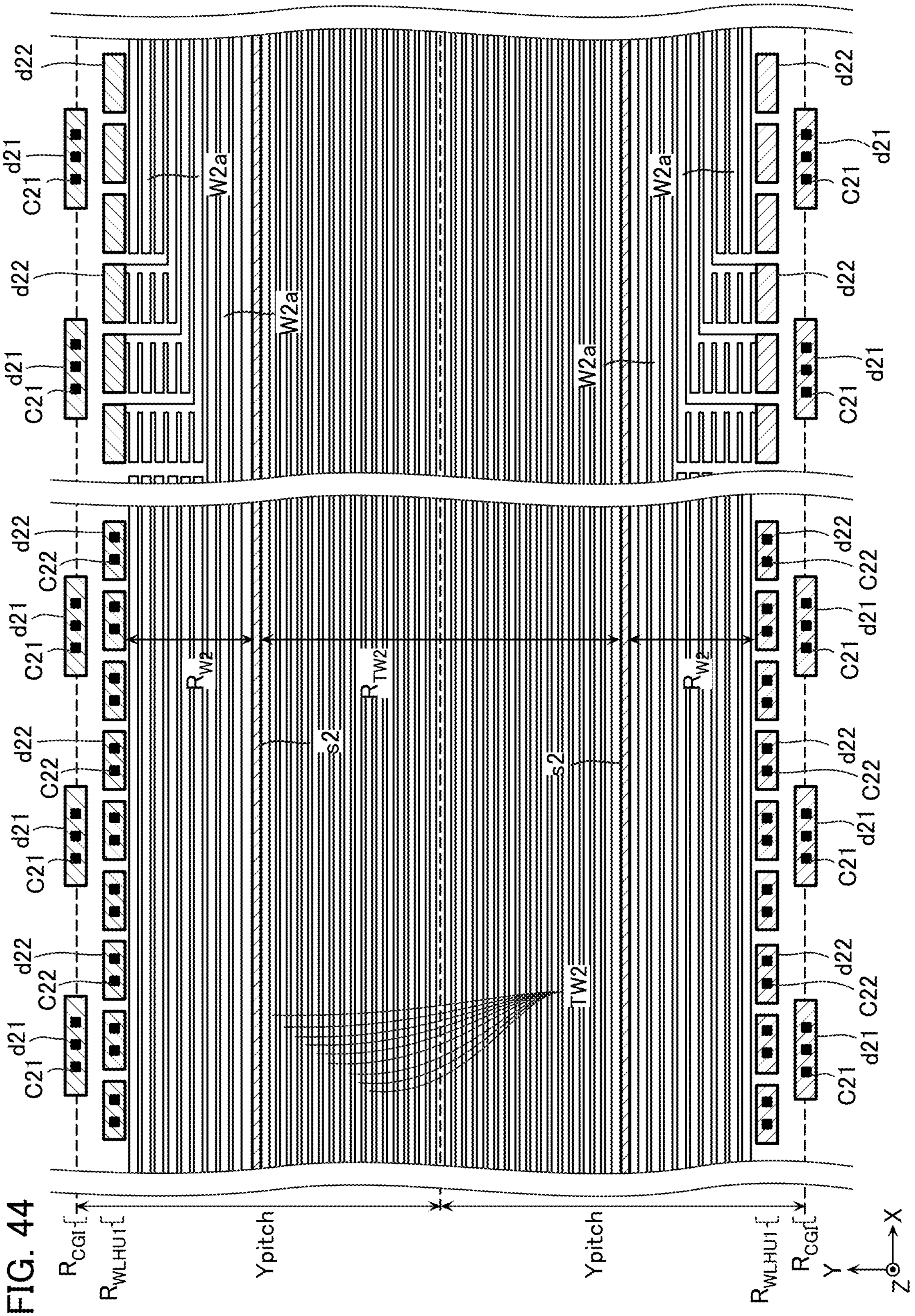
FIG. 44 is a schematic plan view illustrating an example of a wiring pattern in the wiring layer D2 of the sixth embodiment.
Figure 45:
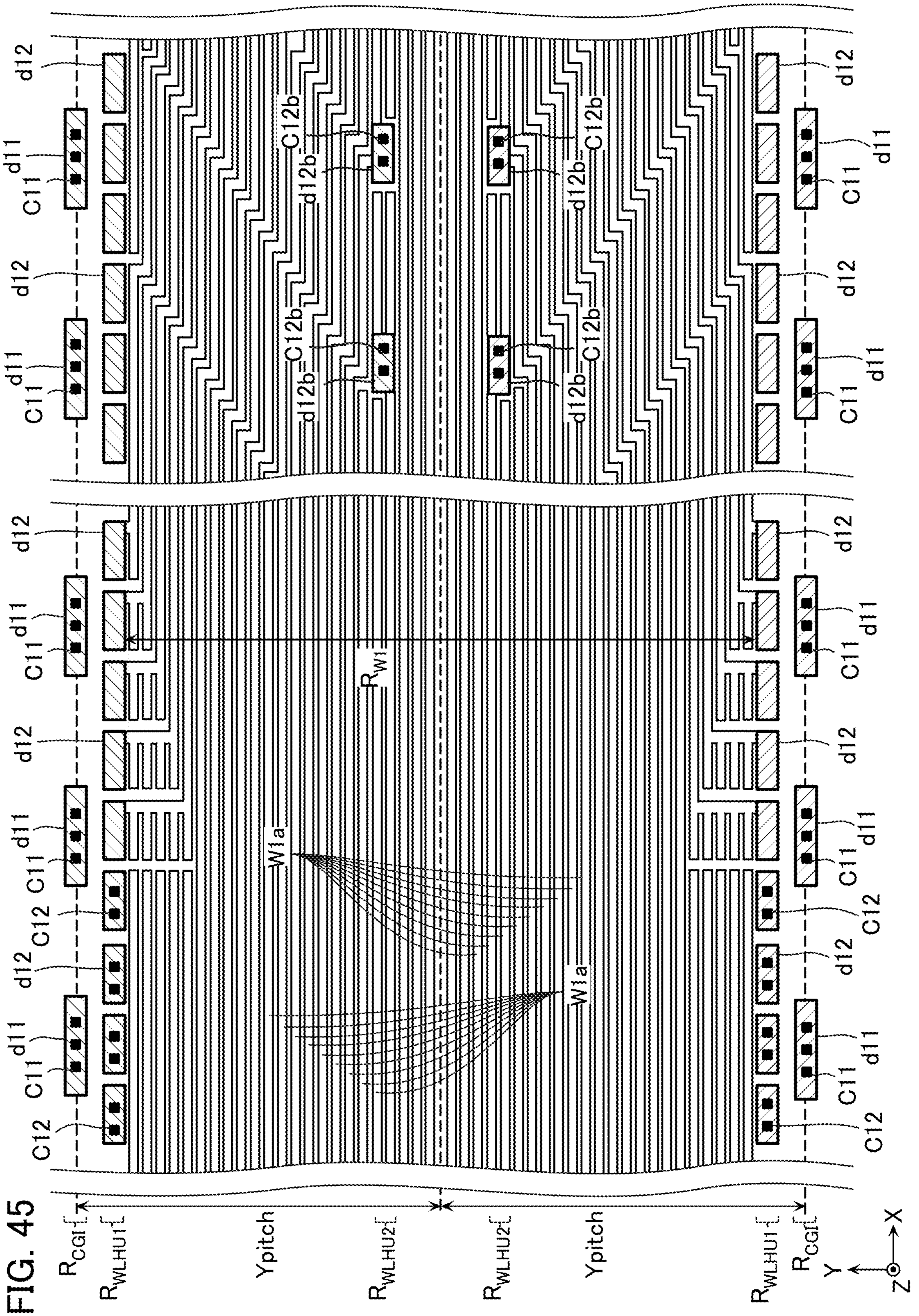
FIG. 45 is a schematic plan view illustrating an example of a wiring pattern in the wiring layer D1 of the sixth embodiment.
Figure 46:
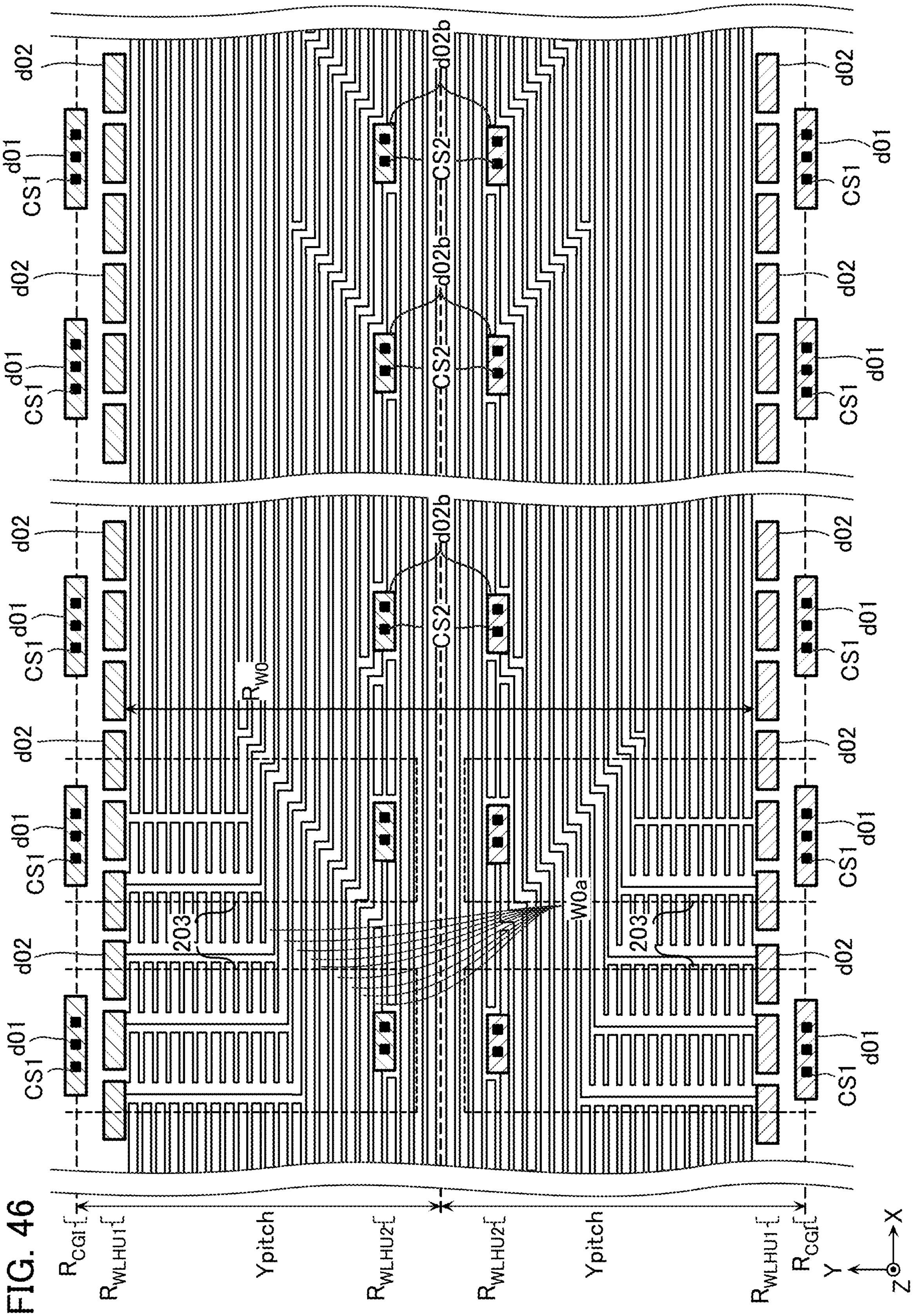
FIG. 46 is a schematic plan view illustrating an example of a wiring pattern in the wiring layer DO of the sixth embodiment.

FIG. 43 is a schematic plan view illustrating an example of a wiring pattern in the wiring layer D3 of the sixth embodiment. FIG. 44 is a schematic plan view illustrating an example of a wiring pattern in the wiring layer D2 of the sixth embodiment. FIG. 45 is a schematic plan view illustrating an example of a wiring pattern in the wiring layer D1 of the sixth embodiment. FIG. 46 is a schematic plan view illustrating an example of a wiring pattern in the wiring layer DO of the sixth embodiment.

FIG. 43 is a diagram corresponding to FIG. 23, FIG. 44 is a diagram corresponding to FIG. 25, FIG. 45 is a diagram corresponding to FIG. 26, and FIG. 46 is a diagram corresponding to FIG. 27.

[Positions of Connecting Portions d31, d32 of Wiring Layer D3 and Wiring Pattern in Wiring Layer D3]

In FIG. 43, since the positions of the connecting portions d31, d32 and the shield wiring s3 are similar to those illustrated in FIG. 23, the overlapping explanation will be omitted.

As illustrated in FIG. 43, in the passing wiring region $R_{TW3}$, a plurality of passing wirings TW3*a*, TW3*b* are disposed. The plurality of passing wirings TW3*a*, TW3*b* extend in the X-direction and are arranged in the Y-direction. Widths in the Y-direction of the passing wirings TW3*a*, TW3*b* are larger than the width in the Y-direction of the passing wiring TW3 illustrated in FIG. 23. The width in the Y-direction of the passing wiring TW3*a* is larger than the width in the Y-direction of the passing wiring TW3*b*. For example, the plurality of passing wirings TW3*a* are power lines, and the plurality of passing wirings TW3*b* are signal lines. The signal can be surely transmitted by the passing wirings TW3*a*, TW3*b*, and the stability of the operation of the peripheral circuit PC can be achieved.

In the wiring region $R_{W3}$, a plurality of hook-up wirings W3*a* are disposed. The plurality of hook-up wirings W3*a* extend in the X-direction and are arranged in the Y-direction. The width in the Y-direction of the hook-up wiring W3*a* is smaller than the width in the Y-direction of the hook-up wiring W3 illustrated in FIG. 23.

In the wiring region $R_{W3}$, the hook-up wirings W3*a* are preferred to be formed at approximately constant pitches at the exposure in photolithography or the like. While Chemical Mechanical Polishing (CMP) is performed in forming the plurality of wiring layers, an arrangement density of the wiring layer D3 is preferred to be uniform in performing the CMP. Therefore, as illustrated in FIG. 43, for disposing the hook-up wirings W3*a* to be approximately constant in the wiring region $R_{W3}$, comb-shaped wirings are disposed as the hook-up wirings W3*a*.

[Positions of Connecting Portions d21, d22 of Wiring Layer D2 and Wiring Pattern in Wiring Layer D2]

In FIG. 44, since the positions of the connecting portions d21, d22 and the shield wiring s2 are similar to those illustrated in FIG. 25, the overlapping explanation will be omitted. Additionally, in FIG. 44, since the plurality of passing wirings TW2 of the passing wiring region $R_{TW2}$ are also similar to those illustrated in FIG. 25, the overlapping explanation will be omitted.

In the wiring region $R_{W2}$, a plurality of hook-up wirings W2*a* are disposed. The plurality of hook-up wirings W2*a* extend in the X-direction and are arranged in the Y-direction.

As illustrated in FIG. 44, for disposing the hook-up wirings W2*a* to be approximately constant in the wiring region $R_{W2}$, comb-shaped wirings are disposed as the hook-up wirings W2*a*.

[Positions of Connecting Portions d11, d12, d12*b* of Wiring Layer D1 and Wiring Pattern in Wiring Layer D1]

In FIG. 45, since the positions of the connecting portions d11, d12, d12*b* are similar to those illustrated in FIG. 26, the overlapping explanation will be omitted.

In the wiring region $R_{W1}$, a plurality of hook-up wirings Wla are disposed. The plurality of hook-up wirings W1*a* extend in the X-direction and are arranged in the Y-direction.

As illustrated in FIG. 45, in the wiring region $R_{W1}$, for forming the hook-up wirings W1*a* at approximately constant pitches, comb-shaped wirings are disposed as the hook-up wirings W1*a*.

[Positions of Connecting Portions d01, d02, d02*b* of Wiring Layer D0 and Wiring Pattern in Wiring Layer D0]

In FIG. 46, since the positions of the connecting portions d01, d02, d02*b* are similar to those illustrated in FIG. 27, the overlapping explanation will be omitted.

In the wiring region $R_{W0}$, a plurality of hook-up wirings W0*a* are disposed. The plurality of hook-up wirings W0*a* extend in the X-direction and are arranged in the Y-direction.

In the wiring region $R_{W0}$, for forming the hook-up wirings W0*a* at approximately constant pitches, comb-shaped wirings are disposed as the hook-up wirings W0*a*.

Seventh Embodiment

Figure 47:
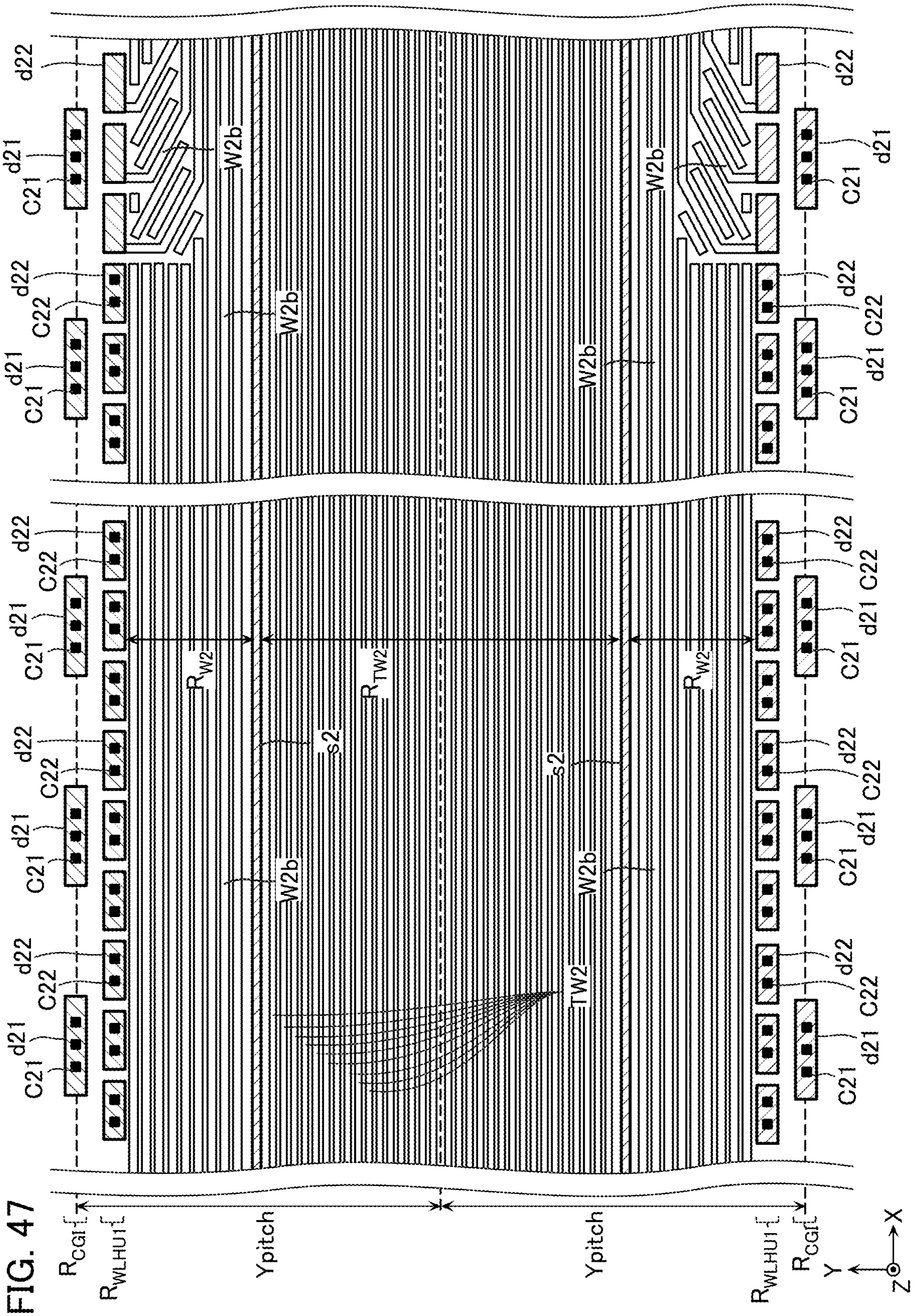
FIG. 47 is a schematic plan view illustrating an example of a wiring pattern in the wiring layer D2 of a seventh embodiment.
Figure 48:
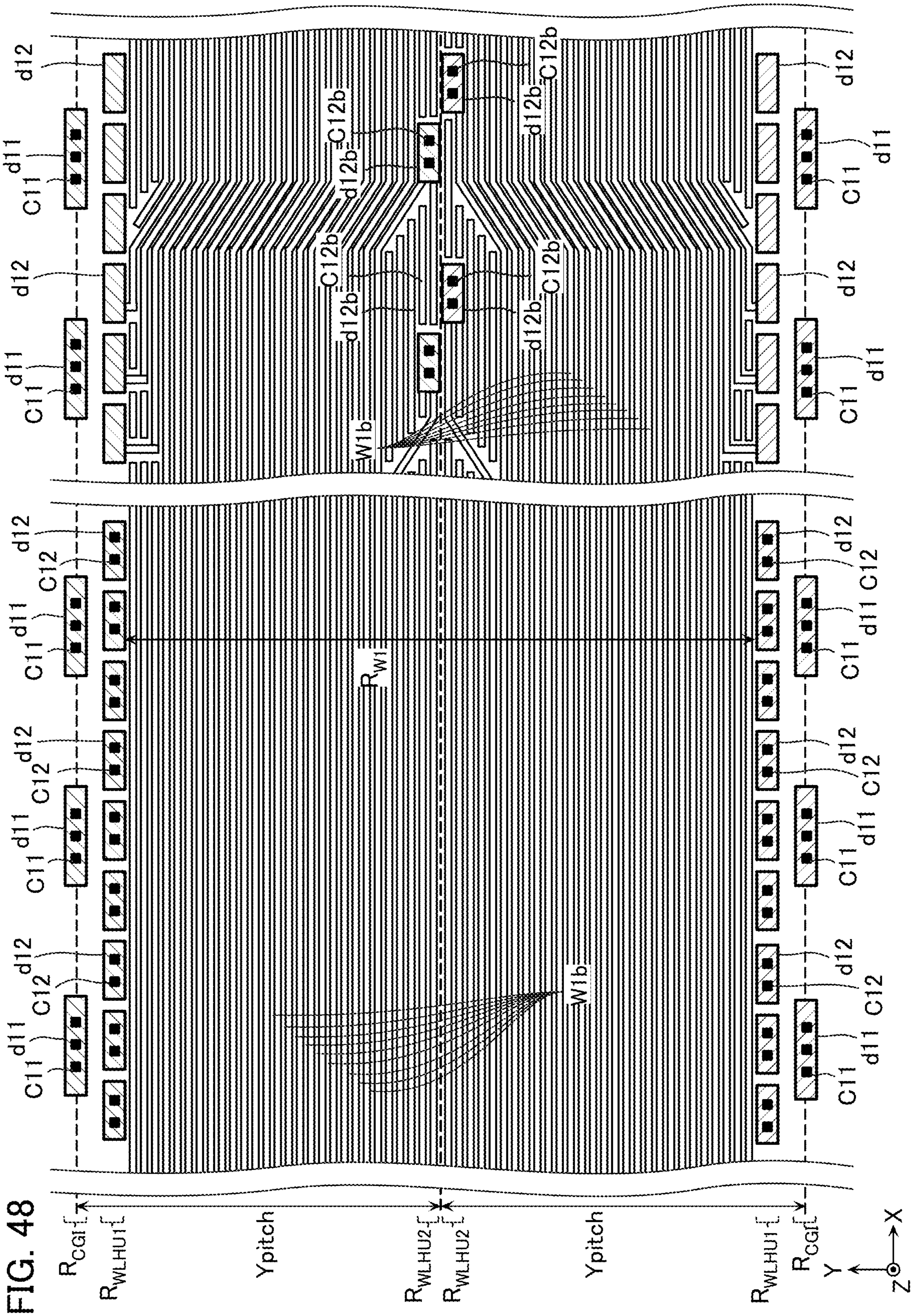
FIG. 48 is a schematic plan view illustrating an example of a wiring pattern in the wiring layer D1 of the seventh embodiment.
Figure 49:
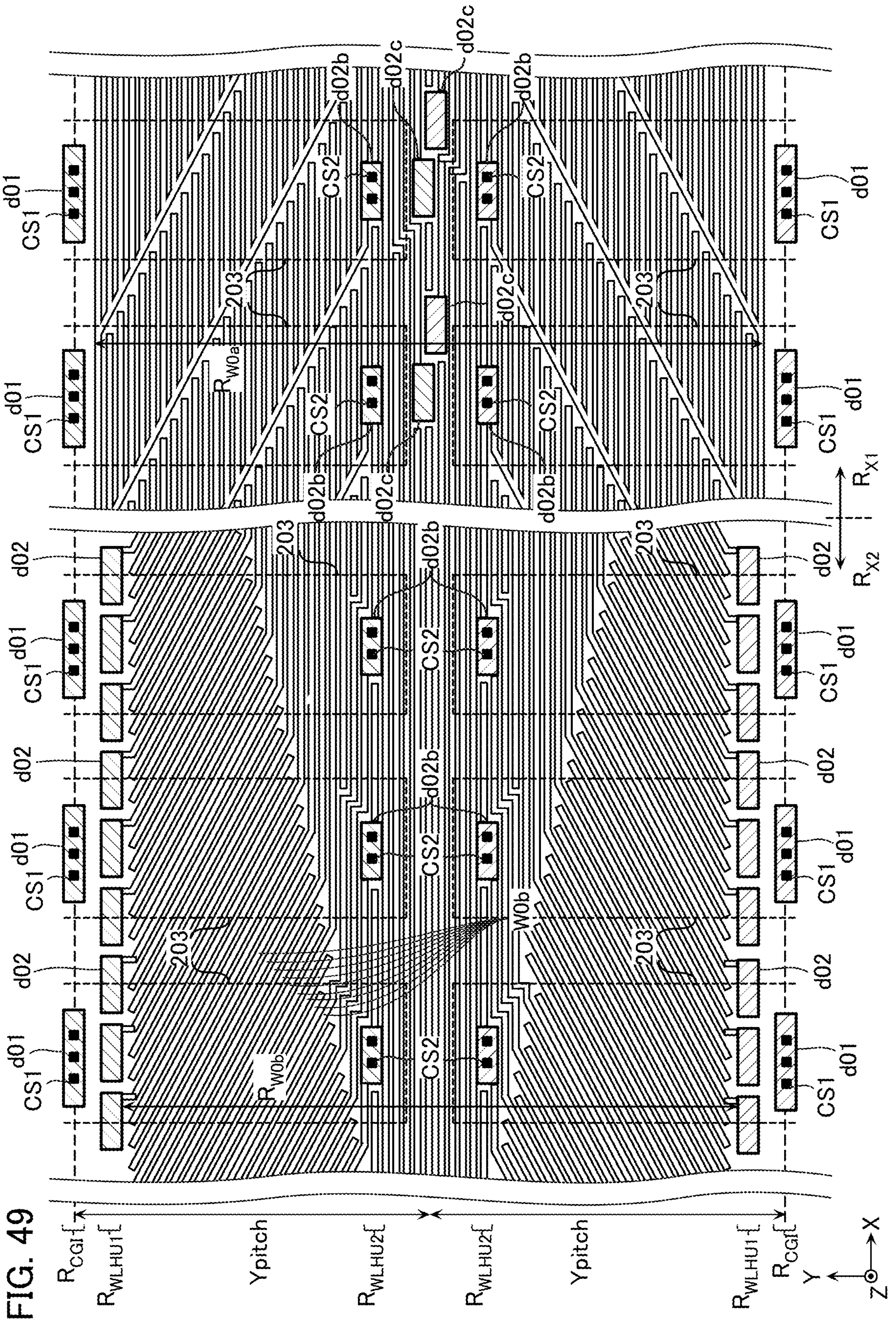
FIG. 49 is a schematic plan view illustrating an example of a wiring pattern in the wiring layer DO of the seventh embodiment.

FIG. 47 is a schematic plan view illustrating an example of a wiring pattern in the wiring layer D2 of the seventh embodiment. FIG. 48 is a schematic plan view illustrating an example of a wiring pattern in the wiring layer D1 of the seventh embodiment. FIG. 49 is a schematic plan view illustrating an example of a wiring pattern in the wiring layer DO of the seventh embodiment.

FIG. 47 is a diagram corresponding to FIG. 25, FIG. 48 is a diagram corresponding to FIG. 26, and FIG. 49 is a diagram corresponding to FIG. 27.

[Positions of Connecting Portions d21, d22 of Wiring Layer D2 and Wiring Pattern in Wiring Layer D2]

In FIG. 47, since the positions of the connecting portions d21, d22 and the shield wiring s2 are similar to those illustrated in FIG. 25, the overlapping explanation will be omitted. Additionally, in FIG. 47, since the plurality of passing wirings TW2 of the passing wiring region $R_{TW2}$ are also similar to those illustrated in FIG. 25, the overlapping explanation will be omitted.

In the wiring region $R_{W2}$, a plurality of hook-up wirings W2*b* are disposed. A part of the plurality of hook-up wirings W2*b* extend in a direction having a predetermined angle with respect to the X-direction, and the other part of the plurality of hook-up wirings W2*b* extend in the X-direction. The plurality of hook-up wirings W2*b* are arranged in the Y-direction.

In the wiring region $R_{W2}$, for forming the hook-up wirings W2*b* at approximately constant pitches, dummy wirings in the X-direction and dummy wirings in a direction having a predetermined angle with respect to the X-direction are disposed as the hook-up wirings W2*b*.

[Positions of Connecting Portions d11, d12, d12*b* of Wiring Layer D1 and Wiring Pattern in Wiring Layer D1]

In FIG. 48, since the positions of the connecting portions d11, d12 are similar to those illustrated in FIG. 26, the overlapping explanation will be omitted. In FIG. 48, the position of the connecting portion d12*b* is different from the position of the connecting portion d12*b* illustrated in FIG. 25, and the connecting portion d12*b* is disposed in the proximity of the center of the wiring region $R_{W1}$. In this case, the connecting portion d12*b* of FIG. 48 is connected to a connecting portion d02*c* (see FIG. 49) of the wiring layer DO at a position overlapping with the connecting portion d12*b* when viewed in the Z-direction via the via-contact electrode C12*b*, and the connecting portion d02*c* is connected to the connecting portion d02*b* via a hook-up wiring W0*b*.

In the wiring region $R_{W1}$, a plurality of hook-up wirings W1*b* are disposed. A part of the plurality of hook-up wirings W1*b* extend in a direction having a predetermined angle with respect to the X-direction, and the other part of the plurality of hook-up wirings W1*b* extend in the X-direction. The plurality of hook-up wirings W1*b* are arranged in the Y-direction.

In the wiring region $R_{W1}$, for forming the hook-up wirings W1*b* at approximately constant pitches, dummy wirings in the X-direction and dummy wirings in a direction having a predetermined angle with respect to the X-direction are disposed as the hook-up wirings W1*b*.

[Positions of Connecting Portions d01, d02, d02*b* of Wiring Layer D0 and Wiring Pattern in Wiring Layer D0]

In FIG. 49, since the positions of the connecting portions d01, d02*b* are similar to those illustrated in FIG. 27, the overlapping explanation will be omitted. In the second region $R_{WLHU1}$ of FIG. 49, while the connecting portion d02 is disposed in a region $R_{X2}$ on the X-direction negative side, the connecting portion d02 is not disposed in a region $R_{X1}$ on the X-direction positive side. In a wiring region $R_{W0a}$ corresponding to this region $R_{X1}$, the plurality of hook-up wirings W0*b* are disposed also in the second region $R_{WLHU1}$. Accordingly, the width in the Y-direction of the wiring region $R_{W0a}$ corresponding to the region $R_{X1}$ is larger than the width in the Y-direction of the wiring region $R_{W0}$ illustrated in FIG. 27. Meanwhile, the width in the Y-direction of the wiring region $R_{W0b}$ corresponding to the region $R_{X2}$ is the same as the width in the Y-direction of the wiring region $R_{W0}$ illustrated in FIG. 27.

As illustrated in FIG. 49, in the wiring regions $R_{W0a}$, $R_{W0}$b, the plurality of hook-up wirings W0*b* are disposed. A part of the plurality of hook-up wirings W0*b* extend in a direction having a predetermined angle with respect to the X-direction, and the other part of the plurality of hook-up wirings W0*b* extend in the X-direction. The plurality of hook-up wirings W0*b* are arranged in the Y-direction.

In the wiring region $R_{W0a}$, the above-described plurality of connecting portions d02*c* are disposed. The plurality of connecting portions d02*c* are disposed at positions overlapping with the plurality of connecting portions d12*b* of FIG. 48 when viewed in the Z-direction. The respective plurality of connecting portions d02*c* are electrically connected to the plurality of connecting portions d12*b* via the via-contact electrodes C12*b*. The respective plurality of connecting portions d02*c* are electrically connected to a part of or all of the plurality of connecting portions d02*b* via the hook-up wirings W0*b*.

In the wiring regions $R_{W0a}$, $R_{W0b}$, for forming the hook-up wirings W0*b* at approximately constant pitches, dummy wirings in the X-direction and dummy wirings in a direction having a predetermined angle with respect to the X-direction are disposed as the hook-up wirings W0*b*. The dummy wiring is electrically insulated and floating.

In FIG. 47 to FIG. 49, a part of the hook-up wirings W2*b*, W1*b*, W0*b* extend in the direction having a predetermined angle with respect to the X-direction. While this predetermined angle is about 30 degrees in FIG. 47 to FIG. 49, the predetermined angle is not limited to such an angle, and is appropriately adjustable. For example, the predetermined angle may be 30 degrees or less, and may be about 45 degrees.

Eighth Embodiment

In the eighth embodiment, according to the wiring resistance of the hook-up wirings W0 to W3 and the density (the degree of congestion) of the hook-up wirings W0 to W3), the thickness (the width in the Y-direction) of the hook-up wirings W0 to W3 is changed. Note that the configuration according to the eighth embodiment, for example, is added to the configuration according to the first embodiment.

Figure 51:
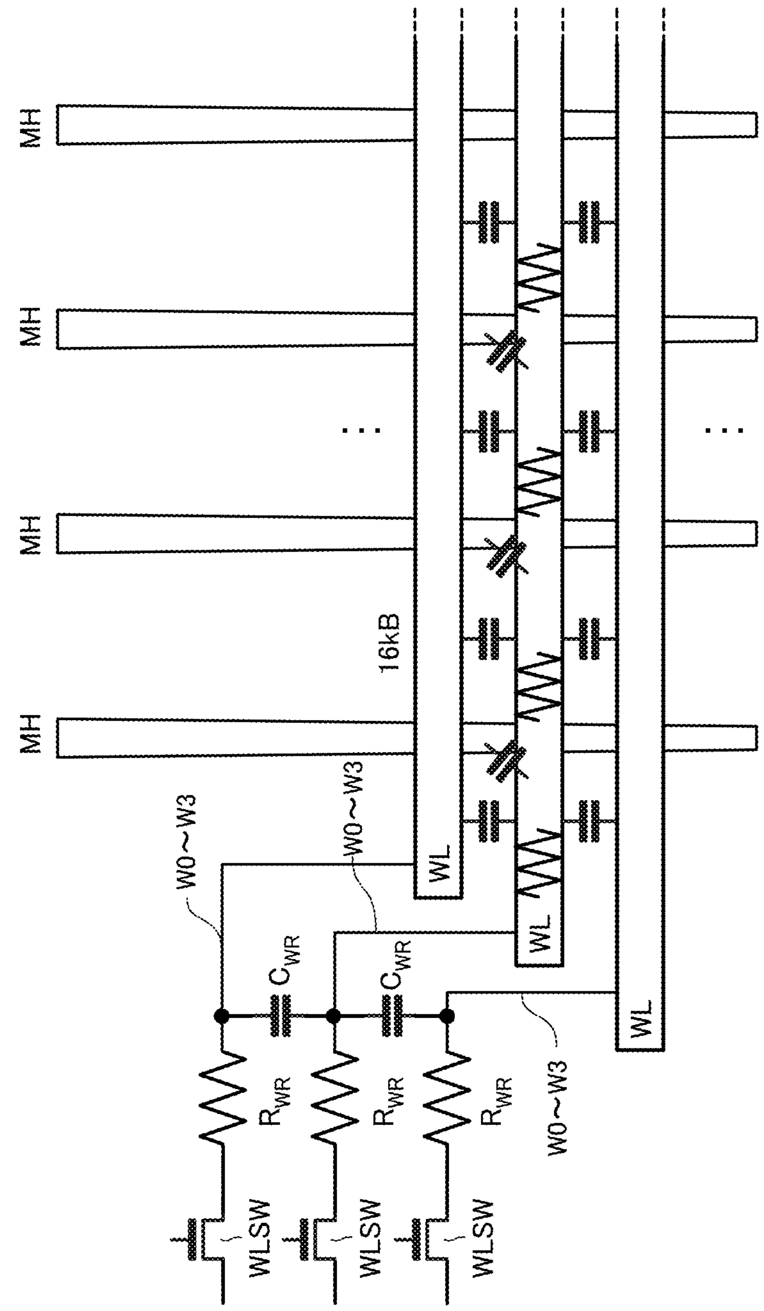
FIG. 51 is a diagram illustrating wiring resistances $R_{WR}$ of the hook-up wirings W0 to W3 according to an eighth embodiment.

FIG. 51 is a diagram illustrating wiring resistances $R_{WR}$ of the hook-up wirings W0 to W3 according to the eighth embodiment. As illustrated in FIG. 51, the word lines WL are connected to the word line switches WLSW via the hook-up wirings W0 to W3. Note that FIG. 51 omits the via-contact electrodes CC, the bonding electrodes $P_{I1}$, $P_{I2}$, and the like.

The execution unit of the read operation or the write operation is referred to as a page in some cases. As illustrated in FIG. 51, the word line WL has an electrostatic capacity between the word lines WL by the length of the page (hereinafter referred to as a capacity) and a capacity between the word line WL and the semiconductor layer 120 (memory hole MH). Additionally, the word line WL itself has a resistance. The distance between the word lines WL tends to decrease, and the resistance and the capacity of the word line WL is increasing.

Figure 52:
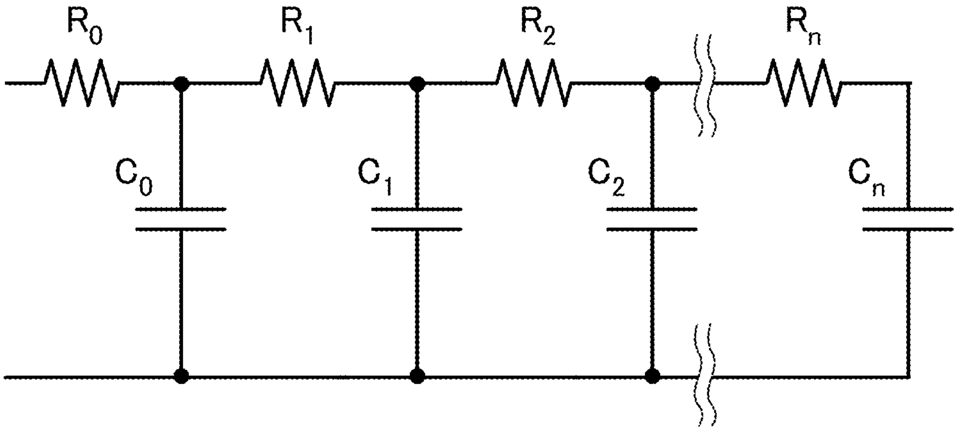
FIG. 52 is a circuit diagram illustrating an equivalent circuit of FIG. 51.

FIG. 52 is a circuit diagram illustrating an equivalent circuit of FIG. 51. A resistance $R_0$ in FIG. 52 corresponds to the wiring resistance $R_{WR}$ of the hook-up wirings W0 to W3 in FIG. 51. A delay time tpd is obtained by the formula of the following Elmore Delay.

$$tpd=R_0C_0+(R_0+R_1)C_1+(R_0+R_1+R_2)C_2+\dots+(R_0+R_1+R_2+\dots+R_n)C_n \quad \text{Formula of Elmore Delay}$$

In the formula of Elmore Delay, $R_0$ is equivalent to the wiring resistance $R_{WR}$ of the hook-up wirings W0 to W3, $C_0$ is equivalent to a capacity $C_{WR}$ between the wirings of the hook-up wirings W0 to W3, the resistances $R_1$, $R_2$, . . . $R_n$ are equivalent to the resistances of the word lines WL, $C_1$, $C_2$, . . . $C_n$ are equivalent to the capacities between the word lines WL, and the capacity between the word line WL and the semiconductor layer 120. $R_0$ equivalent to the wiring resistance $R_{WR}$ of the hook-up wirings W0 to W3 affects all of the terms in the formula of Elmore Delay. In view of this, when the resistance and the capacity of the word line WL increase, the wiring resistance $R_{WR}$ of the hook-up wirings W0 to W3 gives a comparatively large influence on the delay time tpd. Especially, this becomes a problem when the page length is large like 16 k bytes and the capacity of the word line WL is large.

Figure 53:
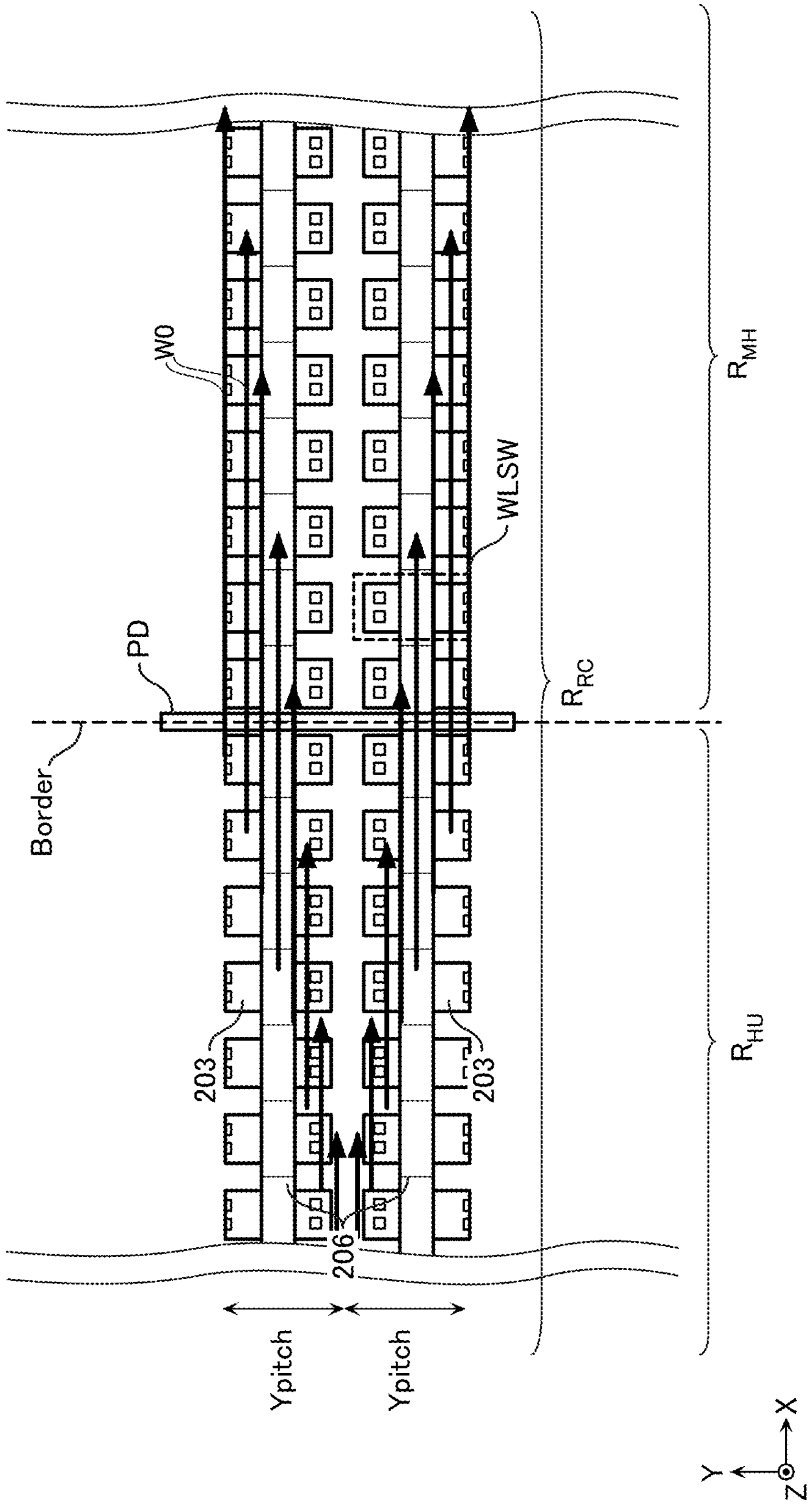
FIG. 53 is a diagram illustrating an outline of wiring length of the hook-up wiring W0 according to the eighth embodiment.

FIG. 53 is a diagram illustrating an outline of the wiring length of the hook-up wiring W0 according to the eighth embodiment. Note that the longer the wiring length of the hook-up wiring W0 becomes, the larger the wiring resistance $R_{WR}$ of the hook-up wiring W0 is. In FIG. 53, the arrow lines indicate the lengths in the X-direction in the hook-up wirings W0 of the wiring layer DO. The dotted line indicates the boundary between the hook-up region $R_{HU}$ and the memory hole region $R_{MH}$.

As described in the first embodiment, the word lines WL and the word line switches WLSW are connected via the via-contact electrodes CC, the wirings m0, m1 in the wiring layers M0, M1, the bonding electrodes $P_{I1}$, $P_{I2}$, the connecting portions d42, d32, d22, d12, d12*b*, d02, d02*b* in the wiring layers D4 to DO, and the via-contact electrodes CS2. Although not illustrated in FIG. 53, the connecting portions d02 of the wiring layer DO are disposed at regular intervals in the X-direction in the hook-up region $R_{HU}$. Although not illustrated in FIG. 53, the connecting portions d02*b* of the wiring layer DO are disposed at regular intervals in the X-direction in the row control circuit region $R_{RC}$. Note that the connecting portions d42, d32, d22, d12, d12*b*, d02, d02*b* and the via-contact electrodes CS2 are referred to as a node in some cases.

When the connecting portion d02 and the connecting portion d02*b* are connected with the hook-up wiring W0, as illustrated in FIG. 53, the connecting portion d02*b* (that is, the word line switch WLSW) has the shorter length in the X-direction of the hook-up wiring W0 toward the X-direction negative side, and the connecting portion d02*b* (that is, the word line switch WLSW) has the longer length in the X-direction of the hook-up wiring W0 toward the X-direction positive side. In this case, depending on the position in the X-direction, a part where the hook-up wirings W0 are dense and a part where the hook-up wirings W0 are sparse occur. In the example of FIG. 53, in the boundary portion between the hook-up region $R_{HU}$ and the memory hole region $R_{MH}$, the hook-up wirings W0 are the densest. This part is referred to as a densest part PD in some cases.

Figure 54:
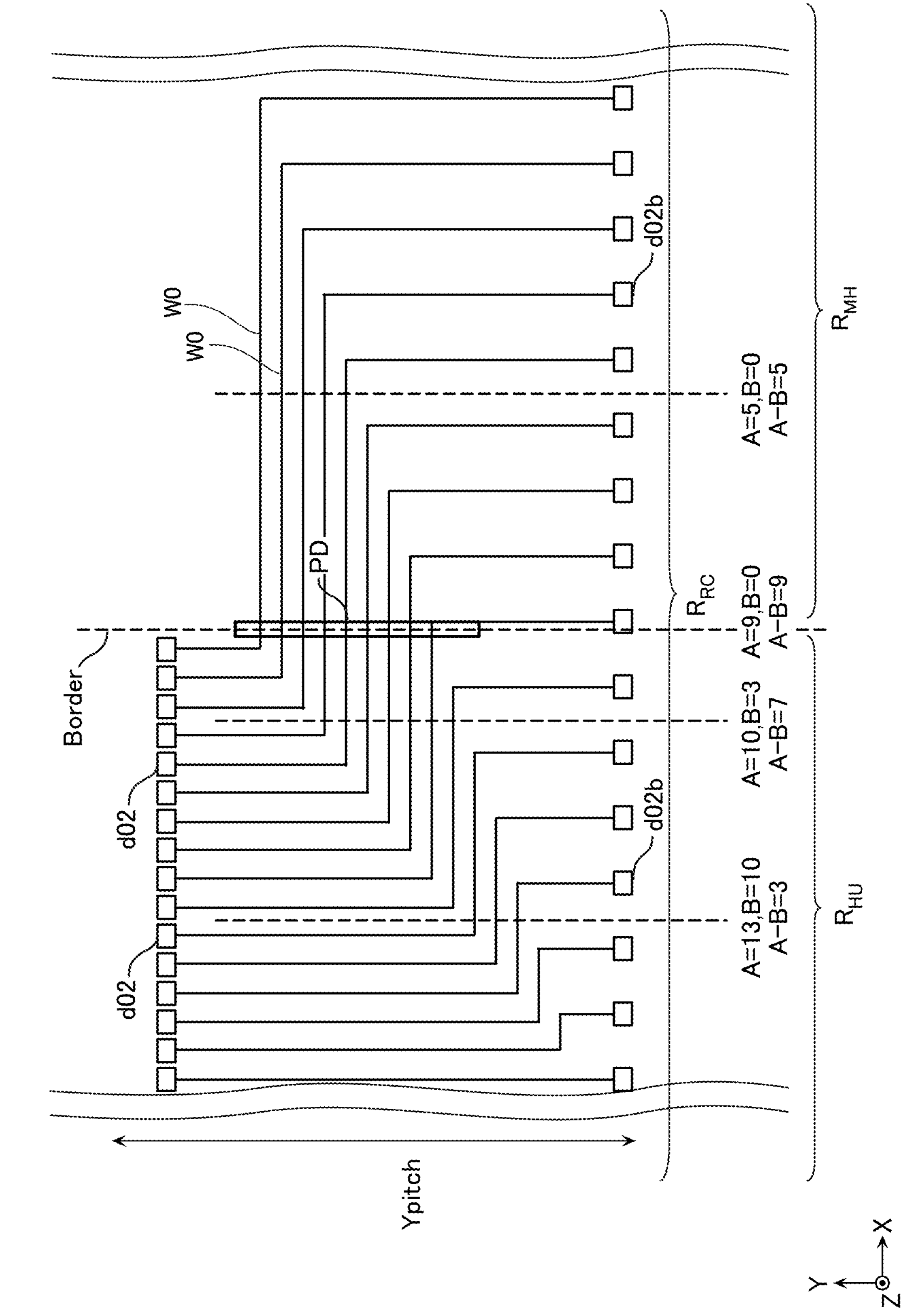
FIG. 54 is a diagram illustrating a way of obtaining a density of the hook-up wirings W0.

FIG. 54 is a diagram illustrating a way of obtaining the density of the hook-up wirings W0. FIG. 54 illustrates the hook-up wirings W0 of the wiring layer DO by the solid lines. Note that, in FIG. 54, for ease of understanding of the density of the hook-up wirings W0, the hook-up wirings W0 in the X-direction are indicated by the straight lines. However, as in FIG. 27, FIG. 46, and the like, the hook-up wirings W0 may be bent in a crank shape.

With reference to FIG. 54, the way of obtaining the densest part PD of the hook-up wirings W0 will be described. In FIG. 54, the density of the hook-up wirings W0 is obtained at the four positions. Here, the density of the hook-up wirings W0 is the number of the hook-up wirings W0 across the straight line extending in the Y-direction at the predetermined position in the X-direction. A indicates the number of the connecting portions d02*b* (that is, the word line switches WLSW) on the X-direction positive side with respect to the position in the X-direction where the density of the hook-up wirings W0 is obtained. B indicates the number of the connecting portions d02 on the X-direction positive side with respect to the position in the X-direction where the density of the hook-up wirings W0 is obtained.

At the first position counted from the X-direction positive side, A is 5 and B is 0, and the density of the hook-up wirings W0(A-B) at the position is 5. At the second position counted from the X-direction positive side, A is 9 and B is 0, and the density of the hook-up wirings W0(A-B) at the position is 9. At the third position counted from the X-direction positive side, A is 10 and B is 3, and the density of the hook-up wirings W0(A-B) at the position is 7. At the fourth position counted from the X-direction positive side, A is 13 and B is 10, and the density of the hook-up wirings W0(A-B) at the position is 3. Therefore, the second position counted from the X-direction positive side, that is, the boundary portion between the hook-up region $R_{HU}$ and the memory hole region $R_{MH}$ is the densest part PD.

Figure 55:
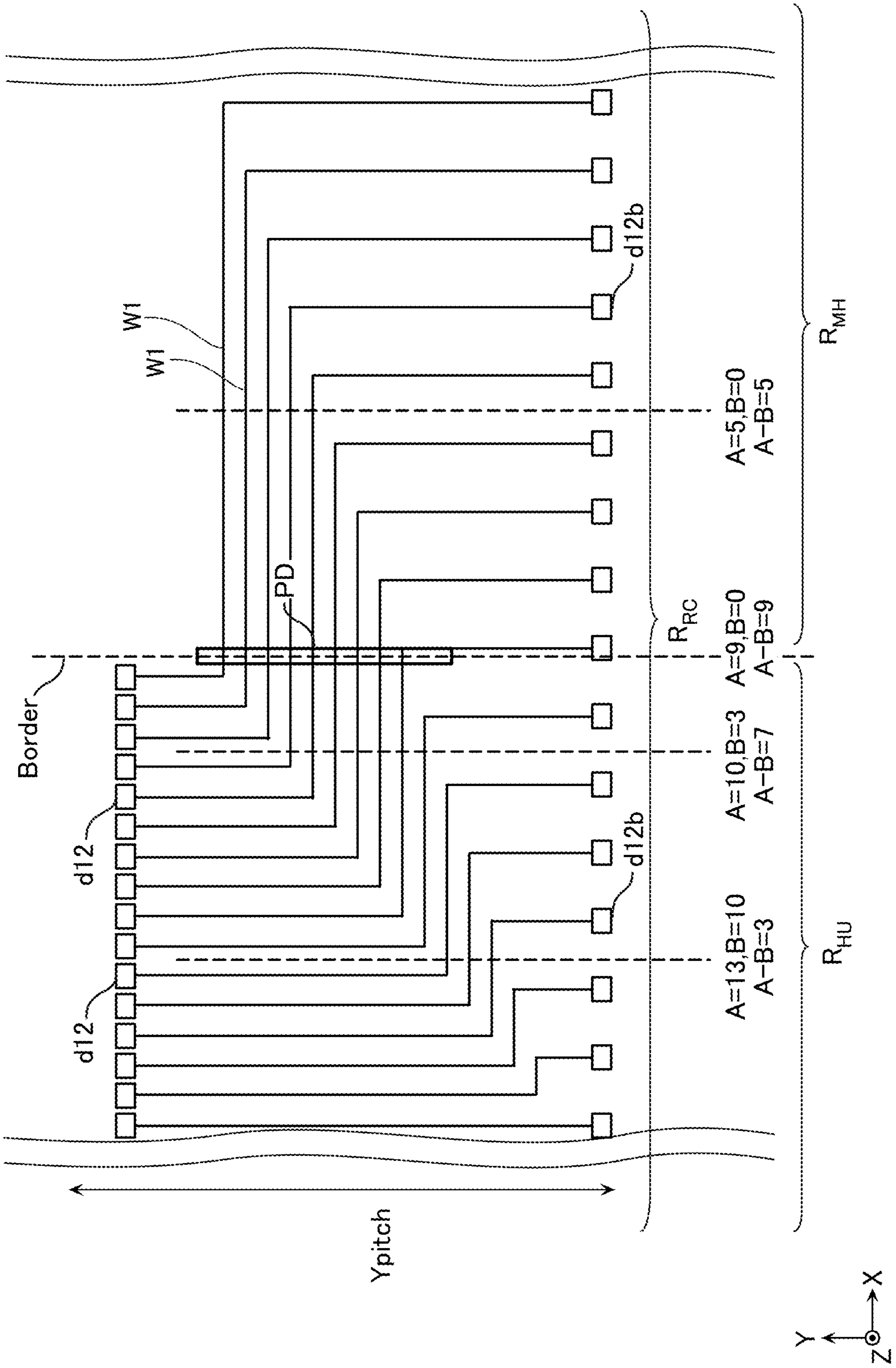
FIG. 55 is a diagram illustrating a way of obtaining a density of the hook-up wirings W1.

FIG. 55 is a diagram illustrating a way of obtaining the density of the hook-up wirings W1. FIG. 55 illustrates the hook-up wirings W1 of the wiring layer D1 by the solid lines. Note that, in FIG. 55, for ease of understanding of the density of the hook-up wirings W1, the hook-up wirings W1 in the X-direction are indicated by the straight lines. However, as in FIG. 26, FIG. 45, and the like, the hook-up wirings W1 may be bent in a crank shape. Note that the hook-up wirings W1 illustrated in FIG. 55 are not consistent with the hook-up wirings W0 illustrated in FIG. 54. When the hook-up wirings W1 illustrated in FIG. 55 are formed in the wiring layer D1, the hook-up wirings W0 illustrated in FIG. 54 are not formed in the wiring layer DO.

With reference to FIG. 55, the way of obtaining the densest part PD of the hook-up wirings W1 will be described. In FIG. 55, the density of the hook-up wirings W1 is obtained at the four positions. Similarly to the density of the hook-up wirings W0, the density of the hook-up wirings W1 is the number of the hook-up wirings W1 across the straight line extending in the Y-direction at the predetermined position in the X-direction. A indicates the number of the connecting portions d02*b* (that is, the word line switches WLSW) on the X-direction positive side with respect to the position in the X-direction where the density of the hook-up wirings W1 is obtained. B indicates the number of the connecting portions d02 on the X-direction positive side with respect to the position in the X-direction where the density of the hook-up wirings W1 is obtained.

At the first position counted from the X-direction positive side, A is 5 and B is 0, and the density of the hook-up wirings W1(A-B) at the position is 5. At the second position counted from the X-direction positive side, A is 9 and B is 0, and the density of the hook-up wirings W1(A-B) at the position is 9. At the third position counted from the X-direction positive side, A is 10 and B is 3, and the density of the hook-up wirings W1(A-B) at the position is 7. At the fourth position counted from the X-direction positive side, A is 13 and B is 10, and the density of the hook-up wirings W1(A-B) at the position is 3. Therefore, the second position counted from the X-direction positive side, that is, the boundary portion between the hook-up region $R_{HU}$ and the memory hole region $R_{MH}$ is the densest part PD.

Figure 56:
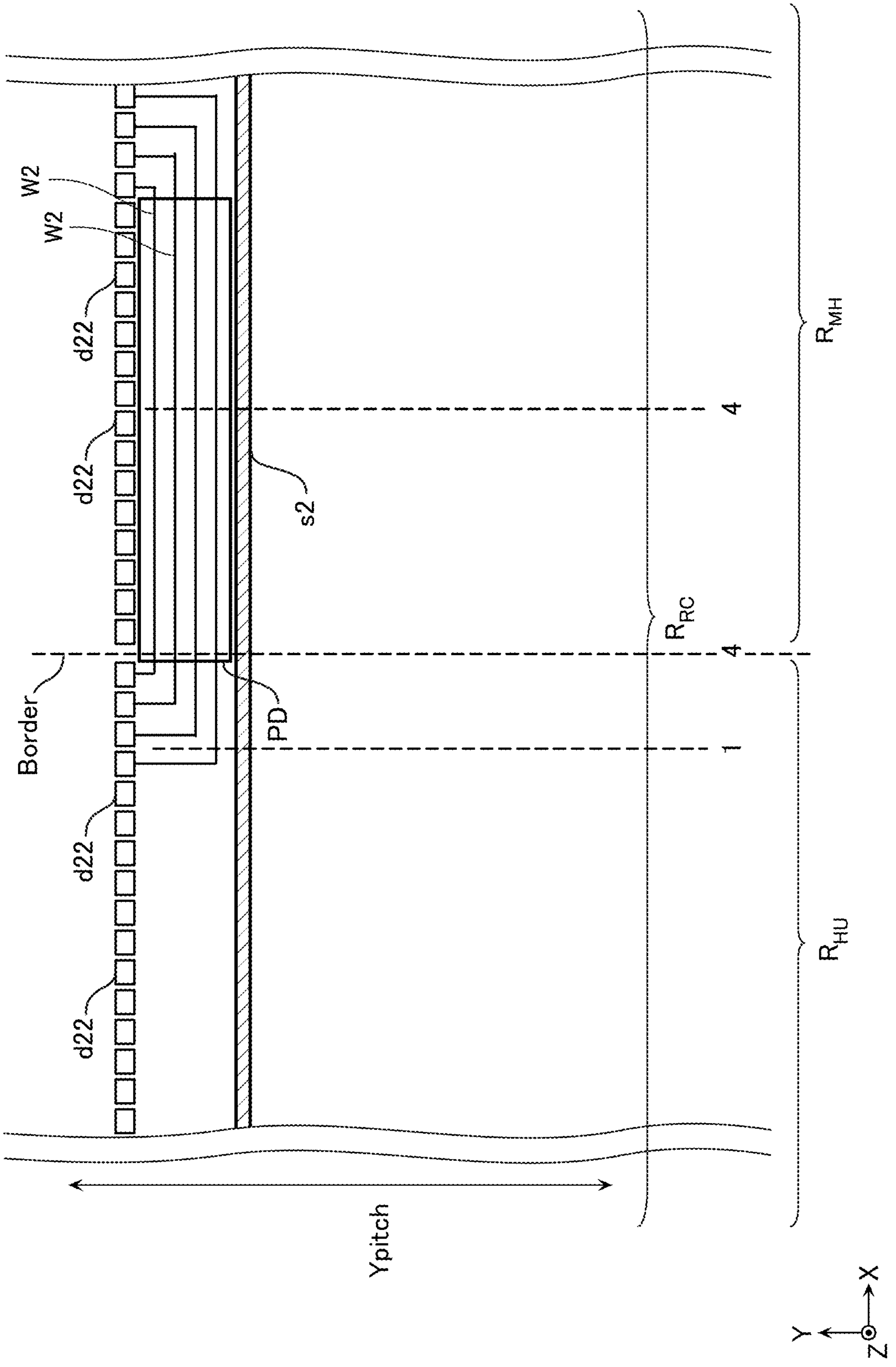
FIG. 56 is a diagram illustrating a way of obtaining a density of the hook-up wirings W2.

FIG. 56 is a diagram illustrating a way of obtaining a density of the hook-up wirings W2. FIG. 56 illustrates the hook-up wirings W2 of the wiring layer D2 by the solid lines. Note that the hook-up wirings W2 illustrated in FIG. 56 are not consistent with the hook-up wirings W0, W1 illustrated in FIG. 54 or FIG. 55. Regarding the connecting portions d22 in which the hook-up wirings W2 are formed in the wiring layer D2 illustrated in FIG. 56, the hook-up wirings W0, W1 illustrated in FIG. 54 and FIG. 55 are formed in the wiring layers DO, D1.

With reference to FIG. 56, the way of obtaining the densest part PD of the hook-up wirings W2 will be described. In FIG. 56, the density of the hook-up wirings W2 is obtained at the three positions. Similarly to the densities of the hook-up wirings W0, W1, the density of the hook-up wirings W2 is the number of the hook-up wirings W2 across the straight line extending in the Y-direction at the predetermined position in the X-direction.

The density of the hook-up wirings W2 at the first position counted from the X-direction positive side is 4. The density of the hook-up wirings W2 at the second position counted from the X-direction positive side is 4. The density of the hook-up wirings W2 at the third position counted from the X-direction positive side is 1. Accordingly, the first and second positions counted from the X-direction positive side are the densest part PD. Note that as illustrated in FIG. 56, the densest part PD is a range having a predetermined width in the X-direction including the first and second positions counted from the X-direction positive side.

Figure 57:
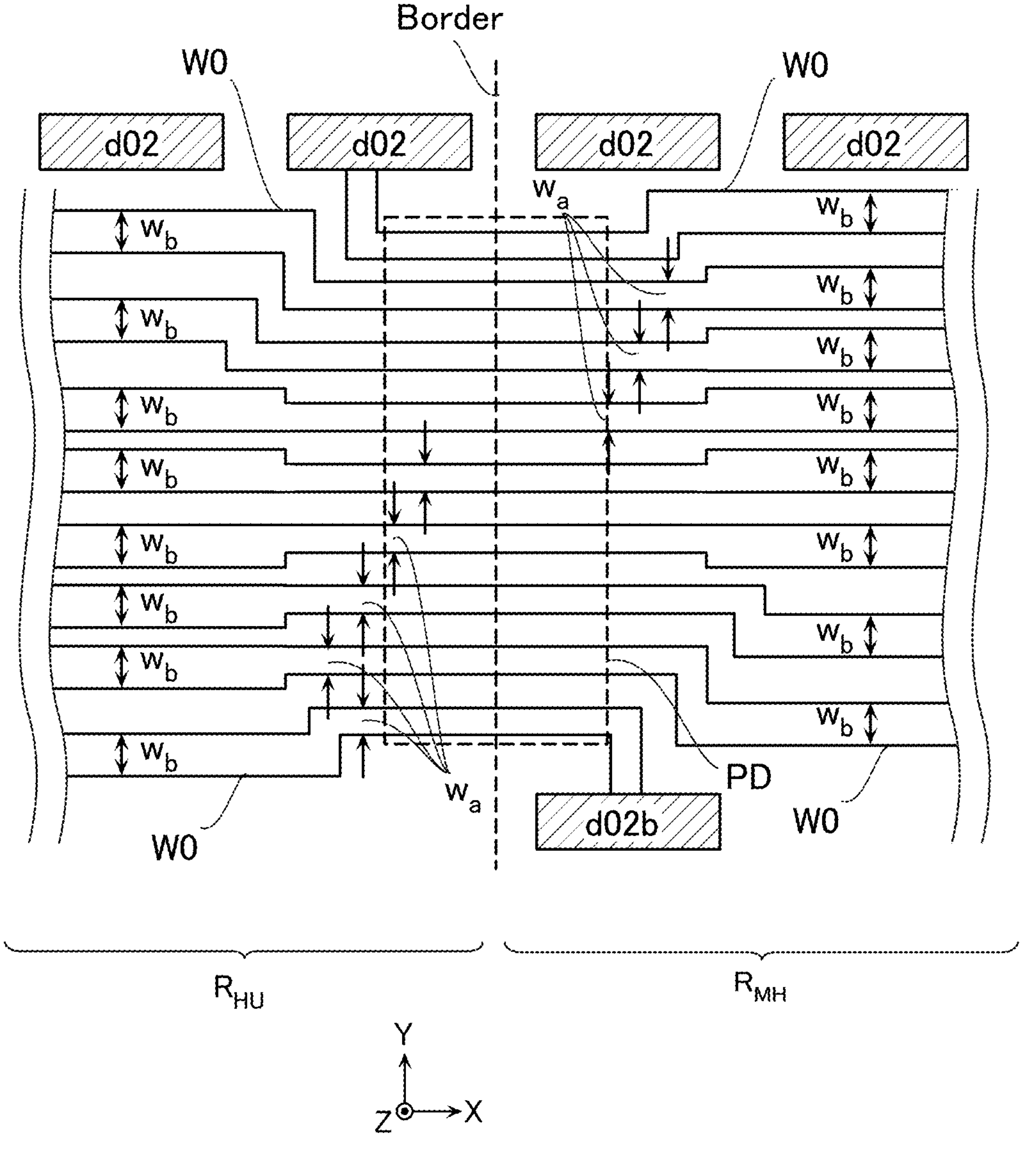
FIG. 57 is a diagram illustrating widths $W_a$, $W_b$ in a Y-direction of the hook-up wirings W0 according to the eighth embodiment.

FIG. 57 is a diagram illustrating widths $W_a$, $W_b$ in the Y-direction of the hook-up wirings W0 according to the eighth embodiment. While the densest parts PD of the hook-up wirings W0 to W2 are obtained in FIG. 54 to FIG.

56, in FIG. 57, the wiring width and the number of wirings regarding the densest part PD of the hook-up wirings W0 will be described.

The densest part PD in FIG. 57 is on the X-direction positive side with respect to the position where the hook-up wiring W0 terminates at the connecting portion d02 and the X-direction negative side with respect to the position where the hook-up wiring W0 terminates at the connecting portion d02*b*. The part other than the densest part PD in FIG. 57 is the part on the X-direction negative side with respect to the position where the hook-up wiring W0 terminates at the connecting portion d02. The part other than the densest part PD in FIG. 57 is a part on the X-direction positive side with respect to the position where the hook-up wiring W0 terminates at the connecting portion d02*b*.

As illustrated in FIG. 57, a width in the Y-direction of the hook-up wiring W0 at the part other than the densest part PD is denoted as $W_b$. The width in the Y-direction of the hook-up wiring W0 at the densest part PD is denoted as $W_a$ narrower than $W_b$.

As illustrated in FIG. 57, while eight wirings pass through between the connecting portion d02 and the connecting portion d02*b* in the part other than the densest part PD, nine wirings pass through between the connecting portion d02 and the connecting portion d02*b* in the densest part PD.

As described above, in the densest part PD, the many hook-up wirings W0 can be formed in the narrow range in the Y-direction. Note that while the hook-up wirings W0 have been described in FIG. 57, the same applies to the hook-up wirings W1, W2.

Figure 58:
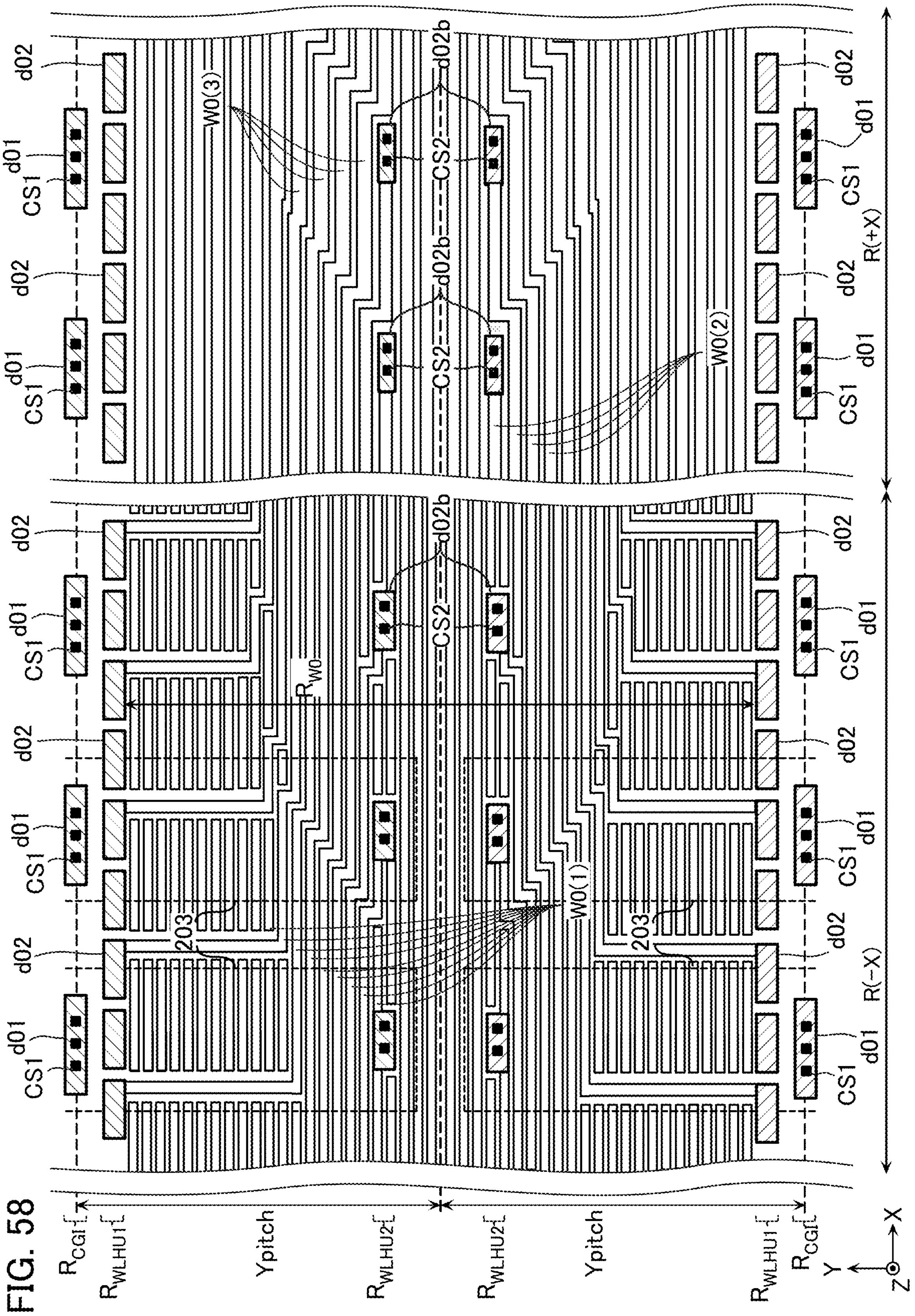
FIG. 58 is a schematic plan view illustrating an example of a wiring pattern in the wiring layer DO of the eighth embodiment.

FIG. 58 is a schematic plan view illustrating an example of a wiring pattern in the wiring layer DO of the eighth embodiment. FIG. 58 is a diagram corresponding to FIG. 27.

In FIG. 27, in the region on the X-direction negative side, a collection of the five respective connecting portions d02, which are arranged in the X-direction, connected to the hook-up wirings W0 and a collection of the plurality of connecting portions d02, which are arranged in the X-direction, not connected to the hook-up wirings W0 are disposed. In contrast to this, in FIG. 58, in the region R (−X) on the X-direction negative side, the respective plurality of connecting portions d02 connected to the hook-up wirings W0 are alternately arranged at regular intervals in the X-direction. In other words, the connecting portions d02 connected to the hook-up wirings W0 and the connecting portions d02 not connected to the hook-up wirings W0 are alternately disposed in the X-direction. In other words, in FIG. 58, the plurality of connecting portions d02 arranged in the X-direction at regular intervals are divided into two collections of the connecting portions d02. The hook-up wirings W0 are connected to the connecting portion d02 of one of the two connecting portions d02 (the X-direction positive side or negative side). Note that the plurality of connecting portions d02 arranged in the X-direction at regular intervals may be divided into collections of m pieces of the connecting portions d02 and the hook-up wiring W0 may be connected to the n-th connecting portion d02 counted from the X-direction positive side or negative side among the m pieces of the connecting portions d02.

In FIG. 27, the widths in the Y-direction of the hook-up wirings W0 are equal. In contrast to this, in FIG. 58, hook-up wirings W0(1), W0(2), W0(3) of the hook-up wirings W0 having different widths in the Y-direction are formed. The width in the Y-direction of the hook-up wiring W0(1) is smaller than the width in the Y-direction of the hook-up wiring W0(2) and the width in the Y-direction of the hook-up wiring W0(2) is smaller than the width in the Y-direction of the hook-up wiring W0(3).

At the position in the X-direction where the density of the hook-up wirings W0 is high, since the number of the hook-up wirings W0 increases, the width in the Y-direction of the hook-up wiring W0 is decreased. At the position in the X-direction where the density of the hook-up wirings W0 is low, since the number of the hook-up wirings W0 decreases, the width in the Y-direction of the hook-up wiring W0 is increased. By increasing the width in the Y-direction of the hook-up wiring W0, the wiring resistance $R_{WR}$ of the hook-up wiring W0 can be decreased.

While FIG. 58 has described the hook-up wirings W0, the same applies to the hook-up wirings W1.

[Effects]

By disposing many word line switches WLSW in the memory hole region $R_{MH}$ (below the memory cell array MCA), the sizes of chips $C_M$, $C_P$ can be decreased. On the other hand, when many word line switches WLSW are disposed in the memory hole region $R_{MH}$, the word line switches WLSW are disposed at the positions in the X-direction far from the boundary between the hook-up region $R_{HU}$ and the memory hole region $R_{MH}$. In this case, the wiring length of the hook-up wiring lengthens, and the wiring resistance $R_{WR}$ also increases. As a result, the delay time tpd also increases.

With the configuration according to the eighth embodiment, the wiring parts including the densest part of the hook-up wirings are laid out with wirings at a thin line and space (L/S) wherever possible and the line and space (L/S) of another part is thickened. Accordingly, the number of the word line switches WLSW in the memory hole region $R_{MH}$ (below the memory cell array MCA) can be increased and the increase in the wiring resistance $R_{WR}$ of the hook-up wiring can be avoided as much as possible. Consequently, the wiring resistance $R_{WR}$ of the hook-up wiring can be decreased and the delay time tpd can also be decreased.

Note that in FIG. 57, the thickness (the width in the Y-direction) of the hook-up wiring W0 is switched between the two widths $W_a$, $W_b$, and in FIG. 58, the thickness (the width in the Y-direction) of the hook-up wiring W0 is switched between the three widths. However, the configuration is not limited to this, and the four or more widths may be switched. Additionally, as the wiring length of the hook-up wiring lengthens, the width in the Y-direction may be increased. As the wiring length of the hook-up wiring shortens, the width in the Y-direction may be decreased. Thus, the wiring resistance $R_{WR}$ can be further reduced.

Ninth Embodiment

Figure 59:
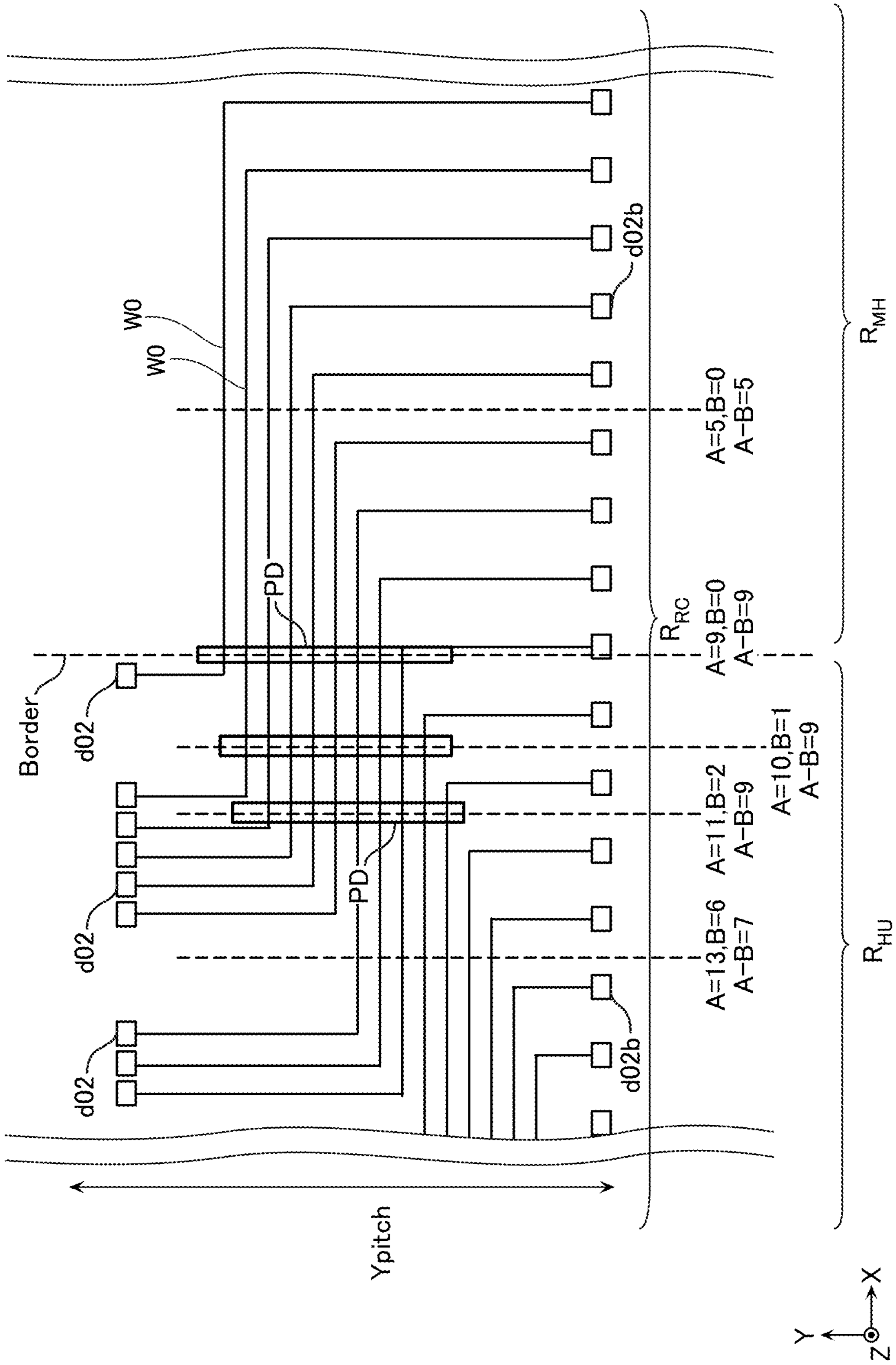
FIG. 59 is a diagram illustrating a way of obtaining a density of the hook-up wirings W0 according to a ninth embodiment.

FIG. 59 is a diagram illustrating a way of obtaining a density of the hook-up wirings W0 according to the ninth embodiment. In FIG. 54, the connecting portions d02 are arranged in the X-direction at regular intervals. However, in FIG. 59, a collection where one connecting portion d02 and the five connecting portions d02 are arranged in the X-direction, a space where the three connecting portions d02 are not disposed, and a collection where the three connecting portions d02 are arranged in the X-direction are disposed. With the configuration, the part different from the densest part PD of the hook-up wirings W0 in FIG. 54 can be the densest part PD.

In the example of FIG. 59, at the first position counted from the X-direction positive side, A is 5 and B is 0, and the density of the hook-up wirings W0(A-B) at the position is 5.

At the second position counted from the X-direction positive side, A is 9 and B is 0, and the density of the hook-up wirings W0(A-B) at the position is 9. At the third position counted from the X-direction positive side, A is 10 and B is 1, and the density of the hook-up wirings W0(A-B) at the position is 9. At the fourth position counted from the X-direction positive side, A is 11 and B is 2, and the density of the hook-up wirings W0(A-B) at the position is 9. At the fifth position counted from the X-direction positive side, A is 13 and B is 6, and the density of the hook-up wirings W0(A-B) at the position is 7. Accordingly, the second, third, and fourth positions counted from the X-direction positive side are the densest parts PD.

In the configuration as well, regarding the wiring part including the two densest parts PD, the width in the Y-direction of the hook-up wiring W0 is decreased and the widths in the Y-direction of other parts are increased. Accordingly, the number of the word line switches WLSW in the memory hole region $R_{MH}$ (below the memory cell array MCA) can be increased and the increase in the wiring resistance $R_{WR}$ of the hook-up wiring can be avoided as much as possible. Consequently, the wiring resistance $R_{WR}$ of the hook-up wiring can be decreased and the delay time tpd can also be decreased. Although FIG. 59 has described the hook-up wirings W0, the same applies to the hook-up wirings W1, W2.

Figure 60:
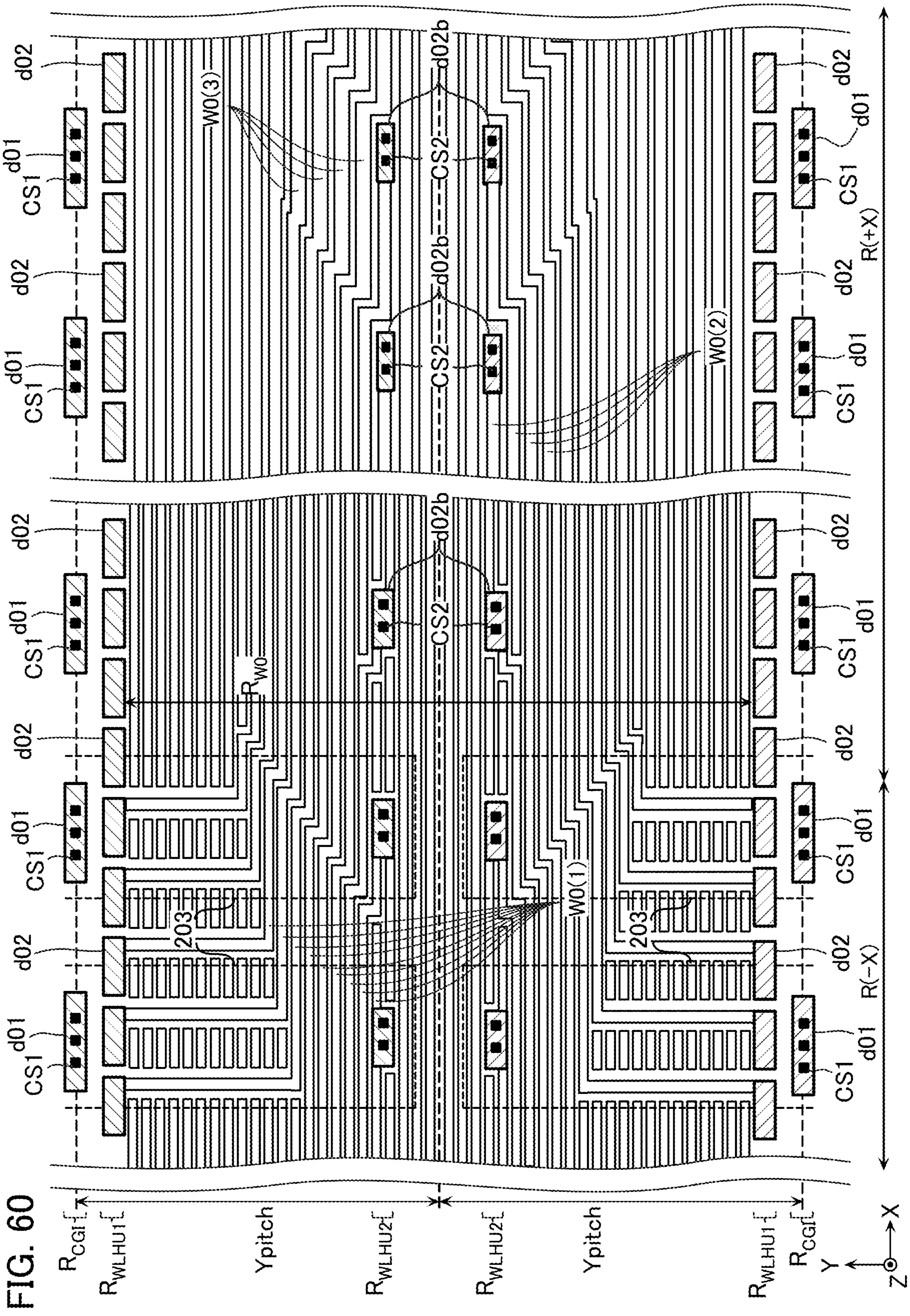
FIG. 60 is a schematic plan view illustrating an example of a wiring pattern of the wiring layer DO of the ninth embodiment.

FIG. 60 is a schematic plan view illustrating an example of a wiring pattern in the wiring layer DO of the ninth embodiment. FIG. 60 is a diagram corresponding to FIG. 27.

In FIG. 60, similarly to FIG. 27, in the region on the X-direction negative side, a collection of the five respective connecting portions d02, which are arranged in the X-direction, connected to the hook-up wirings W0 and a collection of the plurality of connecting portions d02, which are arranged in the X-direction, not connected to the hook-up wirings W0 are disposed. Note that the plurality of connecting portions d02 arranged in the X-direction at regular intervals may be divided into collections of m pieces of the connecting portions d02 and the hook-up wiring W0 may be connected to the n-th connecting portion d02 counted from the X-direction positive side or negative side among the m pieces of the connecting portions d02.

In FIG. 27, the widths in the Y-direction of the hook-up wirings W0 are equal. In contrast to this, in FIG. 60, the hook-up wirings W0(1), W0(2), W0(3) of the hook-up wirings W0 having different widths in the Y-direction are formed. The width in the Y-direction of the hook-up wiring W0(1) is smaller than the width in the Y-direction of the hook-up wiring W0(2) and the width in the Y-direction of the hook-up wiring W0(2) is smaller than the width in the Y-direction of the hook-up wiring W0(3).

At the position in the X-direction where the density of the hook-up wirings W0 is high, since the number of the hook-up wirings W0 increases, the width in the Y-direction of the hook-up wiring W0 is decreased. At the position in the X-direction where the density of the hook-up wirings W0 is low, since the number of the hook-up wirings W0 decreases, the width in the Y-direction of the hook-up wirings W0 is increased. By increasing the width in the Y-direction of the hook-up wiring W0, the wiring resistance $R_{WR}$ of the hook-up wiring W0 can be decreased.

In FIG. 60, the plurality of connecting portions d02 are arranged in the X-direction at regular intervals, and the hook-up wirings W0 are connected to the respective plurality of connecting portions d02 disposed in the region R (−X) on the X-direction negative side. That is, the region R (−X) in FIG. 60 is similar to the region R (−X) in FIG. 27.

Note that FIG. 59 does not illustrate the connecting portion d02 not connected to the hook-up wiring W0. Instead of a space where the connecting portion d02 illustrated in FIG. 59 is not disposed, as illustrated in FIG. 60, the five connecting portions d02 not connected to the hook-up wirings W0 may be disposed.

In FIG. 60, the collection of the five connecting portions d02 connected to the hook-up wirings W0 and the collection of the five connecting portions d02 not connected to the hook-up wirings W0 are repeatedly disposed. However, it is not limited to the five connecting portions d02, and a collection of the plurality of connecting portions d02 connected to the hook-up wirings W0 and a collection of the plurality of connecting portions d02 not connected to the hook-up wirings W0 may be repeatedly disposed.

While FIG. 60 has described the hook-up wirings W0, the same applies to the hook-up wirings W1.

Tenth Embodiment

Figure 61:
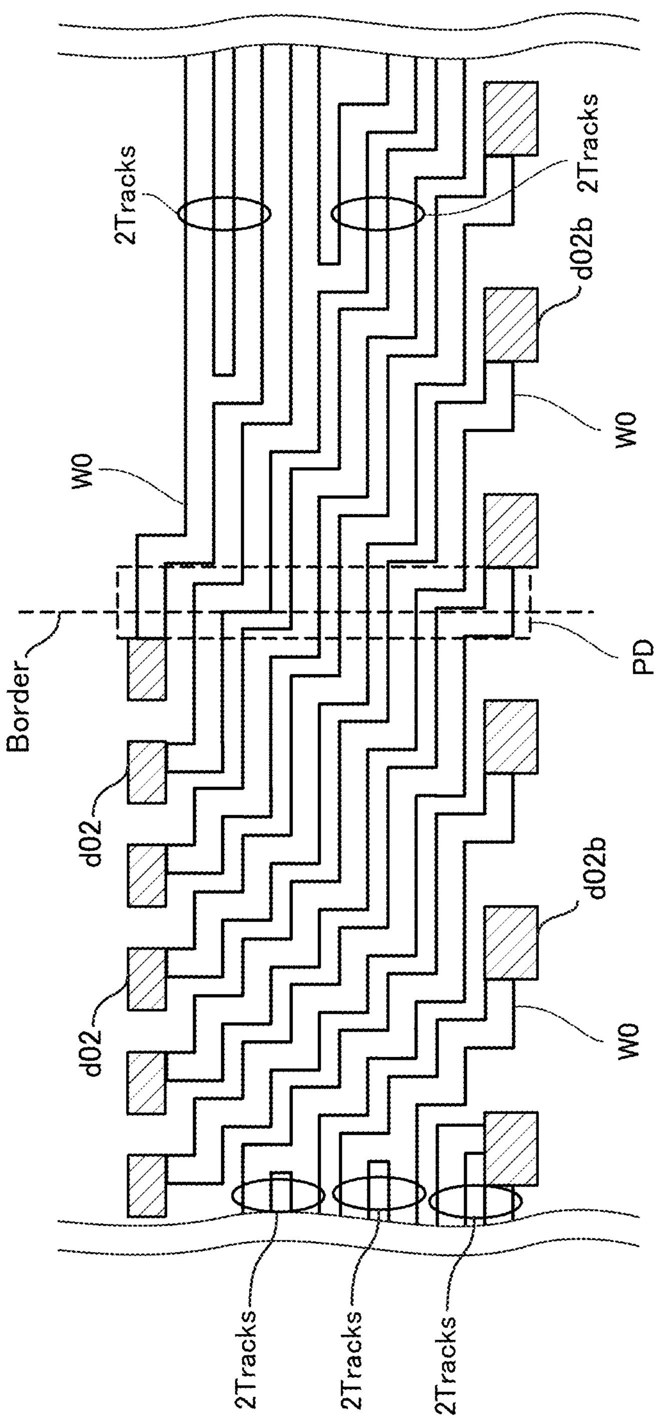
FIG. 61 is a diagram illustrating the hook-up wirings W0 according to a tenth embodiment.

FIG. 61 is a diagram illustrating the hook-up wirings W0 according to the tenth embodiment. In FIG. 57, the width in the Y-direction of the hook-up wiring W0 is changed between the densest part PD and another part. In contrast to this, in FIG. 61, the densest part PD is treated as one hook-up wiring W0, and the two hook-up wirings W0 are connected in parallel in other parts. Note that the width in the Y-direction of one hook-up wiring W0 is, for example, $W_a$ same as that in FIG. 57.

The densest part PD in FIG. 61 is on the X-direction positive side with respect to the position where the hook-up wiring W0 terminates at the connecting portion d02 and the X-direction negative side with respect to the position where the hook-up wiring W0 terminates at the connecting portion d02*b*. The part other than the densest part PD in FIG. 61 is the part on the X-direction negative side with respect to the position where the hook-up wiring W0 terminates at the connecting portion d02. The part other than the densest part PD in FIG. 61 is a part on the X-direction positive side with respect to the position where the hook-up wiring W0 terminates at the connecting portion d02*b*.

As illustrated in FIG. 61, in the parts other than the densest part PD, one hook-up wiring W0 branches into the two hook-up wirings W0 (denoted as "2 Tracks" in FIG. 61). The densest part PD includes one hook-up wiring W0.

Thus, one hook-up wiring W0 is branched into the two hook-up wirings W0 in the parts other than the densest part PD. Accordingly, the effect similar to the effect when the width in the Y-direction of the hook-up wiring W0 is increased can be obtained. Accordingly, at the position in the X-direction where the density of the hook-up wirings W0 is low, by increasing the width in the Y-direction of the hook-up wiring W0, the wiring resistance $R_{WR}$ can be decreased.

As described above, in the densest part PD, the many hook-up wirings W0 can be formed in the narrow range in the Y-direction. Although FIG. 61 has described the hook-up wirings W0, the same applies to the hook-up wirings W1, W2.

With the configuration as well, similarly to the case described in FIG. 57, the number of the word line switches WLSW in the memory hole region $R_{MH}$ (below the memory cell array MCA) can be increased and the increase in the wiring resistance $R_{WR}$ of the hook-up wiring can be avoided as much as possible. Consequently, the wiring resistance $R_{WR}$ of the hook-up wiring can be decreased and the delay time tpd can also be decreased. Although FIG. 61 has described the hook-up wirings W0, the same applies to the hook-up wirings W1, W2.

Eleventh Embodiment

Figure 62:
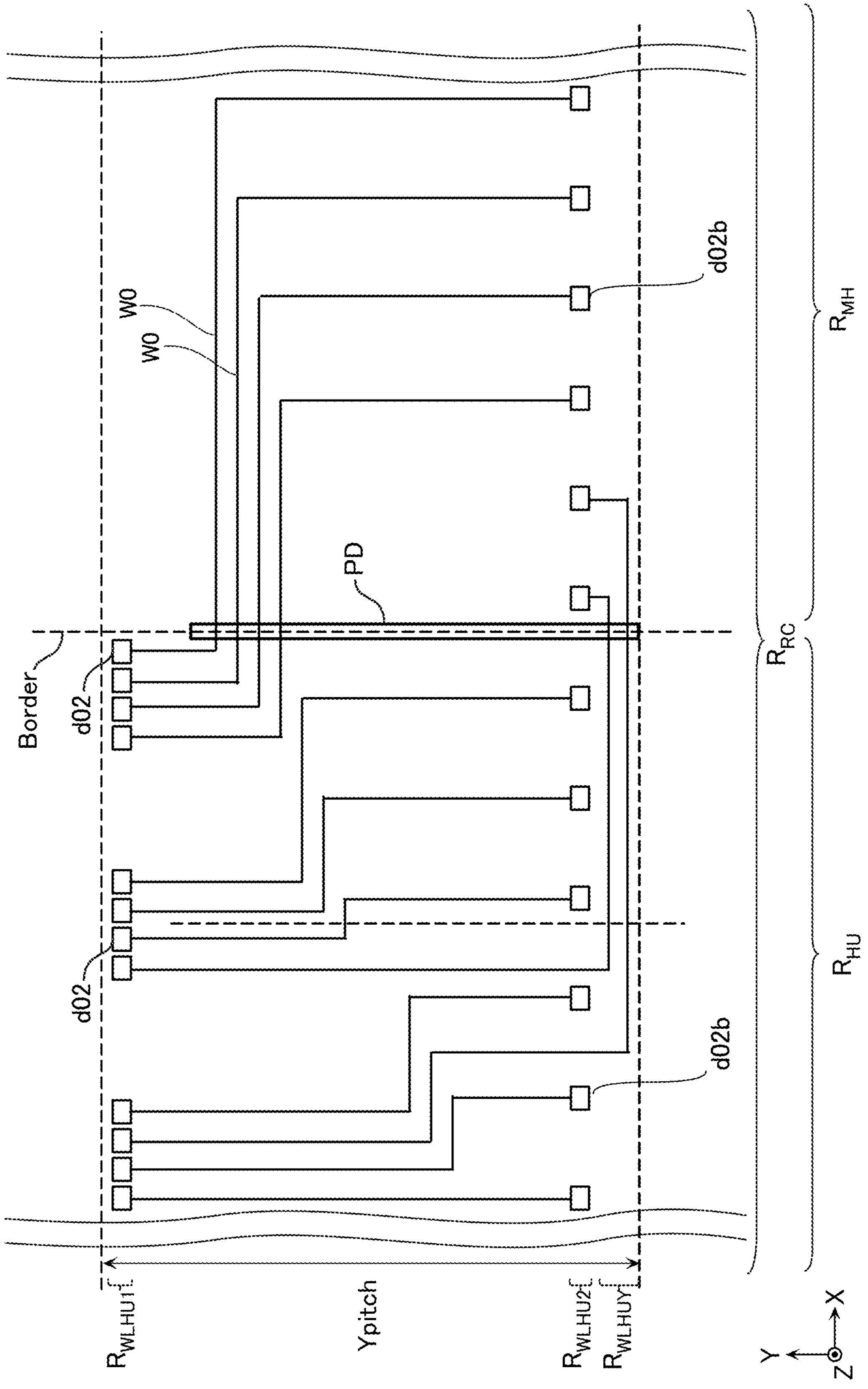
FIG. 62 is a diagram illustrating a way of obtaining a density of the hook-up wirings W0 according to an eleventh embodiment.

FIG. 62 is a diagram illustrating a way of obtaining a density of the hook-up wirings W0 according to the eleventh embodiment. Note that in FIG. 62, a collection where the four connecting portions d02 are arranged in the X-direction and a space where the four connecting portions d02 are not disposed are repeatedly disposed.

For example, as illustrated in FIG. 27 and the like, in the region where the hook-up wirings W0 are can be formed (that is, the pitch Ypitch in the Y-direction of the word line switches WLSW), the hook-up wirings W0 are formed in the region on the Y-direction negative side with respect to the third region $R_{WLMU2}$ where the connecting portions d02*b* are disposed in some cases. In FIG. 62, the region on the Y-direction negative side with respect to the third region $R_{WLHU2}$ is a region $R_{WLHUY}$. The density of the hook-up wirings W0 may be obtained considering the hook-up wirings W0 formed in this region $R_{WLHUY}$. In the example of FIG. 62, the boundary portion between the hook-up region $R_{HU}$ and the memory hole region $R_{MH}$ is the densest part PD of the hook-up wirings W0.

Note that the hook-up wirings W0 connecting the select gate line switches SGSW and the select gate lines (SGD, SGS) may be formed in the region $R_{WLHUY}$. While FIG. 62 has described the hook-up wirings W0, the same applies to the hook-up wirings W1.

Note that in the eighth embodiment to the eleventh embodiment, the hook-up wirings connecting the word lines WL and the word line switches WLSW have been described. However, it may be applied to hook-up wirings connecting the select gate lines (SGD, SGS) and the select gate line switches SGSW.

Additionally, as illustrated in FIG. 51, while the page, which is an execution unit of an operation, is 16 k bytes, the page may be 16 k bytes or more or 16 k bytes or less.

Twelfth Embodiment

Figure 63:
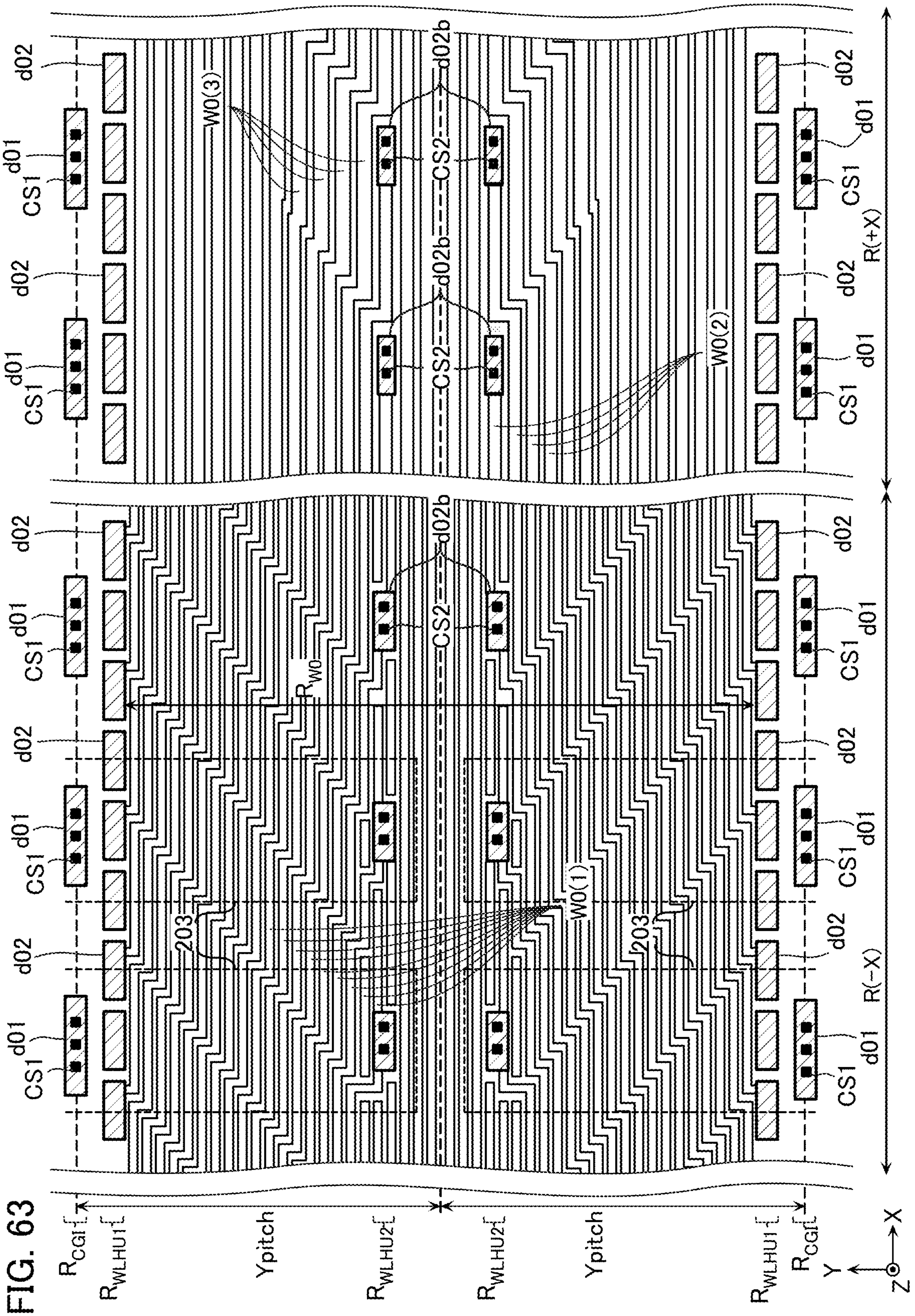
FIG. 63 is a schematic plan view illustrating an example of a wiring pattern of the wiring layer DO according to a twelfth embodiment.

FIG. 63 is a schematic plan view illustrating an example of a wiring pattern of the wiring layer DO according to the twelfth embodiment. FIG. 63 is a diagram corresponding to FIG. 58.

In FIG. 63, similarly to FIG. 58, in the region R (−X) on the X-direction negative side, the respective plurality of connecting portions d02 connected to the hook-up wirings W0 are alternately arranged at regular intervals in the X-direction. In other words, the connecting portions d02 connected to the hook-up wirings W0 and the connecting portions d02 not connected to the hook-up wirings W0 are alternately disposed in the X-direction. Meanwhile, in FIG. 63, different from FIG. 58, the hook-up wiring W0 connected to the connecting portion d02 extends in the Y-direction from the connecting portion d02, and is bent in a crank shape at a position close to the connecting portion d02. Note that the plurality of connecting portions d02 arranged in the X-direction at regular intervals may be divided into collections of m pieces of the connecting portions d02 and the hook-up wiring W0 may be connected to the n-th connecting portion d02 counted from the X-direction positive side or negative side among the m pieces of the connecting portions d02.

In FIG. 63, similarly to FIG. 58, the hook-up wirings W0(1), W0(2), W0(3) of the hook-up wirings W0 having different widths in the Y-direction are formed. The width in the Y-direction of the hook-up wiring W0(1) is smaller than the width in the Y-direction of the hook-up wiring W0(2) and the width in the Y-direction of the hook-up wiring W0(2) is smaller than the width in the Y-direction of the hook-up wiring W0(3).

At the position in the X-direction where the density of the hook-up wirings W0 is high, since the number of the hook-up wirings W0 increases, the width in the Y-direction of the hook-up wirings W0 is decreased. At the position in the X-direction where the density of the hook-up wirings W0 is low, since the number of the hook-up wirings W0 decreases, the width in the Y-direction of the hook-up wiring W0 is increased. By increasing the width in the Y-direction of the hook-up wiring W0, the wiring resistance $R_{WR}$ of the hook-up wiring W0 can be decreased.

While the hook-up wirings W0 have been described in FIG. 63, the hook-up wirings (W0 to W2, W0*a* to W2*a*) in FIG. 25 to FIG. 27 and FIG. 44 to FIG. 46 may have the similar configuration. That is, at the position in the X-direction where the density of the hook-up wirings is high, the width in the Y-direction of the hook-up wiring W0 may be decreased, and at the position in the X-direction where the density of the hook-up wirings W0 is low, the width in the Y-direction of the hook-up wiring may be increased.

Thirteenth Embodiment

Figure 64:
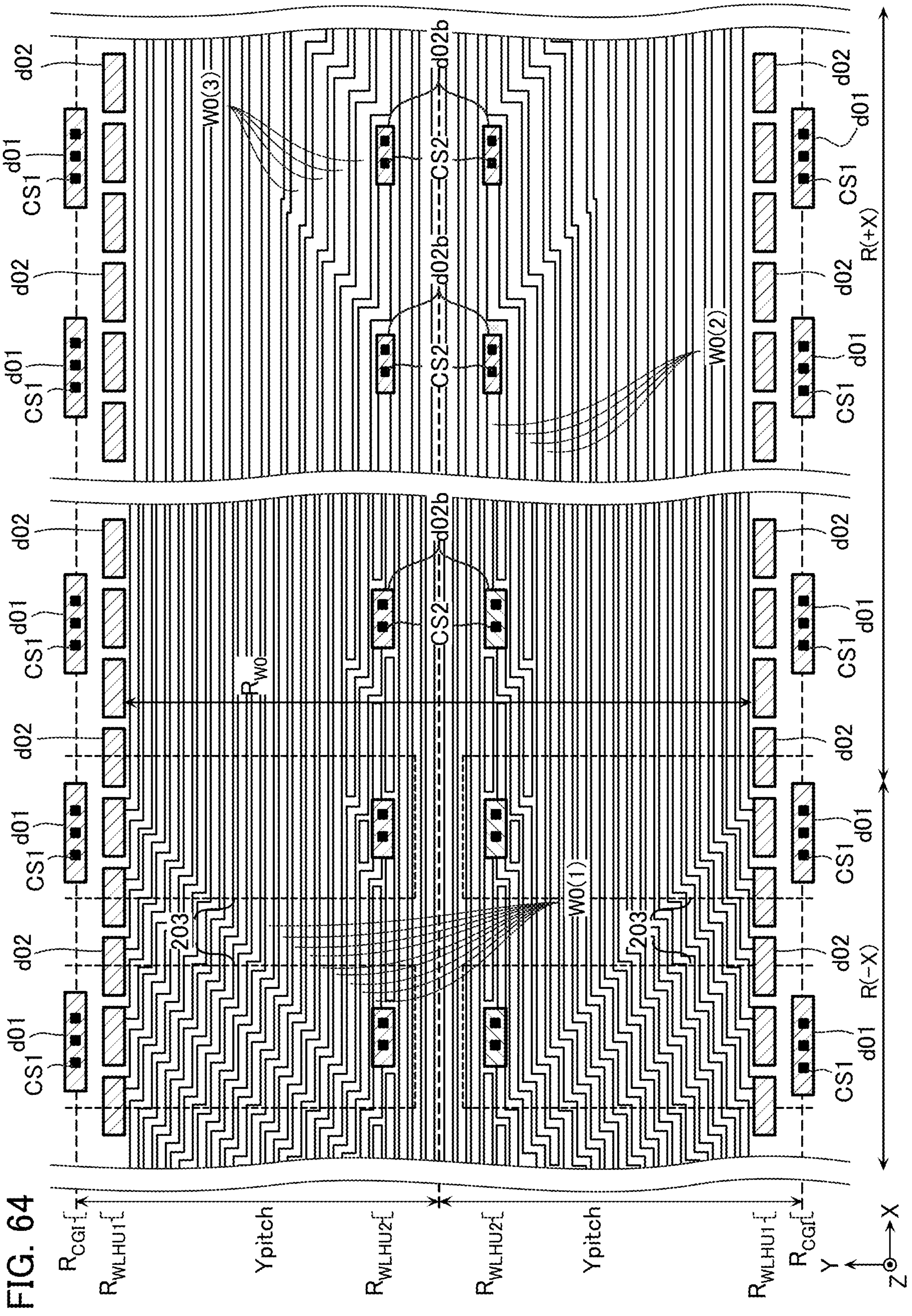
FIG. 64 is a schematic plan view illustrating an example of a wiring pattern of the wiring layer DO according to a thirteenth embodiment.

FIG. 64 is a schematic plan view illustrating an example of a wiring pattern of the wiring layer DO according to the thirteenth embodiment. FIG. 64 is a diagram corresponding to FIG. 60.

In FIG. 64, similarly to FIG. 60, in the region on the X-direction negative side, a collection where the five respective connecting portions d02, which are arranged in the X-direction, are connected to the hook-up wirings W0 and a collection of the plurality of connecting portions d02, which are arranged in the X-direction, are not connected to the hook-up wirings W0 are disposed. Meanwhile, in FIG. 64, different from FIG. 60, the hook-up wiring W0 connected to the connecting portion d02 extends in the Y-direction from the connecting portion d02, and is bent in a crank shape at a position close to the connecting portion d02. Note that the plurality of connecting portions d02 arranged in the X-direction at regular intervals are divided into collections of m pieces of the connecting portions d02 and the hook-up wiring W0 may be connected to the n-th connecting portion d02 counted from the X-direction positive side or negative side among the m pieces of the connecting portions d02.

In FIG. 64, similarly to FIG. 60, the hook-up wirings W0(1), W0(2), W0(3) of the hook-up wirings W0 having different widths in the Y-direction are formed. The width in the Y-direction of the hook-up wiring W0(1) is smaller than the width in the Y-direction of the hook-up wiring W0(2) and the width in the Y-direction of the hook-up wiring W0(2) is smaller than the width in the Y-direction of the hook-up wiring W0(3).

At the position in the X-direction where the density of the hook-up wirings W0 is high, since the number of the hook-up wirings W0 increases, the width in the Y-direction of the hook-up wiring W0 is decreased. At the position in the Y-direction where the density of the hook-up wirings W0 is low, since the number of the hook-up wirings W0 decreases, the width in the Y-direction of the hook-up wiring W0 is increased. By increasing the width in the Y-direction of the hook-up wiring W0, the wiring resistance $R_{WR}$ of the hook-up wiring W0 can be decreased.

In FIG. 64, the collection of the five connecting portions d02 connected to the hook-up wirings W0 and the collection of the five connecting portions d02 not connected to the hook-up wirings W0 are repeatedly disposed. However, it is not limited to the five connecting portions d02, the collection of the plurality of connecting portions d02 connected to the hook-up wirings W0 and a collection of the plurality of connecting portions d02 not connected to the hook-up wirings W0 may be repeatedly disposed.

While the hook-up wirings W0 have been described in FIG. 64, the hook-up wirings (W0 to W2, W0*a* to W2*a*) in FIG. 25 to FIG. 27 and FIG. 44 to FIG. 46 may have the similar configuration. That is, at the position in the X-direction where the density of the hook-up wirings is high, the width in the Y-direction of the hook-up wiring W0 may be decreased, and at the position in the X-direction where the density of the hook-up wirings W0 is low, the width in the Y-direction of the hook-up wiring may be increased.

This specification discloses the following inventions.

When the number of hook-up wirings across a straight line extending in the second direction (Y-direction) at a first position in the first direction (X-direction) is larger than the number of the hook-up wirings (W0 to W2) across the straight line at a second position in the first direction (X-direction), a width in the second direction at a first part of the hook-up wiring including the first position is configured to be smaller than a width in the second direction at a second part other than the first part.

The first part includes a boundary portion between the memory region ($R_{MH}$) and the hook-up region ($R_{HU}$).

The first part includes a position in the first direction where the number of the hook-up wirings (W0 to W2) across the straight line is the largest.

At the position in the first direction where the number of the hook-up wirings (W0 to W2) across the straight line is the largest, a difference between the number of nodes (A) connected to transistors at the memory region side in the first direction with respect to the position and the number of nodes (B) connected to the nodes via the hook-up wirings at the memory region side in the first direction with respect to the position (A-B) becomes the maximum.

As the wiring length of the hook-up wiring lengthens, the width in the second direction (Y-direction) is increased. As the wiring length of the hook-up wiring shortens, the width in the second direction (Y-direction) is decreased.

The semiconductor memory device includes: a plurality of stacked structures (memory blocks BLK) that include the plurality of conductive layers (510, WL, SG) arranged in the third direction (Z-direction), the plurality of conductive layers being arranged in the second direction (Y-direction); a memory region ($R_{MH}$) that includes a plurality of semiconductor columns (520, MH) disposed corresponding to the plurality of stacked structures, extending in the third direction, and opposed to the plurality of conductive layers; and a hook-up region ($R_{HU}$) that includes a plurality of first via-contact electrodes (CC) disposed corresponding to the plurality of stacked structures, extending in the third direction, and electrically connected to the plurality of conductive layers. The hook-up region ($R_{HU}$) is disposed at a center position or an approximately center position in the first direction (X-direction) or an end portion in the first direction of a memory plane (MP).

A first part of the hook-up wiring including the first position is formed of one wiring, and a second part other than the first part is formed of two (or two or more) wirings.

Other Embodiments

The semiconductor memory devices according to the first embodiment to the tenth embodiment have been described above. However, the configurations described above are merely examples, and the specific configurations are appropriately adjustable.

For example, the plurality of bonding electrodes $P_{I1}$, $P_{I2}$ illustrated as an example in FIG. 18 are disposed in the entire region of the hook-up region $R_{HU}$. However, the plurality of bonding electrodes $P_{I1}$, $P_{I2}$ may be disposed in a part of the region of the hook-up region $R_{HU}$ or the region other than the hook-up region $R_{HU}$ (for example, the memory hole region $R_{MH}$). In this case, a part of the plurality of via-contact electrodes CC are connected to the wirings m0, m1 in the wiring layers M0, M1 and connected to the bonding electrodes $P_{I1}$ in a part of the region of the hook-up region $R_{HU}$ or in the region other than the hook-up region $R_{HU}$ via the wirings m0, m1.

For example, while the wiring region $R_{W3}$ is disposed in the wiring layer D3 in FIG. 21 to FIG. 23, the wiring region $R_{W3}$ need not be disposed. While the wiring region $R_{W2}$ is disposed in the wiring layer D2 in FIG. 24 and FIG. 25, the wiring region $R_{W2}$ need not be disposed. Additionally, the passing wiring region is not disposed in the wiring layer D1 in FIG. 26, but the passing wiring region (for example, $R_{Tw}$) may be disposed.

Figure 50:
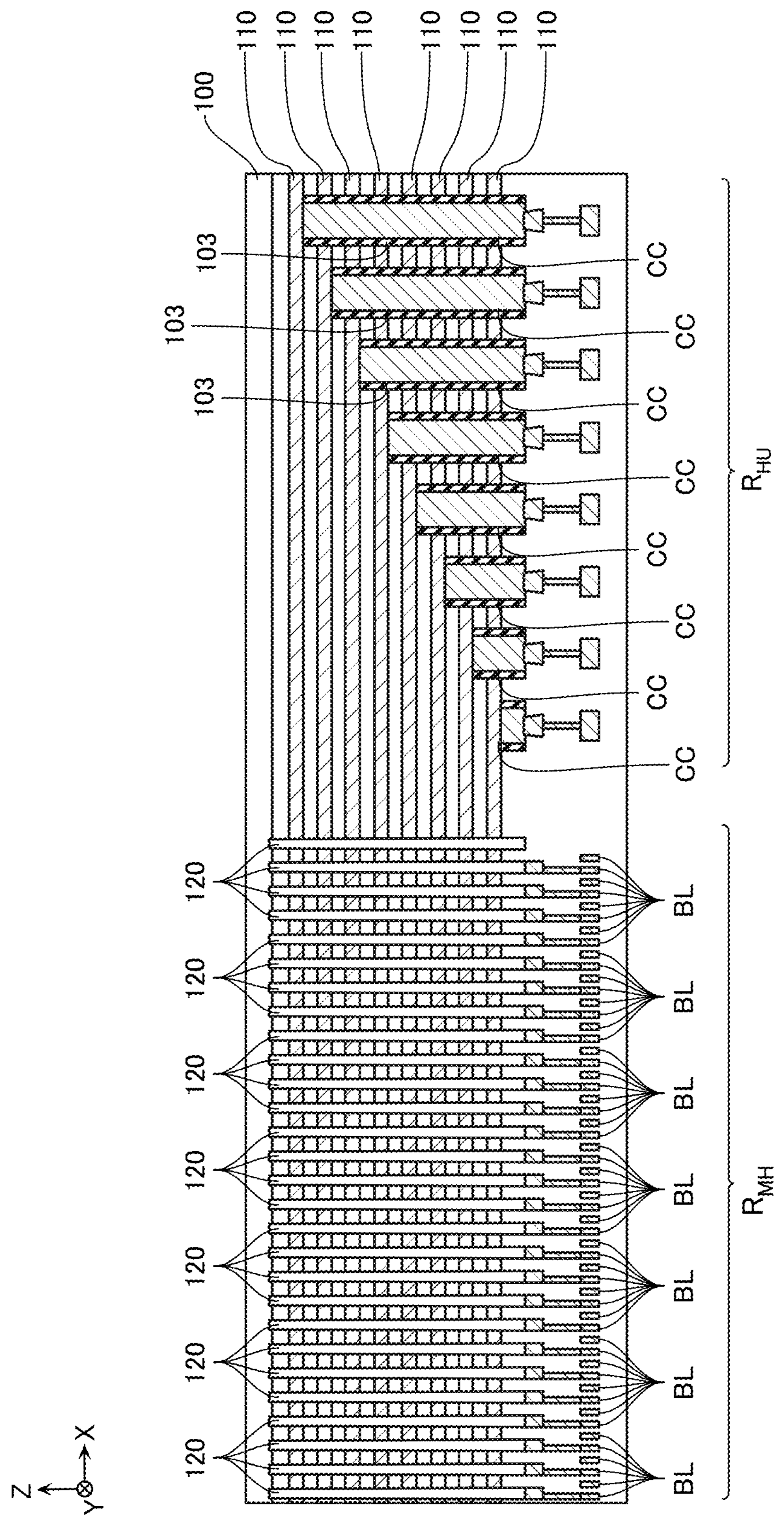
FIG. 50 is a schematic cross-sectional view illustrating a modification of via-contact electrodes CC.

In the hook-up regions $R_{HU}$, $R_{HU2}$, the conductive layers 110 (the word lines WL and the select gate line SG) of the respective layers are formed in the staircase pattern and the lower ends or the upper ends of the via-contact electrodes CC are connected to the conductive layers 110 of the respective layers. However, in the hook-up regions $R_{HU}$, $R_{HU2}$, the via-contact electrodes CC may be formed in the next process. For example, a plurality of contact holes reaching the conductive layers 110 of the respective layers are formed. Insulating layers, such as silicon oxide ($SiO_2$), are formed on outer peripheral surfaces of the plurality of contact holes. For example, a stacked film of a barrier conductive film, such as titanium nitride (TiN), and a metal film, such as tungsten (W), is formed on the inside of the outer peripheral surfaces of the plurality of contact holes. FIG. 50 is a schematic cross-sectional view illustrating the via-contact electrodes CC formed by the above-described process. As illustrated in FIG. 50, the plurality of via-contact electrodes CC disposed in the hook-up region $R_{HU}$ extend in the Z-direction and connected to the conductive layer 100 at the upper ends. The via-contact electrode CC may include, for example, a stacked film of a barrier conductive film, such as titanium nitride (TiN), and a metal film, such as tungsten (W). On the outer peripheral surface of the via-contact electrode CC, an insulating layer 103, such as silicon oxide ($SiO_2$), is disposed.

For example, as described with reference to, for example, FIG. 15, the source region $R_{SO}$ is used by the two word line switches WLSW in common. However, the two word line switches WLSW may have a configuration in which the source region $R_{SO}$ is not used in common, that is, have a configuration that the source region $R_{SO}$ of the semiconductor region 203 is separated (Single Finger structure). Similarly, the select gate line switch SGSW may have a configuration that the source region $R_{SO}$ of the semiconductor region 203 is separated (Single Finger structure).

While the word line switches WLSW and the select gate line switches SGSW are disposed in the row control circuit region $R_{RC}$, the word line switches WLSW may be disposed in the row control circuit region $R_{RC}$ and the select gate line switches SGSW may be disposed in the block decoder region $R_{BD}$.

In FIG. 34 and FIG. 35, the widths in the X-direction of the row control circuit region $R_{RC}$ and the block decoder region $R_{BD}$ and the width in the X-direction of the hook-up region $R_{HU2}$ are the same. However, the widths in the X-direction of the row control circuit region $R_{RC}$ and the block decoder region $R_{BD}$ may be larger than the width in the X-direction of the hook-up region $R_{HU2}$. In this case, as described with reference to FIG. 12, the bit line BL may be connected to the column control circuit region $R_{CC}$ via the wiring m1*a* in the wiring layer M1.

In FIG. 7, FIG. 8, and FIG. 17, while the bonding electrode $P_{I2}$ and the connecting portion d42 are connected without the via-contact electrode, they may be connected via the via-contact electrode.

As described with reference to FIG. 12, it may be configured such that a part of the row control circuit regions $R_{RC}$ are disposed in the regions overlapping with the hook-up regions $R_{HU}$ when viewed in the Z-direction, the remaining parts are disposed in the regions overlapping with the memory hole regions $R_{MH}$ when viewed in the Z-direction, and as described with reference to FIG. 34, the row control circuit regions $R_{RC}$ are disposed at the centers of the regions MP0' to MP3'. In this case, the hook-up regions $R_{HU}$ are also disposed at the centers of the regions MP0' to MP3'. Additionally, the plurality of via-contact electrodes CC disposed in the hook-up region $R_{HU}$ may have the configuration illustrated in FIG. 50.

Additionally, the following configuration is disclosed as the semiconductor memory device according to the above-described respective embodiments. The semiconductor memory device includes two wiring layers (for example, the wiring layers D0, D1, the wiring layers D1, D2, or the wiring layers D2, D3) arranged adjacent in the Z-direction and disposed between the semiconductor substrate (for example, the semiconductor substrate 200 in FIG. 7 and the semiconductor substrate 500 in FIG. 32) and the plurality of wirings CGI (voltage supply wirings). In a plurality of wirings (hook-up wirings, shield wirings, passing wirings) disposed in the two wiring layers, the number of wirings having a longitudinal direction in the X-direction is larger than the number of wirings having a longitudinal direction in the Y-direction.

Additionally, the following configuration is disclosed as the semiconductor memory device according to the above-described respective embodiments. The semiconductor memory device includes three wiring layers (for example, the wiring layers D0, D1, D2 or the wiring layers D1, D2, D3) arranged adjacent in the Z-direction and disposed between the semiconductor substrate (for example, the semiconductor substrate 200 in FIG. 7 and the semiconductor substrate 500 in FIG. 32) and the plurality of wirings CGI (voltage supply wirings). In a plurality of wirings (hook-up wirings, shield wirings, passing wirings) disposed in the three wiring layers, the number of wirings having a longitudinal direction in the X-direction is larger than the number of wirings having a longitudinal direction in the Y-direction.

Additionally, the following configuration is disclosed as the semiconductor memory device according to the above-described respective embodiments. The semiconductor memory device includes a plurality of wiring layers (for example, DO to D3) arranged adjacent in the Z-direction and disposed between the semiconductor substrate (for example, the semiconductor substrate 200 in FIG. 7 and the semiconductor substrate 500 in FIG. 32) and the plurality of voltage supply wirings (voltage supply wirings). Each of the plurality of wiring layers (for example, DO to D3) includes the plurality of drain regions $R_{DR}$ disposed at positions overlapping with the plurality of source regions $R_{SO}$ when viewed in the Z-direction and a plurality of connecting portions (for example, d02 to d32) electrically connected to the plurality of conductive layers 110. The respective plurality of connecting portions (d02 to d32) in the plurality of wiring layers (for example, DO to D3) are disposed at positions to be overlapped when viewed in the Z-direction (for example, see FIG. 17). Among the plurality of connecting portions (for example, d02 to d32), the connecting portion (for example, any of d02 to d32) to which a hook-up wiring (for example, any of the hook-up wirings W3 to W0) is connected is connected to the adjacent connecting portion in a wiring layer on a side of the voltage supply wiring via a via-contact electrode (for example, C12 to C42). Among the plurality of connecting portions (for example, d02 to d32), the connecting portion in a wiring layer on a side of the semiconductor substrate adjacent to the connecting portion (for example, any of d02 to d32) to which the hook-up wiring (for example, any of the hook-up wirings W3 to W0) is connected is electrically insulated.

In the above-mentioned embodiments, the example of application to the NAND flash memory has been described. However, the technique described in this specification is also applicable to a configuration other than the NAND flash memory, for example, a three-dimensional NOR flash memory. Additionally, the technique described in this specification is also applicable to a configuration other than the flash memory, for example, a three-dimensional DRAM.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
- a semiconductor substrate;
- a plurality of voltage supply wirings;
- a plurality of transistors disposed on the semiconductor substrate, arranged in a first direction, and arranged in a second direction intersecting with the first direction; and
- a first wiring layer disposed between the semiconductor substrate and the plurality of voltage supply wirings, wherein
- each of the plurality of transistors includes a source region and a drain region arranged with the source region in the second direction,
- the first wiring layer includes:
  - a plurality of first connecting portions disposed at positions overlapping with the plurality of source regions when viewed in a third direction intersecting with the first direction and the second direction and electrically connected to the plurality of source regions and the plurality of voltage supply wirings;
  - a plurality of second connecting portions disposed at positions overlapping with the plurality of source regions when viewed in the third direction and electrically connected to the plurality of drain regions and a plurality of conductive layers; and a passing wiring region disposed between a pair of the second connecting portions arranged in the second direction, and the passing wiring region includes one or a plurality of passing wirings extending in the first direction.

2. The semiconductor memory device according to claim 1, comprising a second wiring layer disposed between the semiconductor substrate and the first wiring layer, wherein the second wiring layer includes:

a plurality of third connecting portions disposed at positions overlapping with the plurality of source regions when viewed in the third direction and electrically connected to the plurality of first connecting portions and the plurality of source regions:

a plurality of fourth connecting portions disposed at positions overlapping with the plurality of source regions when viewed in the third direction and electrically connected to the plurality of second connecting portions; and a plurality of fifth connecting portions disposed at positions overlapping with the plurality of drain regions when viewed in the third direction and electrically connected to the plurality of fourth connecting portions and the plurality of drain regions.

3. The semiconductor memory device according to claim 2, wherein positions in the first direction of the plurality of fourth connecting portions and positions in the first direction of the plurality of fifth connecting portions are same or different.

4. The semiconductor memory device according to claim 2, wherein the respective plurality of first connecting portions and plurality of third connecting portions are overlapped when viewed in the third direction, and the respective plurality of second connecting portions and plurality of fourth connecting portions are overlapped when viewed in the third direction.

5. The semiconductor memory device according to claim 1, wherein a shield wiring extending in the first direction is disposed between the second connecting portion and the passing wiring region.

6. The semiconductor memory device according to claim 5, comprising a hook-up wiring region disposed between the second connecting portion and the shield wiring, wherein a plurality of hook-up wirings that connect two of the second connecting portions spaced in the first direction are disposed in the hook-up wiring region.

7. The semiconductor memory device according to claim 6, wherein a width in the second direction of the hook-up wiring close to the shield wiring is larger than a width in the second direction of the hook-up wiring close to the second connecting portion.

8. The semiconductor memory device according to claim 6, wherein a number of hook-up wirings across a straight line extending in the second direction at a first position in the first direction is configured to be larger than a number of the hook-up wirings across the straight line at a second position in the first direction, and a width in the second direction at a first part of the hook-up wiring including the first position is configured to be smaller than a width in the second direction at a second part other than the first part.

9. The semiconductor memory device according to claim 1, comprising:

a plurality of stacked structures that include the plurality of conductive layers arranged in the third direction, the plurality of conductive layers being arranged in the second direction;

a memory region that includes a plurality of semiconductor columns disposed corresponding to the plurality of stacked structures, extending in the third direction, and opposed to the plurality of conductive layers; and a hook-up region that includes a plurality of first via-contact electrodes disposed corresponding to the plurality of stacked structures, extending in the third direction, and electrically connected to the plurality of conductive layers.

10. The semiconductor memory device according to claim 9, wherein the plurality of transistors are disposed at positions overlapping with the hook-up region and a part of the memory region when viewed in the third direction.

11. The semiconductor memory device according to claim 9, wherein a pitch in the second direction of the transistors is a same as a pitch in the second direction of the stacked structures.

12. The semiconductor memory device according to claim 1, wherein the plurality of voltage supply wirings extend in the second direction and are arranged in the first direction.

13. The semiconductor memory device according to claim 1, wherein the passing wiring includes a first passing wiring that transmits a voltage and a second passing wiring that transmits a control signal, and a width in the second direction of the first passing wiring is larger than a width in the second direction of the second passing wiring.

14. The semiconductor memory device according to claim 1, wherein the plurality of first connecting portions are arranged in the first direction in a first region overlapping with a region across the plurality of source regions arranged in the first direction when viewed in the third direction, and the plurality of second connecting portions are arranged in the first direction in a second region close to both sides in the second direction of the first region.

15. The semiconductor memory device according to claim 1, comprising a first chip and a second chip arranged in the third direction and bonded via a plurality of bonding electrodes, wherein the first chip includes:

a plurality of stacked structure that includes the plurality of conductive layers arranged in the third direction and are arranged in the second direction;

a memory region that includes a plurality of semiconductor columns disposed corresponding to the plurality of stacked structures, extending in the third direction, and opposed to the plurality of conductive layers; and a hook-up region that includes a plurality of first via-contact electrodes disposed corresponding to the plurality of stacked structures, extending in the third direction, and electrically connected to the plurality of conductive layers and the plurality of bonding electrodes, and the second chip includes:

the semiconductor substrate;

the plurality of voltage supply wirings;

the plurality of transistors; and the first wiring layer.

16. The semiconductor memory device according to claim 1, comprising:

a plurality of stacked structure that includes the plurality of conductive layers arranged in the third direction and are arranged in the second direction;

a memory region that includes a plurality of semiconductor columns disposed corresponding to the plurality of stacked structures, extending in the third direction, and opposed to the plurality of conductive layers; and a hook-up region that includes a plurality of first via-contact electrodes disposed corresponding to the plurality of stacked structures, extending in the third direction, and electrically connected to the plurality of conductive layers, wherein the plurality of stacked structures and the semiconductor substrate are arranged in the third direction, and the plurality of transistors, the first wiring layer, and the plurality of voltage supply wirings are disposed between the plurality of stacked structures and the semiconductor substrate.

17. The semiconductor memory device according to claim 1, comprising two wiring layers arranged adjacent in the third direction and disposed between the semiconductor substrate and the plurality of voltage supply wirings, wherein in a plurality of wirings disposed in the two wiring layers, a number of wirings having a longitudinal direction in the first direction is larger than a number of wirings having a longitudinal direction in the second direction.

18. The semiconductor memory device according to claim 1, comprising a plurality of wiring layers arranged adjacent in the third direction and disposed between the semiconductor substrate and the plurality of voltage supply wirings, wherein each of the plurality of wiring layers includes a plurality of connecting portions disposed at positions overlapping with the plurality of source regions when viewed in the third direction and electrically connected to the plurality of drain regions and the plurality of conductive layers, the respective plurality of connecting portions in the plurality of wiring layers are disposed at positions to be overlapped when viewed in the third direction, among the plurality of connecting portions, the connecting portion to which a hook-up wiring is connected is connected to the adjacent connecting portion in a wiring layer on a side of the voltage supply wiring via a via-contact electrode, and among the plurality of connecting portions, the connecting portion in a wiring layer on a side of the semiconductor substrate adjacent to the connecting portion to which the hook-up wiring is connected is electrically insulated.

19. The semiconductor memory device according to claim 9, wherein three times of a pitch in the second direction of the transistors is a same as twice of a pitch in the second direction of the stacked structures.

20. The semiconductor memory device according to claim 1, wherein the plurality of first connecting portions and the plurality of second connecting portions are arranged in the first direction in a first region overlapping with a region across the plurality of source regions arranged in the first direction when viewed in the third direction, and the first connecting portion is disposed between two of the second connecting portions.

* * * * *